US011085578B2

(12) United States Patent
Roth

(10) Patent No.: US 11,085,578 B2
(45) Date of Patent: Aug. 10, 2021

(54) MOUNTING SYSTEM, DEVICES, METHODS AND USES THEREOF

(71) Applicant: Core-Arms, LLC, Laguna Hills, CA (US)

(72) Inventor: David Roth, Laguna Hills, CA (US)

(73) Assignee: Core-Arms, LLC, Laguna Hills, CA (US)

( * ) Notice: Subject to any disclaimer, the term of this patent is extended or adjusted under 35 U.S.C. 154(b) by 0 days.

(21) Appl. No.: 17/183,158

(22) Filed: Feb. 23, 2021

(65) Prior Publication Data
US 2021/0177114 A1 Jun. 17, 2021

Related U.S. Application Data

(63) Continuation of application No. 17/154,971, filed on Jan. 21, 2021, which is a continuation-in-part of
(Continued)

(51) Int. Cl.
*A45C 11/00* (2006.01)
*A42B 3/04* (2006.01)
(Continued)

(52) U.S. Cl.
CPC ............ *F16M 13/02* (2013.01); *A42B 3/0406* (2013.01); *A45C 11/00* (2013.01); *F16B 1/00* (2013.01);
(Continued)

(58) Field of Classification Search
CPC .............. A45C 11/00; A45C 2011/002; A45C 2011/003; A42B 3/0406; F16B 1/00;
(Continued)

(56) References Cited

U.S. PATENT DOCUMENTS 2,734,409 A 2/1956 Schum et al.
9,022,334 B1 5/2015 Demayo
(Continued)

OTHER PUBLICATIONS

WIPO, "PCT Form ISA210, International Search Report for International Patent Application Serial No. PCT/US2020/014675, pp. 8 (dated Apr. 9, 2020)".
(Continued)

*Primary Examiner* — Stephen S Sul
*Assistant Examiner* — Michael A Matey
(74) *Attorney, Agent, or Firm* — UltimatEdge IP Law Group, P.C.; Dean G. Stathakis

(57) ABSTRACT

The present specification discloses systems, devices, and methods and uses provide a mounting system which includes rail and a bracket which is selectively secured to the rail. A bracket disclosed herein selectively and/or automatically secures or locks to a rail disclosed herein when positioned on the rail by actuating or triggering a locking mechanism disclosed herein to adopted a locked configuration. In addition, a bracket disclosed herein may be selectively removed from a rail by actuating or triggering a locking mechanism disclosed herein to adopted an unlocked configuration. The disclosed mounting systems, devices, and methods enable a device to be protected from impact and moisture exposure, enable a device to be securely mounted on a base, and/or enable a device to be quickly secured and removed from a base.

22 Claims, 74 Drawing Sheets

Related U.S. Application Data application No. PCT/US2020/014675, filed on Jan. 22, 2020, and a continuation-in-part of application No. 16/749,973, filed on Jan. 22, 2020, now Pat. No. 10,966,331.

(60) Provisional application No. 62/877,270, filed on Jul. 22, 2019, provisional application No. 62/796,494, filed on Jan. 24, 2019, provisional application No. 62/795,539, filed on Jan. 22, 2019.

(51) Int. Cl.
*F16M 13/02* (2006.01)
*H04B 1/3888* (2015.01)
*F16B 1/00* (2006.01)
*H05K 5/02* (2006.01)

(52) U.S. Cl.
CPC ......... *H04B 1/3888* (2013.01); *H05K 5/0204* (2013.01); *H05K 5/0221* (2013.01); *A45C 2011/002* (2013.01); *A45C 2011/003* (2013.01)

(58) Field of Classification Search
CPC .... F16B 2/10; F16B 2/12; F16B 2/185; F16B 7/0493; F16B 1/02; F16B 2200/40; F16B 2200/403; F16B 2/18; F16B 5/121; F16B 5/126; H05K 5/0204; H05K 5/0221; H05K 5/0008; H05K 5/0086; H05K 5/069; H05K 7/1474; B25B 1/103; B25B 1/22; B25B 1/125; B25B 1/2405; B25B 13/12; B25B 13/14; B25B 1/08; B25B 5/068; E05Y 2600/502
See application file for complete search history.

(56) References Cited

U.S. PATENT DOCUMENTS

| | | | |
|---|---|---|---|
| 2002/0061225 A1 | 5/2002 | Boucher et al. | |
| 2002/0101083 A1* | 8/2002 | Toledano | E05B 63/20 292/332 |
| 2003/0075930 A1* | 4/2003 | Mak | E05B 63/06 292/1.5 |
| 2003/0090048 A1 | 5/2003 | Varzino et al. | |
| 2004/0118886 A1 | 6/2004 | Mirshafiee et al. | |
| 2004/0169378 A1* | 9/2004 | Hodgin | E05B 63/044 292/244 |
| 2005/0120630 A1* | 6/2005 | Sanders | E06B 7/215 49/365 |
| 2006/0120040 A1 | 6/2006 | Chen | |
| 2006/0186673 A1* | 8/2006 | Wong | E05B 47/026 292/175 |
| 2006/0255220 A1 | 11/2006 | Skripps | |
| 2006/0255596 A1* | 11/2006 | Yong | E05C 1/14 292/173 |
| 2008/0087055 A1* | 4/2008 | Chen | E05B 63/16 70/107 |
| 2010/0181454 A1 | 7/2010 | Vogt | |
| 2012/0296335 A1 | 11/2012 | Mullaney | |
| 2013/0038073 A1* | 2/2013 | Bui | E05B 63/06 292/169.23 |
| 2013/0182381 A1* | 7/2013 | Gray | A61M 5/1415 361/679.01 |
| 2014/0007408 A1* | 1/2014 | Nool | A61M 5/1418 29/525.01 |
| 2014/0021667 A1 | 1/2014 | Wang | |
| 2014/0217750 A1* | 8/2014 | Lin | E05C 7/045 292/156 |
| 2015/0300386 A1* | 10/2015 | Fong | F16M 11/041 24/505 |
| 2015/0369564 A1 | 12/2015 | Wilson | |
| 2016/0136028 A1* | 5/2016 | Koch | F16M 13/022 5/503.1 |
| 2016/0281920 A1 | 9/2016 | Perez et al. | |
| 2017/0008155 A1 | 1/2017 | Hanlon et al. | |
| 2017/0224569 A1* | 8/2017 | Pfeuffer | B25B 5/08 |
| 2017/0306654 A1* | 10/2017 | Maeng | E05B 55/00 |
| 2017/0314304 A1* | 11/2017 | Nguyen | E05B 13/002 |
| 2017/0326015 A1 | 11/2017 | Katzenstein | |
| 2018/0080605 A1* | 3/2018 | Janway | F16M 13/022 |
| 2018/0203331 A1 | 7/2018 | Johnson et al. | |
| 2018/0245883 A1 | 8/2018 | Silvennoinen | |
| 2018/0320414 A1* | 11/2018 | Piantek | E05B 63/202 |
| 2018/0328076 A1* | 11/2018 | Romero | E05C 5/00 |
| 2019/0226235 A1* | 7/2019 | Xiao | E05B 15/102 |
| 2019/0339037 A1 | 11/2019 | Burton | |
| 2019/0350093 A1 | 11/2019 | Lin et al. | |
| 2020/0003359 A1 | 1/2020 | Vlaar | |
| 2020/0056403 A1* | 2/2020 | Wong | E05B 15/022 |

OTHER PUBLICATIONS

WIPO, "PCT Form ISA237, Written Opinion for International Patent Application Serial No. PCT/US2020/014675, pp. 6 (dated Apr. 9, 2020)."
U.S. Appl. No. 16/749,973, filed Jan. 22, 2020, US 2020/0236799, U.S. Pat. No. 10,966,331.
U.S. Appl. No. 17/154,971, filed Jan. 21, 2021.
U.S. Appl. No. 17/183,137, filed Feb. 23, 2021.
WIPO, PCT Form ISA210, International Search Report for International Patent Application Serial No. PCT/US2020/014675, pp. 4 (dated May 13, 2021).
WIPO, PCT Form ISA237, Written Opinion for International Patent Application Serial No. PCT/US2020/014875, pp. 18 (dated May 13, 2021).

* cited by examiner

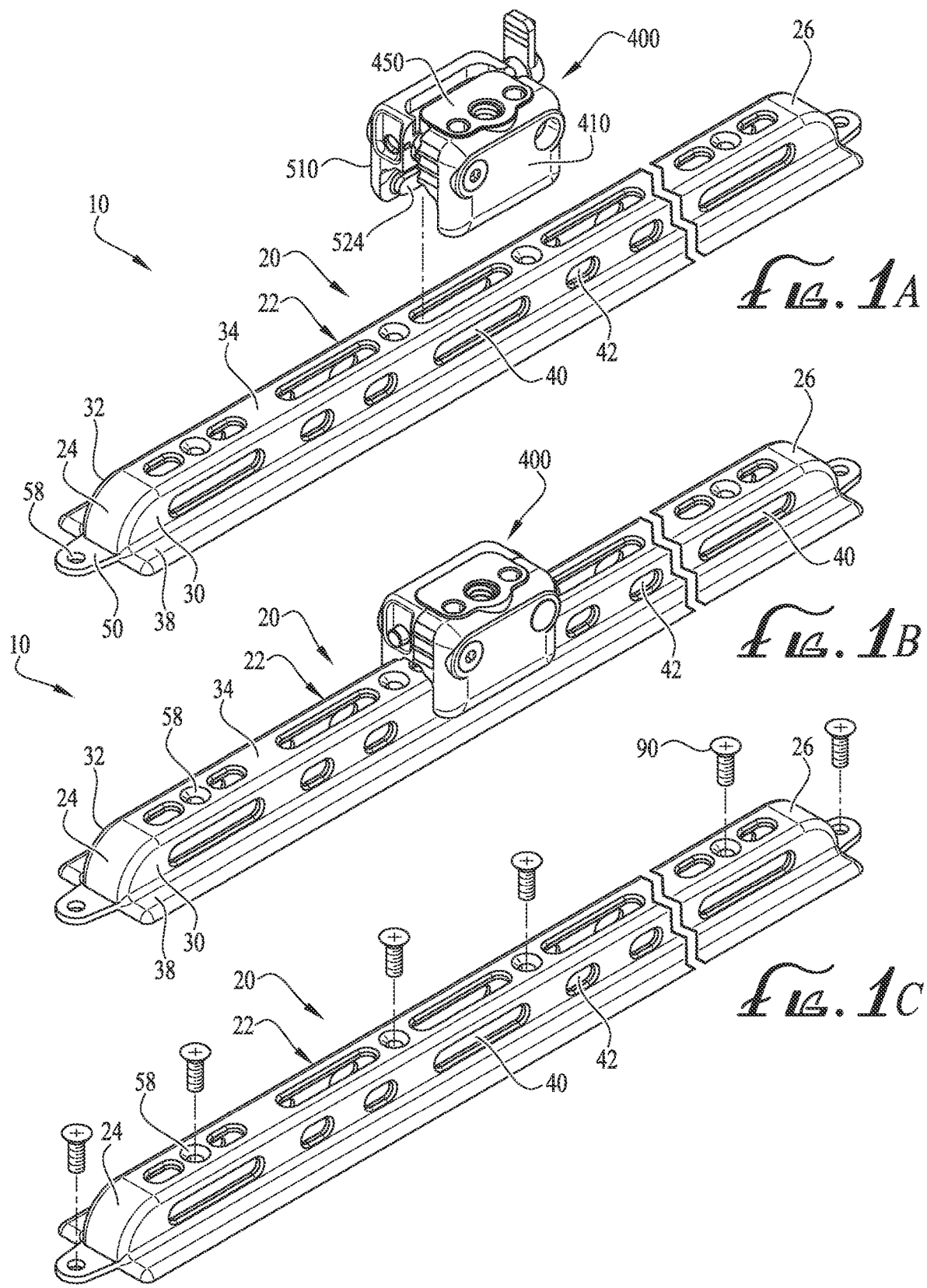

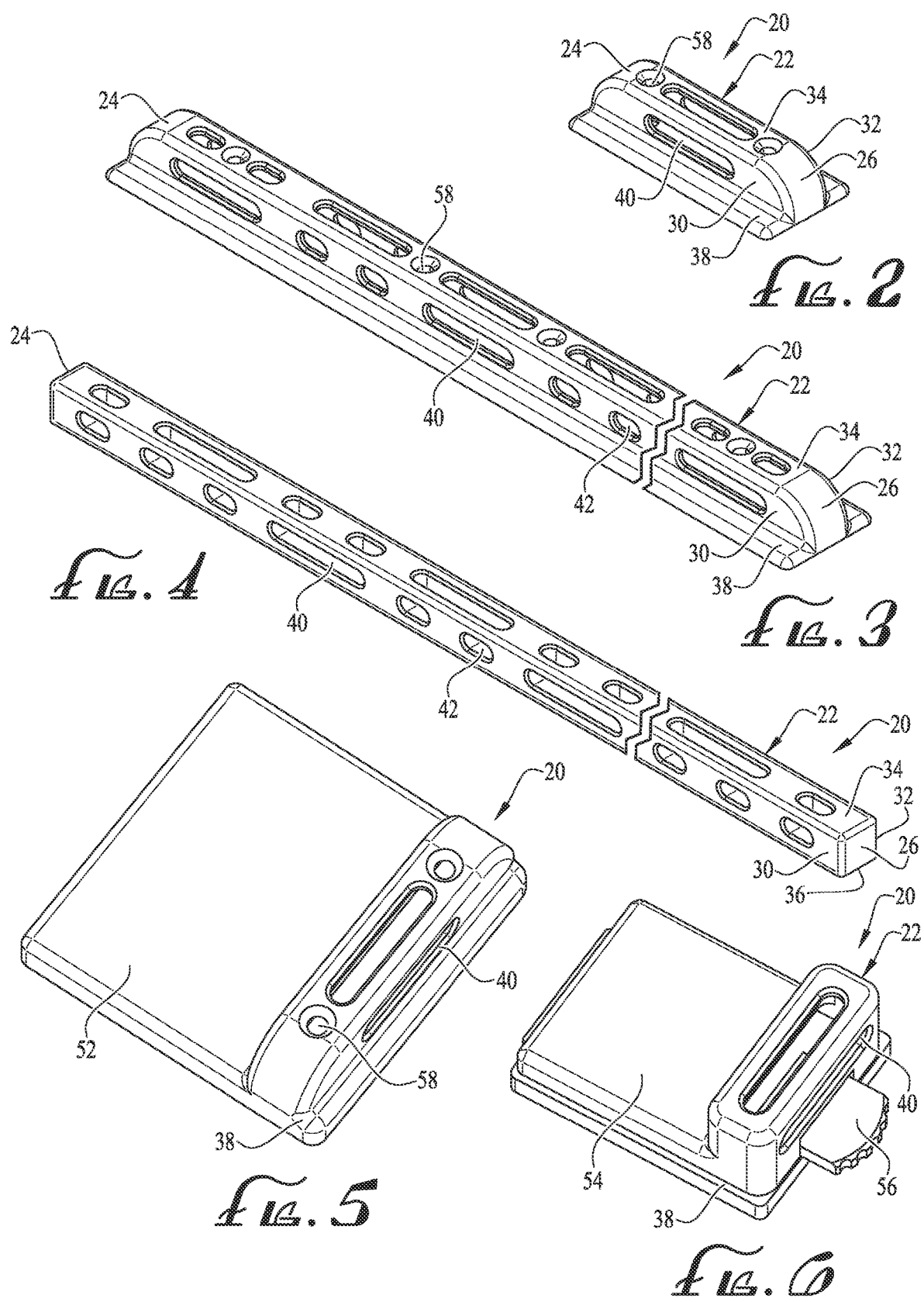

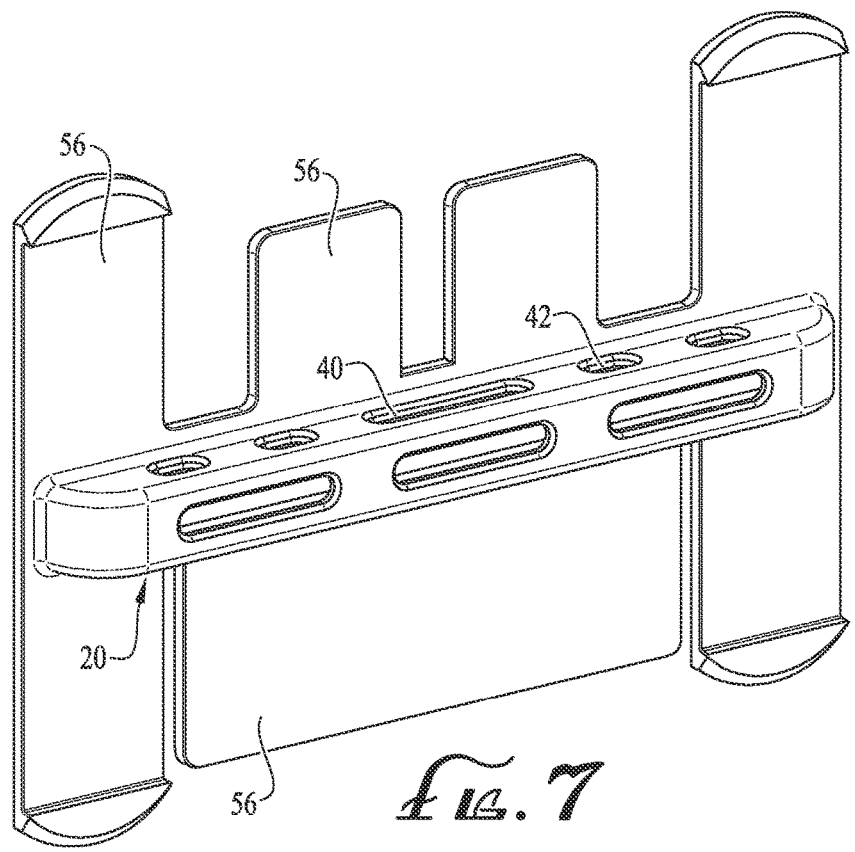
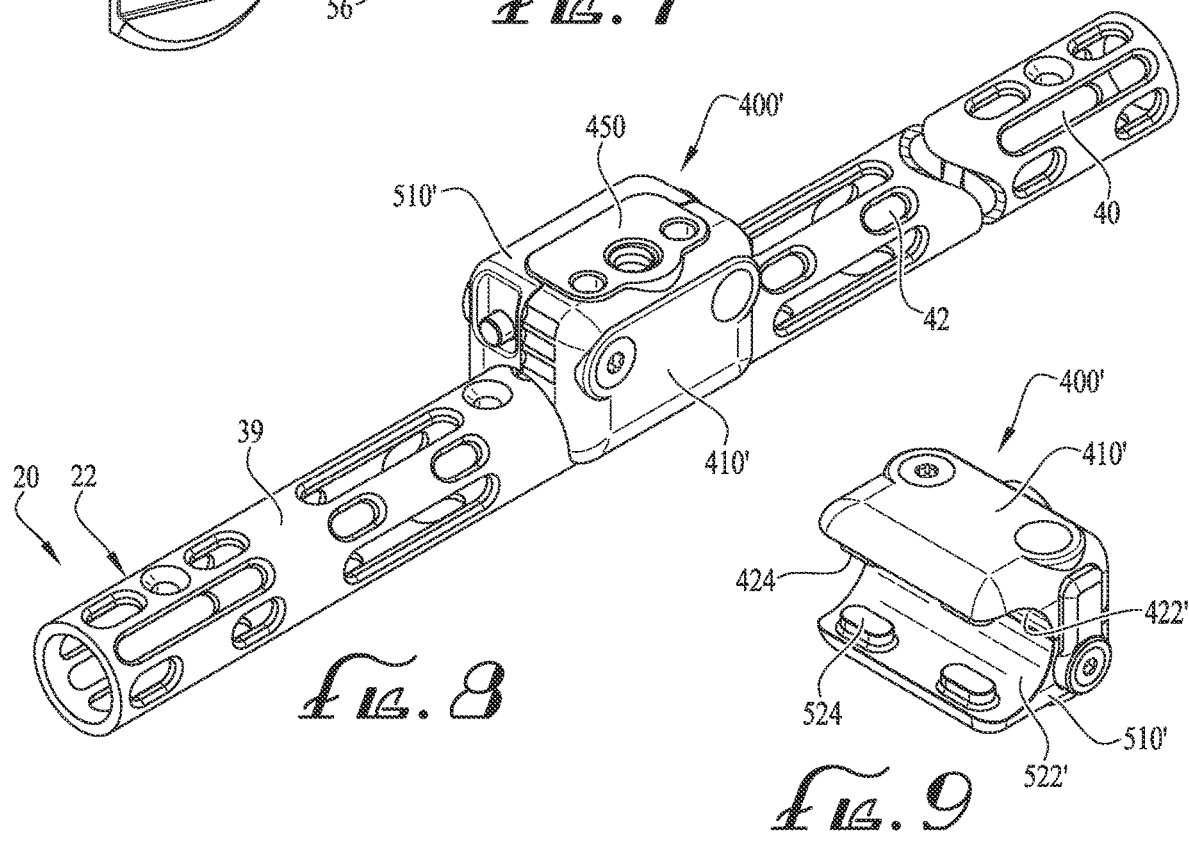

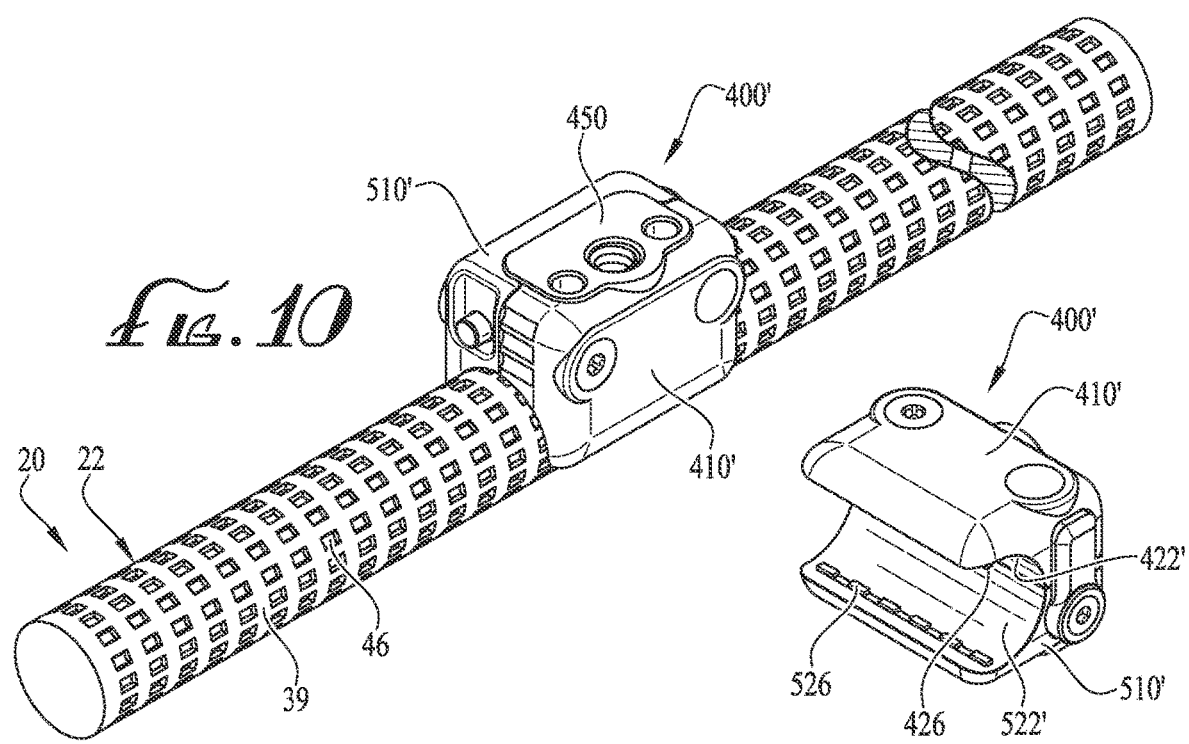
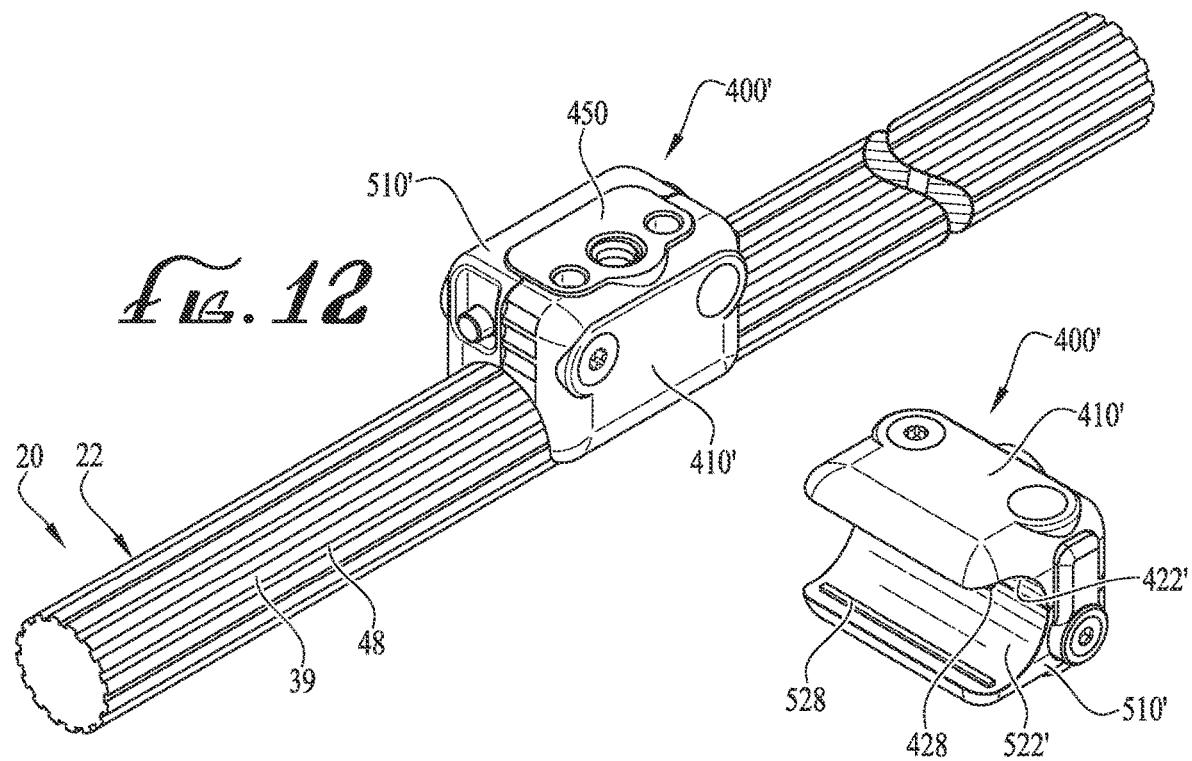

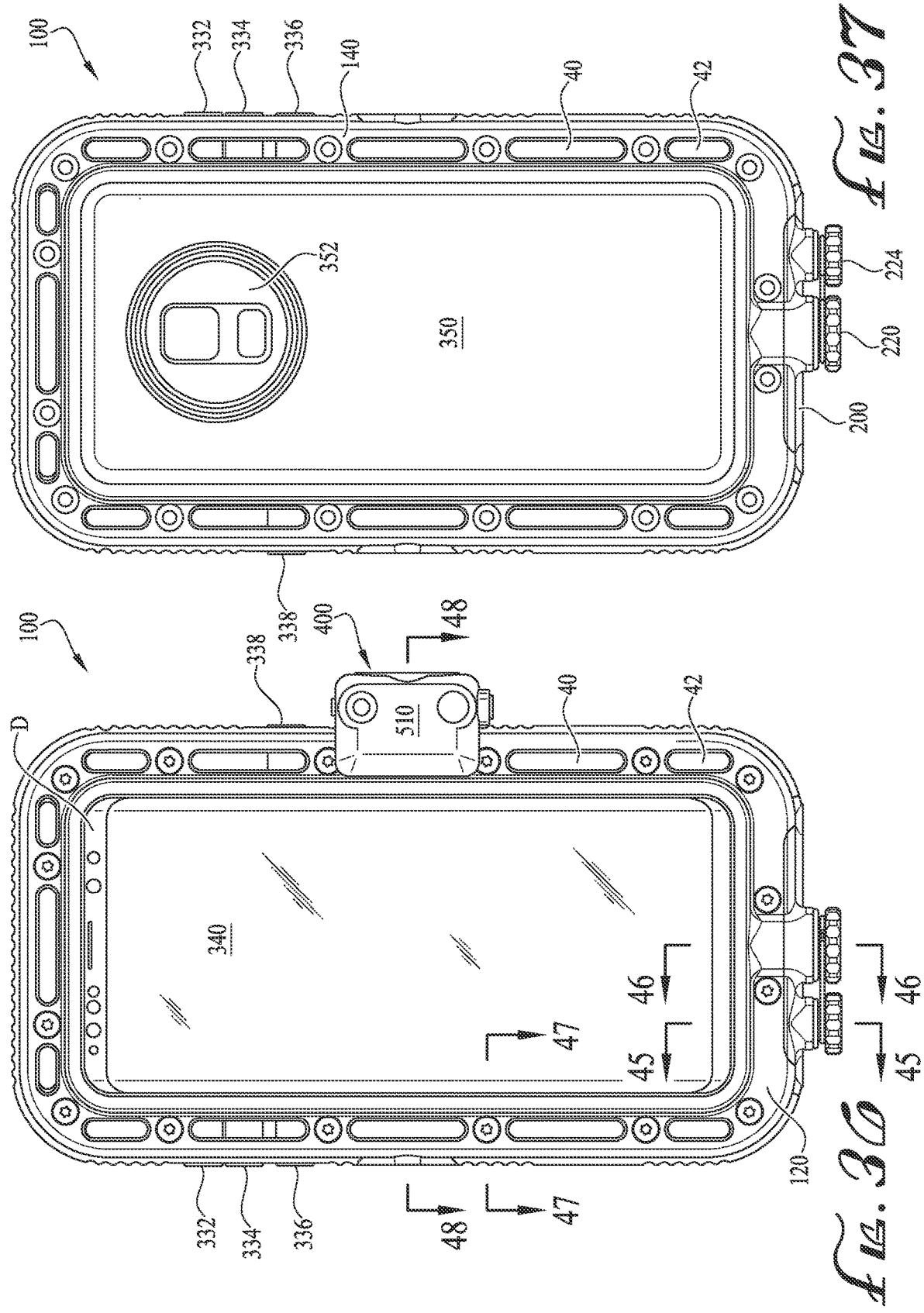

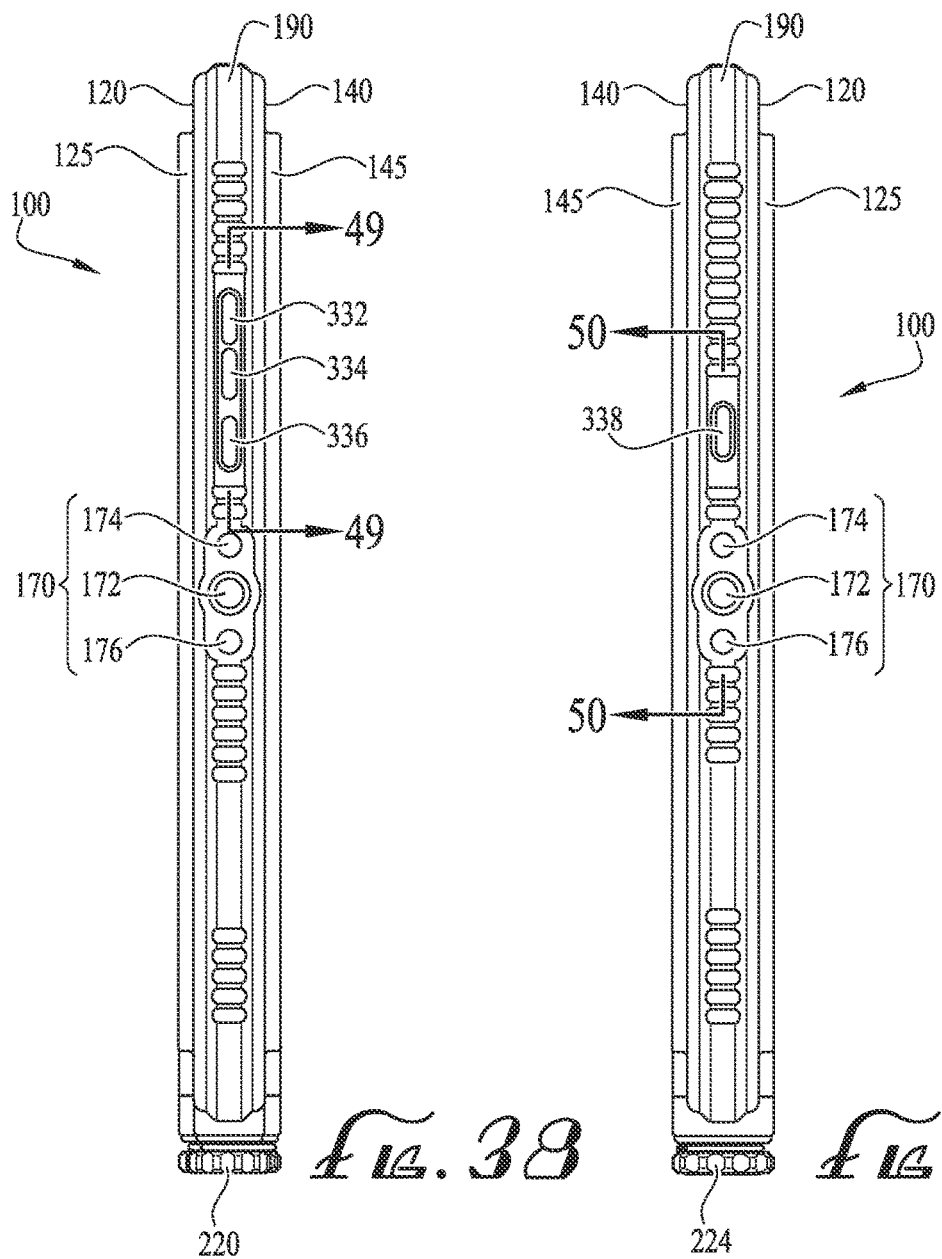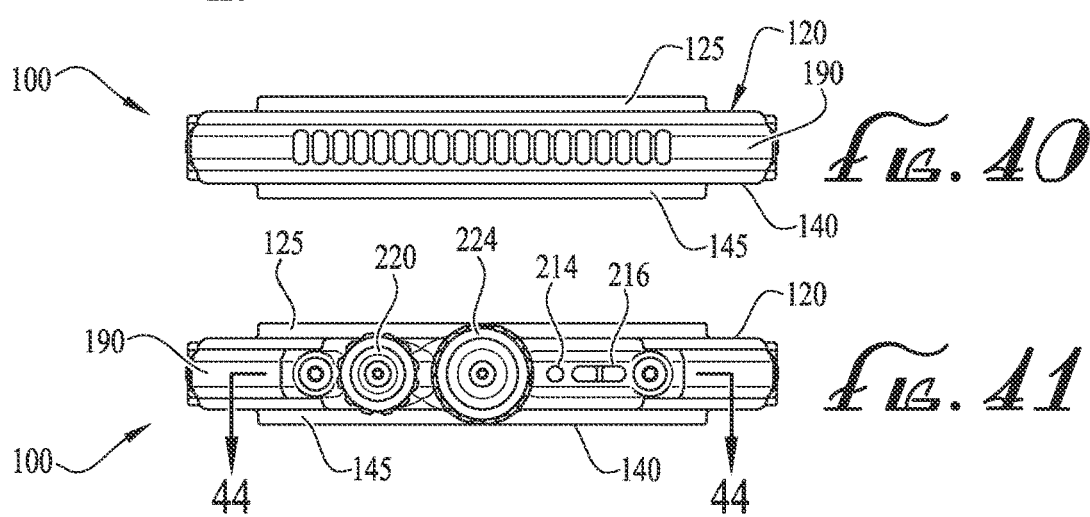

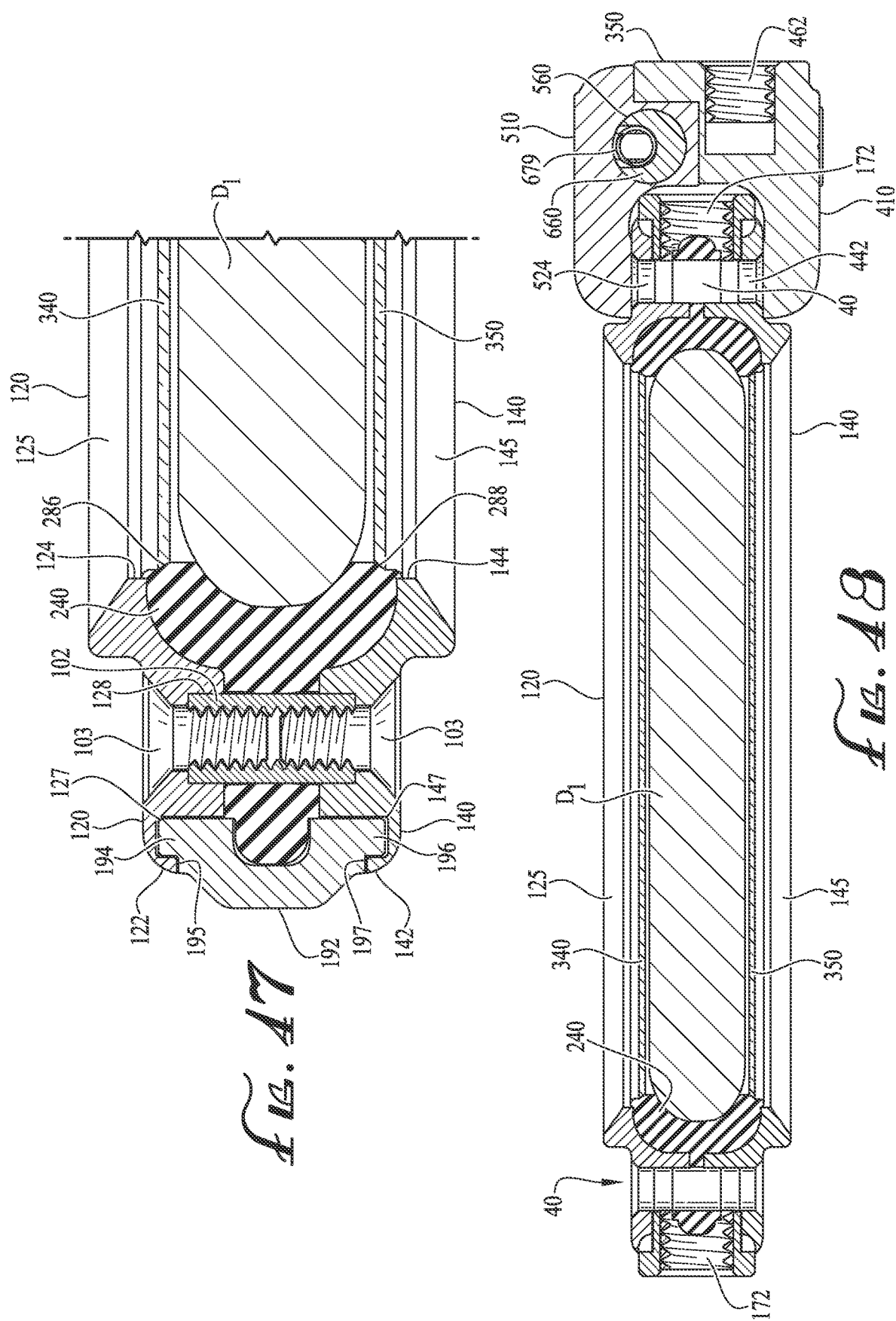

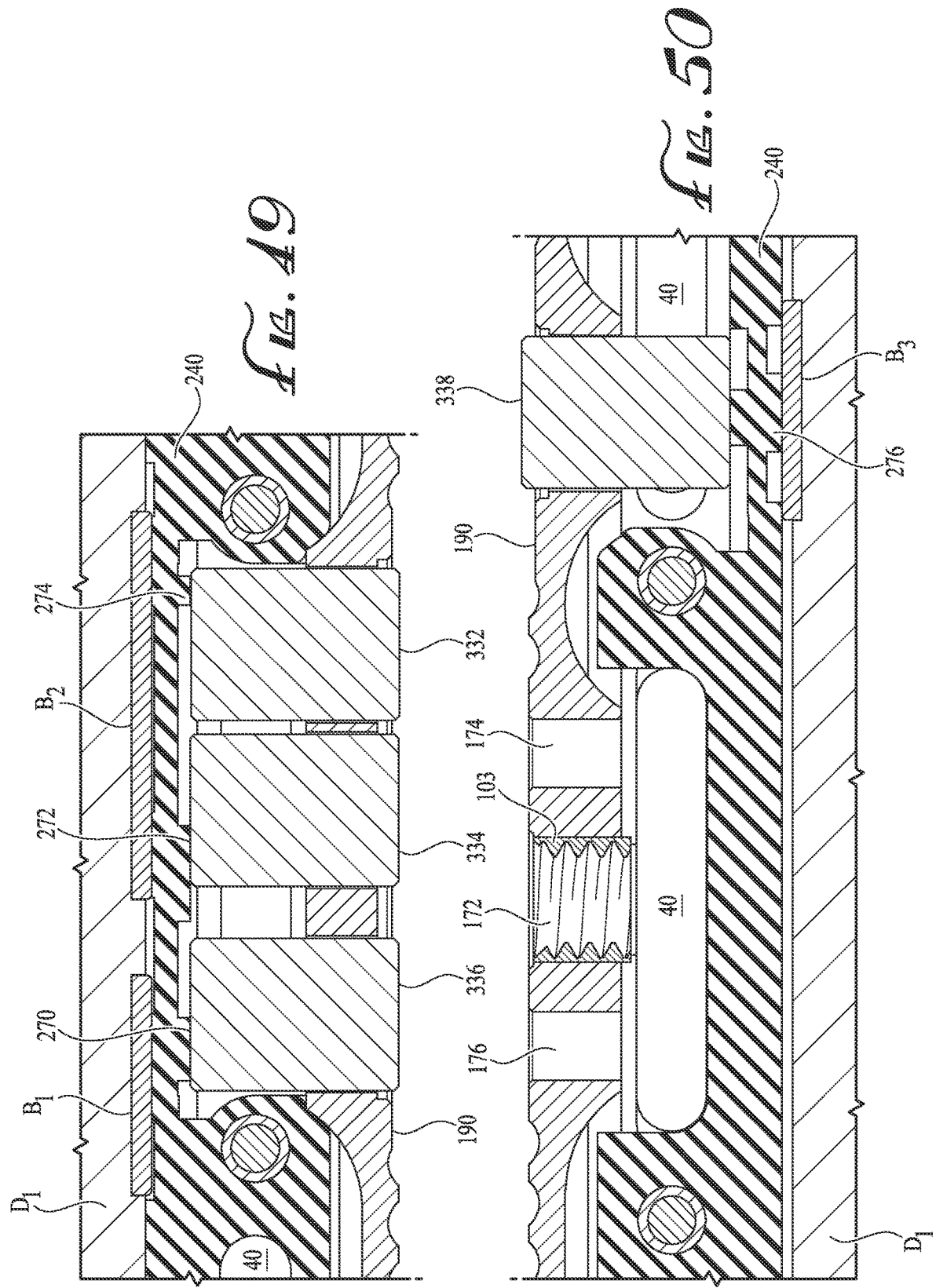

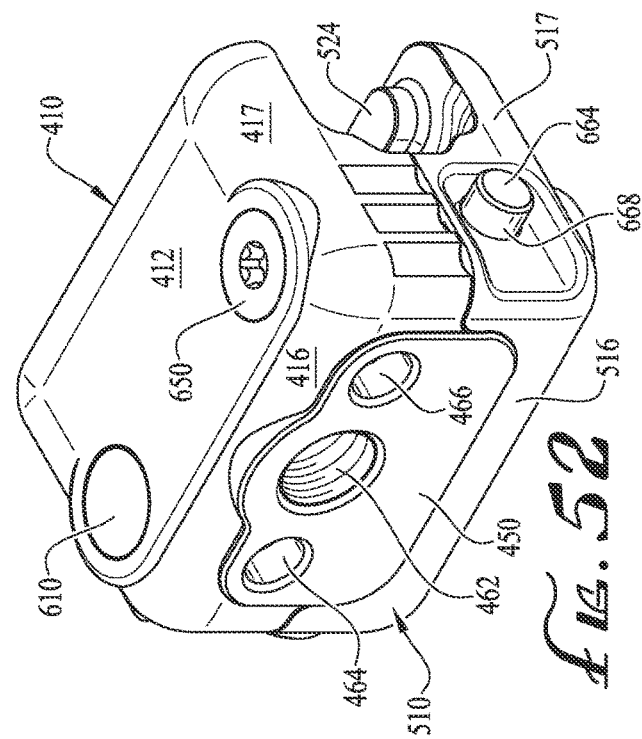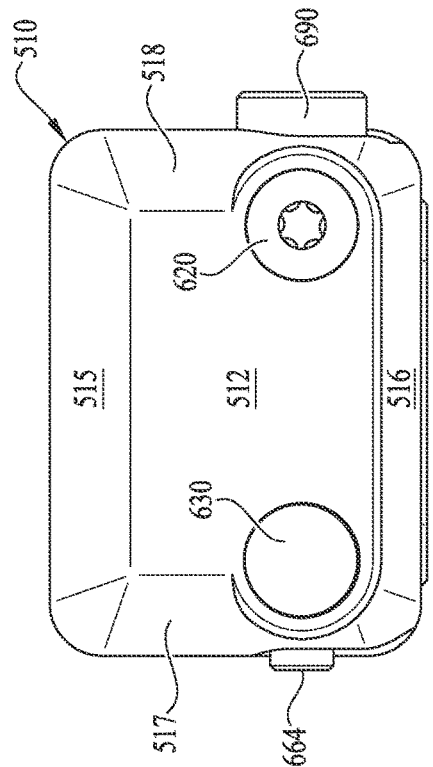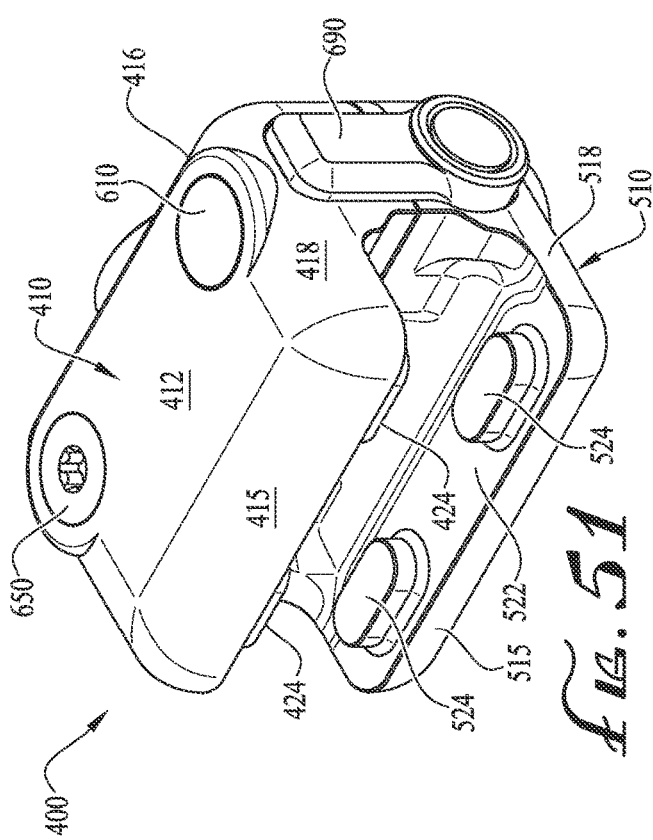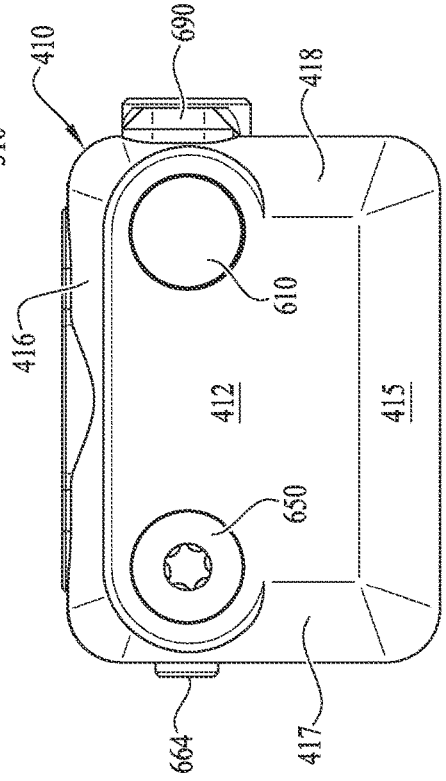

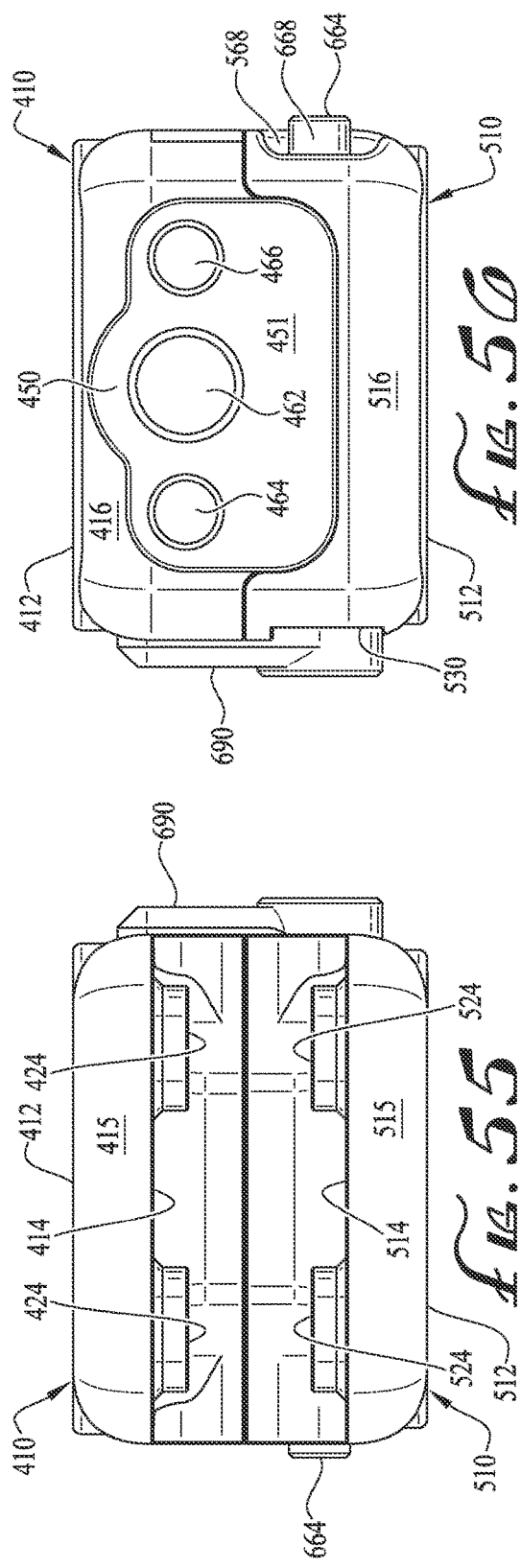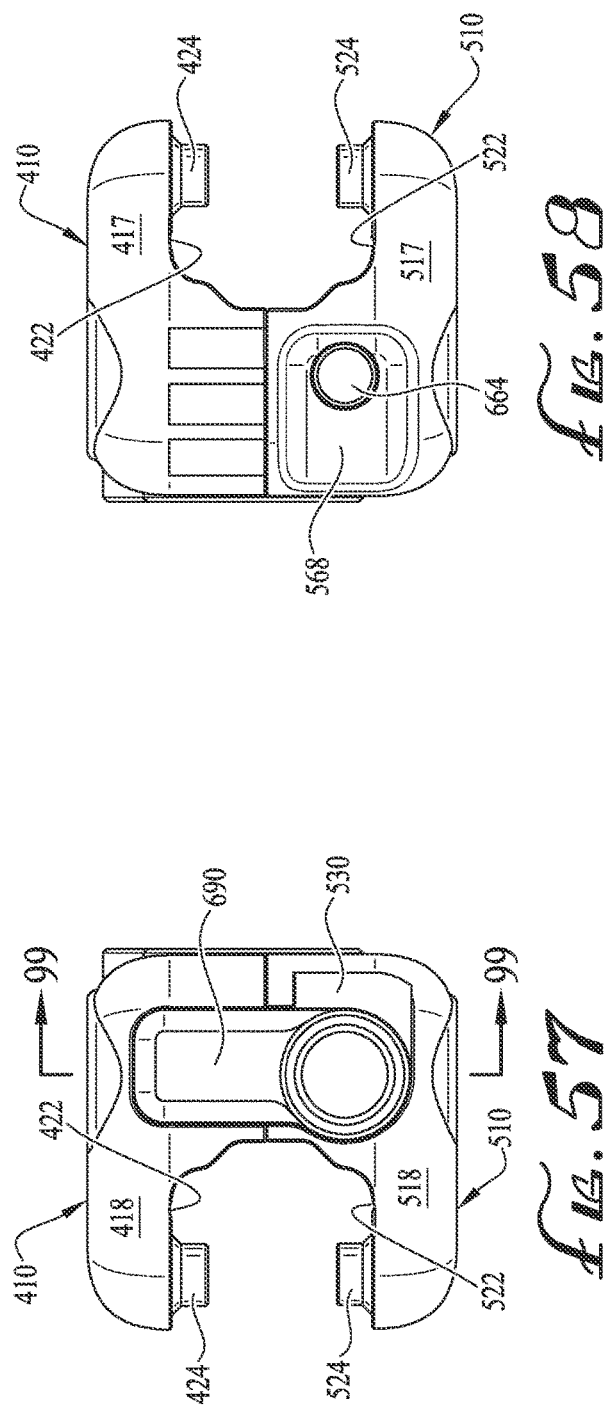

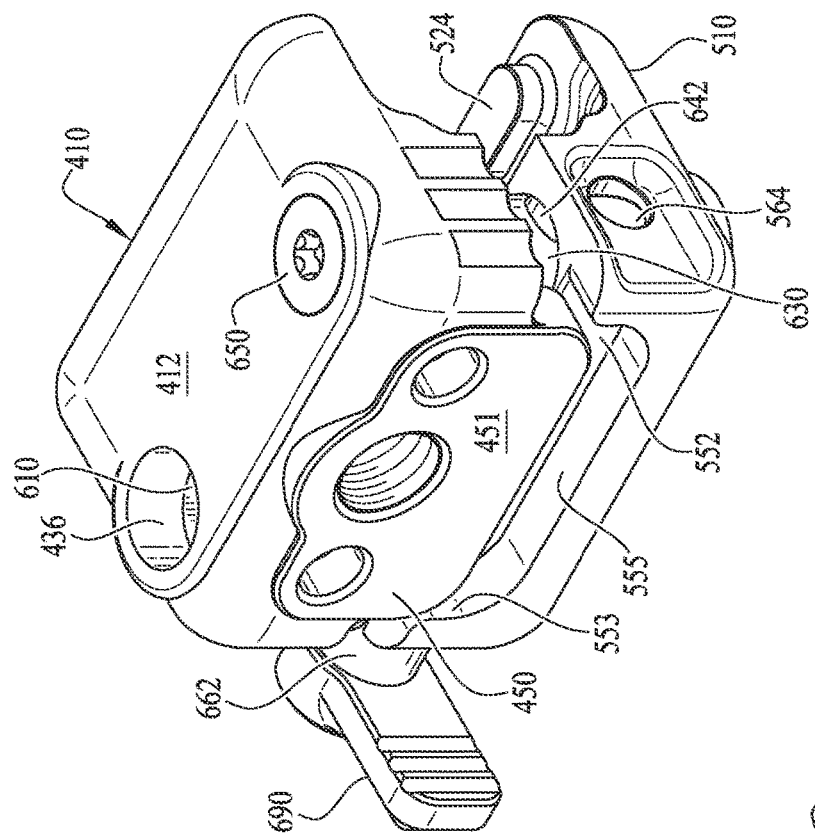
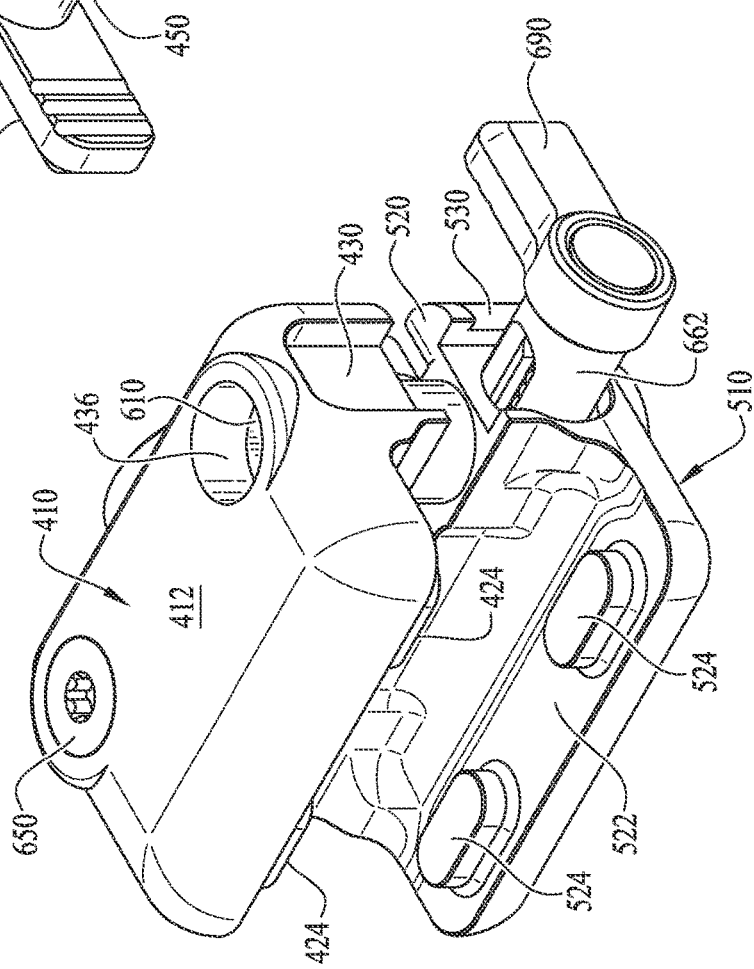

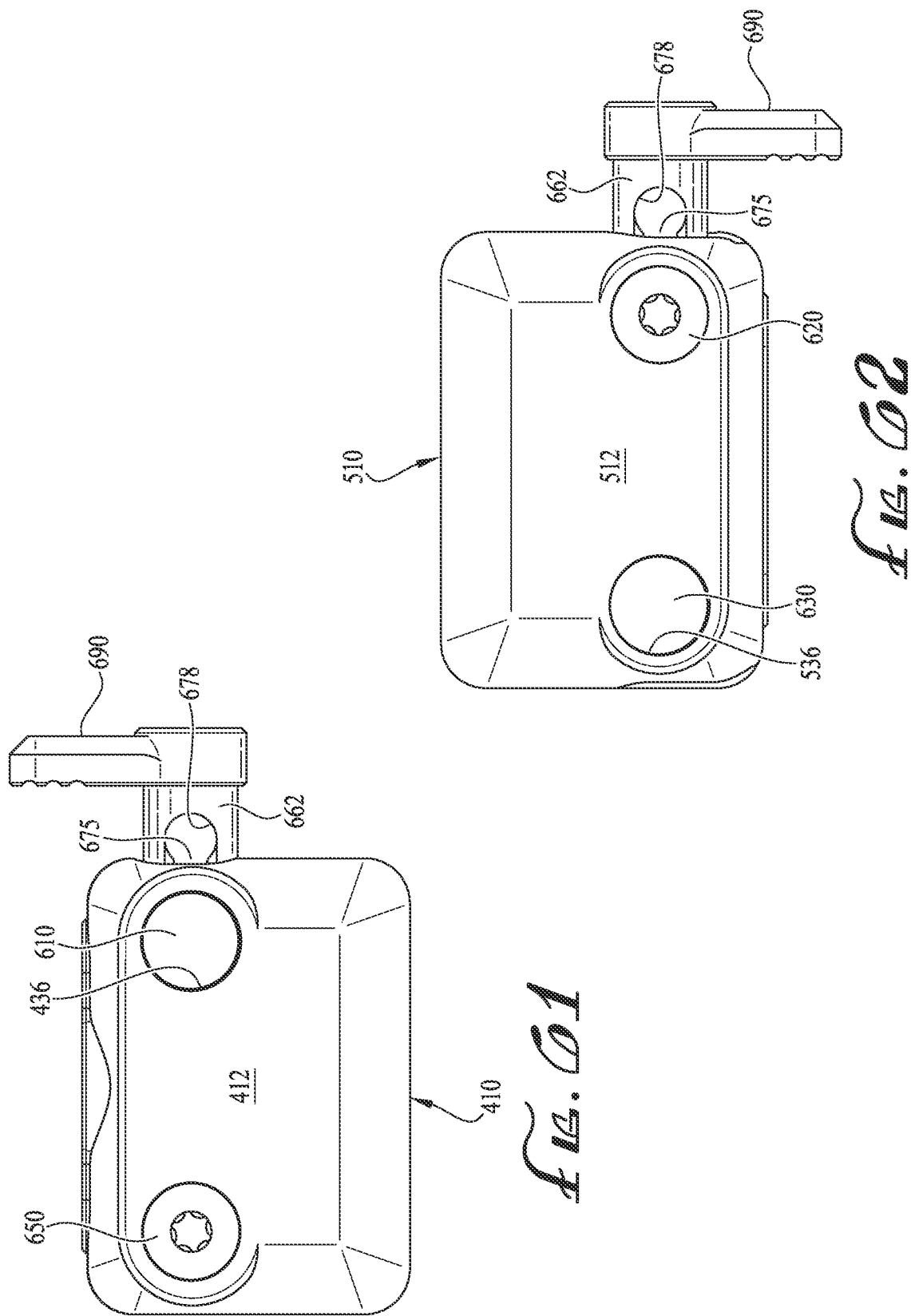

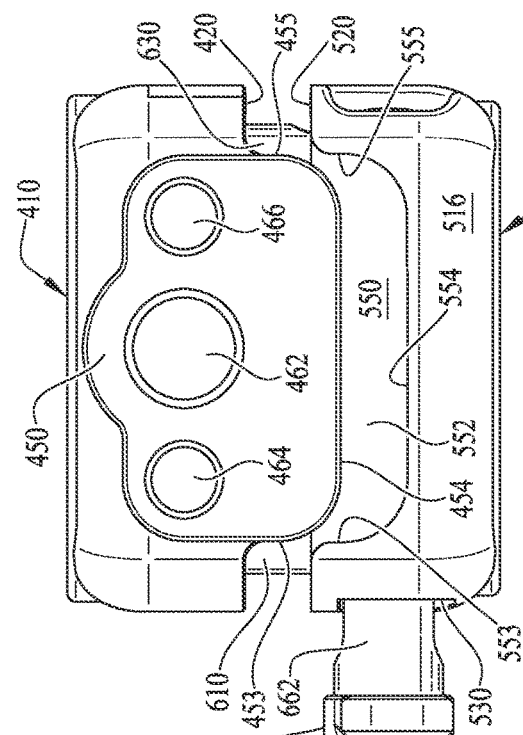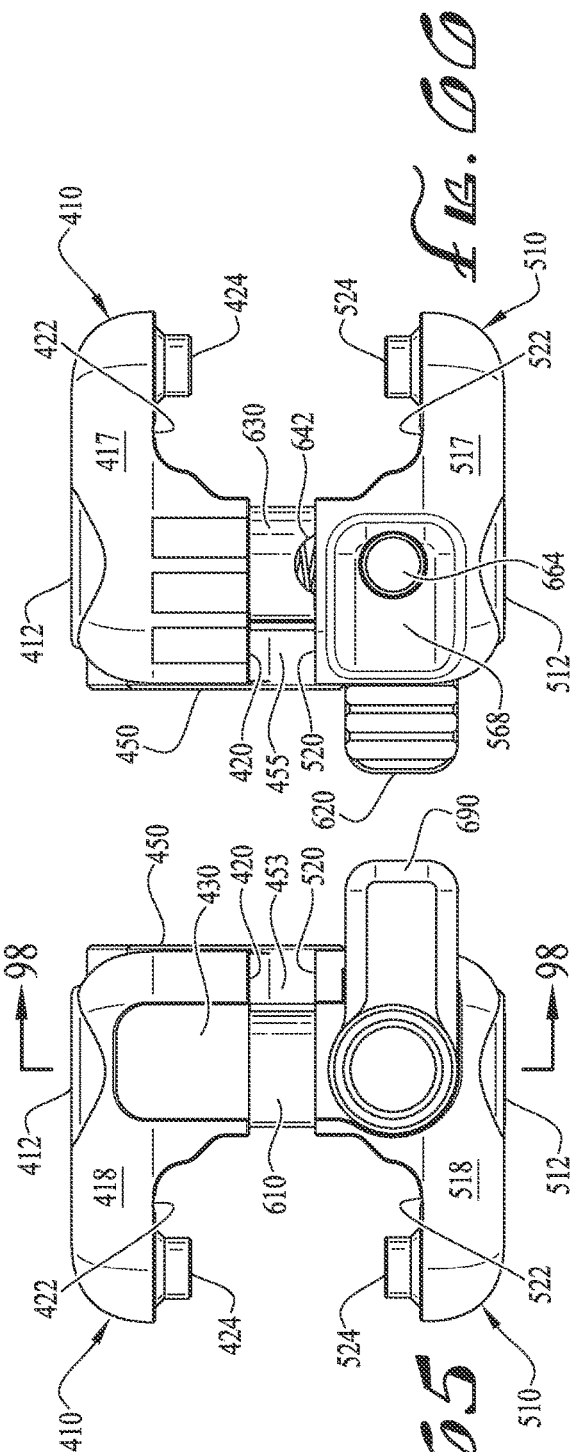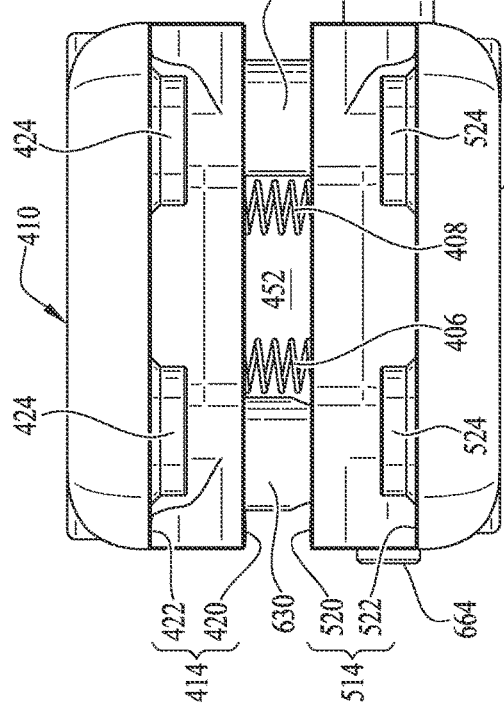

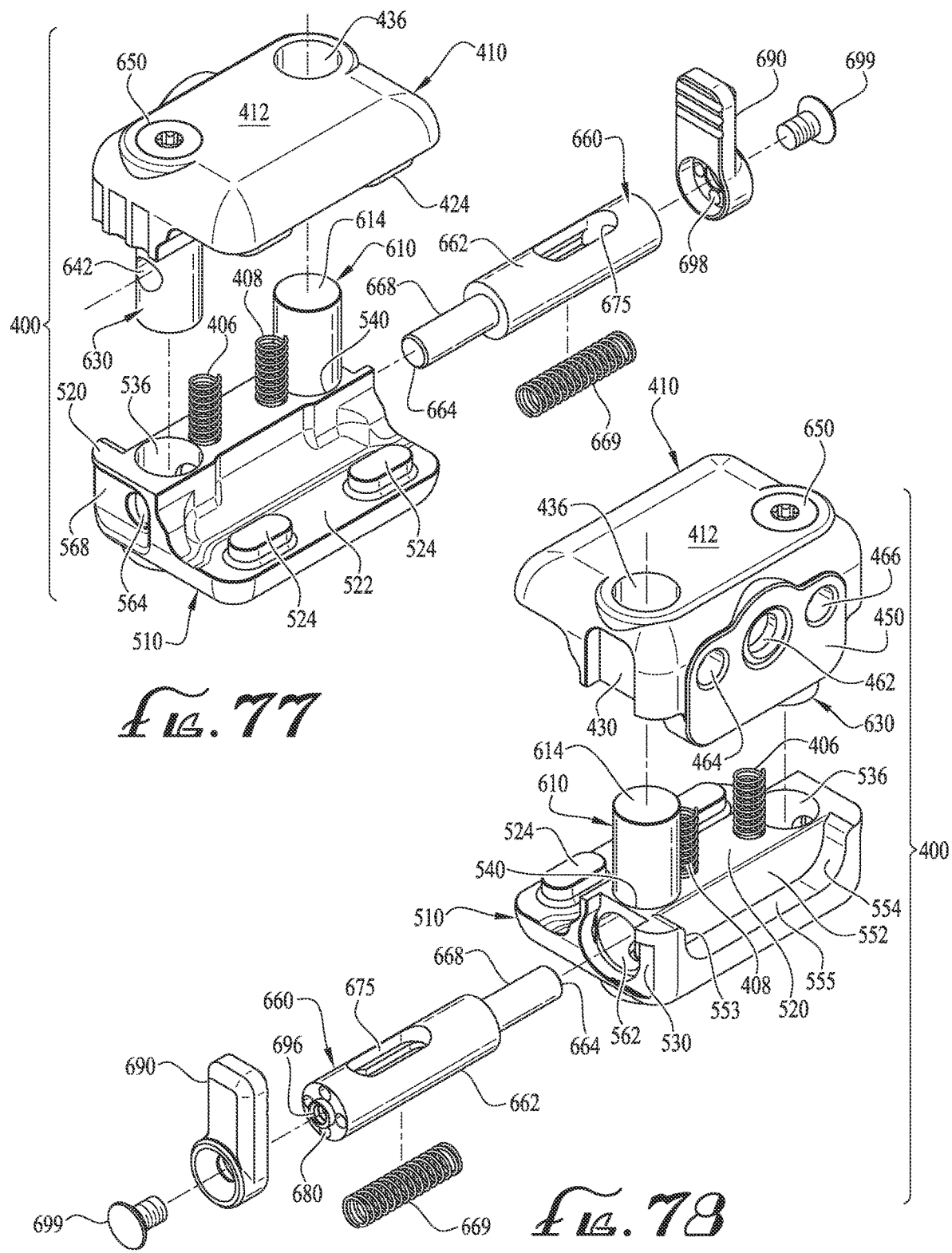

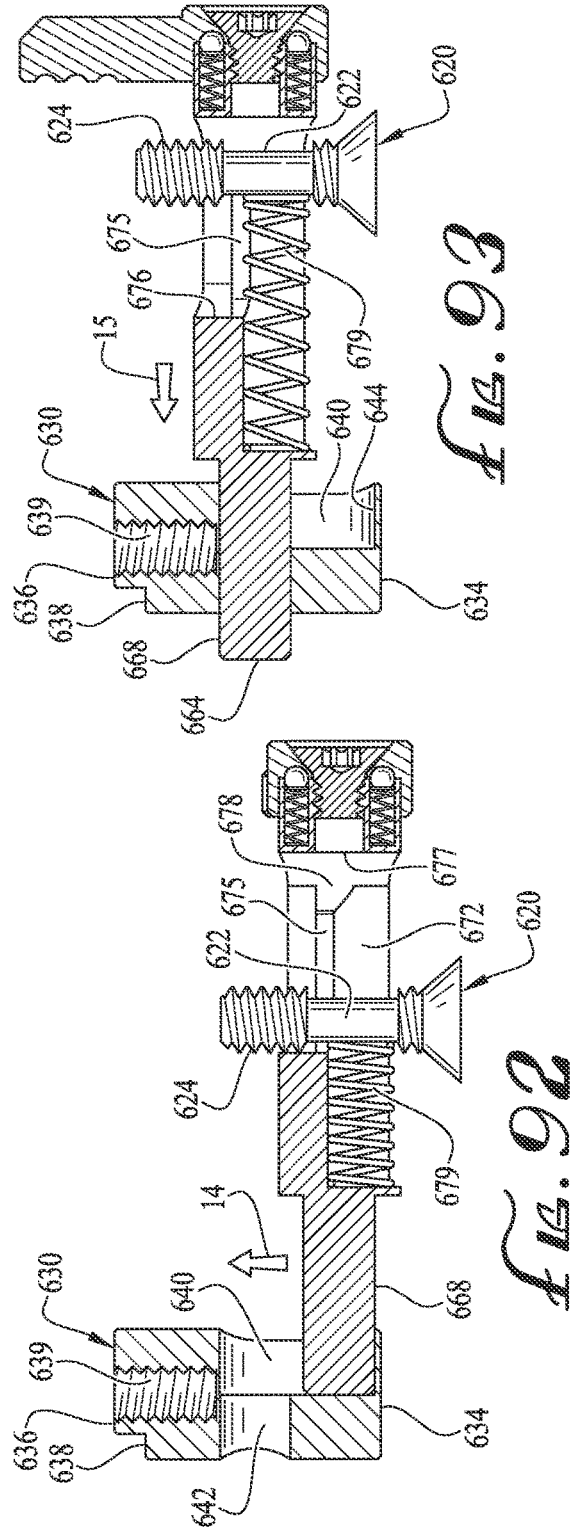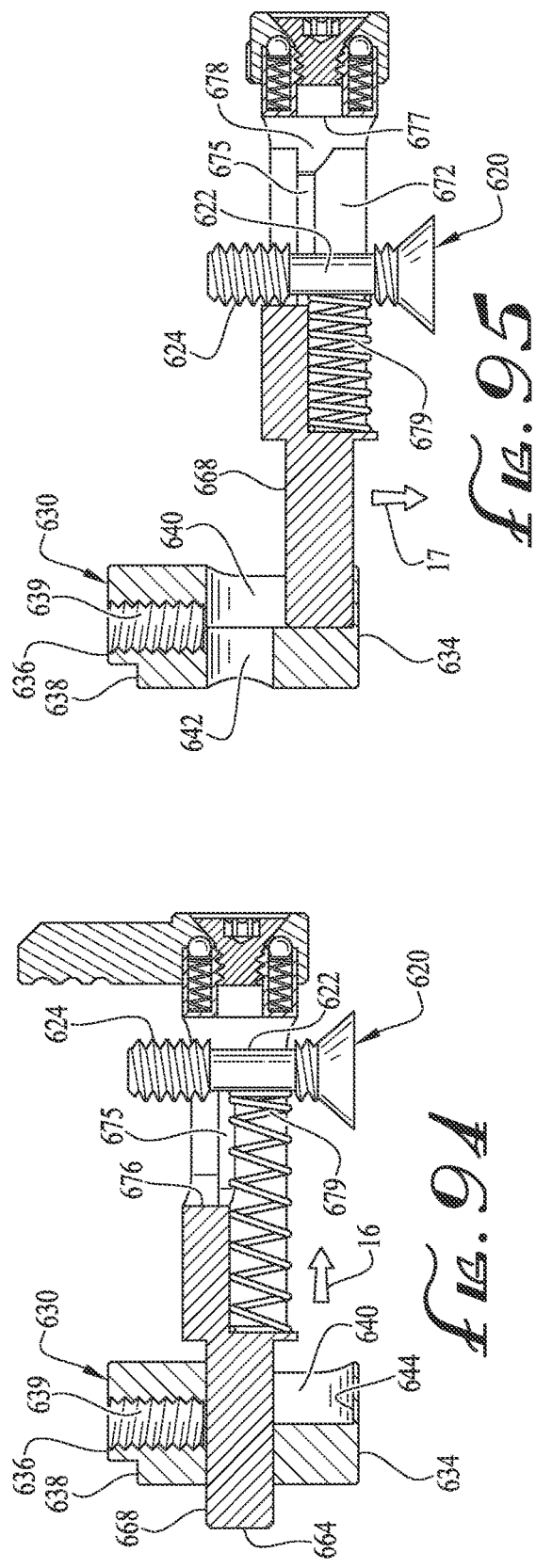

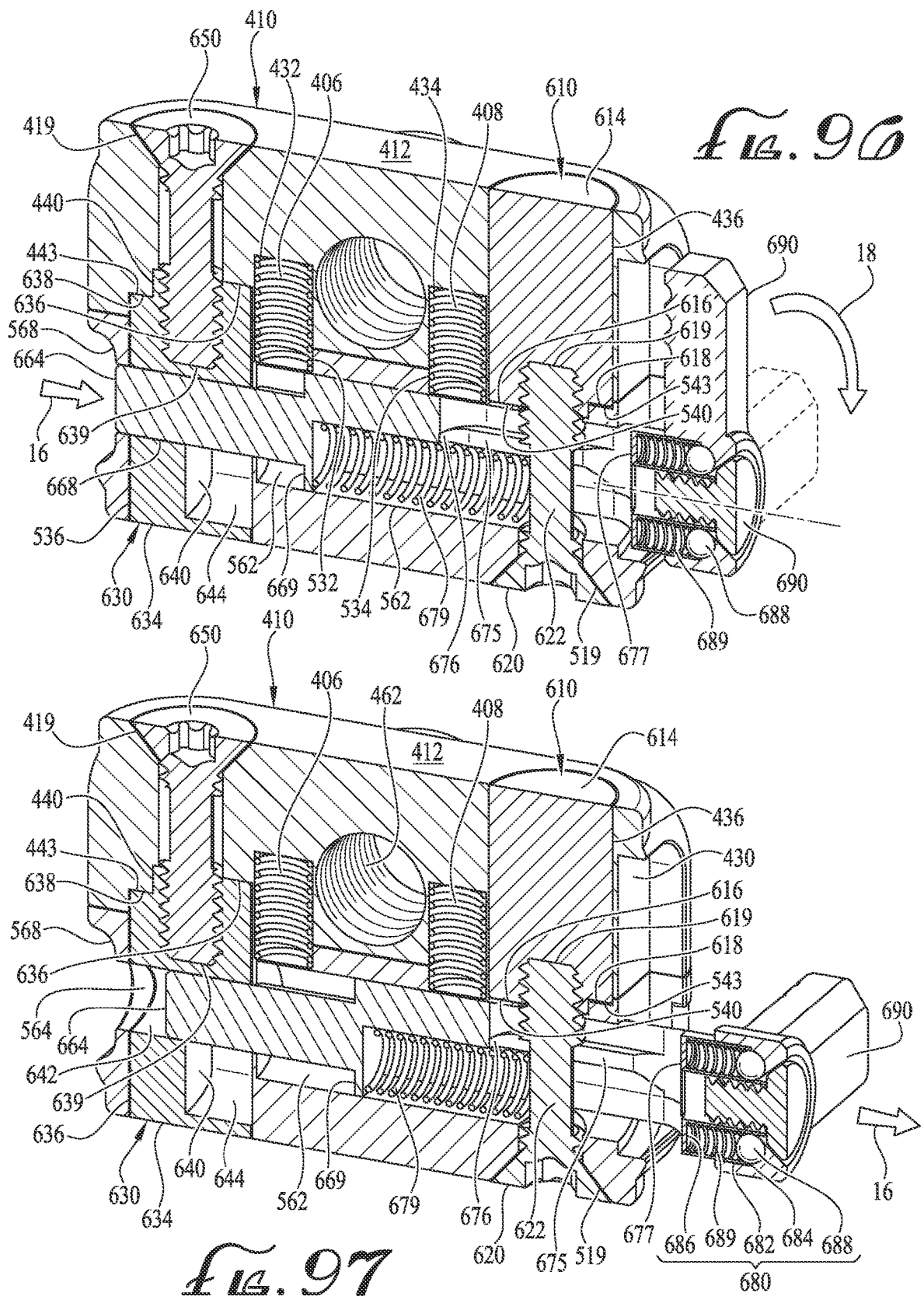

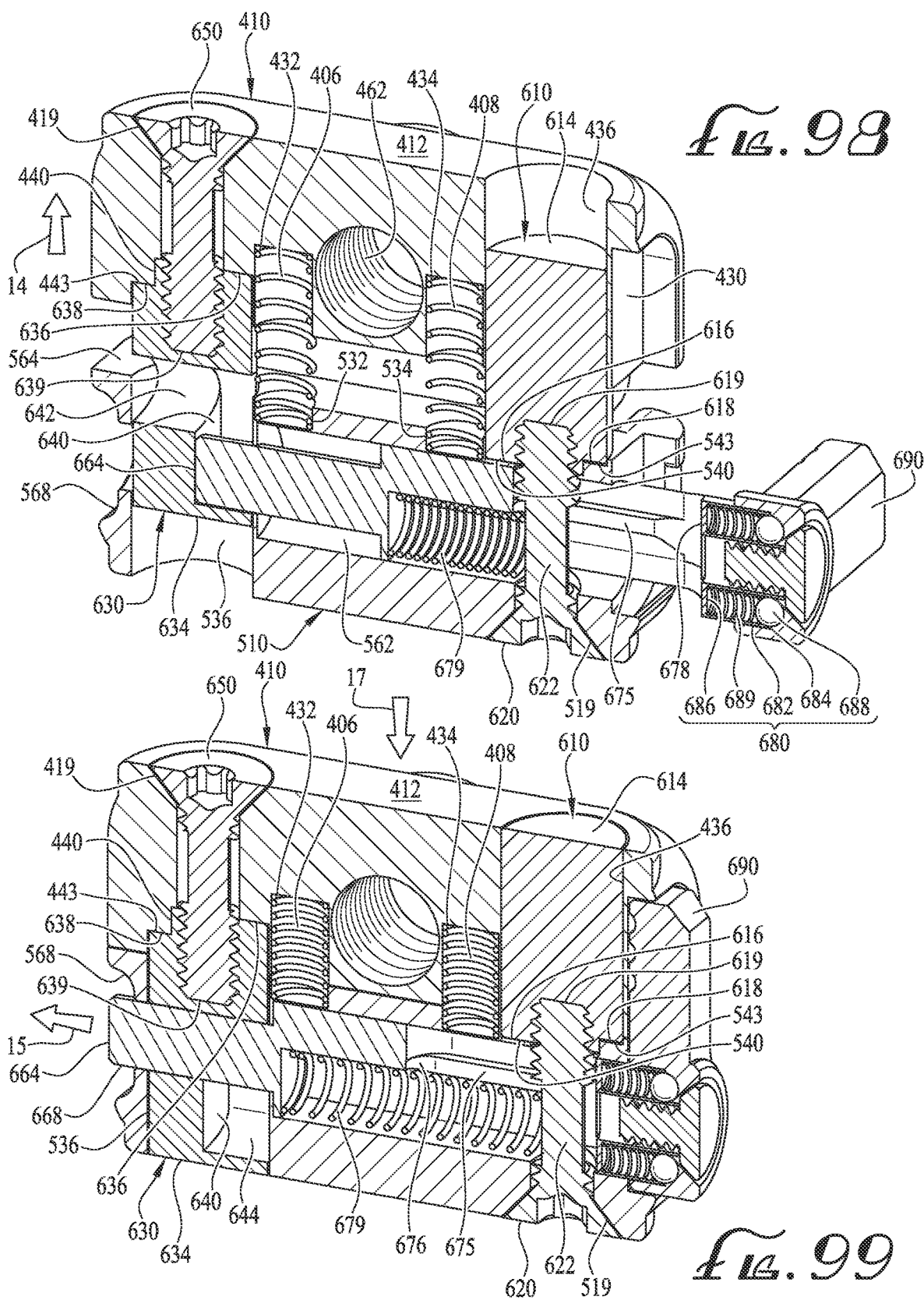

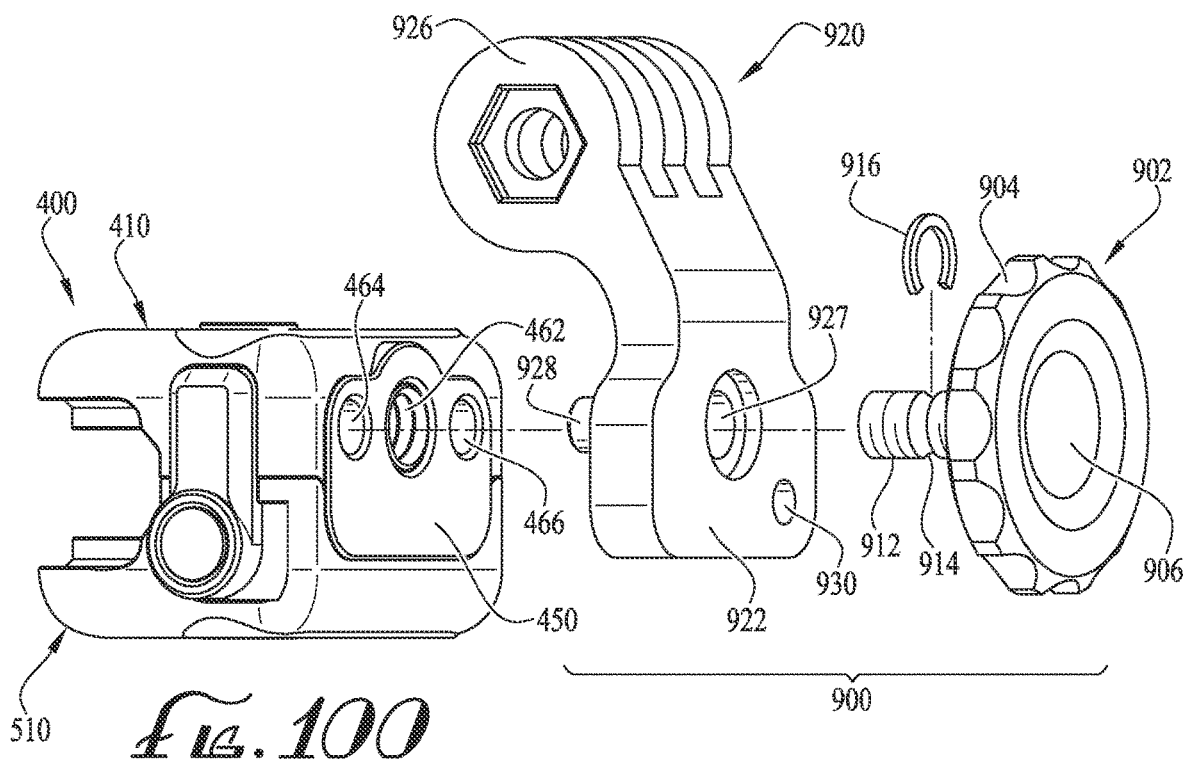
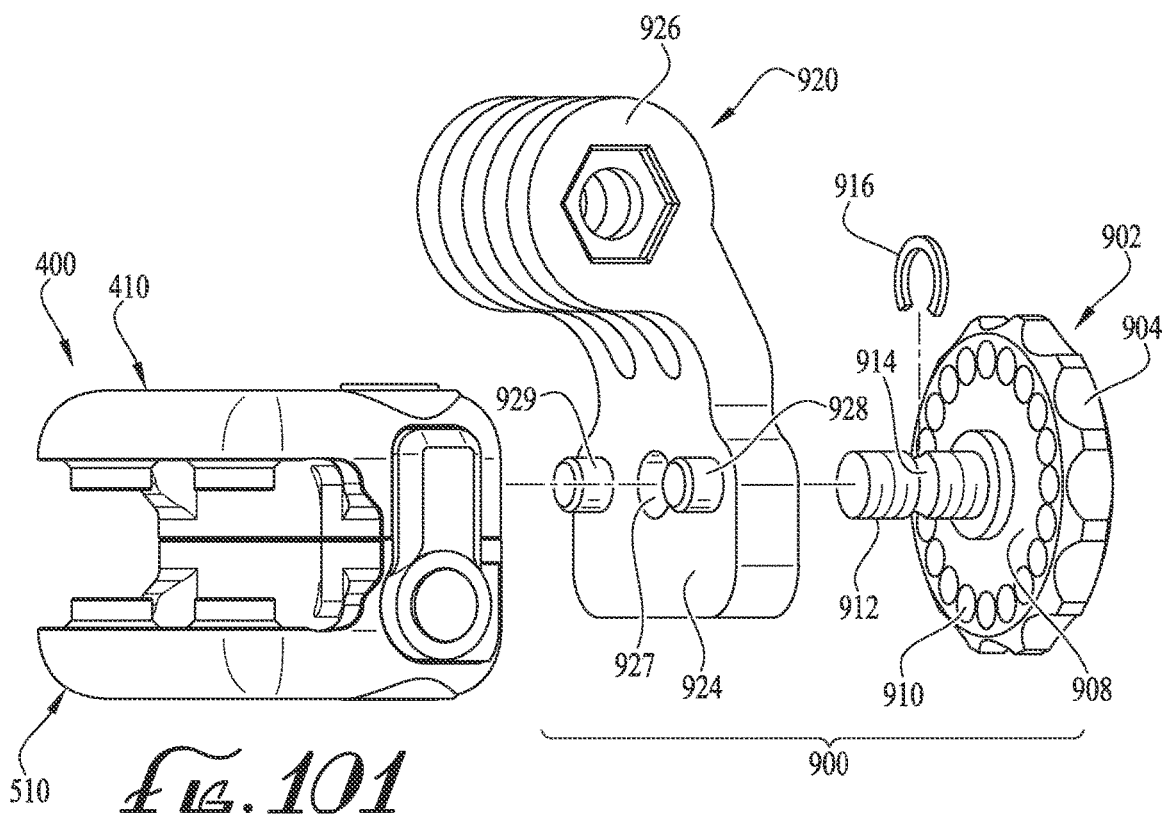

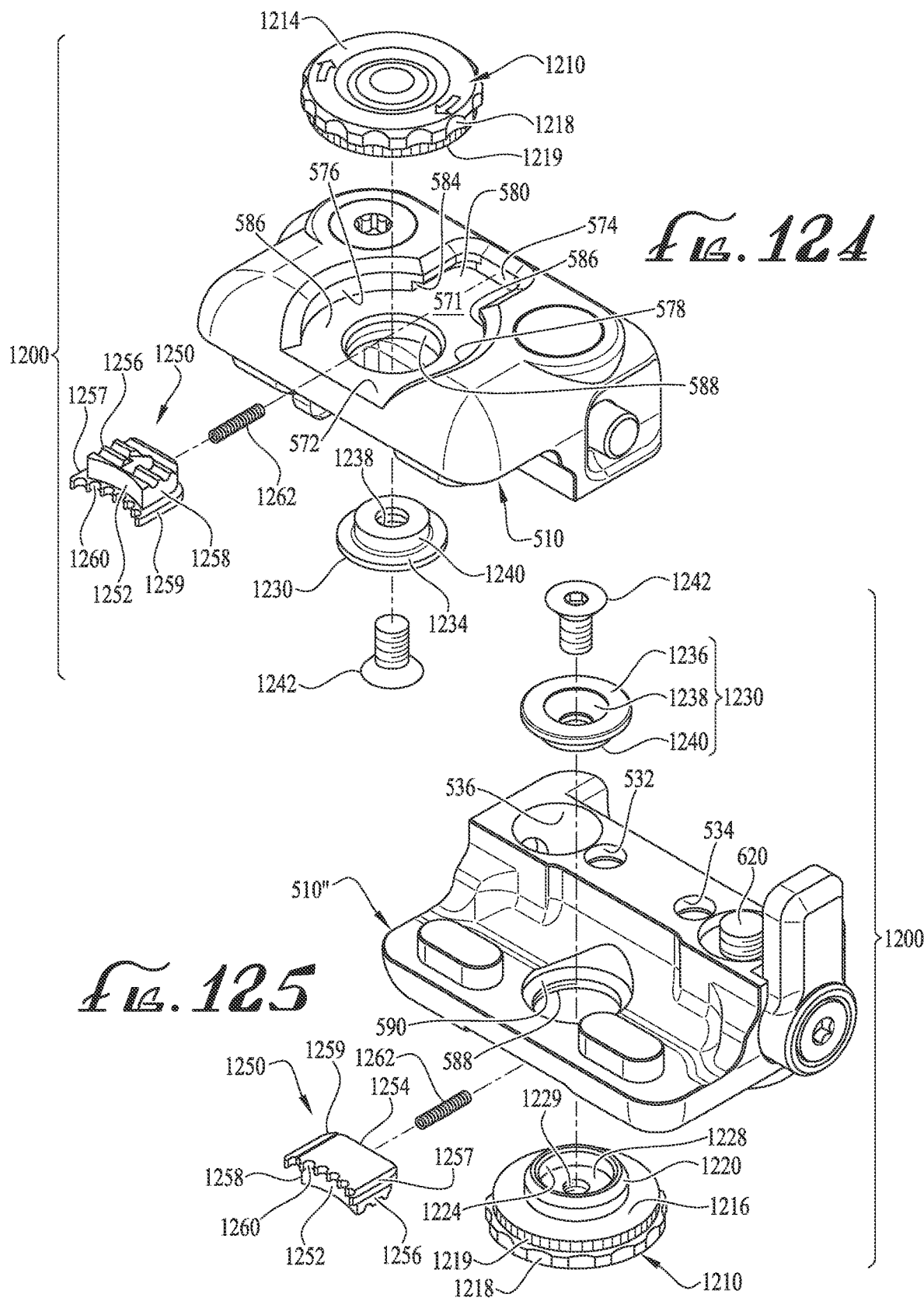

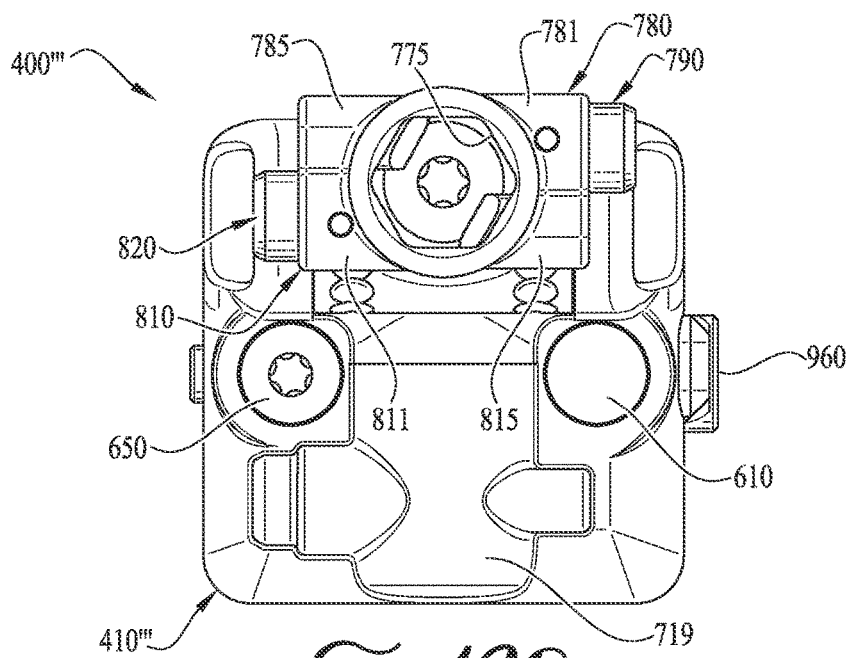
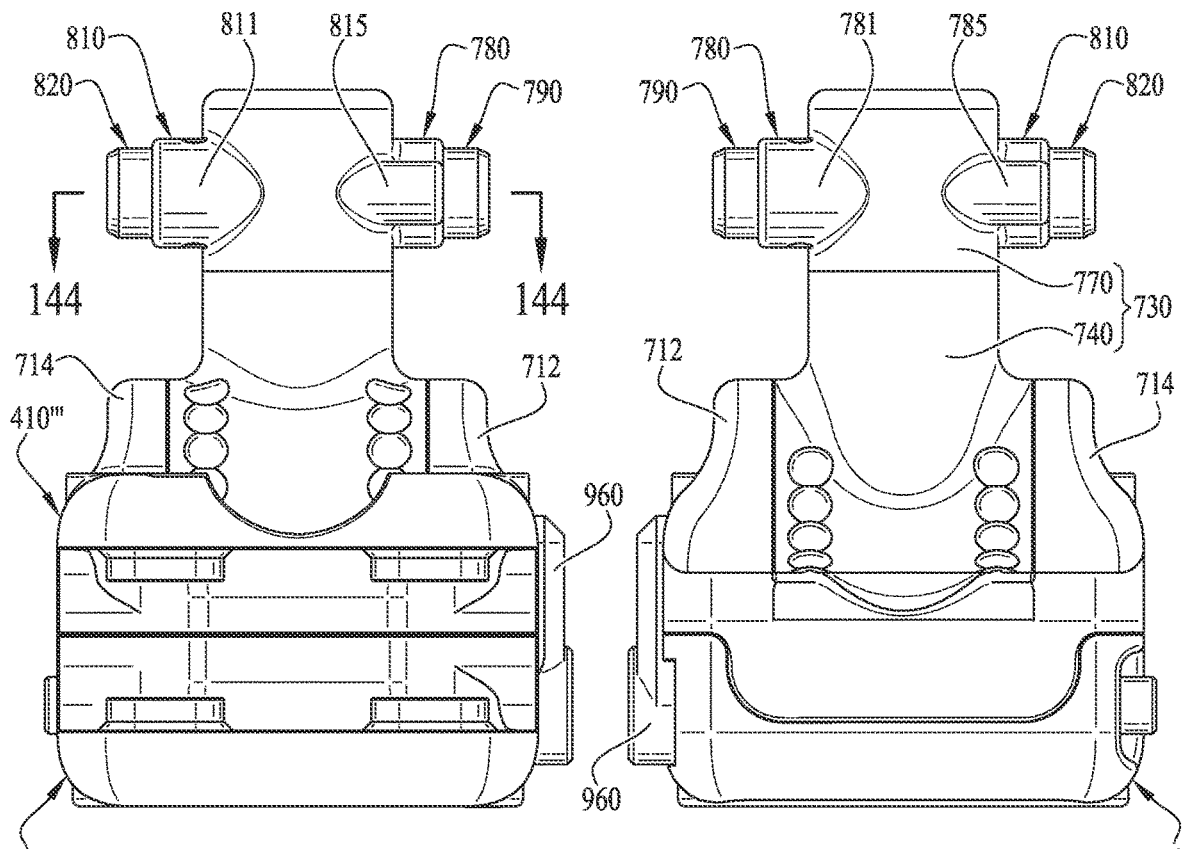

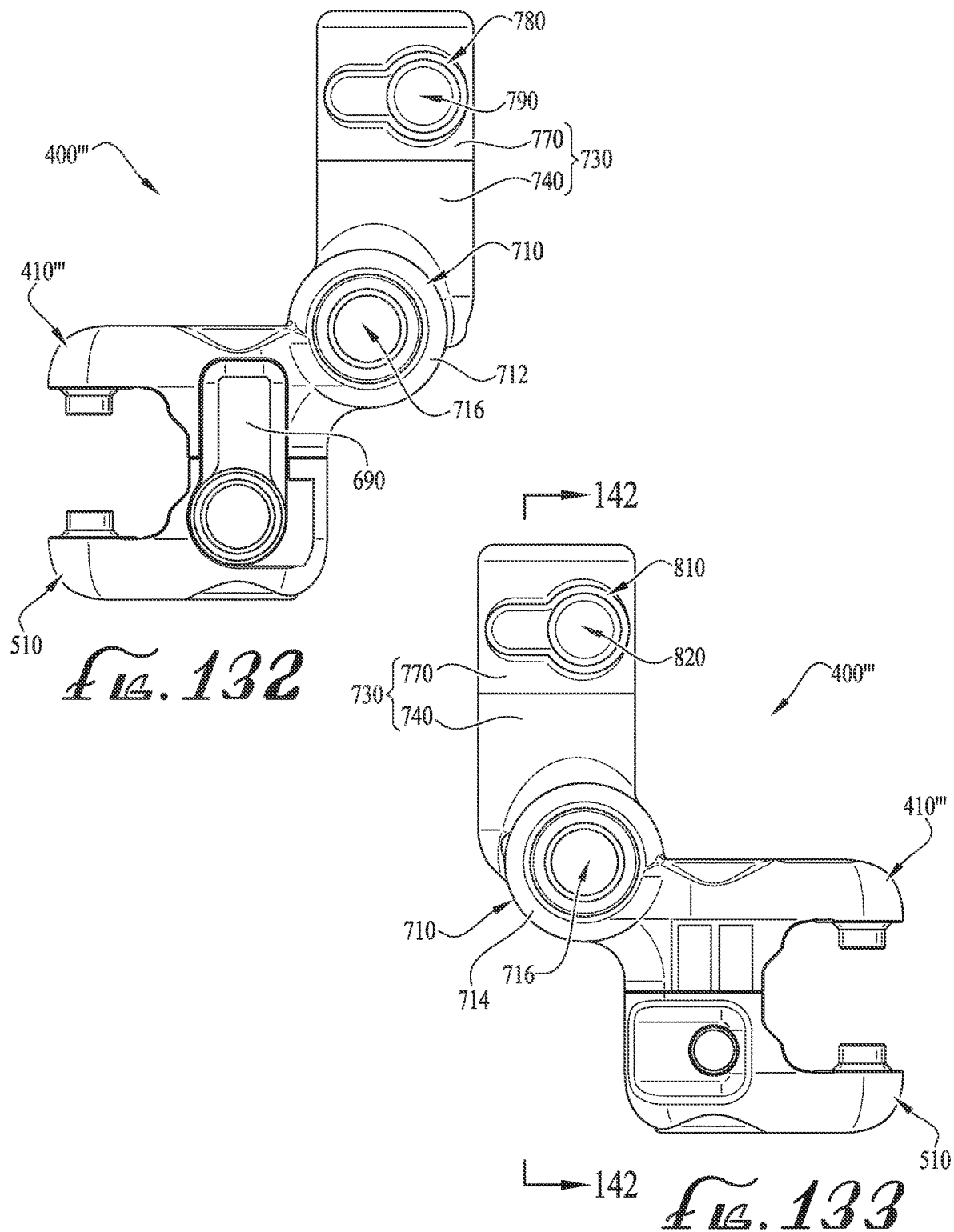

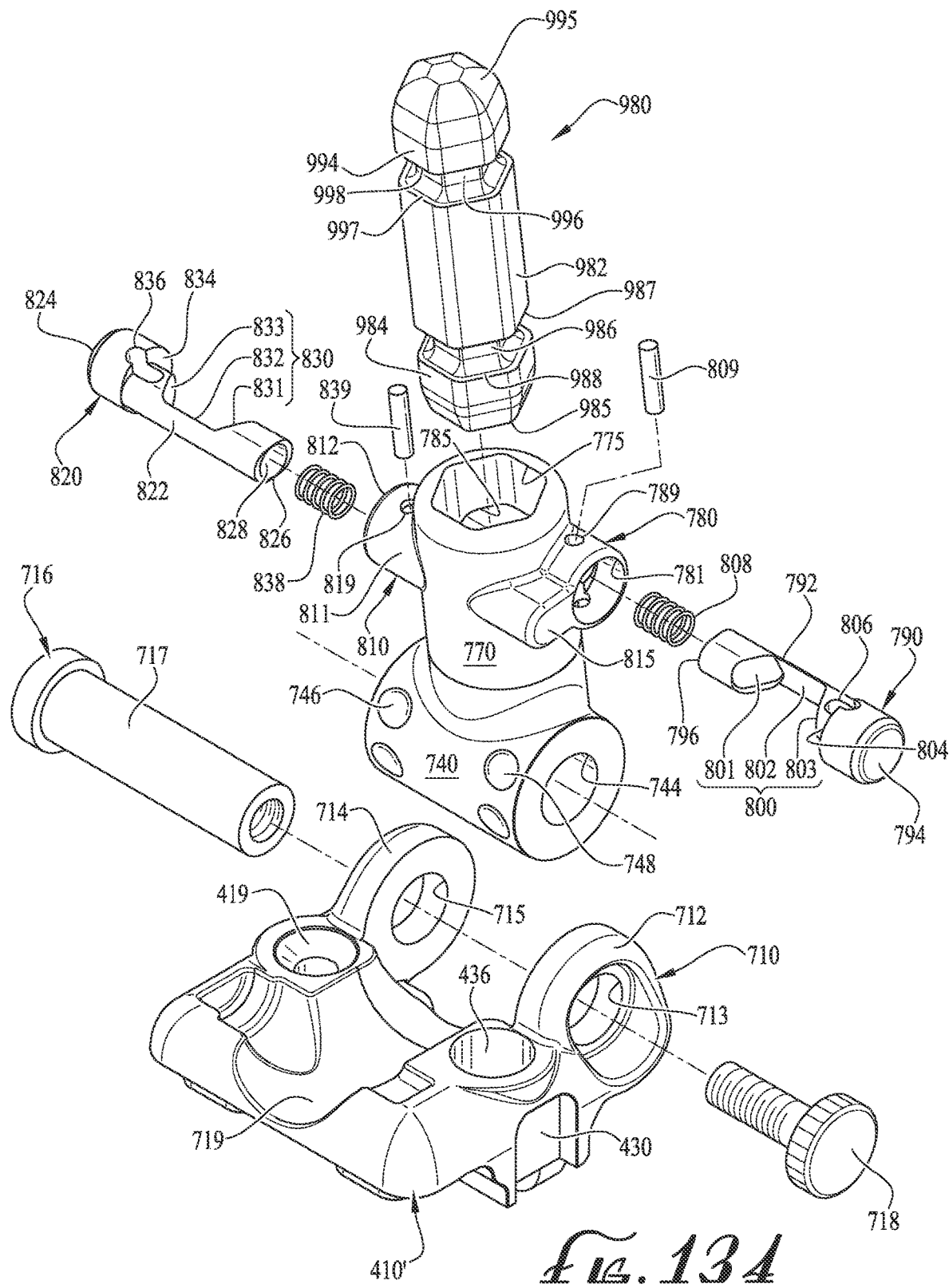

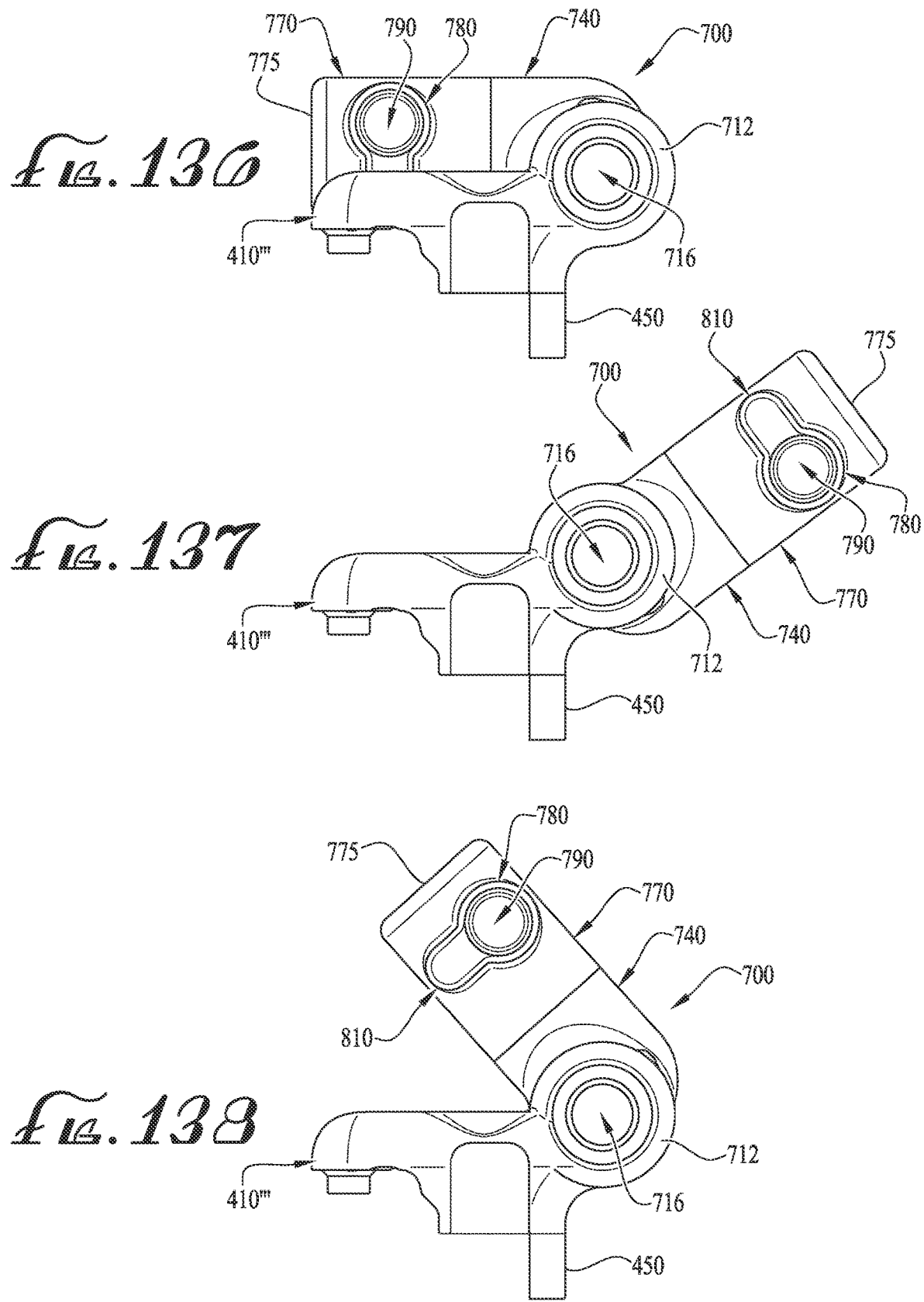

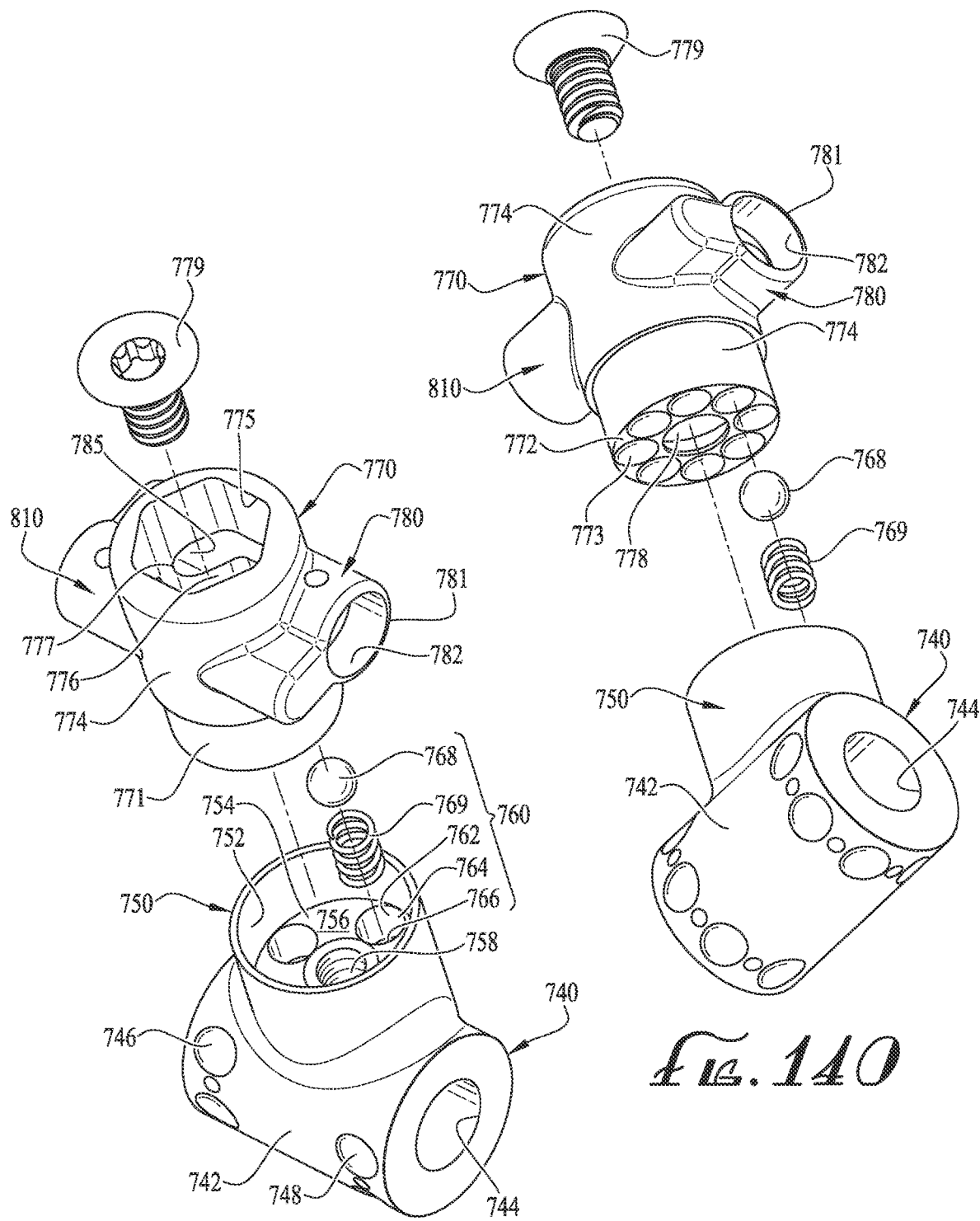

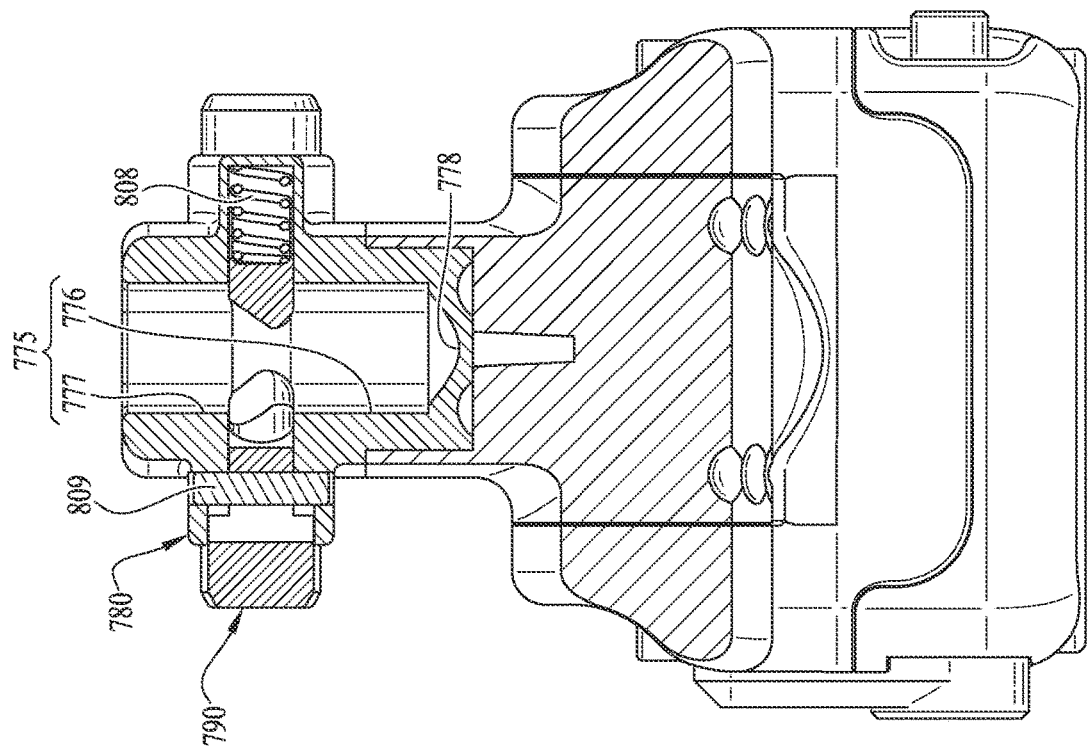
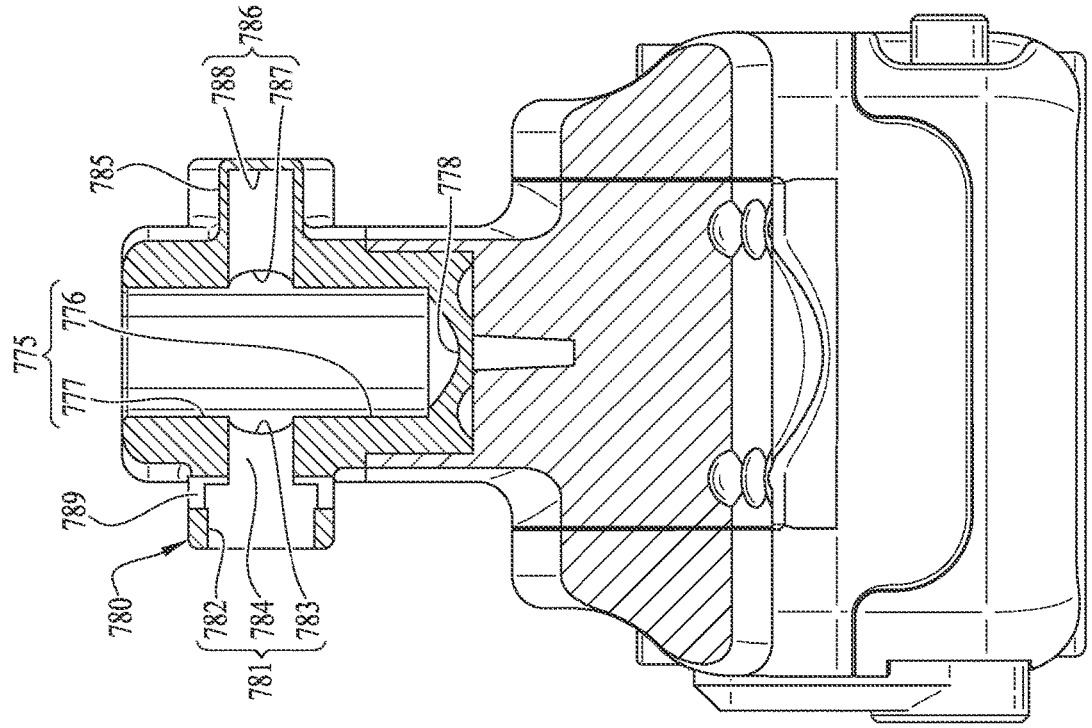

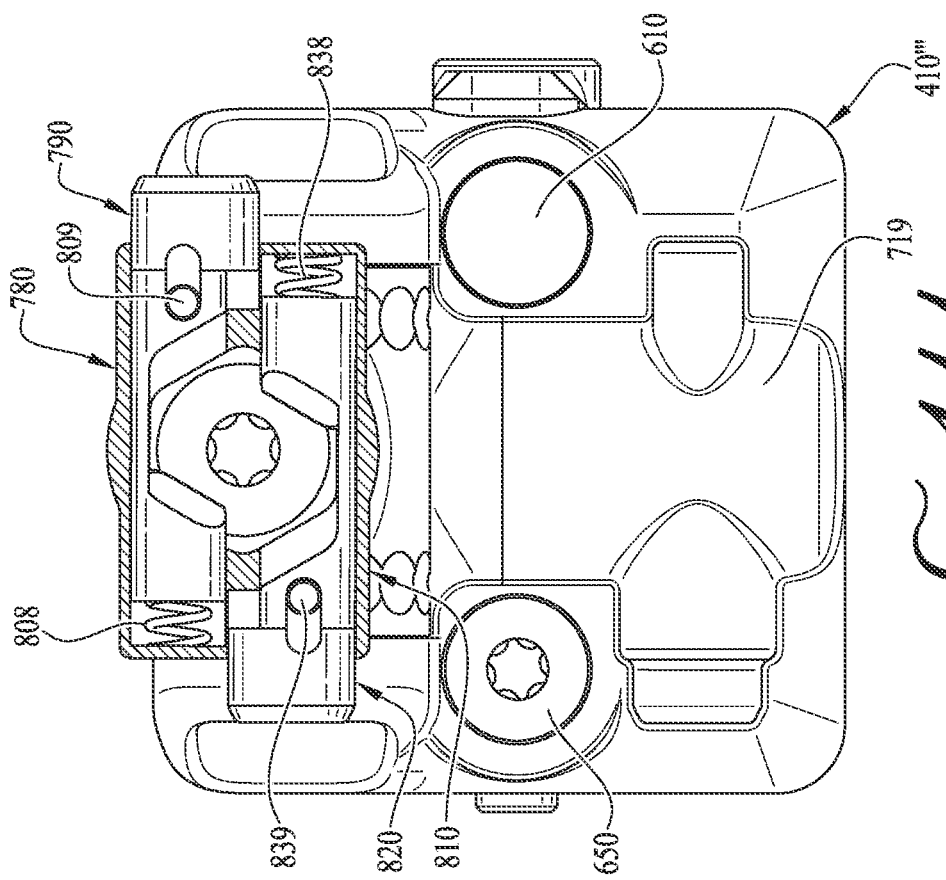
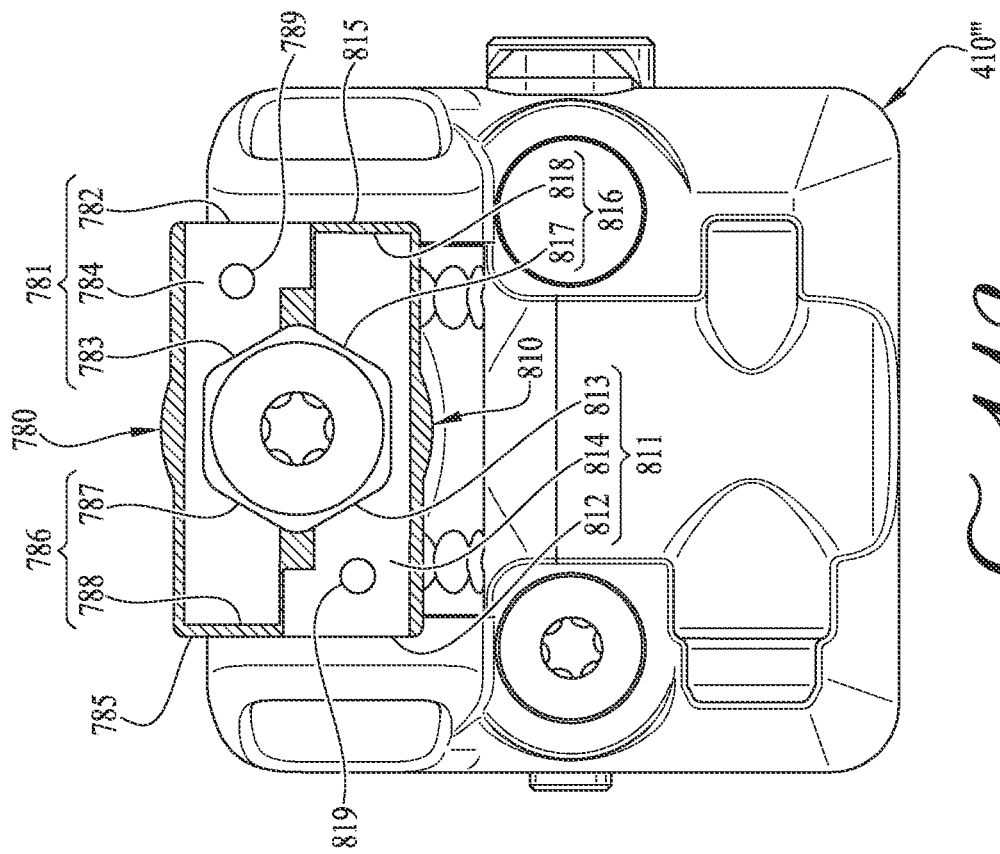

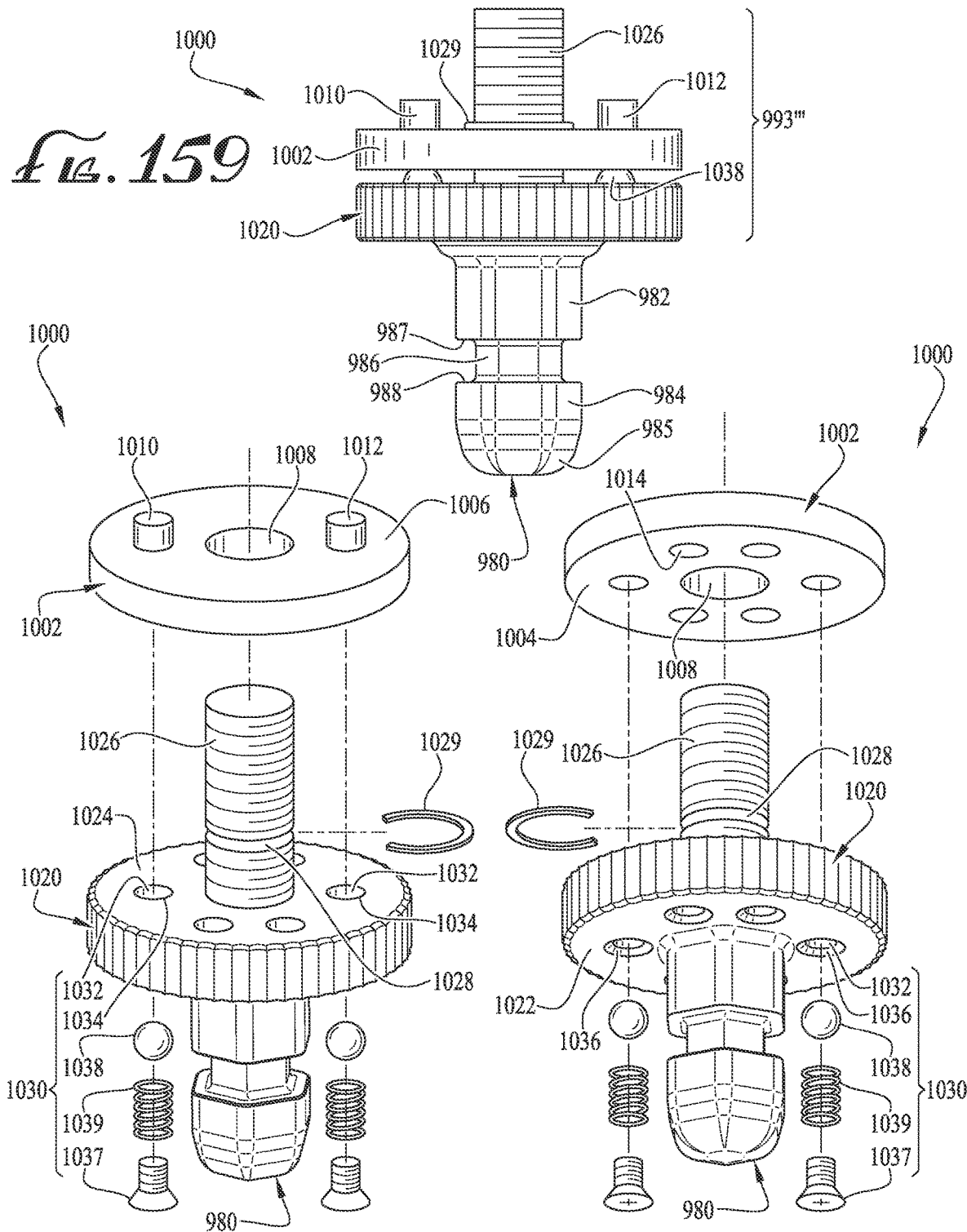

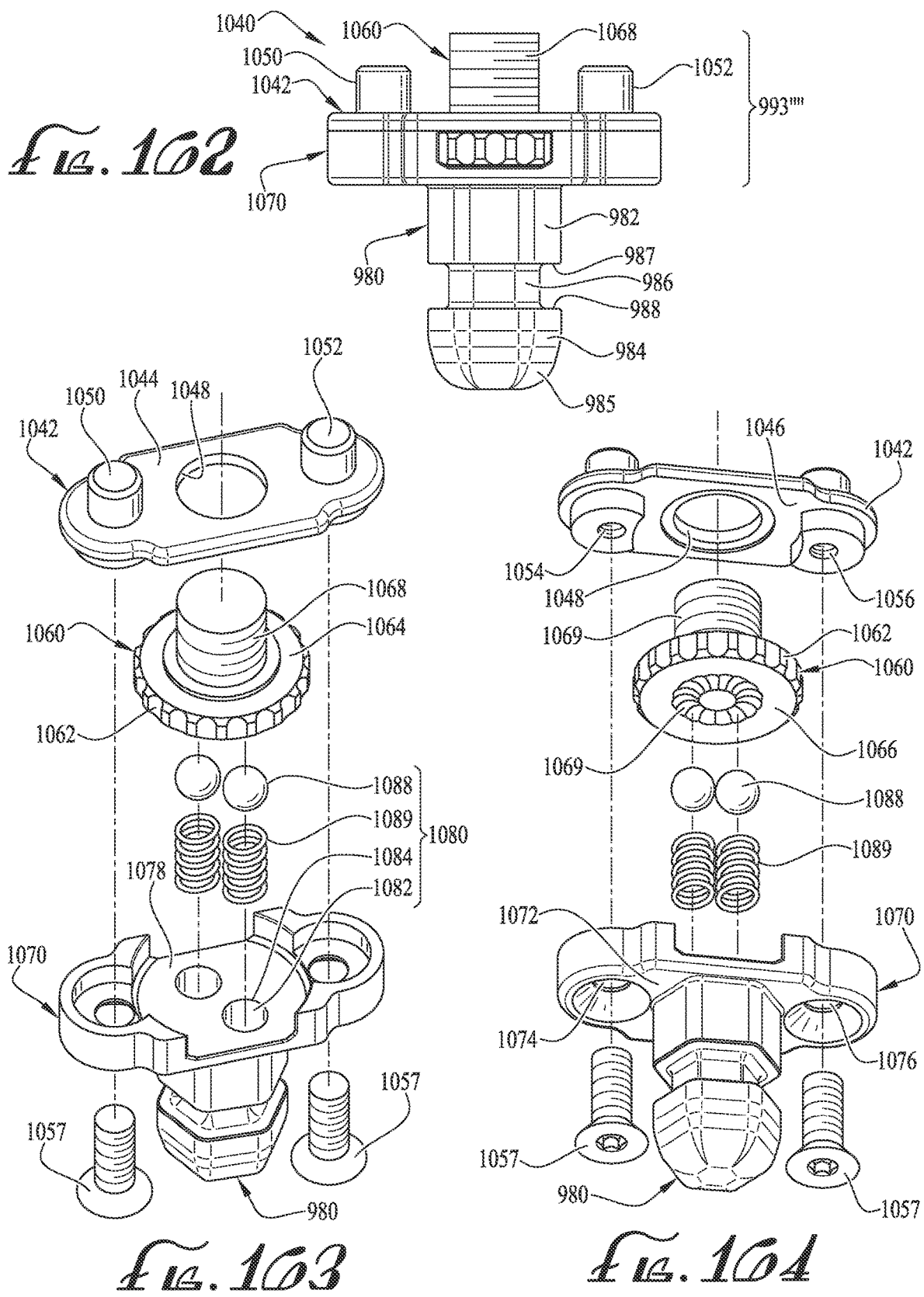

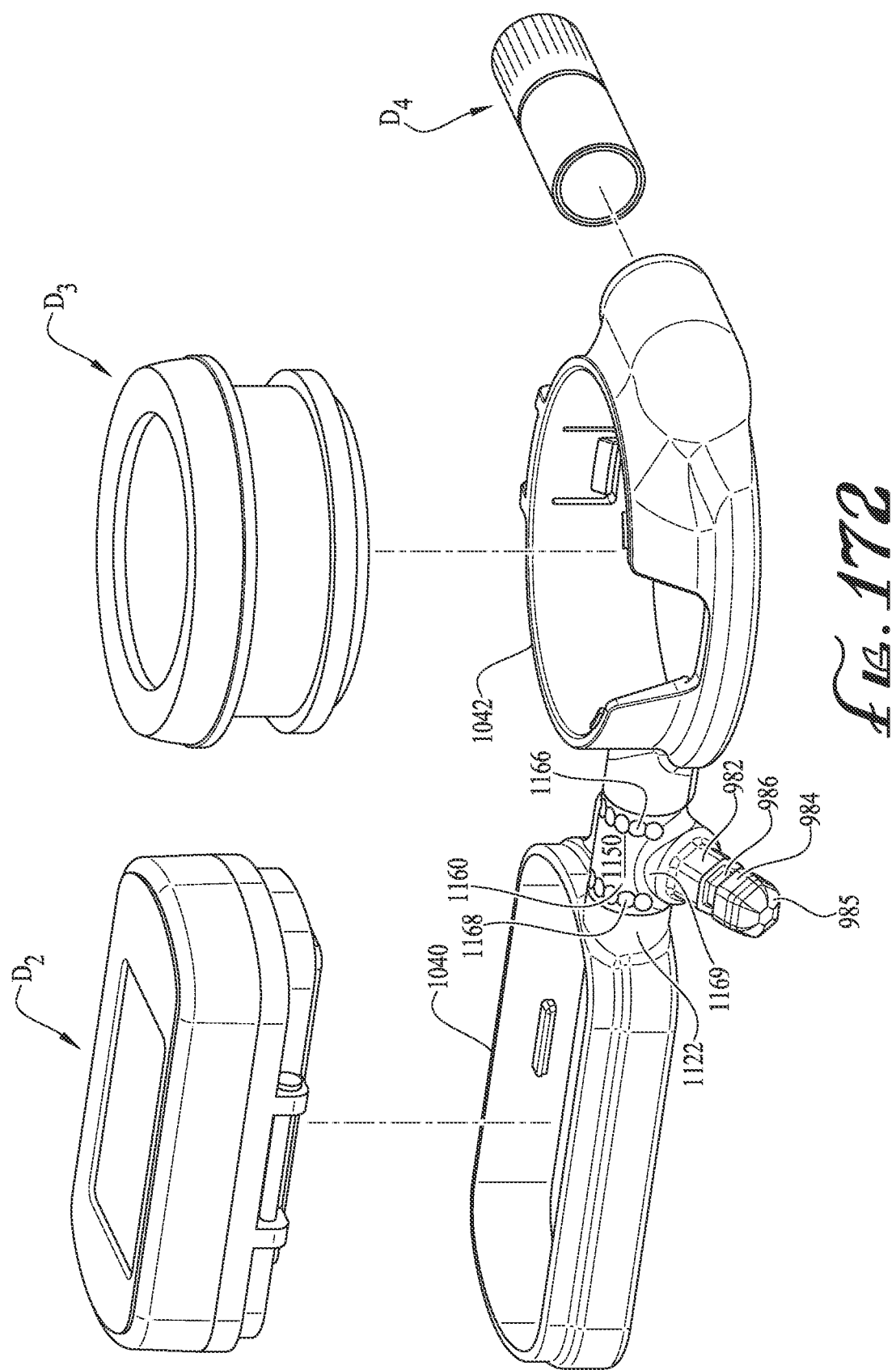

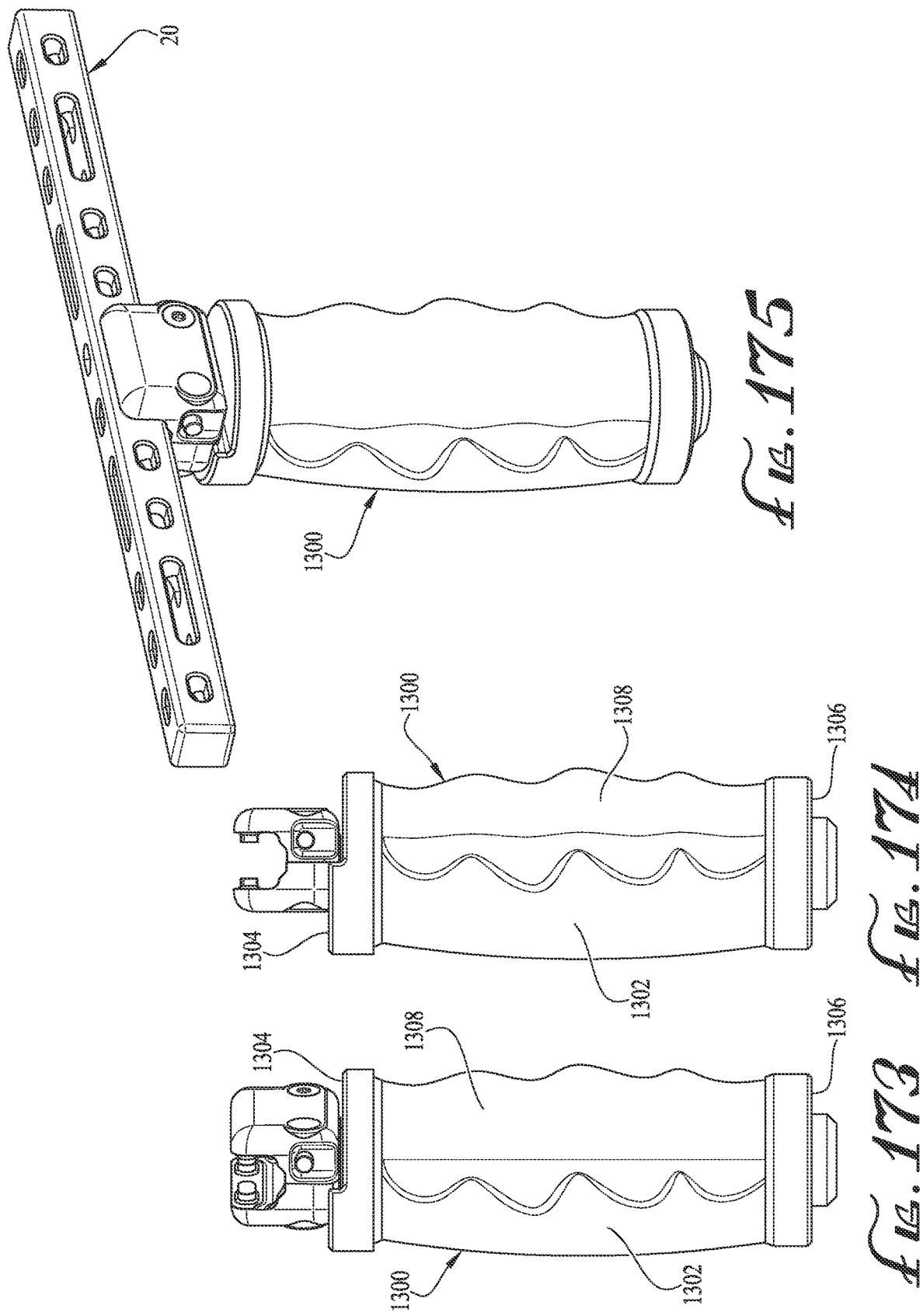

MOUNTING SYSTEM, DEVICES, METHODS AND USES THEREOF

This continuation application claims the benefit of priority and is entitled to the filing date pursuant to 35 U.S.C. § 120 of U.S. Non-Provisional patent application Ser. No. 17/154,971, a continuation-in-part patent application which 1) claims the benefit of priority and is entitled to the filing date pursuant to 35 U.S.C. § 120 U.S. Non-Provisional patent application Ser. No. 16/749,973, filed on Jan. 22, 2020, a 35 U.S.C. § 111 application that that claims priority to and is entitled to the filing dates of U.S. Provisional Patent Application Ser. No. 62/796,494, filed on Jan. 24, 2019, U.S. Provisional Patent Application Ser. No. 62/795,539, filed on Jan. 22, 2019, and U.S. Provisional Patent Application Ser. No. 62/877,270, filed on Jul. 22, 2019 and 2) claims the benefit of priority and the filing dates pursuant to 35 U.S.C. § 120 to International Patent Application Serial No. PCT/US2020/01467535, filed on Jan. 22, 2020, an international application that claims priority and is entitled to the filing dates to U.S. Provisional Patent Application Ser. No. 62/796,494, filed on Jan. 24, 2019, U.S. Provisional Patent Application Ser. No. 62/795,539, filed on Jan. 22, 2019, and U.S. Provisional Patent Application Ser. No. 62/877,270, filed on Jul. 22, 2019, each of which is hereby incorporated by reference in its entirety.

BACKGROUND

The subject of this patent application relates generally to devices for securely and releasably mounting and/or protecting devices, equipment or other apparatus (collectively referred to as "devices").

By way of background, in rugged applications and environments, there is a need for devices, equipment or other apparatus to be protected from impact and moisture. For example, both electrical and mechanical devices can become damaged and their operability impaired or lost upon exposure to moisture, such as, e.g., air moisture or humidity or being submerged in a liquid. Such moisture exposure can affect electronical and/or mechanical mechanisms to such a degree that the device becomes inoperable. Similar damage can occur from the resulting impact if a device is dropped or struck by another object.

In addition, in rugged applications and environments, a user of a device may desire to take a device into an environment where moisture exposure is highly likely or certain to occur and/or device impact is a risk. In such situations, the user wants to protect a device to prevent such damage before entering into this environment. For example, a user may wish to take a photographic device, such as, e.g., a camera or device such as a smart phone or tablet having a camera underwater in order to take pictures of the sea life or environment. Such devices need protection for the inevitable exposure to the fresh or salt-water exposure. Likewise, a user may wish to take a photographic device while hiking or climbing in rugged terrain where there is a real risk of dropping the device or having the device striking the terrain. Again, such devices need protection for the impact when the device is so struck.

Further, in rugged applications and environments, there is a need for a device to be securely mounted (through a mount) on a base. Such device mounting could be done to facilitate operation of the device and/or store the device when not in use. Such mounting could also enable free use of the hands of a user to do other things or complete other tasks. For example, a user may desire to mount a smart phone, tablet, night vision goggle (NVG), compass, ground-positioning system (GPS) or similar device to the dashboard of a vehicle in order to operate a navigational system while operating the vehicle or take a video during vehicle operation. Similarly, a device can be mounted on clothing of a user, for example, vest or harness, in order to attach a device to the person of the user. For example, a use may wish to mount a device on a helmet or vest worn by the user in order to navigate terrain while hiking or riding a bike or videotape the experience.

Moreover, in rugged applications and environments, there is a need for these devices to be quickly removed from the mount and reattached to another mount (or simply stowed), while preventing unintended removal or fumbling. Such quick removal can reduce user frustration, enhances operability of the devices and imparts greater flexibility of use. For example, a user could mount a device like a smart phone, on the dashboard of a vehicle in order to navigate to a rock-climbing location, and once there, quickly remove the device from the dashboard and then quickly attach the device to a helmet or vest worn by the user to video record ongoing activities. During these activities, the user could then quickly remove the device from the helmet or vest to make a call, take a photograph, or perform another task on the device, and then quickly attach the device to the helmet or vest again once that task is completed in order to continue to record the ongoing activities.

However, current devices, systems and methods are unable to achieve or attain all of the attributes discussed above. For example, while certain devices may offer protection to impact or moisture exposure, these devices are either ineffective or so cumbersome that they interfere with the operability of the device. Similarly, while current mounting systems provide a means to secure a device to a base, these systems typically ignore or are ineffective in protecting a device from impact or moisture exposure. These mounting systems also suffer in that they tend to be incompatible with other mounting systems, forcing a user to purchase additional adaptors to enable compatibility or simply choice one mounting system over another. Likewise, although certain mounting systems may offer a means to secure a device quickly to a base or remove the device quickly from the base, attachment security is sacrificed to achieve such each of use. As such, a device can become dislodged from a base and incur damage from the resulting impact or moisture exposure.

Aspects of the present invention fulfill these needs and provide further related advantages as described in the following summary.

SUMMARY

The present systems, devices, and methods provide a mounting system which includes a rail and a bracket which is selectively secured to the rail. A bracket disclosed herein selectively and/or automatically secures or locks to a rail disclosed herein when positioned on the rail by actuating or triggering a locking mechanism disclosed herein to adopted a locked configuration. In addition, a bracket disclosed herein may be selectively removed from a rail by actuating or triggering a locking mechanism disclosed herein to adopted an unlocked configuration.

The disclosed systems, devices, and methods provide a mounting system which includes a rail configured as a case to enclose a device and a bracket which is selectively secured to the case. The device case enables a device to be protected from impact and moisture exposure, enable a device to be securely mounted on a base, and enable a device to be quickly secured and removed from a base.

Other features and advantages of aspects of the present invention will become apparent from the following more detailed description, taken in conjunction with the accompanying drawings, which illustrate, by way of example, the principles of aspects of the invention.

BRIEF DESCRIPTION OF THE DRAWINGS

FIG. 1A-C is a mounting system disclosed herein, with FIG. 1A showing a top perspective of a mounting system disclosed herein, illustrating a bracket aligned and ready for attachment to a rail, where the rail is configured as a base; FIG. 1B showing a top perspective of the mounting system of FIG. 1A, illustrating a bracket attached to a rail; and FIG. 1C showing an exploded top perspective view of the rail of FIG. 1A;

FIG. 2 is a front top perspective view of a rail disclosed herein;

FIG. 3 is a front top perspective view of a rail disclosed herein;

FIG. 4 is a front top perspective view of a rail disclosed herein;

FIG. 5 is a front top perspective view of a rail disclosed herein;

FIG. 6 is a front top perspective view of a rail disclosed herein;

FIG. 7 is a front top perspective view of a rail disclosed herein;

FIG. 8 is a front top perspective view of mounting system disclosed herein showing a bracket disclosed herein attached to a rail disclosed herein;

FIG. 9 is a front top perspective view of the bracket of FIG. 8;

FIG. 10 is a front top perspective view of mounting system disclosed herein showing a bracket disclosed herein attached to a rail disclosed herein;

FIG. 11 is a front top perspective view of the bracket of FIG. 10;

FIG. 12 is a front top perspective view of mounting system disclosed herein showing a bracket disclosed herein attached to a rail disclosed herein;

FIG. 13 is a front top perspective view of the bracket of FIG. 12;

FIG. 36 is a top plan view of the mounting system of FIG. 22;

FIG. 37 is a bottom plan view of the rail of FIG. 22;

FIG. 38 is a fourth side plan view of the rail of FIG. 22;

FIG. 39 is a second side plan view of the rail of FIG. 22;

FIG. 40 is a first side plan view of the rail of FIG. 22;

FIG. 41 is a third side plan view of the rail of FIG. 22;

FIG. 47 is a magnified partial cross-sectional view of the mounting system of FIG. 36, taken at 47-47;

FIG. 48 is a cross-sectional view of the mounting system of FIG. 36, taken at 48-48;

FIG. 49 is a magnified partial cross-sectional view of the rail of FIG. 38, taken at 49-49;

FIG. 50 is a magnified partial cross-sectional view of the rail of FIG. 39, taken at 50-50;

FIG. 51 is a front top perspective view of a bracket disclosed herein in the closed configuration;

FIG. 52 is a back top perspective view of the bracket of FIG. 51 in the closed configuration;

FIG. 53 is a top plan view of the bracket of FIG. 51 in the closed configuration;

FIG. 54 is a bottom plan view of the bracket of FIG. 51 in the closed configuration;

FIG. 55 is a front plan view of the bracket of FIG. 51 in the closed configuration;

FIG. 56 is a back plan view of the bracket of FIG. 51 in the closed configuration;

FIG. 57 is a second side plan view of the bracket of FIG. 51 in the closed configuration;

FIG. 58 is a first side plan view of the bracket of FIG. 51 in the closed configuration;

FIG. 59 is a front top perspective view of the bracket of FIG. 51 in the open configuration;

FIG. 60 is a back top perspective view of the bracket of FIG. 51 in the open configuration;

FIG. 61 is a top plan view of the bracket of FIG. 51 in the open configuration;

FIG. 62 is a bottom plan view of the bracket of FIG. 51 in the open configuration;

FIG. 63 is a front plan view of the bracket of FIG. 51 in the open configuration;

FIG. 64 is a back plan view of the bracket of FIG. 51 in the open configuration;

FIG. 65 is a second side plan view of the bracket of FIG. 51 in the open configuration;

FIG. 66 is a first side plan view of the bracket of FIG. 51 in the open configuration;

FIG. 77 is an exploded front top perspective view of a bracket disclosed herein;

FIG. 78 is an exploded back top perspective view of the bracket of FIG. 77;

FIG. 92 is a cross-sectional side view of the latch mechanism of FIG. 89 in an unlocked configuration showing application of a force to enable the latch mechanism to adopt a locked configuration;

FIG. 93 is a cross-sectional side view of a latch mechanism of FIG. 89 showing a force of latch bolt compression spring actuating or triggering a locked configuration;

FIG. 94 is a cross-sectional side view of a latch mechanism of FIG. 89 in a locked configuration showing application of a force to enable the latch mechanism to adopt an unlocked configuration;

FIG. 95 is a cross-sectional side view of a latch mechanism of FIG. 89 showing a force actuating or triggering an unlocked configuration;

FIG. 96 is a cross-sectional top perspective view of the bracket of FIG. 57, showing the bracket in a locked configuration and application of a force needed to enable the bracket to adopt an unlocked configuration;

FIG. 97 is a cross-sectional top perspective view of the bracket of FIG. 96, showing force moving the latch bolt from a latch pin disclosed herein;

FIG. 98 is a cross-sectional top perspective view of the bracket of FIG. 65, taken at 98-98, showing force from bracket compression springs actuating or triggering an unlocked configuration of the bracket;

FIG. 99 is a cross-sectional top perspective view of the bracket of FIG. 57, taken at 99-99, showing a force of latch bolt compression spring actuating or triggering a locked configuration by moving the latch bolt through hole of the latch pin;

FIG. 100 is an exploded top perspective view of a bracket adaptor disclosed herein, illustrating attachment of the bracket adaptor to a bracket disclosed herein;

FIG. 101 is an exploded bottom perspective view of the bracket adaptor of FIG. 100;

FIG. 120 is a front bottom perspective view of a bracket having a cinching assembly disclosed herein;

FIG. 121 is a front top perspective view of the bracket of FIG. 120;

FIG. 122 is a bottom plan view of the bracket of FIG. 120;

FIG. 123 is a front plan view of the bracket of FIG. 120;

FIG. 124 is an exploded front top perspective view of cinching assembly disclosed herein;

FIG. 125 is an exploded front bottom perspective view of cinching assembly disclosed herein of FIG. 124;

FIG. 126 is an exploded first side plan view of cinching assembly disclosed herein of FIG. 124;

FIG. 127 is a front top perspective view of a bracket having a hinged socket disclosed herein;

FIG. 128 is a back top perspective view of the hinged socket of FIG. 127;

FIG. 129 is a top plan view of the hinged socket of FIG. 127;

FIG. 130 is a front plan view of the hinged socket of FIG. 127;

FIG. 131 is a back plan view of the hinged socket of FIG. 127;

Figure 127:
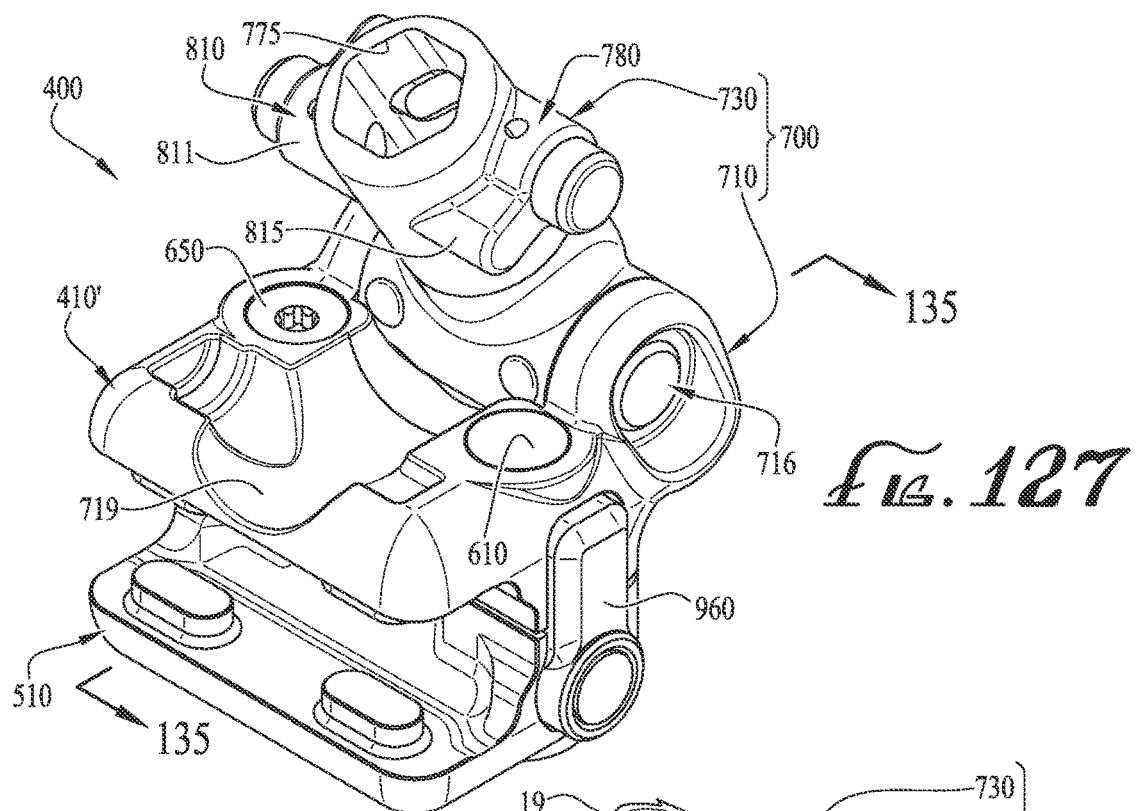
Figure 128:
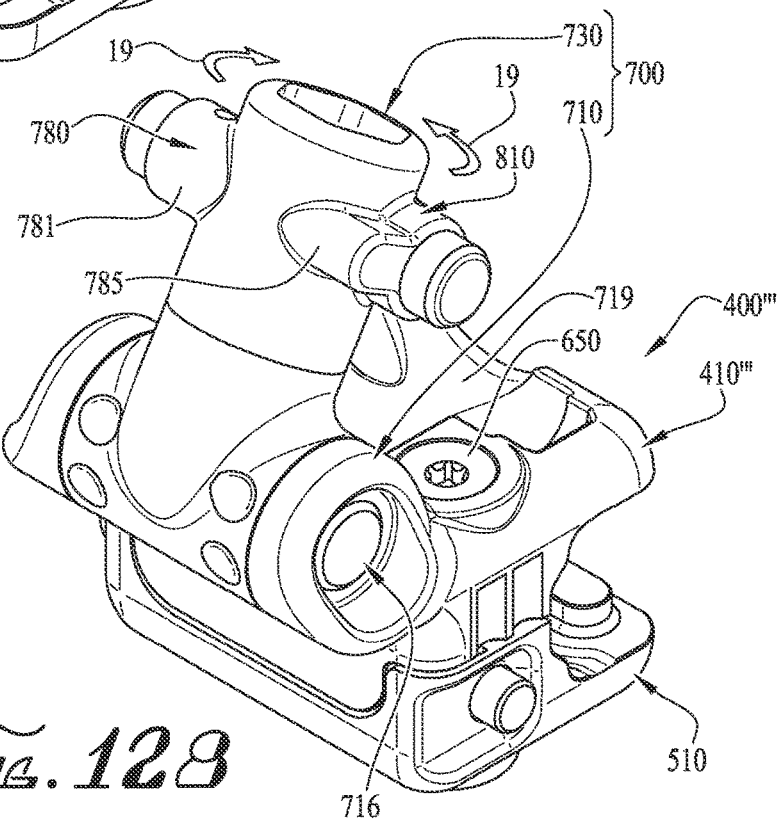
Figure 135:
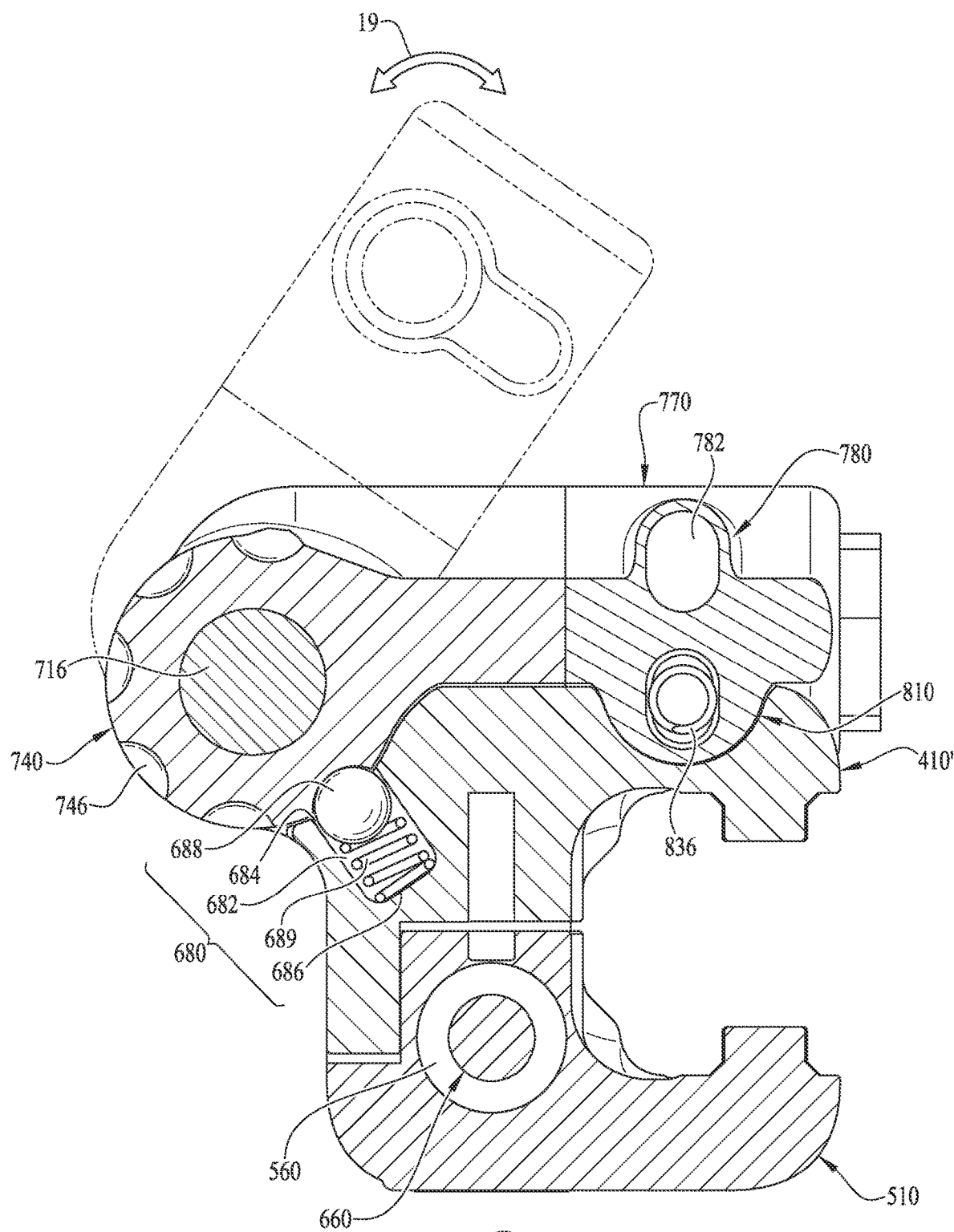
Figure 145:
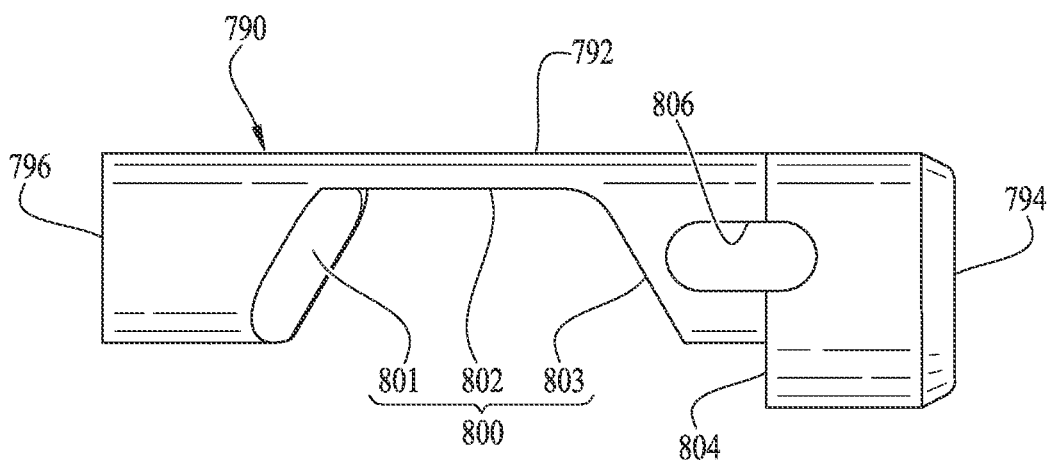
Figures 146, 147:
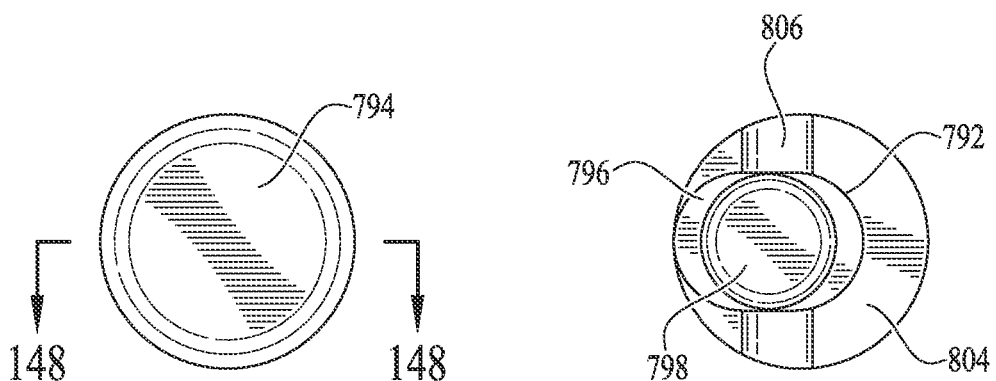
Figure 148:
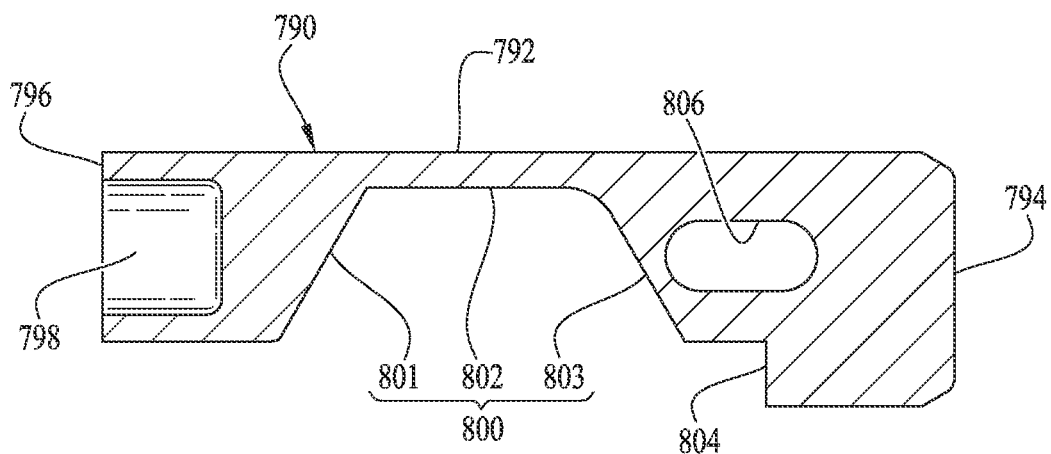
Figure 149:
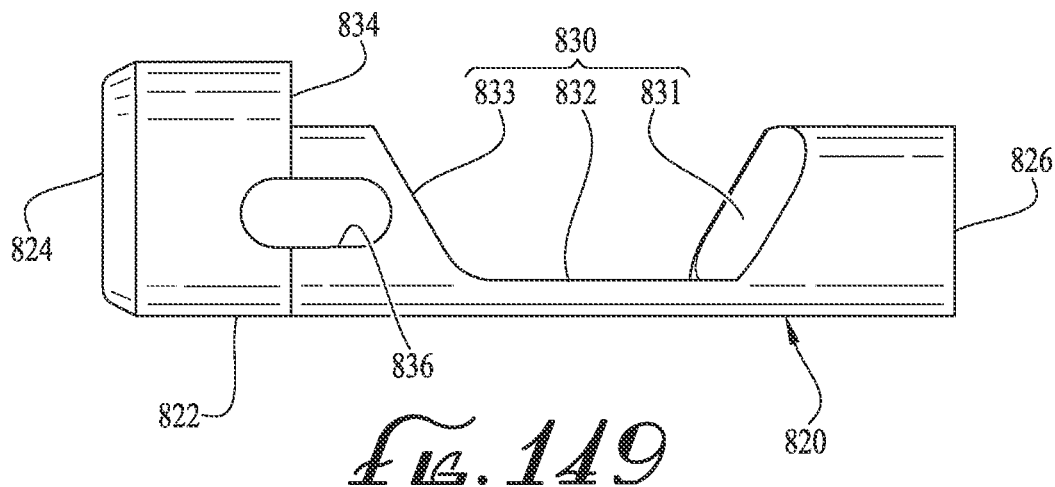
Figure 150:
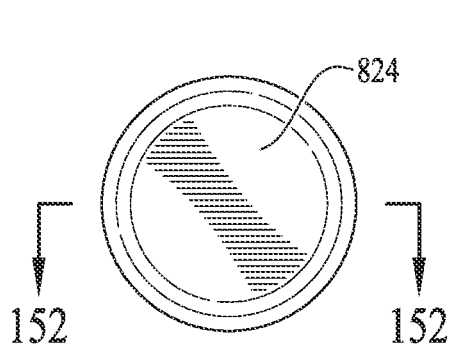
Figure 151:
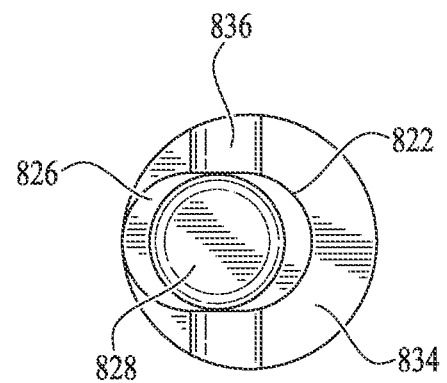
Figure 152:
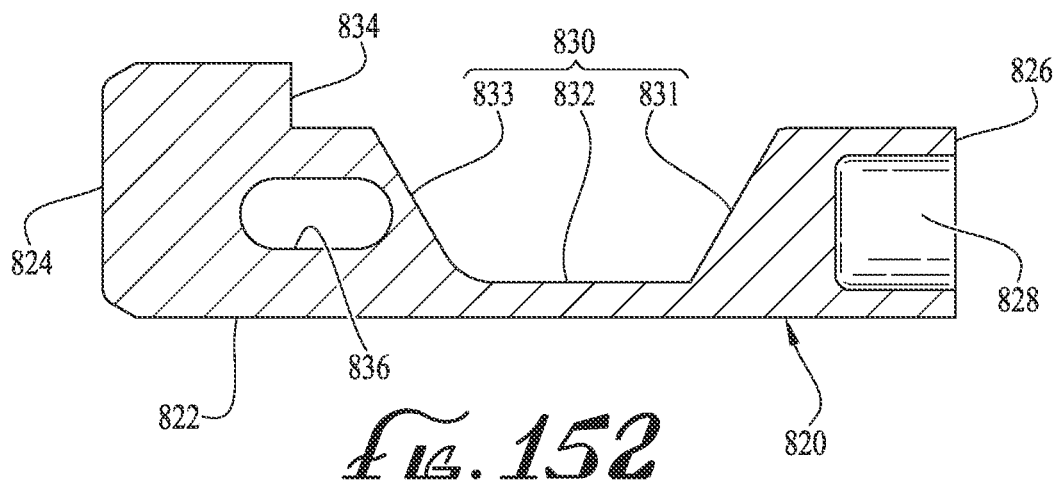
Figure 153:
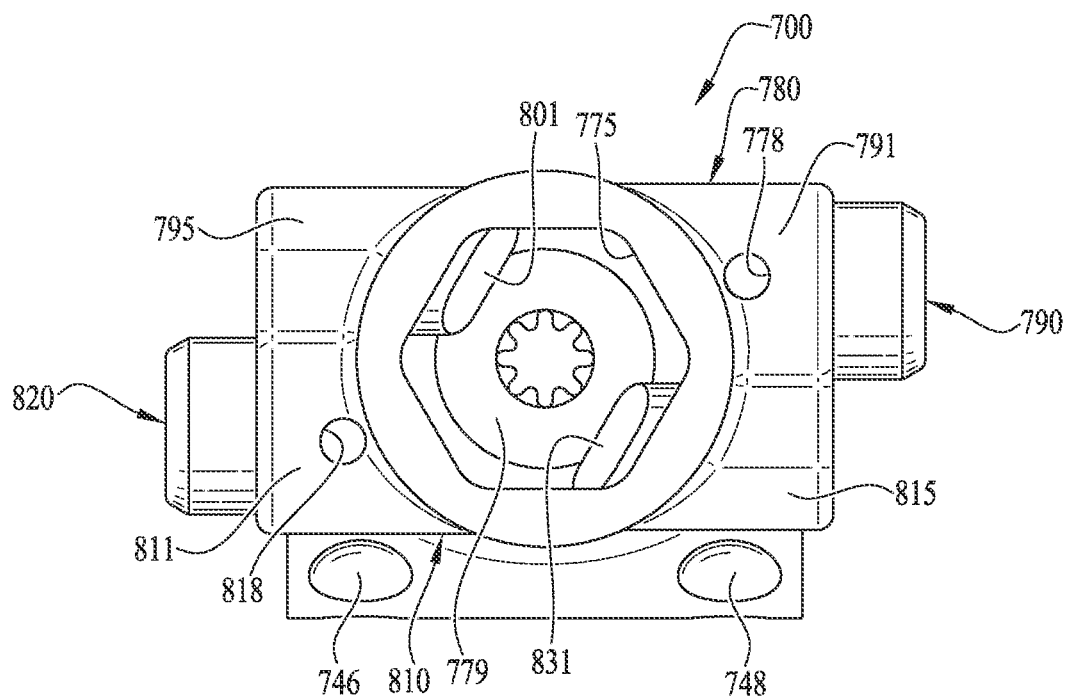
Figure 154:
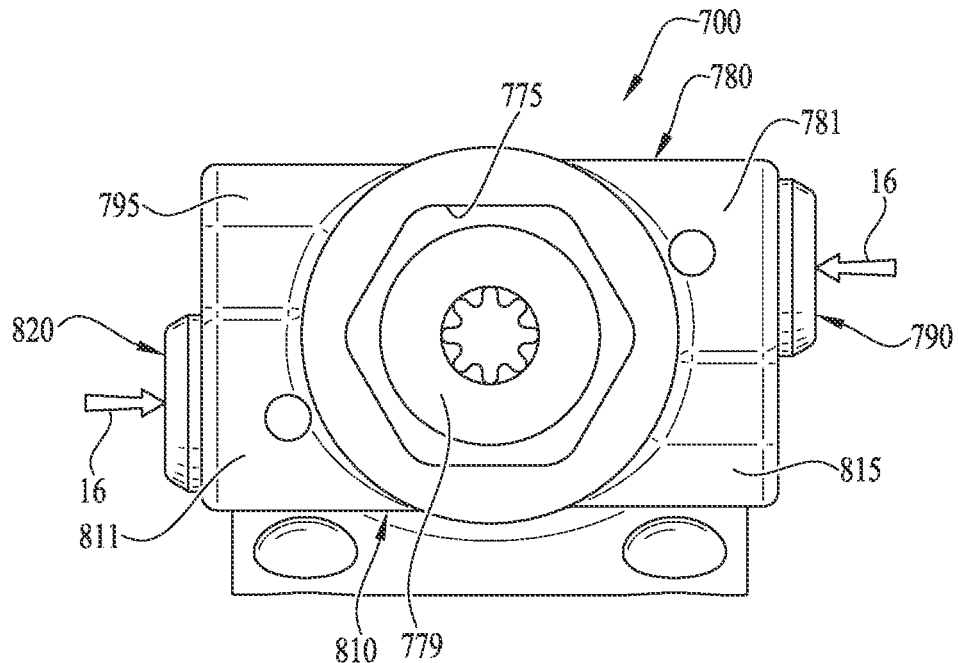
Figure 155:
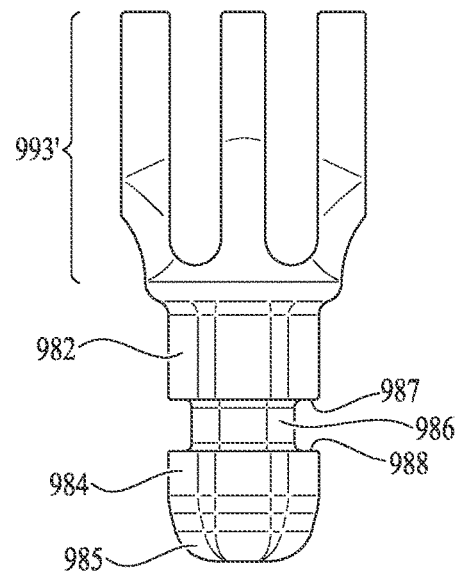
Figure 156:
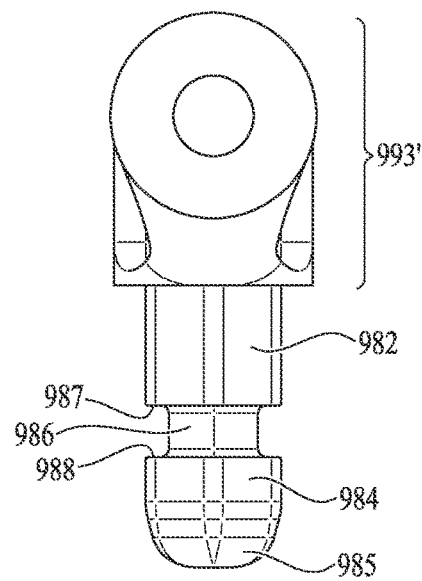
Figure 157:
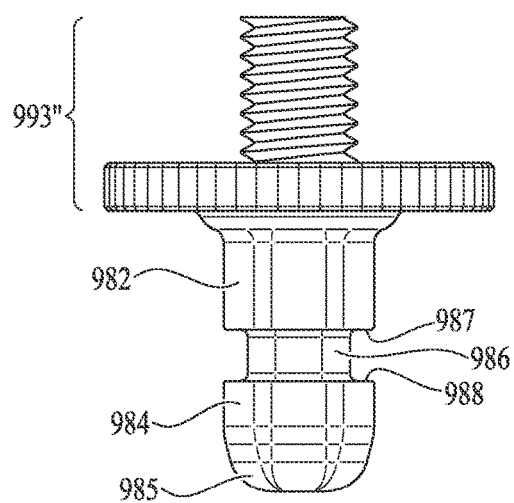
Figure 158:
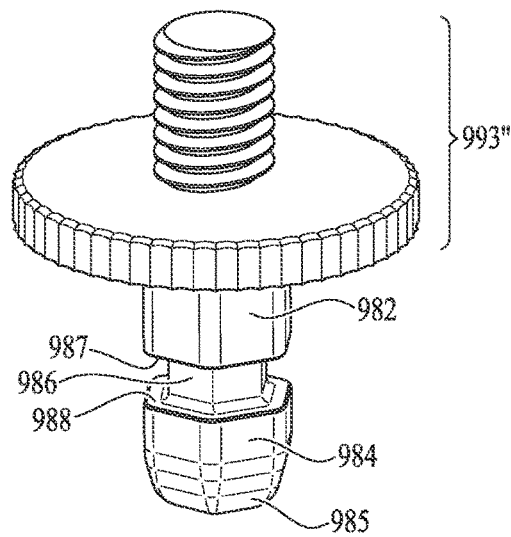
Figure 165:
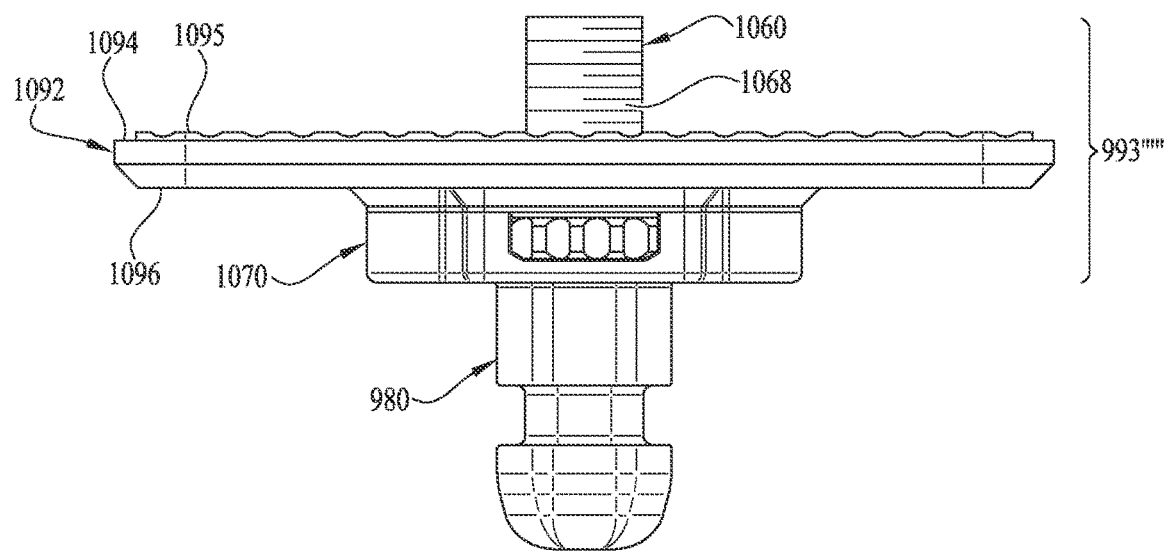
Figure 166:
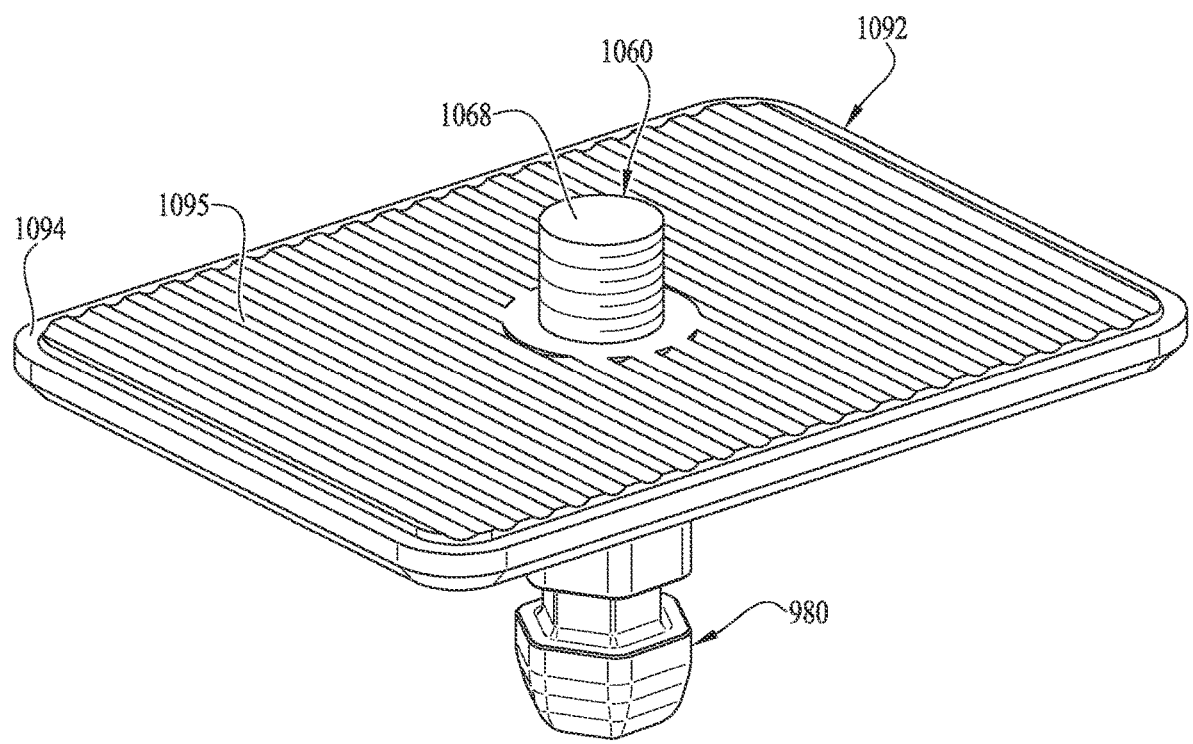
Figure 167:
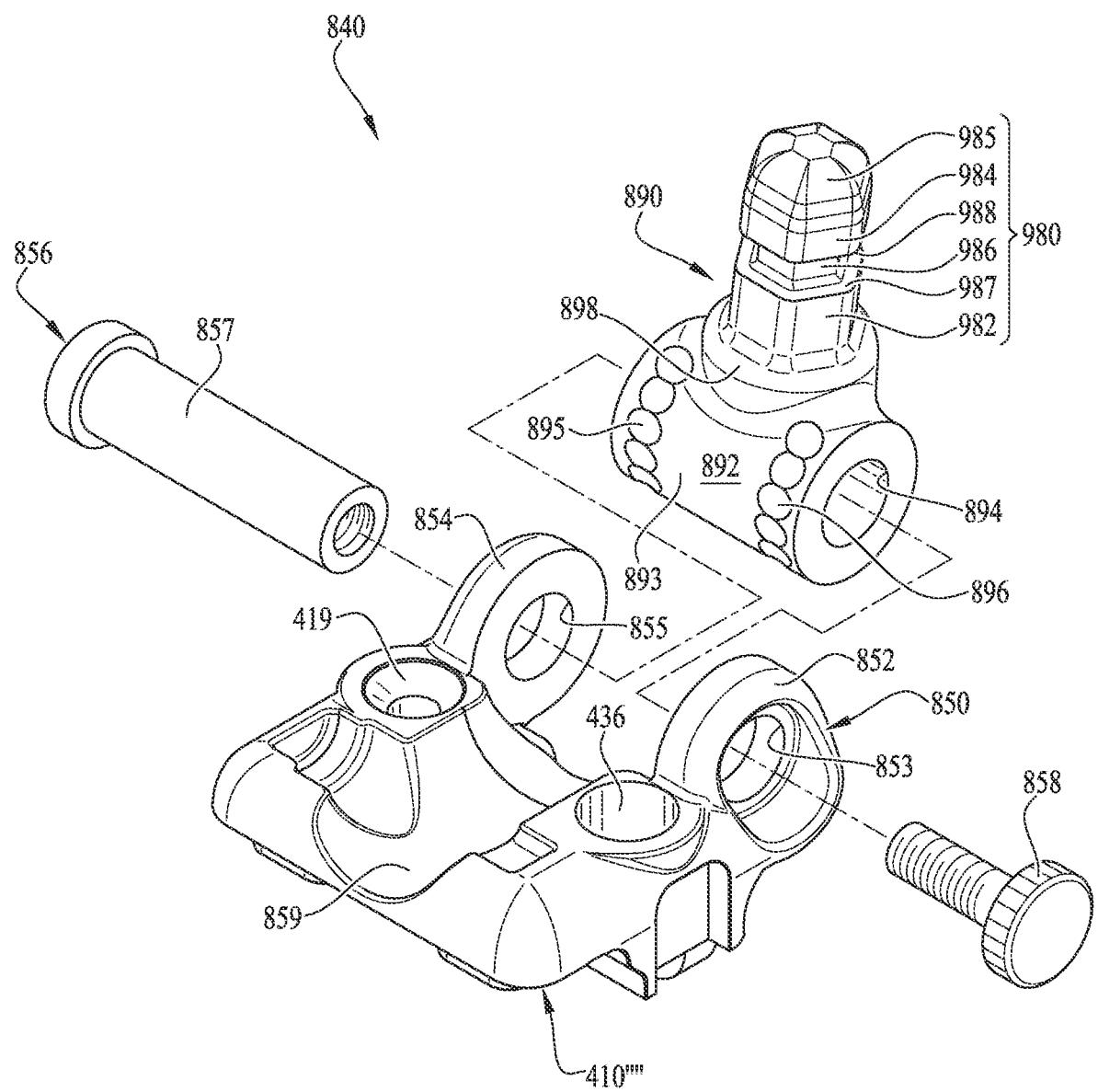
Figure 168:
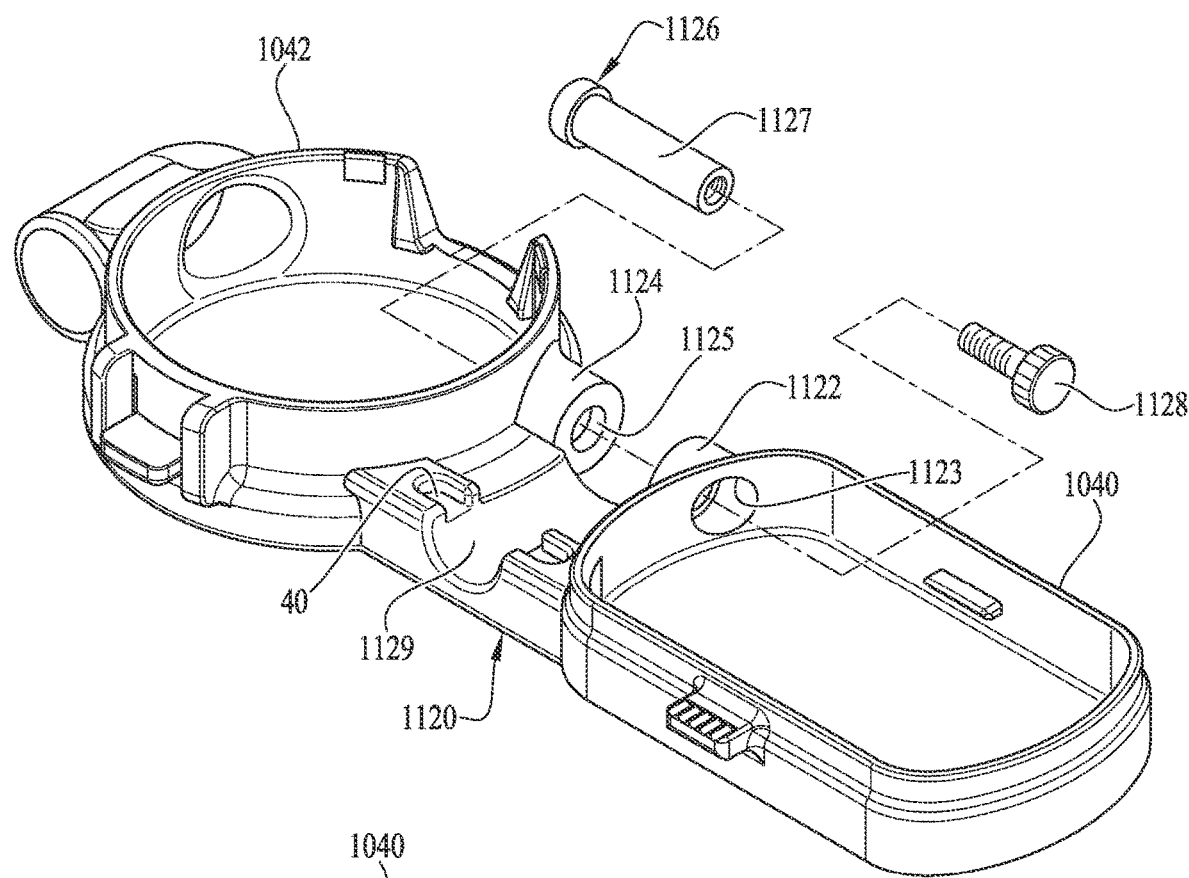
Figure 169:
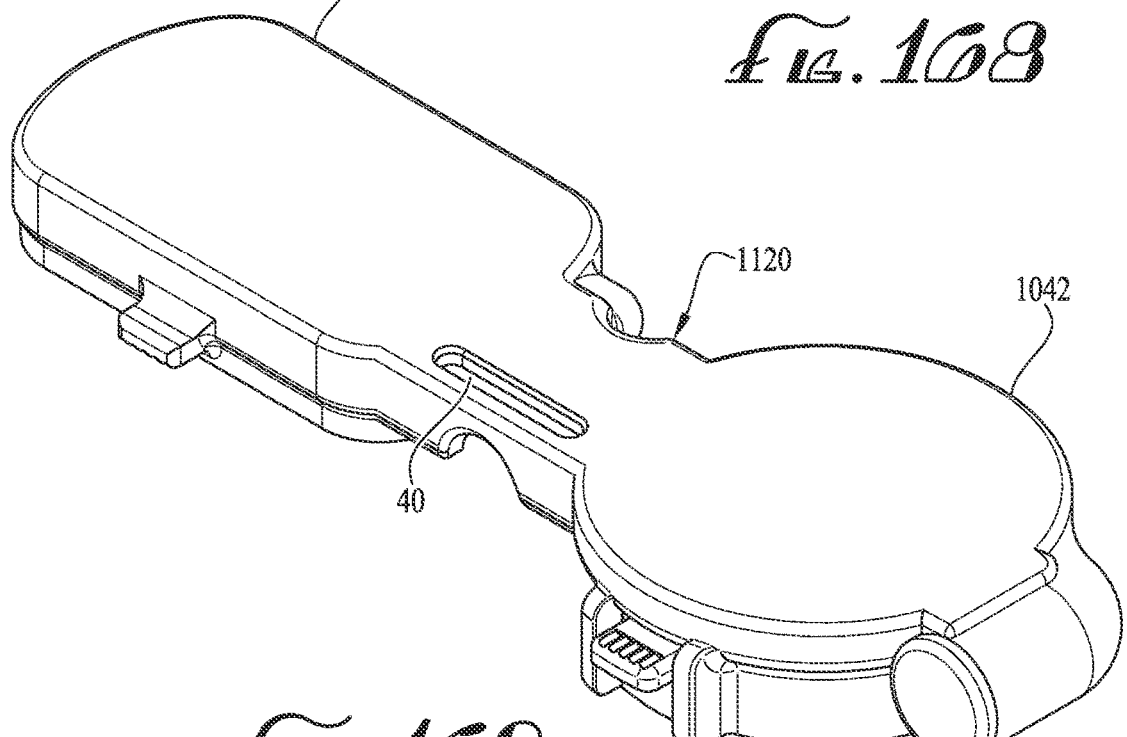
Figure 170:
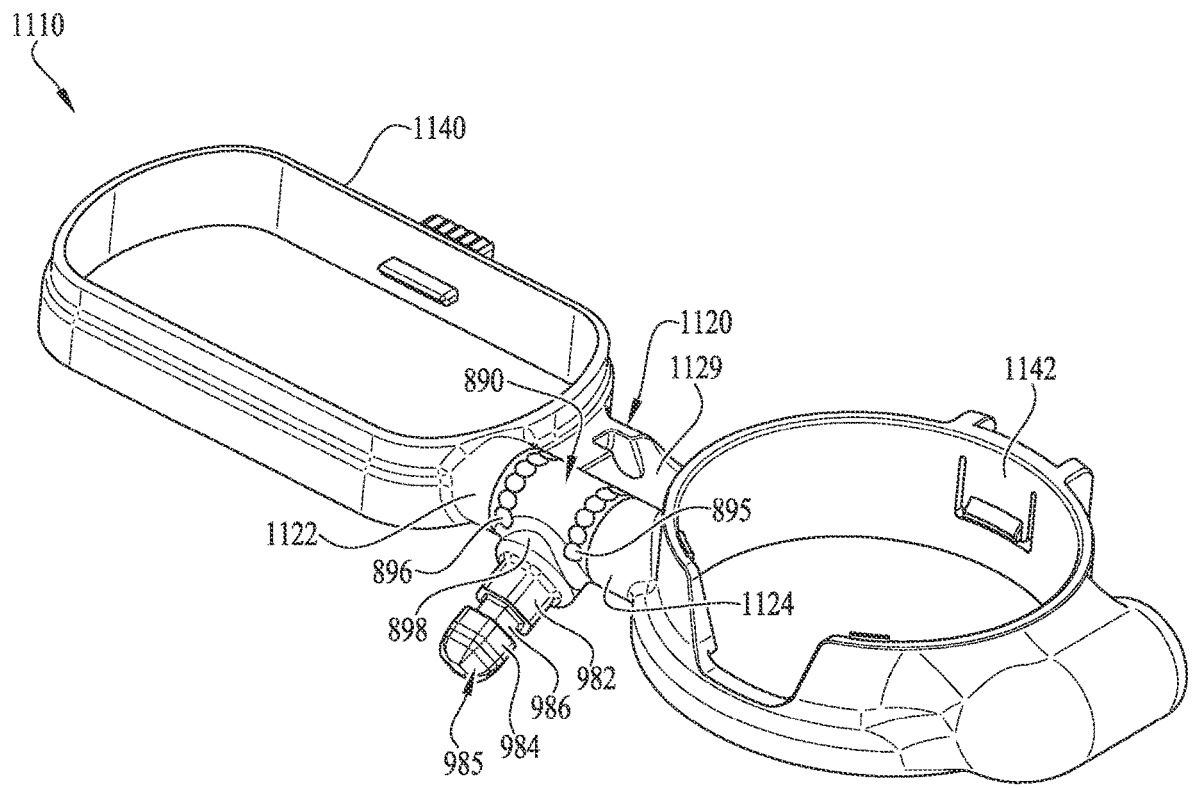
Figure 171:
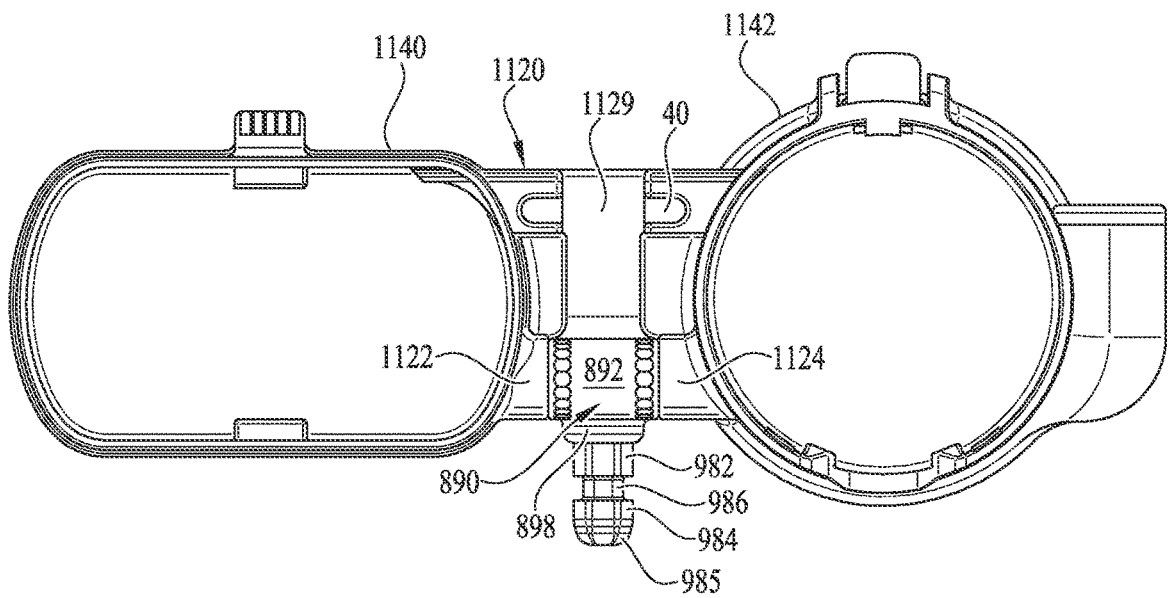
Figure 176:
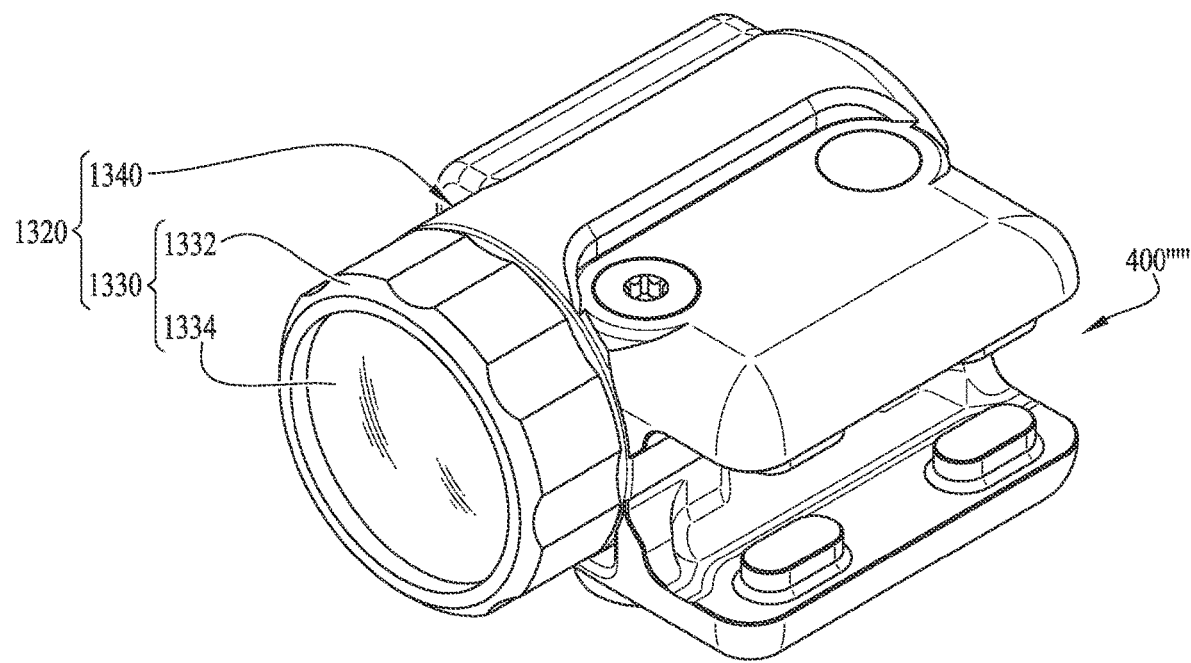
Figure 177:
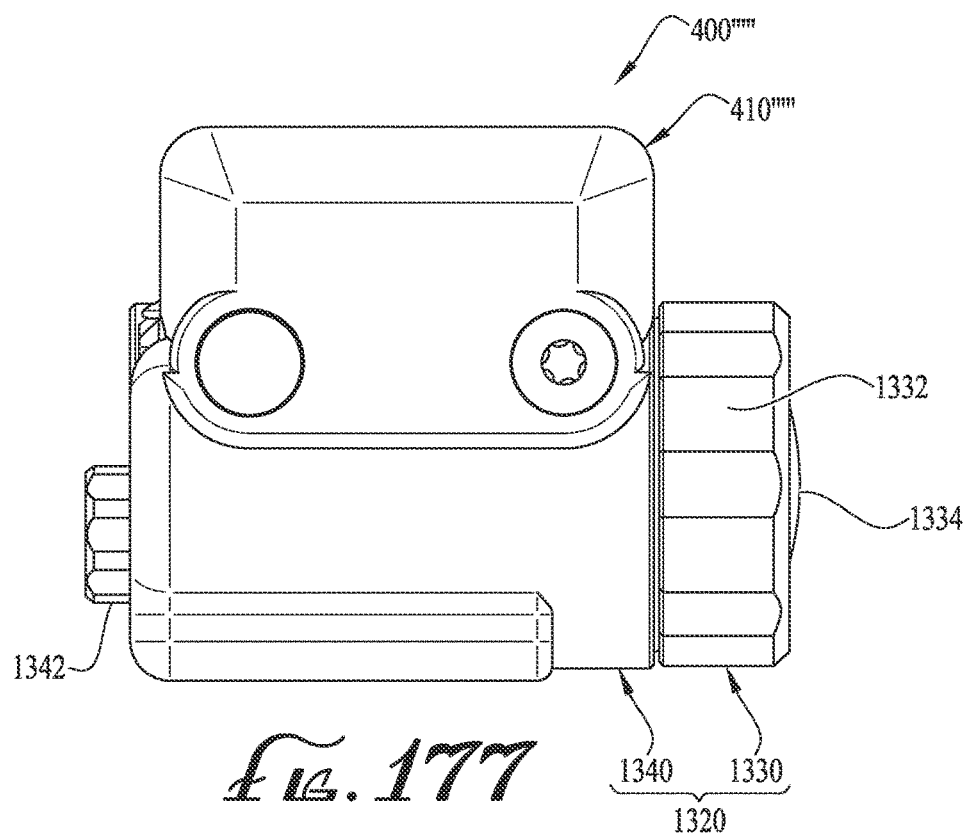
Figure 179:
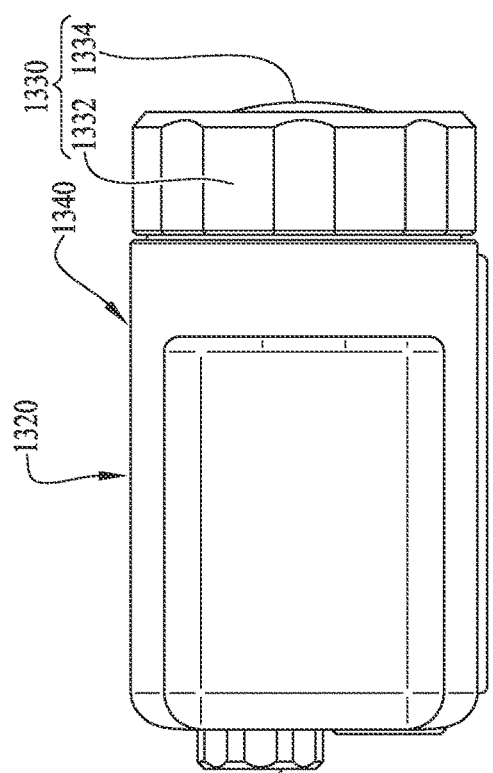
Figure 178:
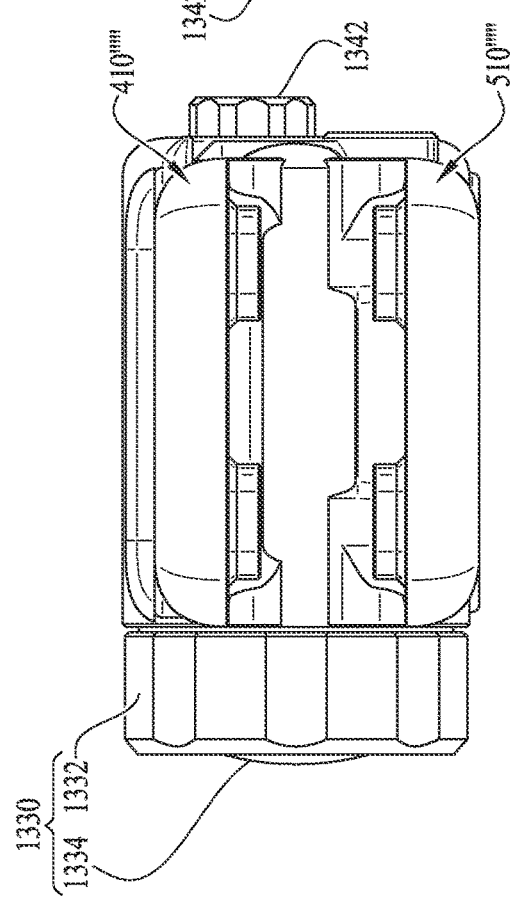
Figure 181:
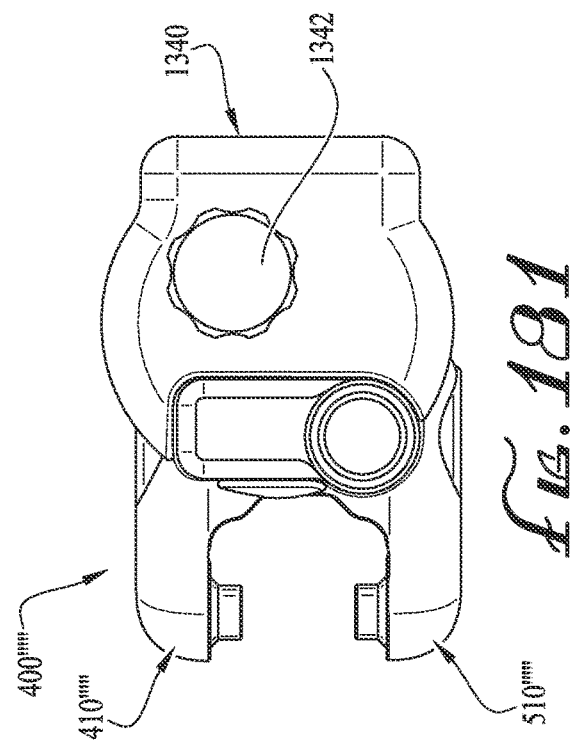
Figure 180:
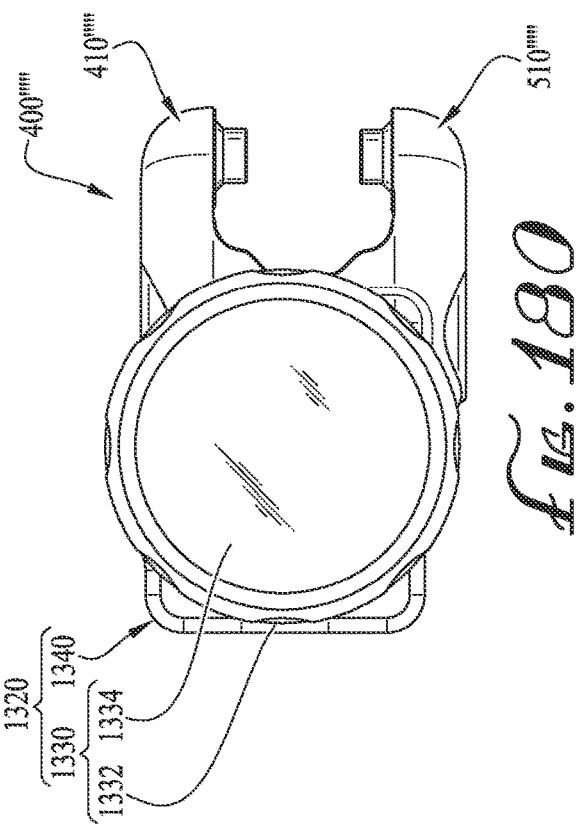
Figure 182:
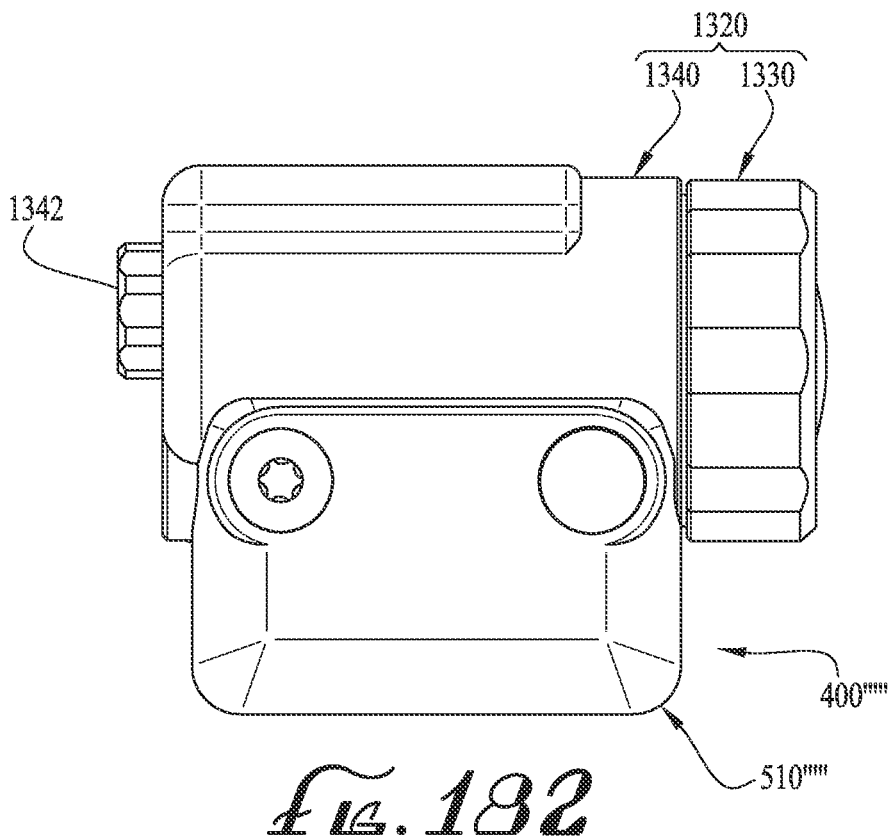
Figure 183:
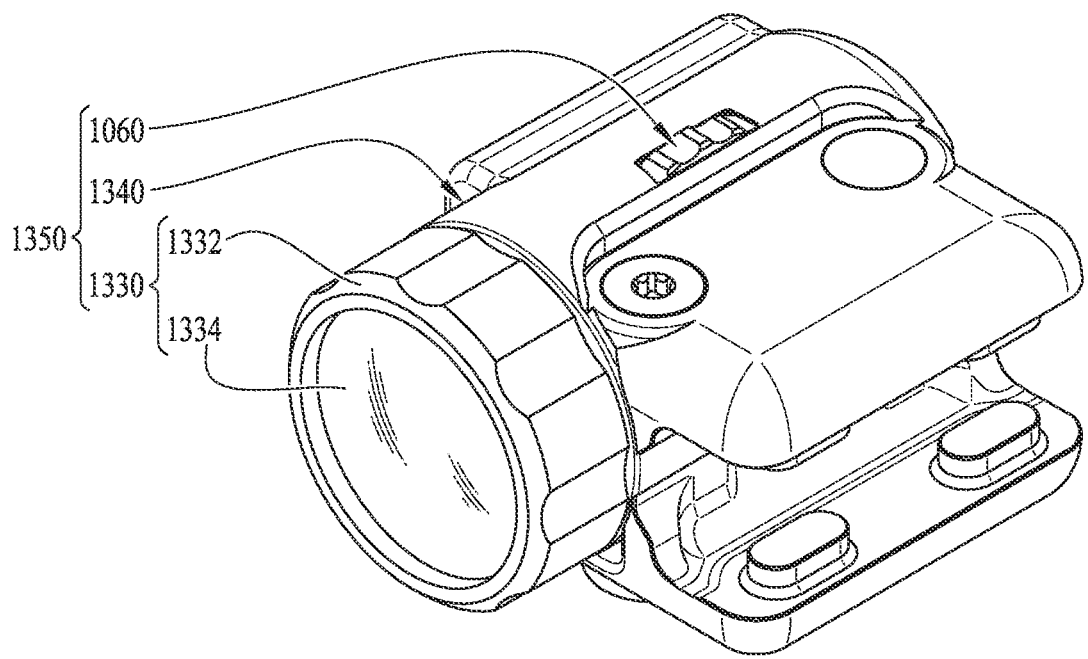

FIG. 132 is a first side plan view of the hinged socket of FIG. 127;

FIG. 133 is a second side plan view of the hinged socket of FIG. 127;

FIG. 134 is an exploded front top perspective view of the hinged socket of FIG. 127 with a coupler disclosed herein;

FIG. 135 is a cross-sectional side view of the hinged socket of FIG. 127, taken at 135-135, showing detent assembly;

FIG. 136 is a first side plan view of the hinged socket of FIG. 127, showing hinged socket in a first angular position;

FIG. 137 is a first side plan view of the hinged socket of FIG. 127, showing hinged socket in a second angular position;

FIG. 138 is a first side plan view of the hinged socket of FIG. 127, showing hinged socket in a third angular position;

FIG. 139 is an exploded top perspective view of a latching socket assembly disclosed herein;

FIG. 140 is an exploded bottom perspective view of a latching socket assembly of FIG. 139;

FIG. 141 is a cross-sectional side view of the hinged socket of FIG. 127, socket without latching pins;

FIG. 142 is a cross-sectional side view of the hinged socket of FIG. 133, taken at 142-142, showing socket with latching pins disclosed herein;

FIG. 143 is a cross-sectional side view of the hinged socket of FIG. 127, showing latching pin housing without latching pins;

FIG. 144 is a cross-sectional side view of the hinged socket of FIG. 130, taken at 144-144, showing latching pin housing with latching pins disclosed herein;

FIG. 145 is a top plan view of a first latching pin disclosed herein;

FIG. 146 is a first end plan view of the first latching pin of FIG. 145;

FIG. 147 is a second end plan view of the first latching pin of FIG. 145;

FIG. 148 is a cross-sectional side view of the first latching pin of FIG. 146, taken at 148-148, showing socket with latching pins disclosed herein;

FIG. 149 is a top plan view of a second latching pin disclosed herein;

FIG. 150 is a first end plan view of the first latching pin of FIG. 149;

FIG. 151 is a second end plan view of the first latching pin of FIG. 149;

FIG. 152 is a cross-sectional side view of the first latching pin of FIG. 150, taken at 152-152, showing socket with latching pins disclosed herein;

FIG. 153 is a top plan view of a latching socket assembly of FIG. 139, showing latching pins in a locked position;

FIG. 154 is a top plan view of a latching socket assembly of FIG. 139, showing latching pins in an unlocked position;

FIG. 155 is a front plan view of a coupler disclosed herein;

FIG. 156 is a side plan view of the coupler of FIG. 155;

FIG. 157 is a front plan view of a coupler disclosed herein;

FIG. 158 is a front top perspective view of the coupler of FIG. 157;

FIG. 159 is a side plan view of a coupler adaptor disclosed herein;

FIG. 160 is an exploded top perspective view of the coupler adaptor of FIG. 159;

FIG. 161 is an exploded bottom perspective view of the coupler adaptor of FIG. 159;

FIG. 162 is a side plan view of a coupler adaptor disclosed herein;

FIG. 163 is an exploded top perspective view of the coupler adaptor of FIG. 162;

FIG. 164 is an exploded bottom perspective view of the coupler adaptor of FIG. 162;

FIG. 165 is a side plan view of a coupler adaptor disclosed herein;

FIG. 166 is a top perspective view of the coupler adaptor of FIG. 165;

FIG. 167 is an exploded front top perspective view of a first jaw of a bracket having a hinged coupler disclosed herein;

FIG. 168 is a front top perspective view of a hinged base disclosed herein;

FIG. 169 is a front bottom perspective view of the hinged base of FIG. 168;

FIG. 170 is a back top perspective view of the hinged base of FIG. 168 assembled with a hinged coupler of FIG. 167;

FIG. 171 is a top plan view of the hinged base assembled with the hinged coupler of FIG. 170;

FIG. 172 is a top perspective view of the hinged base assembled with the hinged coupler of FIG. 170, showing placement of a plurality of devices in the hinged coupler;

FIG. 173 is a side perspective view of the handgrip disclosed herein;

FIG. 174 is a side plan view of the handgrip of FIG. 173;

FIG. 175 is a front top perspective view of the handgrip of FIG. 173;

FIG. 176 is a front top perspective view of a bracket having an integrated light disclosed herein;

FIG. 177 is a top plan view of the bracket having an integrated light of FIG. 176;

FIG. 178 is a front plan view of the bracket having an integrated light of FIG. 176;

FIG. 179 is a back plan view of the bracket having an integrated light of FIG. 176;

FIG. 180 is a first side plan view of the bracket having an integrated light of FIG. 176;

FIG. 181 is a second side plan view of the bracket having an integrated light of FIG. 176;

FIG. 182 is a bottom side plan view of the bracket having an integrated light of FIG. 176; and FIG. 183 is a front top perspective view of a bracket having an integrated light disclosed herein.

Listing of Reference Numbers Associated with Drawings

| Ref No. | Element |
|---|---|
| D1 | Device - Phone |
| D2 | Device - GPS |
| D3 | Device - Compass |
| D4 | Device - Flashlight |
| J1 | First jack of device D (audio jack) |
| J2 | Second jack of device D (data/power jack) |
| P | Speaker/Microphone of device D1 |
| B1 | First button of device D1 |
| B2 | Second button of device D1 |
| B3 | Third button of device D1 |
| 10 | Mounting system |
| 12 | Arrow |
| 14 | Arrow up |
| 15 | Arrow forward |
| 16 | Arrow inward |
| 17 | Arrow down |
| 18 | Arrow rotation vertical |
| 19 | Arrow rotation horizontal |
| 20 | Rail |
| 22 | Body of rail 20 |
| 24 | First end of body of rail 20 |
| 26 | Second end of body of rail 20 |
| 30 | First engagement surface of rail 20 |
| 32 | Second engagement surface of rail 20 |
| 34 | Third engagement surface of rail 20 |
| 36 | Fourth engagement surface of rail 20 |
| 38 | Base support of rail 20 |
| 39 | Engagement surface of rail 20 |
| 40 | First engagement slot of rail 20, device case 100 |
| 42 | Second engagement slot of rail 20, device case 100 |
| 46 | Engagement slot of rail 20 |
| 48 | Engagement slot of rail 20 |
| 50 | Tab of rail 20 |
| 54 | Tab insert of rail 20 |
| 56 | Thumb lock release of rail 20 |
| 58 | Through hole of second engagement surface 42 for screw 100 |
| 59 | Countersink of through hole 58 |
| 60 | Handguard |
| 62 | M-Lok engagement slot |
| 64 | M-Lok engagement slot |
| 70 | Helmet |
| 72 | Shroud bracket mount of helmet 70 |
| 74 | ACH-ARC mount of helmet 70 |
| 90 | Screw of rail 20 |
| 100 | Device case |
| 102 | Insert (threaded support barrel) of device case 100 |
| 103 | Screw for insert 102 of device case 100 |
| 104 | Threaded insert of adaptor attachment point 170 |
| 106 | Threaded insert of sealing plate 200 |
| 107 | Screw for insert 106 |
| 110 | First frame member of device case 100 |
| 111 | First side of first frame 122 |
| 112 | Second side of first frame 122 |
| 113 | Third side of first frame 122 |
| 114 | Fourth side of first frame 122 |
| 115 | Outer perimeter of first frame 122 |
| 116 | Inner perimeter of first frame 122 |
| 117 | Internal space of first frame 122 |
| 118 | Mortise portion of outer perimeter of first frame 122 |
| 120 | Top surface of first frame 122 |
| 121 | Bottom surface of first frame 122 |
| 122 | Outer side surface of first frame 122 |
| 123 | Inner side surface of first frame 122 |
| 124 | Overhang of inner perimeter of first frame member 122 |
| 125 | Ridge of top surface of overhang of inner perimeter of first frame member 122 |
| 126 | Seat for gasket 240 |
| 127 | Mortise of bottom surface of outer perimeter of first frame 122 |
| 128 | Seat for insert (threaded binding barrel) 160 |
| 130 | Second frame member of device case 100 |
| 131 | First side of second frame 124 |
| 132 | Second side of second frame 124 |
| 133 | Third side of second frame 124 |
| 134 | Fourth side of second frame 124 |
| 135 | Outer perimeter of second frame 124 |
| 136 | Inner perimeter of second frame 124 |
| 137 | Internal space of second frame 124 |
| 138 | Mortise portion of outer perimeter of second frame member 124 |
| 140 | Top surface of second frame 124 |
| 141 | Bottom surface of second frame 124 |
| 142 | Outer side surface of second frame 124 |
| 143 | Inner side surface of second frame 124 |
| 144 | Overhang of inner perimeter of second frame member 124 |
| 145 | Ridge of top surface of overhang of inner perimeter of second frame member 124 |
| 146 | Seat for gasket 240 |
| 147 | Mortise of bottom surface of outer perimeter of second frame member 124 |
| 148 | Seat for insert (threaded binding barrel) 160 |
| 150 | Sidewall frame member of device case 100 |
| 151 | First side of sidewall frame 126 |
| 152 | Second side of sidewall frame 126 |
| 153 | Third side of sidewall frame 126 |
| 154 | Fourth side of second frame 124 |
| 155 | Outer perimeter of sidewall frame 126 |
| 156 | Inner perimeter of sidewall frame 126 |
| 157 | Internal space of sidewall frame 126 |
| 158 | Locking slot of outer side surface of sidewall frame 126 |
| 159 | Locking tooth of outer side surface of sidewall frame 126 |
| 160 | First port of outer side surface of sidewall frame 126 |
| 161 | Through hole of first port 160 |
| 162 | Second port of outer side surface of sidewall frame 126 |
| 163 | Through hole of second port 162 |
| 164 | Third port of outer side surface of sidewall frame 126 |
| 165 | Through hole of third port 164 |
| 170 | Adaptor attachment plate of sidewall frame member 126 |
| 172 | Threaded port of adaptor attachment plate 170 |
| 173 | Through hole of threaded port of adaptor 172 |
| 174 | First indexing blind hole of adaptor attachment plate 170 |
| 176 | Second indexing blind hole of adaptor attachment plate 170 |
| 180 | First button insert port of outer side surface of sidewall frame 126 |
| 181 | Through hole of first button insert port 180 |
| 182 | Second button insert port of outer side surface of sidewall frame 126 |
| 183 | Through hole of second button insert port 182 |
| 184 | Third button insert port of outer side surface of sidewall frame 126 |
| 185 | Through hole of third button insert port 184 |
| 186 | Fourth button insert port of outer side surface of sidewall frame 126 |
| 187 | Through hole of fourth button insert port 186 |
| 190 | Top surface of sidewall frame member 126 |
| 191 | Bottom surface of sidewall frame member 126 |
| 192 | Outer side surface of sidewall frame 126 |
| 193 | Inner side surface of sidewall frame 126 |
| 194 | Tenon of top surface of sidewall frame member 126 |
| 195 | Notch of top surface of sidewall frame member 126 |
| 196 | Tenon of bottom surface of sidewall frame member 126 |
| 197 | Notch of bottom surface of sidewall frame member 126 |
| 198 | Seat for gasket 240 |
| 199 | Mortise portion of device case 100 |
| 200 | Sealing plate of device case 100 |
| 202 | Body of sealing plate 200 |
| 204 | Outer surface of sealing plate 200 |
| 206 | Inner surface of sealing plate 200 |
| 208 | Tenon portion of inner surface sealing plate 200 |
| 210 | First port of sealing plate 200 |
| 211 | Through hole of first port 210 |
| 212 | Second port of sealing plate 200 |
| 213 | Through hole of second port 212 |
| 214 | Third port of sealing plate 200 |
| 215 | Through hole of third port 214 |
| 216 | Fourth port of sealing plate 200 |
| 217 | Through hole of fourth port 216 |
| 218 | Threaded hole of sealing plate 200 |
| 219 | Threaded hole of sealing plate 200 |
| 220 | Sealing cap of first port 210 |
| 221 | Grip disc of sealing cap 220 |
| 222 | Plug of sealing cap 220 |

Listing of Reference Numbers Associated with Drawings

| Ref No. | Element |
|---|---|
| 223 | Screw of sealing caps 220, 224 |
| 224 | Sealing cap of second port 212 |
| 225 | Grip disc of sealing cap 220 |
| 226 | Plug of sealing cap 220 |
| 227 | O-ring of sealing caps 220, 224 |
| 228 | Lanyard of sealing caps 220, 224 |
| 230 | First hollow boss of first port 210 |
| 231 | Through hole of first hollow boss 230 |
| 232 | Leading edge of first hollow boss 230 |
| 234 | Second hollow boss of second port 212 |
| 235 | Through hole of second hollow boss 234 |
| 236 | Leading edge of second hollow boss 234 |
| 240 | Gasket of device case 100 |
| 241 | First side of gasket 240 |
| 242 | Second side of gasket 240 |
| 243 | Third side of gasket 240 |
| 244 | Fourth side of gasket 240 |
| 245 | Outer perimeter of gasket 240 |
| 246 | Inner perimeter of gasket 240 |
| 247 | Internal space of gasket 240 |
| 250 | Through hole for first engagement slot of device case 100 |
| 252 | Through hole for second engagement slot of device case 100 |
| 258 | Through hole of gasket 240 for screw 100 |
| 260 | First port of gasket 240 |
| 261 | Through hole of first port 260 |
| 262 | Second port of gasket 240 |
| 263 | Through hole of second port 262 |
| 264 | Third port of gasket 240 |
| 265 | Blind hole of third port 264 |
| 266 | Fourth port of gasket 240 |
| 267 | Blind hole of fourth port 266 |
| 270 | First button protrusions of gasket 240 |
| 272 | Second button protrusions of gasket 240 |
| 274 | Third button protrusions of gasket 240 |
| 276 | Fourth button protrusions of gasket 240 |
| 280 | Top surface of gasket 240 |
| 281 | Bottom surface of gasket 240 |
| 282 | Outer side surface of gasket 240 |
| 283 | Inner side surface of gasket 240 |
| 284 | Seat of gasket 340 for device D |
| 286 | Notch of gasket 240 |
| 288 | Notch of gasket 240 |
| 300 | Gasket of device case 100 |
| 301 | First side of gasket 300 |
| 302 | Second side of gasket 300 |
| 303 | Third side of gasket 300 |
| 304 | Fourth side of gasket 300 |
| 305 | Outer perimeter of gasket 300 |
| 306 | Inner perimeter of gasket 300 |
| 307 | Bottom of gasket 300 |
| 308 | Open portion of gasket 300 |
| 309 | Device compartment of gasket 300 |
| 310 | First port of gasket 300 |
| 311 | Through hole of first port 260 |
| 312 | Second port of gasket 300 |
| 313 | Through hole of second port 262 |
| 314 | Third port of gasket 300 |
| 315 | Through hole of third port 264 |
| 316 | Fourth port of gasket 300 |
| 317 | Through hole of fourth port 266 |
| 320 | First button protrusions of gasket 300 |
| 322 | Second button protrusions of gasket 300 |
| 324 | Third button protrusions of gasket 300 |
| 326 | Fourth button protrusions of gasket 300 |
| 330 | Button insert of device case 100 |
| 332 | First button insert of device case 100 |
| 334 | Second button insert of device case 100 |
| 336 | Third button insert of device case 100 |
| 338 | Fourth button insert of device case 100 |
| 340 | Top cover of device case 100 |
| 342 | Window of top cover 340 |
| 350 | Bottom cover of device case 100 |
| 352 | Window of bottom cover 340 |
| 400 | Bracket (FIGS. 1A, 51-66) |
| 400' | Bracket with open curved clamping portion |
| 400" | Bracket with cinching mechanism 580 |
| 400''' | Bracket with hinged socket 700 |
| 400'''' | Bracket with hinged coupler 840 |
| 400''''' | Bracket with illuminating device |
| 406 | First jaw compression spring of bracket 400 |
| 408 | Second jaw compression spring of bracket 400 |
| 410 | First jaw member of bracket 400 |
| 410' | First jaw member with open curved clamping portion 422' of bracket 400' |
| 410" | First jaw with cinching assembly 570 of bracket 400' |
| 410''' | First jaw with hinged socket 700 of bracket 400" |
| 410'''' | First jaw with hinged coupler 840 of bracket 400''' |
| 412 | Outer surface of first jaw 410 |
| 414 | Inner surface of first jaw 410 |
| 415 | Front side of first jaw 410 |
| 416 | Back side of first jaw 410 |
| 417 | First side of first jaw 410 |
| 418 | Second side of first jaw 410 |
| 419 | Countersink of outer surface 412 |
| 420 | First mating portion of inner surface of first jaw 414 |
| 422 | First clamping portion of inner surface of first jaw 414 |
| 422' | First open curved clamping portion of inner surface of first jaw 414 |
| 424 | First engagement boss of first clamping portion 422 |
| 426 | Second engagement boss of first clamping portion 422 |
| 428 | Third engagement boss of first clamping portion 422 |
| 430 | Recess of second side 418 for tab 690 |
| 432 | First blind seat hole of first mating portion 420 |
| 434 | Second blind seat hole of first mating portion 420 |
| 436 | Guide pin bore of first mating portion 420 |
| 440 | Latching pin counterbore of first mating portion 420 |
| 442 | Bottom of latching pin counterbore 148 |
| 443 | Step of bottom of latching pin counterbore 148 |
| 444 | Through hole of bottom 442 |
| 450 | Back plate of first jaw 410 |
| 451 | Outer surface of back plate 490 |
| 452 | Inner surface of back plate 490 |
| 453 | Side wall of back plate 490 |
| 454 | Side wall of back plate 490 |
| 455 | Side wall of back plate 490 |
| 460 | Adaptor attachment plate of back plate 450 |
| 462 | Threaded blind port of adaptor attachment plate 470 |
| 464 | First indexing blind hole of adaptor attachment plate 470 |
| 466 | Second indexing blind hole of adaptor attachment plate 470 |
| 510 | Second jaw of bracket 400 |
| 510' | Second jaw with open curved clamping portion 522' of bracket 400' |
| 512 | Outer surface of second jaw 510 |
| 514 | Inner surface of second jaw 510 |
| 515 | Front side of second jaw 510 |
| 516 | Back side of second jaw 510 |
| 517 | First side of second jaw 510 |
| 518 | Second side of second jaw 510 |
| 519 | Countersink of outer surface 512 |
| 520 | Second mating portion of inner surface 514 |
| 522 | Second clamping portion of inner surface 514 |
| 522' | Second open curved clamping portion of inner surface 514 |
| 524 | First engagement boss of second clamping portion 522 |
| 526 | Second engagement boss of second clamping portion 522 |
| 528 | Third engagement boss of second clamping portion 522 |
| 530 | Recess of second side 518 for tab 690 |
| 532 | First blind seat hole of second mating portion 520 |
| 534 | Second blind seat hole of second mating portion 520 |
| 536 | Latching pin bore of second mating portion 520 |
| 540 | Guide pin counterbore of second mating portion 520 |
| 542 | Bottom of guide pin counterbore 480 |
| 543 | Step of bottom of guide pin counterbore 480 |
| 544 | Through hole of bottom 482 |
| 550 | Back plate recess of back side 456 |
| 552 | Back wall of back plate recess 490 |
| 553 | Side wall of back plate recess 490 |
| 554 | Side wall of back plate recess 490 |
| 555 | Side wall of back plate recess 490 |

-continued

Listing of Reference Numbers Associated with Drawings

| Ref No. | Element |
|---|---|
| 560 | Latch bolt bore of second jaw 510 |
| 562 | Larger diameter portion of latch bolt bore 560 |
| 564 | Smaller diameter portion of latch bolt bore 560 |
| 566 | Opening of latch bolt bore 560 |
| 568 | Recess of first side 517 for bolt terminus |
| 570 | Cinching assembly housing of outer surface 512 |
| 571 | Bottom surface |
| 572 | Open front |
| 574 | Back side |
| 576 | First side |
| 578 | Second side |
| 580 | Release compartment |
| 582 | First groove of release compartment |
| 584 | First groove of release compartment |
| 586 | Adjustment plate compartment |
| 588 | Through hole of cinching assembly housing 570 |
| 590 | Cinching plate housing of clamping portion 522 |
| 600 | Pin assembly of bracket 400 |
| 610 | Guide pin of pin assembly 600 |
| 612 | Body of guide pin 610 |
| 614 | First end of body 612 |
| 616 | Second end of body 612 |
| 618 | Notch of second end 616 |
| 619 | Threaded blind hole of second end 616 |
| 620 | Screw of guide pin 610 |
| 622 | Smooth portion |
| 624 | Threaded portion |
| 630 | Latching pin of pin assembly 600 |
| 632 | Body of latching pin 630 |
| 634 | First end of body 632 |
| 636 | Second end of body 632 |
| 638 | Notch of second end 636 |
| 639 | Threaded blind hole of second end 636 |
| 640 | Bolt channel of latching pin 630 |
| 642 | Through hole of latching pin 630 |
| 644 | Bolt stop of bolt channel 640 |
| 650 | Screw of latching pin 630 |
| 652 | Smooth portion of screw 650 |
| 654 | Threaded portion of screw 650 |
| 660 | Latch bolt (FIGS. 93-95) |
| 662 | Body of latch bolt 660 |
| 664 | First end (terminus) of body 662 |
| 666 | Second end of body 662 |
| 667 | Threaded blind hole of second end 666 |
| 668 | Latch bolt pin of body 662 |
| 669 | Annular shoulder of body 662 |
| 670 | Compression spring housing of body 662 |
| 672 | Channel of compression spring housing |
| 674 | Seat of compression spring housing |
| 675 | Limiter slot of compression spring housing |
| 676 | First limiter wall of limiter slot 178 |
| 677 | Second limiter wall of limiter slot 178 |
| 678 | Latching pin screw through hole of limiter slot 178 |
| 679 | Compression spring of compression spring housing |
| 680 | Detent plunger assembly of latch bolt 660 |
| 682 | Cylinder of detent plunger of detent plunger assembly 680 |
| 684 | Open end of cylinder 682 |
| 686 | Closed end of cylinder 682 |
| 688 | Detent ball of detent plunger assembly 680 |
| 689 | Compression spring of detent ball 688 |
| 690 | Tab of latch bolt 140 |
| 692 | Outside surface of tab 132 |
| 694 | Inside surface of tab 132 |
| 696 | Through hole of tab 132 |
| 698 | Detents of inside surface 694 |
| 699 | Screw of tab 690 |
| 700 | Hinged socket for bracket 400 |
| 710 | Hinged base of hinged socket 700 |
| 712 | First outer knuckle of hinged base 710 |
| 713 | Through hole of first outer knuckle 712 |
| 714 | Second outer knuckle of hinged base 710 |
| 715 | Through hole of second outer knuckle 714 |
| 716 | Hinge pin of hinged base 710 |
| 717 | Pin portion of hinge pin 716 |

-continued

Listing of Reference Numbers Associated with Drawings

| Ref No. | Element |
|---|---|
| 718 | Screw of hinge pin 716 |
| 719 | Recess for hinge socket 700 |
| 720 | First detent plunger assembly of hinged base 710 |
| 722 | Cylinder of detent plunger of detent plunger assembly 720 |
| 724 | Open end of cylinder 722 |
| 726 | Closed end of cylinder 722 |
| 728 | Detent ball of detent plunger assembly 720 |
| 729 | Compression spring of detent ball 728 |
| 720' | Second detent plunger assembly of hinged base 710 |
| 730 | Latching socket assembly of hinged socket 700 |
| 740 | Inner knuckle of latching socket 730 |
| 742 | Rotation portion of inner knuckle 740 |
| 744 | Through hole of rotation portion 742 |
| 746 | First row of detents of rotation portion 742 |
| 748 | Second row of detents of rotation portion 742 |
| 750 | Body housing of inner knuckle 740 |
| 752 | Sleeve wall of body housing 750 |
| 754 | Bottom of body housing 750 |
| 756 | Chamber of body housing 750 |
| 758 | Threaded blind hole of bottom of body housing 750 |
| 760 | First detent plunger assembly of body housing 750 |
| 762 | Cylinder of detent plunger of detent plunger assembly 760 |
| 764 | Open end of cylinder 762 |
| 766 | Closed end of cylinder 762 |
| 768 | Detent ball of detent plunger assembly 760 |
| 769 | Compression spring of detent ball 768 |
| 760' | Second detent plunger assembly of body housing 750 |
| 760" | Third detent plunger assembly of body housing 750 |
| 760"' | Fourth detent plunger assembly of body housing 750 |
| 770 | Socket housing of latching socket 730 |
| 771 | Inner knuckle engagement portion of socket housing 770 |
| 772 | Bottom surface of inner knuckle engagement portion 774 |
| 773 | Detents of bottom 775 |
| 774 | Latching pin housing of socket housing 770 |
| 775 | Socket of socket housing 770 |
| 776 | Attachment chamber of socket 775 |
| 777 | Latching pin chamber of socket 775 |
| 778 | Through hole of socket housing 770 |
| 779 | Screw of socket housing 770 |
| 780 | First latching pin housing of socket housing 770 |
| 781 | Bore of first latching pin housing 780 |
| 782 | First open end of bore 782 |
| 783 | Second open end of bore 782 |
| 784 | Thorough hole of bore 782 |
| 785 | Spring cup of first latching pin housing 780 |
| 786 | Spring seat of spring cup 785 |
| 787 | First open end of spring seat 786 |
| 788 | Second closed end spring seat 786 |
| 789 | Pin hole of first latching pin housing 780 |
| 790 | First latching pin of first latching pin housing 780 |
| 792 | Body of first latching pin 790 |
| 794 | First end of first latching pin 790 |
| 796 | Second end of first latching pin 790 |
| 798 | Blind hole of second end 786 |
| 800 | Keyway cutout of first latching pin 790 |
| 801 | First side of keyway cutout 800 |
| 802 | Second side of keyway cutout 800 |
| 803 | Third side of keyway cutout 800 |
| 804 | Shoulder of first latching pin 790 |
| 806 | Limiter slot of first latching pin 790 |
| 808 | First latching spring of first latching pin 790 |
| 809 | Pin of first latching pin housing 780 |
| 810 | Second latching pin housing of socket housing 770 |
| 811 | Bore of second latching pin housing 810 |
| 812 | First open end of bore 812 |
| 813 | Second open end of bore 812 |
| 814 | Thorough hole of bore 812 |
| 815 | Spring cup of second latching pin housing 810 |
| 816 | Spring seat of spring cup 815 |
| 817 | First open end of spring seat 816 |
| 818 | Second closed end spring seat 816 |
| 819 | Pin hole of second latching pin housing 810 |
| 820 | Second latching pin of second latching pin housing 810 |
| 822 | Body of second latching pin 820 |

Listing of Reference Numbers Associated with Drawings

| Ref No. | Element |
|---|---|
| 824 | First end of second latching pin 820 |
| 826 | Second end of second latching pin 820 |
| 828 | Blind hole of second end 816 |
| 830 | Keyway cutout of second latching pin 820 |
| 831 | First side of keyway cutout 830 |
| 832 | Second side of keyway cutout 830 |
| 833 | Third side of keyway cutout 830 |
| 834 | Shoulder of second latching pin 820 |
| 836 | Limiter slot of first latching pin 782 |
| 838 | Second latching spring of second latching pin 820 |
| 839 | Pin of second latching pin housing 810 |
| 840 | Hinged coupler for bracket 400 |
| 850 | Hinged base of hinged coupler 840 |
| 852 | First outer knuckle of hinged base 850 |
| 853 | Through hole of first outer knuckle 852 |
| 854 | Second outer knuckle of hinged base 850 |
| 855 | Through hole of second outer knuckle 854 |
| 856 | Hinge pin of hinged base 840 |
| 857 | Pin portion of hinge pin 856 |
| 858 | Screw of hinge pin 856 |
| 859 | Recess for male hinge coupler 840 |
| 860 | First detent plunger assembly of hinged base 850 |
| 862 | Cylinder of detent plunger of detent plunger assembly 860 |
| 864 | Open end of cylinder 862 |
| 866 | Closed end of cylinder 862 |
| 868 | Detent ball of detent plunger assembly 860 |
| 869 | Compression spring of detent ball 868 |
| 860' | Second detent plunger assembly of hinged base 850 |
| 870 | Coupler assembly of hinged coupler 840 |
| 880 | Inner knuckle of coupler assembly 870 |
| 882 | Rotation portion of inner knuckle 880 |
| 884 | Through hole of rotation portion 882 |
| 886 | First row of detents of rotation portion 882 |
| 888 | Second row of detents of rotation portion 882 |
| 890 | Coupler assembly of hinged coupler 840 |
| 892 | Inner knuckle of coupler assembly 890 |
| 893 | Rotation portion of inner knuckle 740 |
| 894 | Through hole of rotation portion 742 |
| 895 | First row of detents of rotation portion 742 |
| 896 | Second row of detents of rotation portion 742 |
| 898 | Coupler base of inner knuckle 740 |
| 900 | Bracket adaptor device mount A1 for bracket 400 |
| 902 | Adaptor screw of bracket adaptor 900 |
| 904 | Disc of adaptor screw 900 |
| 906 | Top surface of disc 904 |
| 908 | Bottom surface of disc 904 |
| 910 | Detent of bottom surface 908 |
| 912 | Threaded portion of adaptor screw 902 |
| 914 | Groove of threaded screw 914 |
| 916 | Retaining clip of adaptor screw 902 |
| 920 | Device mount of bracket adaptor 900 |
| 922 | Top surface of adaptor base 920 |
| 924 | Bottom surface of adaptor base 920 |
| 926 | Attachment portion of adaptor base 920 |
| 927 | Through hole of adaptor base 920 |
| 928 | First indexing pin of bottom surface 924 |
| 929 | Second indexing pin of bottom surface 924 |
| 930 | Detent plunger assembly of adaptor base 920 |
| 932 | Cylinder of detent plunger of detent plunger assembly 930 |
| 934 | Open end of cylinder 932 |
| 936 | Closed end of cylinder 932 |
| 938 | Detent ball of detent plunger assembly 930 |
| 939 | Compression spring of detent ball 938 |
| 940 | Bracket adaptor device mount A2 for bracket 400 |
| 942 | Bracket mount of bracket adaptor mount 940 |
| 943 | Body of bracket mount portion 942 |
| 944 | Top surface of body 943 |
| 945 | Bottom surface of body 943 |
| 946 | Front of body 943 |
| 947 | Back of body 943 |
| 948 | First side of body 943 |
| 949 | Second side of body 943 |
| 950 | Threaded blind hole of top surface 946 |
| 952 | Through hole of bracket mount portion 942 |
| 954 | First indexing pin of bottom surface 948 |
| 956 | Second indexing pin of bottom surface 948 |
| 958 | Plate extension |
| 960 | Device mount of bracket adaptor mount 940 |
| 961 | Body of device mount 960 |
| 962 | Top surface of body 961 |
| 963 | Bottom surface of body 962 |
| 964 | Front of body 962 |
| 965 | Back of body 962 |
| 966 | First side of body 962 |
| 967 | Second side of body 962 |
| 968 | Mounting surface of top surface 962 |
| 969 | Recessed portion of top surface 962 |
| 970 | Through hole of recessed portion 969 |
| 972 | Through hole of device mount 960 |
| 974 | Through hole of mounting surface 968 |
| 976 | Screw for bracket mount 942 |
| 977 | Screw for bracket 400 |
| 978 | Screw for device mount 960 |
| 980 | Coupler |
| 980' | Hybrid coupler C1 |
| 980" | Hybrid coupler C2 |
| 982 | Body of coupler 980 |
| 983 | First attachment portion of body 982 |
| 984 | First head of coupler 980 |
| 985 | Leading edge of first head 984 |
| 986 | First circumferential grooves of coupler 980 |
| 987 | First shoulder of body 982 |
| 988 | Shoulder of first head 984 |
| 993 | Second attachment portion of body 982 |
| 994 | Second head of coupler 980 |
| 995 | Leading edge of second head 994 |
| 996 | Second circumferential grooves of coupler 980 |
| 997 | Second shoulder of body 982 |
| 998 | Shoulder of second head 994 |
| 1000 | Hybrid coupler with cinching mechanism C3 |
| 1002 | Indexing plate of cinching coupler 1000 |
| 1004 | Top surface of indexing plate 1002 |
| 1006 | Bottom surface of indexing plate 1002 |
| 1008 | Though hole of indexing plate 1002 |
| 1010 | First indexing pin of top surface 1004 |
| 1012 | Second indexing pin of top surface 1004 |
| 1014 | Detent of bottom surface 1006 |
| 1020 | Adaptor base of cinching coupler 1000 |
| 1022 | Top surface of adaptor base 1020 |
| 1024 | Bottom surface of adaptor base 1020 |
| 1026 | Threaded screw of bottom surface 1024 |
| 1028 | Groove of threaded screw 1026 |
| 1029 | Retaining clip of cinching adaptor 1020 |
| 1030 | Detent plunger assembly of adaptor base 1020 |
| 1032 | Cylinder of detent plunger of detent plunger assembly 1030 |
| 1034 | Open end of cylinder 1032 |
| 1036 | Open threaded end of cylinder 1032 |
| 1037 | Set screw of detent plunger assembly 1030 |
| 1038 | Detent ball of detent plunger assembly 1030 |
| 1039 | Compression spring of detent ball 1038 |
| 1040 | Hybrid coupler with cinching mechanism C4 |
| 1042 | Indexing plate of cinching coupler 1040 |
| 1044 | Top surface of indexing plate 1042 |
| 1046 | Bottom surface of indexing plate 1042 |
| 1048 | Though hole of indexing plate 1042 |
| 1050 | First indexing pin of top surface 1044 |
| 1052 | Second indexing pin of top surface 1044 |
| 1054 | First threaded blind hole of bottom surface 1046 |
| 1056 | Second threaded blind hole of bottom surface 1046 |
| 1057 | Screw |
| 1060 | Adaptor screw of cinching coupler 1040 |
| 1062 | Disc of adaptor screw 1060 |
| 1064 | Top surface of disc 1062 |
| 1066 | Bottom surface of disc 1062 |
| 1068 | Treaded portion of adaptor screw 1060 |
| 1069 | Detent of bottom surface 1066 |
| 1070 | Adaptor base of cinching coupler 1040 |
| 1072 | Top surface of adaptor base 1070 |

-continued

Listing of Reference Numbers Associated with Drawings

| Ref No. | Element |
|---|---|
| 1074 | First through hole of adaptor base 1070 |
| 1076 | Second through hole of adaptor base 1070 |
| 1078 | Internal housing of adaptor base 1070 |
| 1080 | Detent plunger assembly of adaptor base 1070 |
| 1082 | Cylinder of detent plunger of detent plunger assembly 1080 |
| 1084 | Open end of cylinder 1082 |
| 1086 | Closed end of cylinder 1082 |
| 1088 | Detent ball of detent plunger assembly 1080 |
| 1089 | Compression spring of detent ball 1088 |
| 1090 | Hybrid coupler with cinching mechanism C5 |
| 1092 | Indexing plate of cinching coupler 1090 |
| 1094 | Top surface of indexing plate 1092 |
| 1095 | Non-skid pad of top surface 1094 |
| 1096 | Bottom surface of indexing plate 1092 |
| 1098 | Though hole of indexing plate 1092 |
| 1100 | First threaded blind hole of bottom surface 1096 |
| 1102 | Second threaded blind hole of bottom surface 1096 |
| 1060 | Adaptor screw of cinching coupler 1090 |
| 1070 | Adaptor base of cinching coupler 1090 |
| 1110 | Hinged coupler with device holders C6 |
| 1120 | Hinged base of hinged coupler 1110 |
| 1122 | First outer knuckle of hinged base 1120 |
| 1123 | Through hole of first outer knuckle 1122 |
| 1124 | Second outer knuckle of hinged base 1120 |
| 1125 | Through hole of second outer knuckle 1124 |
| 1126 | Hinge pin of hinged base 1120 |
| 1127 | Pin portion of hinge pin 1126 |
| 1128 | Screw of hinge pin 1126 |
| 1129 | Recess for coupler assembly 1150 |
| 1130 | First detent plunger assembly of hinged base 1120 |
| 1132 | Cylinder of detent plunger of detent plunger assembly 1130 |
| 1134 | Open end of cylinder 1132 |
| 1136 | Closed end of cylinder 1132 |
| 1138 | Detent ball of detent plunger assembly 1130 |
| 1139 | Compression spring of detent ball 1138 |
| 1130' | Second detent plunger assembly of hinged base 1130 |
| 1140 | First device holder of hinged base 1120 |
| 1142 | Second device holder of hinged base 1120 |
| 1150 | Coupler assembly of hinged coupler 1110 |
| 1160 | Inner knuckle of coupler assembly 870 |
| 1162 | Rotation portion of inner knuckle 880 |
| 1164 | Through hole of rotation portion 882 |
| 1166 | First row of detents of rotation portion 882 |
| 1168 | Second row of detents of rotation portion 882 |
| 1169 | Coupler base portion of coupler assembly 870 |
| 1200 | Cinching assembly for second jaw 510 |
| 1210 | Adjustment plate of cinching assembly 1200 |
| 1212 | Adjustment dial of adjustment plate 1210 |
| 1214 | Top surface of adjustment dial 1210 |
| 1216 | Bottom surface of disc of adjustment dial 1210 |
| 1217 | Side of adjustment dial 1210 |
| 1218 | Griping slots of side 1217 |
| 1219 | Teeth slots of side 1217 |
| 1220 | Threaded hollow boss of adjustment dial 1210 |
| 1222 | Exterior threaded surface of hollow boss 1220 |
| 1224 | Internal surface of hollow boss 1220 |
| 1226 | Internal compartment of hollow boss 1220 |
| 1228 | Bottom of interior compartment 1226 |
| 1229 | Threaded blind hole of interior compartment 1226 |
| 1230 | Cinching plate of cinching assembly 1200 |
| 1232 | Top surface of cinching plate 1230 |
| 1234 | Bottom surface of cinching plate 1230 |
| 1236 | Cinching pad portion of top surface 1232 |
| 1238 | Through hole of cinching plate 1230 |
| 1240 | Insert portion of bottom portion 1238 |
| 1242 | Screw of cinching plate 1230 |
| 1250 | Release of cinching assembly 1200 |
| 1252 | Front side of release 1250 |
| 1254 | Back side of release 1250 |
| 1256 | First side of release 1250 |
| 1257 | Tongue of first side 1256 |
| 1258 | Second side of release 1250 |
| 1259 | Tongue of second side 1258 |
| 1260 | Locking teeth of release 1250 |

-continued

Listing of Reference Numbers Associated with Drawings

| Ref No. | Element |
|---|---|
| 1262 | Compression spring of release 1250 |
| 1300 | Grip |
| 1302 | Body of grip 1300 |
| 1304 | First end of body 1302 |
| 1306 | Second end of body 1302 |
| 1308 | Gripping portion of body 1302 |
| 1320 | Illuminating device |
| 1330 | Head of illuminating device 1320 |
| 1332 | Face cap of head 1330 |
| 1334 | Lens of head 1330 |
| 1340 | Body of illuminating device 1320 |
| 1342 | Switch of body 1340 |
| 1350 | Illuminating device |

The above-described drawing figures illustrate aspects of the invention in at least one of its exemplary embodiments, which are further defined in detail in the following description. Features, elements, and aspects of the invention that are referenced by the same numerals in different figures represent the same, equivalent, or similar features, elements, or aspects, in accordance with one or more embodiments.

DETAILED DESCRIPTION

A mounting system disclosed herein comprises one or more rails and one or more brackets. The brackets are configured to be reversibly connected to a rail disclosed herein. A mounting system disclosed herein also includes one or more connectors allowing a bracket disclosed herein to be attached to another bracket disclosed herein or enabling a bracket disclosed herein to be attached to one or more components of a third-party mounting system. As such, a mounting system disclosed herein is a modular, versatile, and interchangeable system that enables one or more rails, one or more brackets, and/or one or more connectors of a mounting system disclosed herein to interact with one another or with other third-party rails, brackets and connectors.

A mounting system disclosed herein can be mounted on a wide variety of devices or be used as a mounting support for attaching a wide variety of devices to the mounting support. A mounting system disclosed herein enables a device to be protected from impact and moisture exposure, enables a device to be securely mounted on a mounting support, and enables a device to be quickly secured and removed from a mounting support. In addition, the modular, versatile, and interchangeable design of a mounting system disclosed herein enables a device to be transferably mounted from one location to another location. Furthermore, such design allows a user to mount a plurality of devices together with or without also being mounted on a mounting support.

A device is an electrical or mechanical instrument, equipment, or other apparatus that a user desires to use with a mounting system disclosed herein. Exemplary devices include, without limitation, a computational device like a smart phone, a tablet or a computer, a navigational device such as a compass, a ground positioning system (GPS), an altimeter, a pedometer, a medical device, a health monitoring device such as heart rate monitor, blood pulse monitor, or breathing rate monitor, a lighting device such as a flashlight, a night vision goggle (NVG), or infrared laser, an audiovisual device such as a still camera, a video camera, or an audio recorder, a communications device such as a radio, a headset including a headphone and a microphone, or any other device capable of transmitting and/or receiving an analog or digital signal. A device also includes a firearm, such as a rifle or a handgun, a device associated with the operation maintenance or enjoyment of a vehicle such as a land vehicle, an aircraft, a seacraft or a spacecraft, a device associated with the operation maintenance or enjoyment of residential, commercial or industrial building, or any device a user desires to secure using a mounting system disclosed herein.

A rail disclosed herein serves as an attachment point for one or more brackets disclosed herein. A rail comprises a body having one or more engagement surface and one or more engagement slots. An engagement slot is a recess or depression configured to properly receive an engagement boss of a bracket disclosed herein. In some embodiments, a slot disclosed herein can be a through hole. In some embodiments, a slot disclosed herein can be a blind hole. A body disclosed herein of a rail is configured so that one or more engagement slots are located on one engagement surface, on a subset of engagement surfaces, or on all engagement surfaces of body of a rail disclosed herein. A body disclosed herein can be open ended having at least a first and second end or be closed forming a contiguous structure with no ends. A body disclosed herein can be hollow, having an internal space like a tube or be solid. In some embodiments, a rail disclosed herein can be secured to a device enabling the attachment of a bracket to the device. In some embodiments, a rail disclosed herein can be secured to a surface and serve as a base for the attachment of a bracket.

A rail disclosed herein can comprise engagement slots that are identical in shape or engagement slots having two or more different shapes. An engagement slot disclosed herein can be any perimeter shape with the proviso that the perimeter shape of engagement slot is configured to properly receive an engagement boss of a bracket disclosed herein. Non-limiting examples of a perimeter shape of an engagement slot include a convex perimeter polygonal shape, such as, e.g., a triangular perimeter shape, a square perimeter shape, a rectangular perimeter shape, a pentagonal perimeter shape, a hexagonal perimeter shape, a heptagonal perimeter shape or an octagonal perimeter shape; a star polygonal perimeter shape, such as, e.g., a pentagrammic perimeter shape, a heptagramic perimeter shape, an octagramic perimeter shape or decagramic perimeter shape; or a closed curved perimeter shape such as, e.g., a circular perimeter shape, an ovoidal perimeter shape, an oblong perimeter shape, or any other closed curved perimeter shape. An engagement slot disclosed herein with a convex or star polygonal perimeter shape can have each corner of the perimeter rounded. In addition, an engagement slot disclosed herein can optionally be chamfered to facilitate engagement of an engagement boss of a bracket disclosed herein. Additionally, when an engagement boss of a bracket disclosed herein is filleted, the chamfering of an engagement slot is configured to align with the fillet of the engagement boss.

Where a rail disclosed herein comprises a plurality of engagement slots, such engagement slots can be arranged in directly alignment with one another along the length of a rail disclosed herein. Alternatively, a rail disclosed herein comprises a plurality of engagement slots can arrange such engagement slots in staggered or offset alignment with one another along the length of a rail disclosed herein. Such staggered or offset configuration can be employed to take into account the contour of a surface area of a device that deviates from a linear plane.

A rail disclosed herein can be any 3-dimensional shape based on the application for which a mounting system disclosed herein is employed. For example, a rail disclosed herein can be polyhedral in dimension, such as, e.g., a rail with three surfaces, a rail with four surfaces, a rail with five surfaces, a rail with six surfaces, a rail with seven surfaces, a rail with eight surfaces, a rail with nine surfaces, a rail with ten surfaces or any other closed or open polyhedral structure. A rail disclosed herein can be cylindrical in dimension such as, e.g., a circular rail a, an ovoidal rail, an oblong rail, or any other closed or open curved structure. A rail disclosed herein can also incorporate both closed or open polyhedral structures and closed or open curved structures.

In addition, a rail disclosed herein can be any size based on the application for which a mounting system disclosed herein is employed. Furthermore, the size of a rail disclosed herein can be any size and is typically determined by the particular application and the various parameters and requirements associated with that application, including, without limitation, material composition of the rail, force constraints like shear strength, load-bearing minimums and maximums, space limitations or constraints, and the like. For example, a polyhedral-shaped or cylindrical-shaped rail can be sized for a personal, residential, commercial, or industrial application. For example, a polyhedral-shaped rail can be sized to fit a hand-held device, an interior surface of a vehicle, an exterior surface of a vehicle, a transportation container, or rigging for lighting and/or sound system equipment of a stage, a cinema, a theater, a stadium and/or any other location where such lighting and/or sound system equipment is used. In some embodiments, a polyhedral-shaped rail can be sized to a height of between about 0.5 cm to about 25 cm, a width of between about 0.5 cm to about 25 cm, and a length of about 1 cm to 10 m or more. In some embodiments, a cylindrical-shaped rail can be sized to a diameter at its shortest distance of about 0.5 cm to about 25 cm and a length of about 1 cm to 10 m or more.

A rail disclosed herein can be configured and conformed to the dimensions and contour of a surface or space to which the rail is to be attached or employed. For example, a rail disclosed herein can be a linear structure, for example, a line-structure, a L-shaped structure, a T-shaped structure, an X-shaped structure, or a polygonal structure like a triangular structure, a quadrilateral structure, a pentagonal structure, etc. A rail disclosed herein can be a curvilinear structure, including an open curvilinear structure like a wave, a C-shaped structure, a J-shaped structure, S-shaped structure, a U-shaped structure, or a closed curvilinear structure like a circular structure, an ovoidal structure, an oblong structure, or any other closed curved structure that divides a plane into an interior region and an exterior region.

A rail disclosed herein can be configured and conformed to the dimensions and contour of a device to which the rail is to be attached or employed, such as, e.g., fully or partially around the outside perimeter of a device. For example, in aspects where a device is a smart phone or tablet, a rail conforms to the perimeter of the smart phone or tablet, and is thus typically rectangular in shape. In designing a rail disclosed herein to the dimensions and contour of a device, larger structures can be created. For example, where the rail fully encompasses the outside perimeter of a device, the rail can be further configured to be a case that encloses the device. In addition, components of a device that integrate a mounting system disclosed herein can be created. For example, a handguard commonly used in rifles can be made using a rail disclosed herein.

A rail disclosed herein is designed to replace current rail systems, such as, e.g., an ABS rail system, a dovetail rail system, an E Track rail system, a NATO accessory rail (NAR) system, a Picatinny rail mount system, a Monkey mount rail system, A UIT rail system, a VELCRO®-based mount system, and a Weaver rail mount system.

A rail disclosed herein can be configured to be compatible with a mounting system currently in use, such as, e.g., an Advanced Combat Helmet Accessory Rail Connector (ACH-ARC) mounting system, a KeyMod mounting system, a Modular Lock (M-LOK) mounting system, a RAM® Torque mounting system, and any other Rail Interface/Integration System (RIS) mounting system, also called a Rail Accessory System (RAS) mounting system. Such compatibility is enabled by configuring a rail disclosed herein with an adaptor that secures to such a mounting system. In addition, a rail disclosed herein can be configured as a replacement to a current mounting system. Such replacement is enabled by configuring a rail disclosed herein to make use of the attachment points utilized by the current mounting system. Furthermore, a rail disclosed herein can be configured as an integral component of a device or surface.

A bracket is an apparatus that securely attaches to a rail disclosed herein. A bracket disclosed herein selectively and/or automatically secures or locks to a rail disclosed herein when positioned on the rail by actuating or triggering a locking mechanism disclosed herein to adopted a locked configuration. In addition, a bracket disclosed herein may be selectively removed from a rail by actuating or triggering a locking mechanism disclosed herein to adopted an unlocked configuration. In some embodiments, a bracket disclosed herein securely and removably attaches to a rail secured to a device. In some embodiments, a bracket disclosed herein securely and removably attaches to a rail configured to be a base. In some embodiments, a bracket disclosed herein securely and removably attaches to a rail secured to a device as well as to a rail configured to be a base, thereby connecting the device to the base.

A bracket disclosed herein can comprise a first jaw includes a first clamping portion and a second jaw includes a second clamping portion. In some embodiments, a first clamping portion can include one or more engagement bosses and a second clamping portion can include one or more engagement bosses. An engagement boss is a protruding feature configured to properly insert into an engagement slot disclosed herein. In some embodiments, a first clamping portion does not include any engagement bosses and a second clamping portion does not include any ngagement bosses.

An engagement boss disclosed herein can be any shape with the proviso that the shape of engagement boss is configured to properly insert into an engagement slot of a rail disclosed so that a bracket disclosed herein can be securely connected to a rail disclosed herein. Non-limiting examples of a perimeter shape of an engagement boss include a convex polygonal shape, such as, e.g., a triangular shape, a square shape, a rectangular shape, a pentagonal shape, a hexagonal shape, a heptagonal shape or an octagonal shape; a star polygonal shape, such as, e.g., a pentagrammic shape, a heptagramic shape, an octagramic shape or decagramic shape; ora closed curved shape such as, e.g., a circular shape, an ovoidal shape, an oblong shape, or any other closed curved shape. An engagement boss disclosed herein with a convex or star polygonal shape can have each corner of the shape rounded. In addition, an engagement boss disclosed herein can optionally be filleted. Additionally, when an engagement boss of a bracket disclosed herein is filleted, an engagement slot can be chamfered in a manner that enables alignment with the fillet of the engagement boss with the chamfer of the engagement slot. Optionally, an engagement boss of a bracket disclosed herein can be fitted with an O-ring to further enhance secure connection of a bracket disclosed herein to a rail disclosed herein.

The one or more engagement bosses of the first jaw are arranged in opposition to the one or more engagement bosses of the second jaw. Such opposition can be direct opposition where each engagement boss of the first jaw is directly aligned with its counterpart engagement boss on the second jaw or in staggered opposition where each engagement boss of the first jaw is not in direct aligned with its counterpart engagement boss on the second jaw. In addition, each jaw of a bracket disclosed herein can include a different number of engagement bosses relative to the other jaw. For example, a bracket disclosed herein can comprise a first jaw including a single engagement boss and a second jaw including two or more engagement bosses. Similarly, a bracket disclosed herein can comprise a first jaw including two or more engagement bosses and a second jaw including a single engagement boss. Likewise, a bracket disclosed herein can comprise a first jaw including two or more engagement bosses and a second jaw including two or more engagement bosses where the number of engagement bosses present on the first jaw is different than the number of engagement bosses present on the second jaw.

Regardless of the alignment, the engagement bosses of both the first and second jaw are sized and spaced apart so that each engagement boss selectively fits within a single engagement slot of a rail disclosed herein. Where a bracket disclosed herein comprises two or more engagement bosses on each of the first and second jaws, each engagement boss from a jaw is sized and spaced apart to straddle between two or more adjacent engagement slots so that each engagement boss selectively fits within each engagement slot of the two or more adjacent engagement slots of a rail disclosed herein. Regardless of the arrangement, one or more engagement bosses of the first jaw engage one set of engagement slots of a rail disclosed herein and one or more engagement bosses of the second jaw engage a second set of engagement slots of the rail in order to firmly hold a bracket disclosed herein to rail disclosed herein.

A bracket disclosed herein can be any shape based on the application for which a mounting system disclosed herein is employed so long as the bracket can attached to a rail disclosed herein and that the one or more engagement bosses of a first jaw are arranged in opposition to the one or more engagement bosses of a second jaw. Bracket shapes can generally conform to a hexahedral shape, including, without limitation, cuboidal, rectangular, quadrilateral, rhomboidal, parallelepipial, trigonal trapezohedral (congruent quadrilaterals), and trigonal trapezonhedral (congruent rhombi); or a cylindrical shape, including, without limitation, a right circular cylinder or an oblique circular cylinder.

In addition, a bracket disclosed herein can be any size based on the application for which a mounting system disclosed herein is employed. Furthermore, the size of a bracket disclosed herein can be any size and is typically determined by the particular application and the various parameters and requirements associated with that application, including, without limitation, material composition of the bracket, force constraints like shear strength, load-bearing minimums and maximums, space limitations or constraints, and the like. For example, a hexahedral-shaped or cylindrical-shaped bracket can be sized for a personal, residential, commercial, or industrial application. For example, a polyhedral-shaped bracket can be sized to fit a hand-held device, an interior surface of a vehicle, an exterior surface of a vehicle, a transportation container, or rigging for lighting and/or sound system equipment of a stage, a cinema, a theater, a stadium and/or any other location where such lighting and/or sound system equipment is used. In some embodiments, a polyhedral-shaped bracket can be sized to a height of between about 0.5 cm to about 25 cm, a width of between about 0.5 cm to about 25 cm, and a length of about 1 cm to 10 m or more. In some embodiments, a cylindrical-shaped bracket can be sized to a diameter at its shortest distance of about 0.5 cm to about 25 cm and a length of about 1 cm to 10 m or more.

A connector disclosed herein enables a bracket disclosed herein to be attached to another component. Generally, a connector is configured to engage as a female-male connector assembly, a male-female connector assembly, a female-female connector assembly, a male-male connector assembly. In some embodiments, a connector disclosed herein enables a bracket disclosed herein to attach to another bracket disclosed herein. In some embodiments, a connector disclosed herein enables a bracket disclosed herein to attach to a rail disclosed herein. In some embodiments, a connector disclosed herein enables a bracket disclosed herein to attach to a device disclosed herein.

One exemplary embodiment of a mounting system disclosed herein is mounting system 10 as illustrated in FIG. 1A-1B. In these embodiments, mounting system 10 comprises a rail 20 and a bracket 400.

A mounting system disclosed herein comprises one or more rails disclosed herein. In some embodiments, and as shown in FIGS. 1-4, rail 20 comprises a body 22 having a first end 24 and a second end 26. Referring to FIGS. 1-3, body 22 comprises a first engagement surface 30, a second engagement surface 32, a third engagement surface 34 and a base support 38. As shown in FIG. 2, each of first, second and third engagement surfaces 30, 32, 34 comprise a single engagement slot 40. Alternatively, each of first, second and third engagement surfaces 30, 32, 34 can each comprise a plurality of engagement slots, with the plurality of engagement slots being identical in shape or composed of two or more different shapes. As shown in FIGS. 1 & 3, each of first, second and third engagement surfaces 30, 32, 34 comprise a plurality of engagement slots 40 and a plurality of engagement slots 42. In some embodiments, and as illustrated in FIGS. 1-3, rail 20 can further comprise a base support 38 which provides stability to body 22 of rail 20 once secured to a mounting support.

Rail 20 of mounting system 10 can be secured to a mounting support by a wide variety of securing techniques, such as, e.g., by screws, bolts, rivets, adhesives, snap-fit device, insert tab, welding, brazing, or other appropriate securing technique. Alternatively, rail 20 can be manufactured as an integral part of a mounting support. In some embodiments, and referring to FIGS. 1-3, rail 20 comprises one or more through holes 58 each through holes 58 configured to allow passage of a screw 90 through rail 20 to enable screw 90 to be secured into a mounting support thereby affixing rail 20 to the mounting support. In addition, and as shown in FIGS. 1A-1C, rail 20 can optionally include one or more securing tabs 50 each of which comprise through holes 58 to receive screw 90. In some embodiments, and referring to FIGS. 1-3, rail 20 comprises one or more through holes 58 each of which allow passage of a molly bolt through rail 20 to enable the molly bolt to be secured into a mounting support thereby affixing rail 20 to the mounting support. Such applications are useful when affixing rail 20, e.g., to a wall or ceiling. In some embodiments, rail 20 comprises pins or rivets used to pierce fabric and then secure rail 20 using the pin or rivet. Such applications are useful when securing a rail to load-bearing system like a safety harness, a climbing harness, a work vest, a tactical vest, a Modular Lightweight Load-carrying Equipment (MOLLE) load bearing system, a Pouch Attachment Ladder System (PALS) load bearing system, an Individual Integrated Fighting System (IIFS) load bearing system, or an All-purpose Lightweight Individual Carrying Equipment (ALICE) load bearing system.

In some embodiments, and as shown in FIGS. 1-3, rail 20 comprises a body 22 that is a linear structure, the length of which can vary depending on the desired application. In such linear configuration, first engagement surface 30 is opposite to second engagement surface 32 with third engagement surface 34 spanning between first engagement surface 30 and second engagement surface 32. In this example embodiment, first engagement surface 30 is generally parallel to second engagement surface 32, with third engagement surface 34 being substantially perpendicular to the two. When present support base 38 is opposite to third engagement surface 34 with support base 38 spanning between first engagement surface 30 and second engagement surface 32, forming a four-sided structure. In some embodiments, third engagement surface 34 or base support 38 can each be within 10 degrees of perpendicular of at least one of first engagement surface 30 and second engagement surface 32.

In this configuration, rail 20 typically serves as a connection point between a bracket disclosed herein and a mounting support. A mounting support includes any solid support structure or a portion of a surface area from a solid support structure where a user desires to secure rail 20 in order to receive a bracket disclosed herein and employ mounting system disclosed herein to mount a device or component thereof. In some embodiments, a mounting support comprises an article of clothing or other item worn by a user including, without limitation, a helmet, personal protective equipment, a personal load bearing system, or any other item worn about the body. In some embodiments, a mounting support comprises a hard surface or portion thereof, including, without limitation, a portion of an exterior or interior surface of a vehicle like land vehicle (a bicycle, automobile, truck, train), aircraft (helicopter, airplane), seacraft (surface vessel, submergible vessel), or spacecraft, such portion of an exterior or interior surface including a dashboard, a handlebar, an exterior panel, or a windshield. In some embodiments, a mounting support comprises an apparatus including, without limitation, a hand-held object, a tripod or other stand, a weapon or weapons system, an electronics housing, or any other apparatus. n some embodiments, a mounting support comprises a third-party mounting system.

In some embodiments, for example rail 20 of FIG. 4, body 22 comprises a first engagement surface 30, a second engagement surface 32, a third engagement surface 34 and a fourth engagement surface 36. In some embodiments, body 22 is a linear structure, the length of which can vary depending on the desired application. In such linear configuration, first engagement surface 30 is opposite to second engagement surface 32 with third engagement surface 34 spanning between first engagement surface 30 and second engagement surface 32. Fourth engagement surface 36 is opposite to third engagement surface 34 with fourth engagement surface 36 spanning between first engagement surface 30 and second engagement surface 32, forming a four-sided structure. In some embodiments, third and fourth engagement surfaces 34, 36 can each be within 10 degrees of perpendicular of at least one of first engagement surface 30 and second engagement surface 32.

Each of first, second, third and fourth engagement surfaces 30, 32, 34, 36 can each comprise a plurality of engagement slots, with the plurality of engagement slots being identical in shape or composed of two or more different shapes. As shown in FIG. 4, each of first, second, third and fourth engagement surfaces 30, 32, 34, 36 comprise a plurality of engagement slots 40 and a plurality of engagement slots 42. In this configuration, rail 20 typically serves the singular purpose of receiving a bracket disclosed herein. For example, rail 20 of FIG. 4 can be secured to a hand grip or stand, like a tripod stand, using a bracket disclosed herein that is attached to or integrated into the hand grip or stand. In this configuration additional devices can then be secured to the free portions of rail 20. For example, a hand grip can be secured to a central portion of rail 20 of FIG. 4 and a video recorder and/or lights can be secured at either side of the hand grip. In aspects of these embodiments, base support 38 and through holes 58 are not included.

In embodiments where rail 20 comprises body 22 configured in a linear structure, at least first engagement surface 30 and second engagement surface 32 include one or more engagement slots. For example, referring to FIGS. 1-4, at least first engagement surface 30 and second engagement surface 32 includes one or more engagement slots 40, 42. In this configuration, a first jaw of bracket 400 can interface with one of first or second engagement surfaces 30, 32, and a second jaw of bracket 400 can interface with the other surface. It is preferred that both first engagement surface 30 and second engagement surface 32 include one or more engagement slots 40, 42. As shown in FIGS. 1-3, third engagement surface 34 can also include one or more engagement slots 40, 42. Similarly, as shown in FIG. 4, third and fourth engagement surfaces 34, 36 can also include one or more engagement slots 40, 42. In this configuration, a first jaw of bracket 400 can interface with one of third or fourth engagement surfaces 34, 36, and a second jaw of bracket 400 can interface with the other surface. Although engagement slots 40, 42 are shown as elongated slots with rounded ends, engagement slots 40, 42 can be round, rectangular, square, or other appropriate though hole formed through or recess formed on first engagement surface 30 and/or second engagement surface 32. As discussed below, the shape of engagement slots 40, 42 are configured to receive one or more engagement bosses of a bracket disclosed herein.

Referring now to FIGS. 5-7, base support can be modified or integrated with structures used to further facilitate and/or maintain attachment of rail 20 to a mounting support or a preexisting mounting system. In some embodiments, for example rail 20 of FIG. 5, besides or in addition to the use of screws 90, base support 38 extends to form platform 52, with platform 52 having an adhesive layer on the side that will come in contact with a mounting support to provide the sole or additional mechanism of securing rail 20 to a mounting support.

In some embodiments, and as shown in FIG. 6, rail 20 comprises base support 38 that is modified to form or integrated with a tab insert 54. Tab insert 54 serves as an attachment adapter to current mounting systems like a snap-fit mounting system such as, e.g., a shroud bracket system where tab insert 54 is snap-fitted into the snap-fit mounting system. Rail 20 of FIG. 6 can optionally include a thumb release lock 56 which releases a locking mechanism used to secure rail 20 to the snap-fit mounting system. Thumb release lock 52 facilitate insertion and removal of rail 20 from the snap-fit mounting system.

In some embodiments, and as shown in FIG. 7, rail 20 comprises base support 38 that is modified to form or integrated with one or more tab inserts 56. Tab inserts 56 serves as attachment adapters to current mounting systems like a load-bearing system such as, e.g., a safety harness, a climbing harness, a work vest, a tactical vest, a MOLLE load bearing system, a PALS load bearing system, an IIFS load bearing system, or an ALICE load bearing system. Tab inserts 56 are configured for and inserted into one or more pockets or pouches on a load-bearing system which secures rail 20 of FIG. 7 to the load-bearing system.

In some embodiments, and as shown in FIGS. 1-3 & 5-7, body 22 comprising first engagement surface 30, second engagement surface 32, third engagement surface 34, and support base 38 are all part of a single component that forms rail 20, which generally does not require assembly. Similarly, as shown in FIG. 4, body 22 comprising first engagement surface 30, second engagement surface 32, third engagement surface 34, and fourth engagement surface 36 are all part of a single component that forms rail 20, which generally does not require assembly. If rail 20 of FIGS. 1-8 were to be made in a configuration not requiring assembly, then rail 20 can typically be made from a single type of material that is molded, machined, or manufactured by another appropriate process (although multiple types of material can be used, if appropriate for the application).

In some embodiments, body 22 comprising first engagement surface 30, second engagement surface 32, and third engagement surface 34 are separate components are each separate components that are assembled to form rail 20. If rail 20 was to be made in a configuration requiring assembly, then each component part of rail 20 can be made from the same or different type material, such component parts being molded, machined, or manufactured by another appropriate process.

In some embodiments, and as shown in FIGS. 1A, 1B, first and engagement surfaces 30, 32 comprises engagement slots 40, 42. Mounting system 10 comprising rail 20 of FIGS. 1A, 1B further includes bracket 400 having first jaw 410 with two engagement bosses 424 and second jaw 510 with two engagement bosses 524 configured to properly attached to rail 20 of FIGS. 1A, 1B. For example, each engagement boss 424 of first jaw 410 is sized and spaced apart so that 1) both can selectively fit into engagement slot 40, 2) both can straddle between two engagement slots 42 selectively fit into both engagement slots 42, and 3) both can straddle between engagement slots 40, 42 with one engagement boss 424 selectively fitting into engagement slot 40 and the other engagement boss 424 selectively fitting into engagement slot 42. Similarly, each engagement boss 524 of second jaw 510 is sized and spaced apart so that 1) both can selectively fit into engagement slot 40, 2) both can straddle between two engagement slots 42 selectively fit into both engagement slots 42, and 3) both can straddle between engagement slots 40, 42 with one engagement boss 524 selectively fitting into engagement slot 40 and the other engagement boss 524 selectively fitting into engagement slot 42.

In some embodiments, and as shown in FIGS. 8, 10 & 12, rail 20 comprises a body 22 that is a closed curve structure, the length of which can vary depending on the desired application. In such closed curve configuration, body 22 contains a single engagement surface 39. Each rail 20 of FIGS. 8, 10 & 12, are part of three other exemplary mounting systems 10 that includes bracket 400' of FIGS. 9, 11 & 13, respectively. Mounting system 10 comprising rail 20 of FIGS. 8, 10 & 12 and bracket 400' of FIGS. 9, 11 & 13, can serve in attaching a device such as a gear shifter or break to a handlebar of a bicycle. In addition, mounting system 10 comprising rail 20 of FIGS. 8, 10 & 12 and bracket 400' of FIGS. 9, 11 & 13, can serve as rigging components and clamps in attaching lighting and sound system equipment to a stage, a cinema, a theater, a stadium and/or any other location where such lighting and/or sound system equipment is used, replacing currently used rigging components and clamps.

In some embodiments, and as shown in FIG. 8, engagement surface 39 comprises engagement slots 40, 42. Mounting system 10 comprising rail 20 of FIG. 8 further includes bracket 400' having first jaw 410' with two engagement bosses 424 and second jaw 510' with two engagement bosses 524 configured to properly attached to rail 20 of FIG. 8. For example, each engagement boss 424 of first jaw 410' is sized and spaced apart so that 1) both can selectively fit into engagement slot 40, 2) both can straddle between two engagement slots 42 selectively fit into both engagement slots 42, and 3) both can straddle between engagement slots 40, 42 with one engagement boss 424 selectively fitting into engagement slot 40 and the other engagement boss 424 selectively fitting into engagement slot 42. Similarly, each engagement boss 524 of second jaw 510' is sized and spaced apart so that 1) both can selectively fit into engagement slot 40, 2) both can straddle between two engagement slots 42 selectively fit into both engagement slots 42, and 3) both can straddle between engagement slots 40, 42 with one engagement boss 524 selectively fitting into engagement slot 40 and the other engagement boss 524 selectively fitting into engagement slot 42.

In some embodiments, and as shown in FIG. 10, engagement surface 39 comprises engagement slot 46. Although shown as a solid structure, rail 20 of FIG. 10 can also be a hollow structure with an interior space similar to that of rail 20 of FIG. 8. Mounting system 10 comprising rail 20 of FIG. 10 further includes bracket 400' having first jaw 410 with six engagement bosses 426 and second jaw 510' with six engagement bosses 526, each configured to properly attached to rail 20 of FIG. 10. For example, each engagement boss 426 of first jaw 410' is sized and spaced apart so that each pair straddles two engagement slots 46 in a manner where all six engagement bosses 426 align with an engagement slot 46. Similarly, each engagement boss 526 of first jaw 510' is sized and spaced apart so that each pair straddles two engagement slots 48 in a manner where all six engagement bosses 526 align with an engagement slot 46.

In some embodiments, and as shown in FIG. 12, engagement surface 39 comprises engagement slot 48. Although shown as a solid structure, rail 20 of FIG. 12 can also be a hollow structure with an interior space similar to that of rail 20 of FIG. 8. Mounting system 10 comprising rail 20 of FIG. 12 further includes bracket 400' having first jaw 410' with a single engagement boss 428 and second jaw 510' with a single engagement boss 528, each configured to properly attached to rail 20 of FIG. 12. For example, engagement boss 428 of first jaw 410' is sized and spaced apart so that each pair straddles two engagement slots 46 in a manner where all six engagement bosses 426 align with an engagement slot 46. engagement boss 428 of first jaw 410' and engagement boss 528 of second jaw 510' are sized and spaced apart so that each engagement boss 428, 528 selectively fits within a single engagement slot 48 of a rail disclosed herein As shown in FIGS. 8, 10 & 12, body 22 including engagement surface 39 is a single component that forms rail 20, which generally does not require assembly. If rail 20 of FIGS. 8, 10 & 12 were to be made in a configuration not requiring assembly, then rail 20 can typically be made from a single type of material that is molded, machined, or manufactured by another appropriate process (although multiple types of material can be used, if appropriate for the application).

Figure 14:
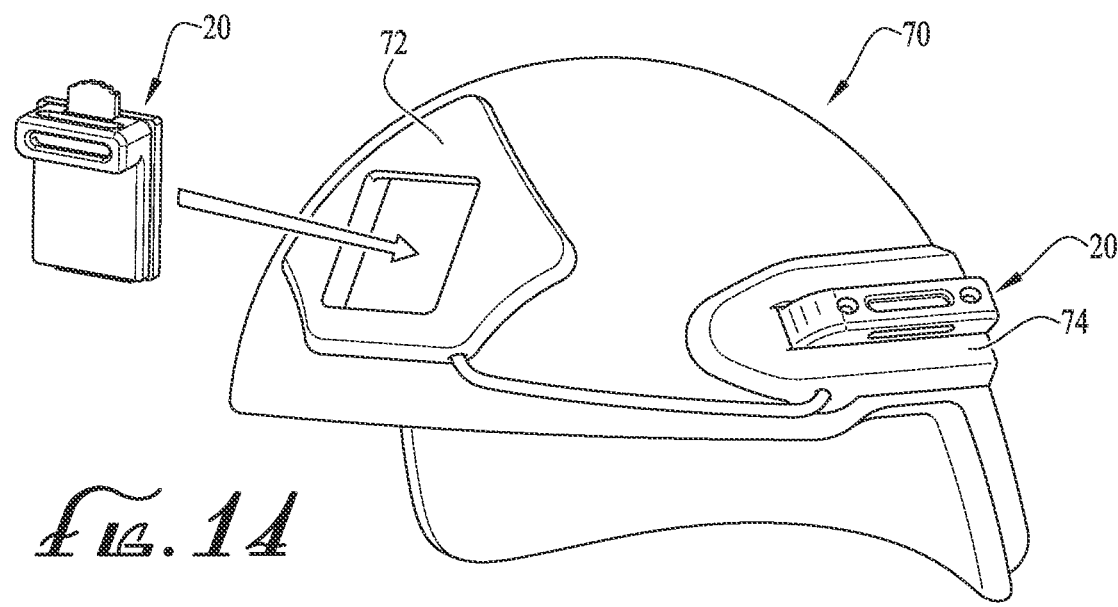
FIG. 14 is a front top perspective view of a helmet with adaptor rail disclosed herein.
Figure 15:
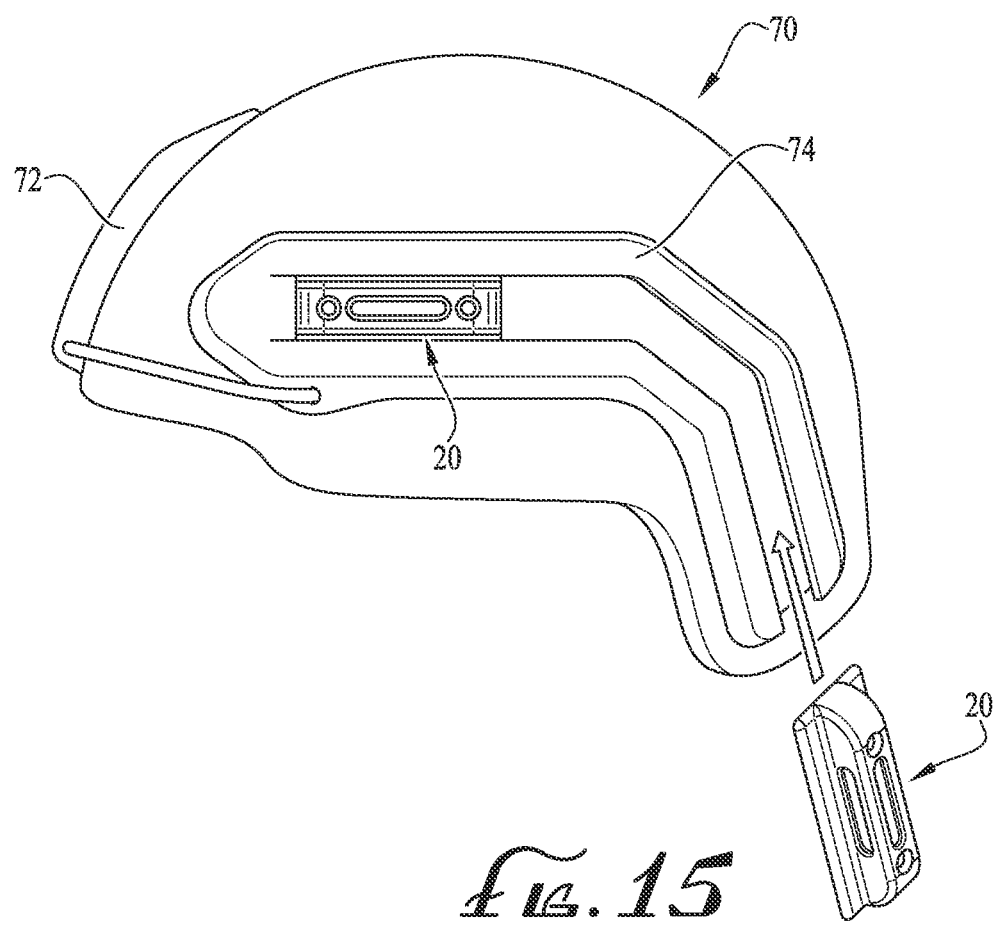
FIG. 15 is a side plan view of FIG. 14.
Figure 16:
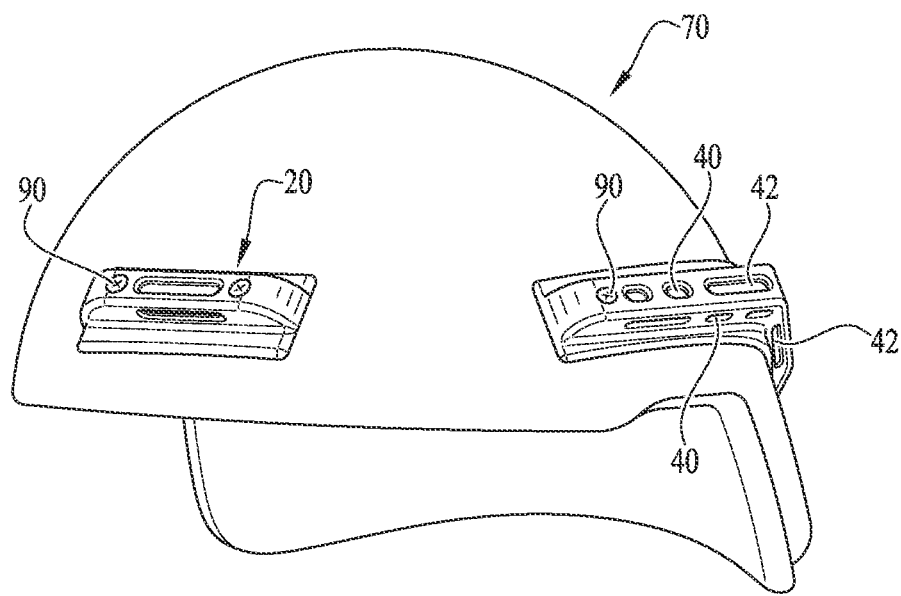
FIG. 16 is a front top perspective view of a helmet with replacement rail disclosed herein.
Figure 17:
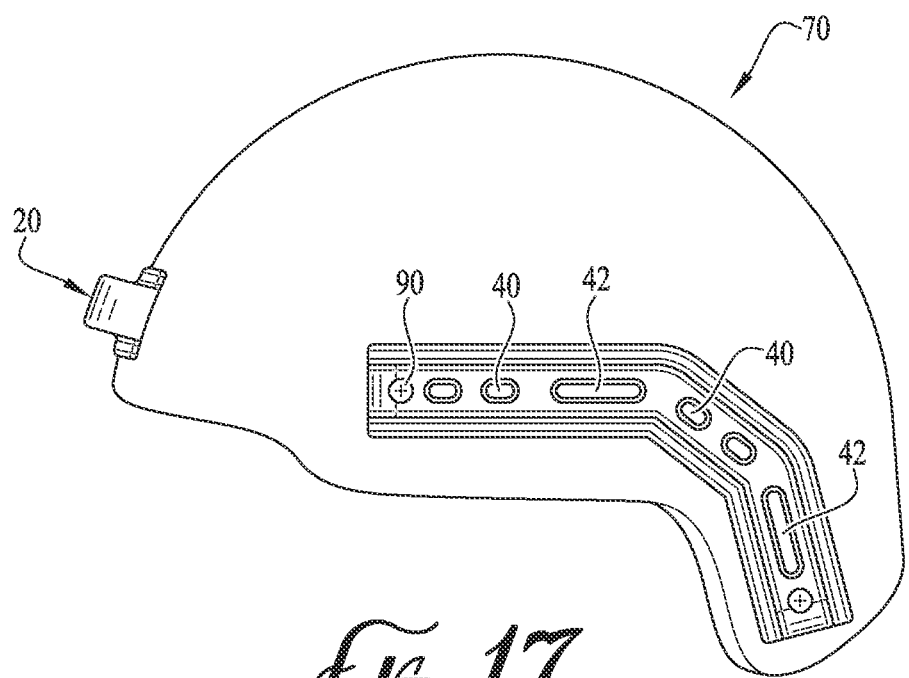
FIG. 17 is a side plan view of FIG. 16.
Figure 18:
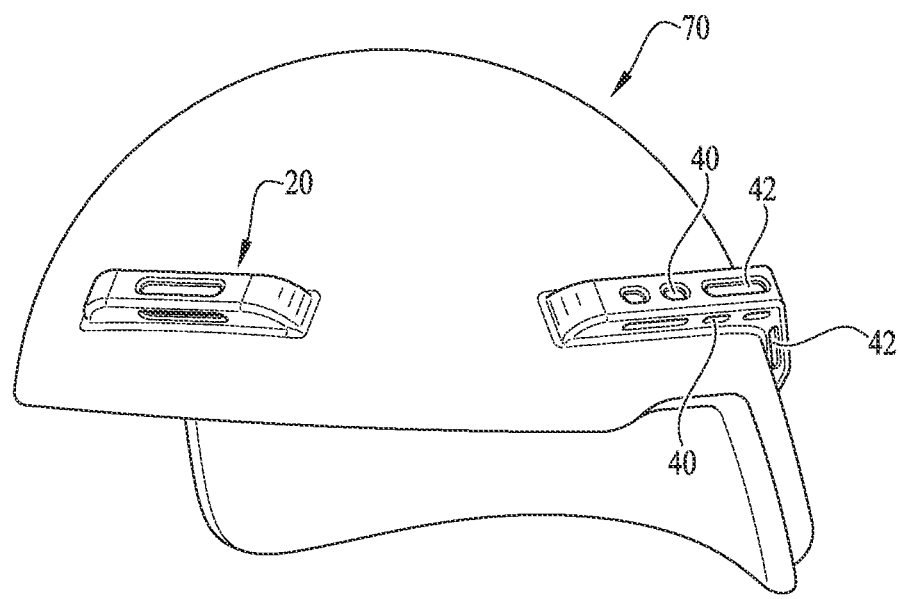
FIG. 18 is a front top perspective view of a helmet with integrated rail disclosed herein.
Figure 19:
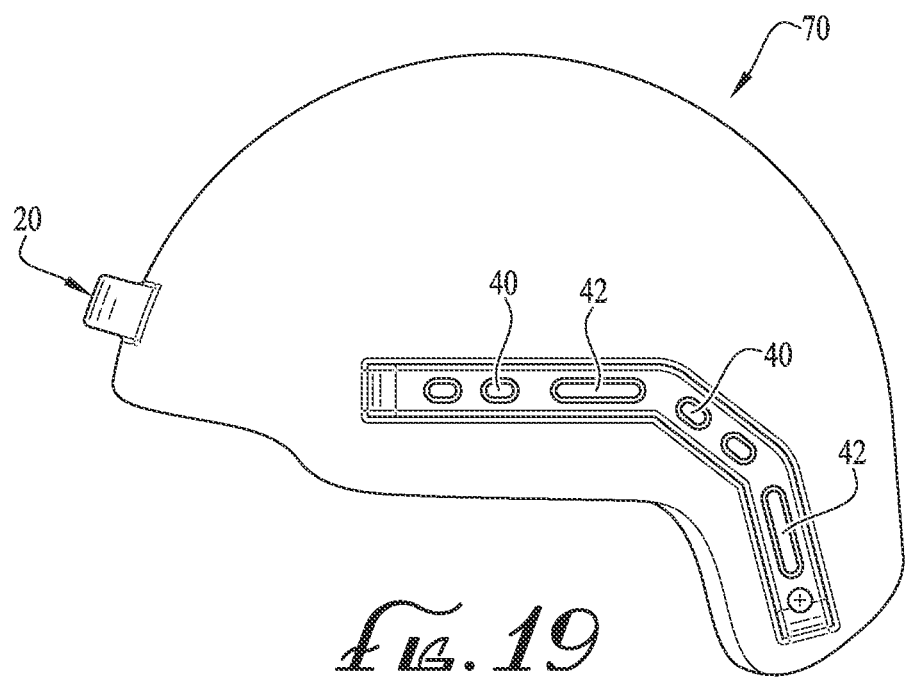
FIG. 19 is a side plan view of FIG. 18.

A rail disclosed herein is a versatile component that can be employed as an attachment adaptor, a replacement part, or an integrated component of a device. In a configuration where rail 20 is designed to adapt to an existing mounting system, two different examples are shown in FIGS. 14 & 15. FIGS. 14 & 15 show a helmet 70 comprising a shroud bracket system 72 and a ACH-ARC mounting system 74. Rail 20 of FIG. 6 is an attachment adapter used to snap-fit into a shroud bracket system 72 whereas base support 38 of rail 20 of FIG. 2 can be configured to enable attachment of rail 20 to ACH-ARC mounting system 74, thereby supplanting other third-party rails such as, e.g., a picatinny rail. In a configuration where rail 20 is designed to replace an existing mounting system, FIGS. 16 & 17 show rail 20 replacing shroud bracket system 72 and a ACH-ARC mounting system 74. In a configuration where rail 20 is integrated as a component to a device, FIGS. 18 & 19 show rail 20 integrated into helmet 70 at the time helmet 70 is manufactured.

Figure 20:
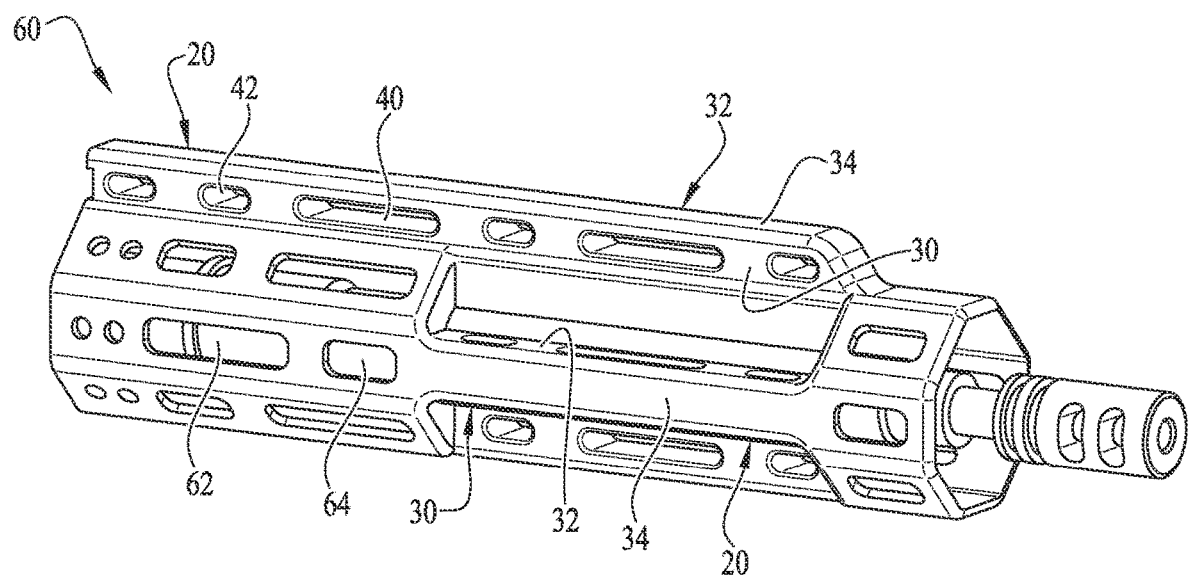
FIG. 20 is a front top perspective view of a handguard rail disclosed herein having attached a bracket disclosed herein.
Figure 21:
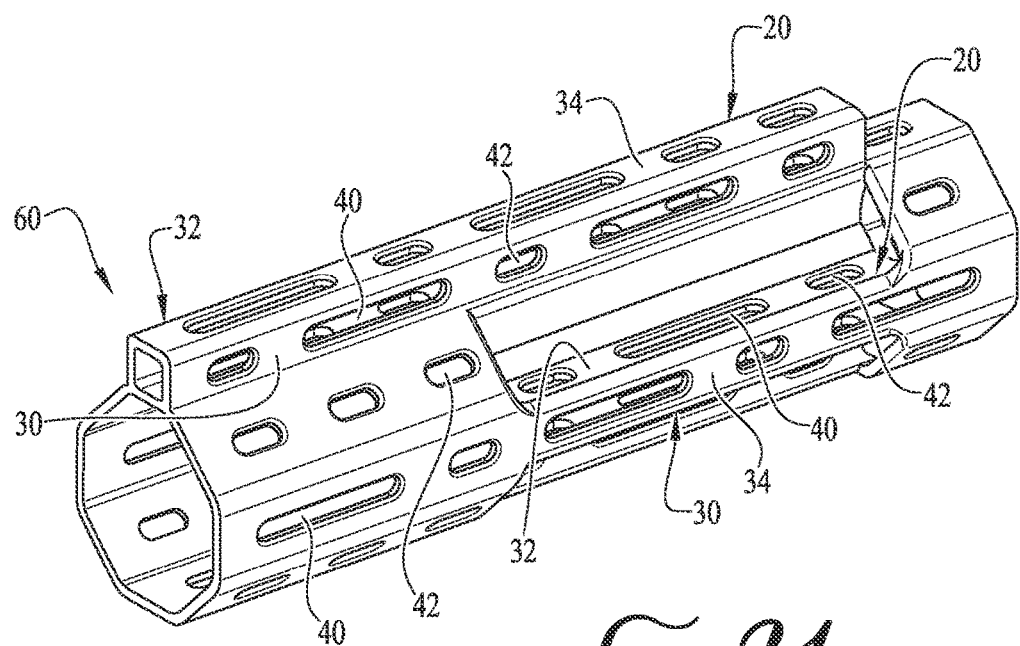
FIG. 21 is a front top perspective view of a handguard rail disclosed herein.

A rail disclosed herein can also form structural unit used in the production of a device that provides additional functionality in addition to incorporating the mounting functionality of a mounting system disclosed herein. In some embodiments, and as shown in FIGS. 20 & 21, rail 20 comprising body 22 is used as a component structure in the manufacturing of a handguard for a rifle. Referring to FIG. 20, handguard 60 shows that one or more rails 20 can co-exist with a current mounting system, in this case an M-LOK mounting system. Handguard 60 comprises a plurality of rails 20, each including first, second and third engagement surfaces 30, 32, 34, with engagement slots 40, 42 located on first and second engagement surfaces 30, 32. Handguard 60 of FIG. 20 further includes M-LOK engagement slots 62, 64. Referring now to FIG. 21, handguard 60 is entirely component of structural units based on a plurality of rails 20. Along with bracket 400, handguard 60 comprising one or more rails 20 as shown in FIGS. 20 & 21 illustrate a fourth exemplary mounting system 10.

Figure 22:
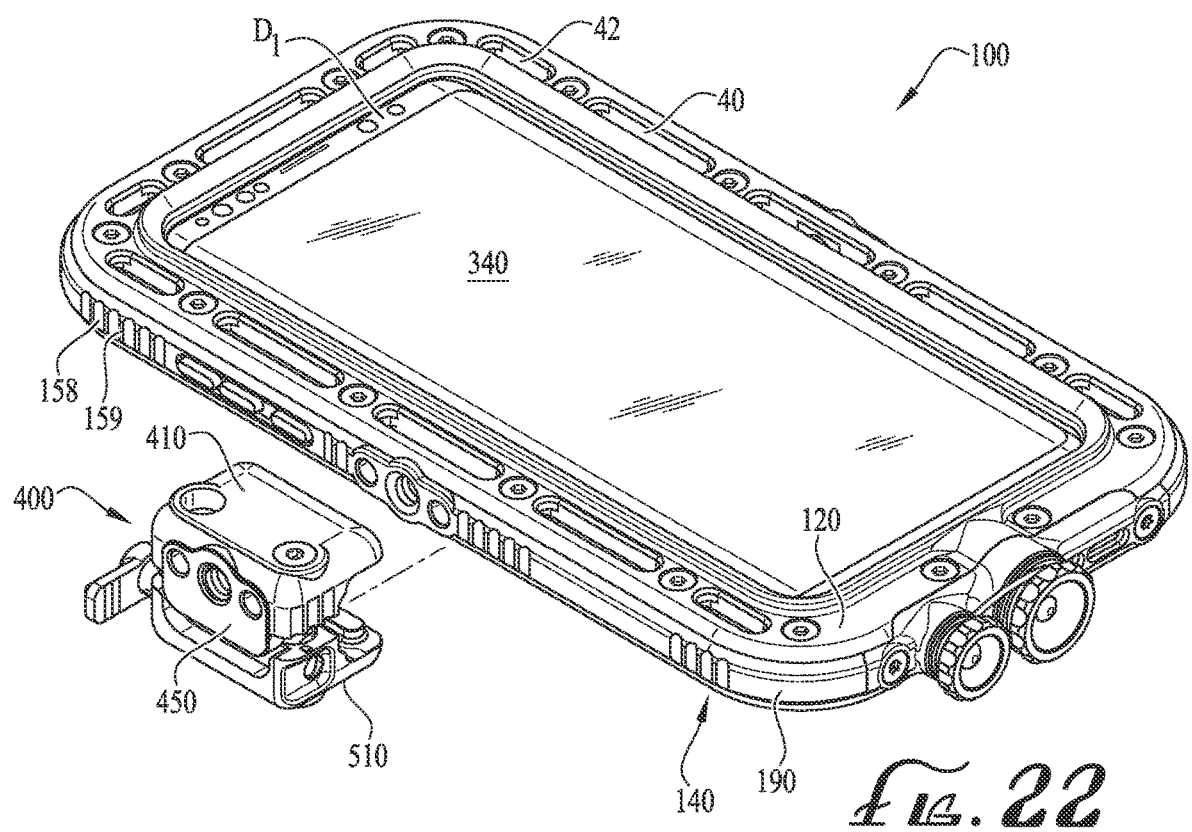
FIG. 22 showing a top perspective of a mounting system disclosed herein, illustrating a bracket aligned and ready for attachment to a rail disclosed herein, where the rail is configured as a device case containing a device.
Figure 23:
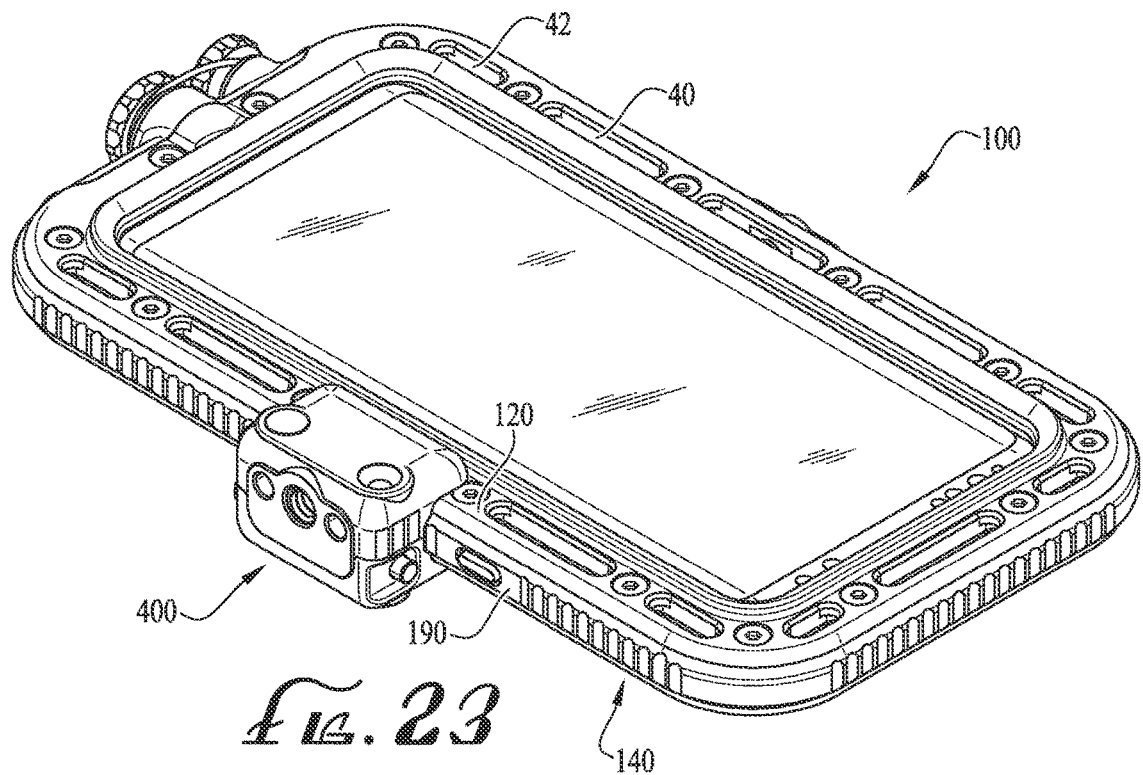
FIG. 23 showing a top perspective of the mounting system of FIG. 22, illustrating a bracket attached to a rail disclosed herein.

Another exemplary embodiment of a rail disclosed herein used as structural unit in the protection of a device. In some embodiments, and as shown in FIGS. 22 & 23 a rail disclosed herein forms a device case 100, which along with bracket 400 show a fifth exemplary mounting system 10. In this configuration, rail 20 serves as a device case 56 as well as serving as an attachment framework for receiving bracket 400. In this embodiment, the shape of device case 100 conforms to the perimeter shape of a device that device case 100 is configured to contain or enclose. In some embodiments, and as shown in FIGS. 22 & 23, rail 20 is a quadrilateral structure configured to the dimensions of a device D1 for protectively holding device D1.

In some embodiments, and referring to FIGS. 24-29 & 33, device case 100 comprises a first frame member 110, a second frame member 130, and a sidewall frame member 150. In some embodiments, and as shown in FIGS. 30-33, device case 100 can comprises a gasket, such as a gasket 240 or a gasket 300 to provide water resistant or waterproof capabilities. In some embodiments, device case 100 can optionally comprises a top cover 340, as shown in FIGS. 22, & 45-48, and a bottom cover 350, as shown in FIGS. 33, & 45-48.

Figure 24:
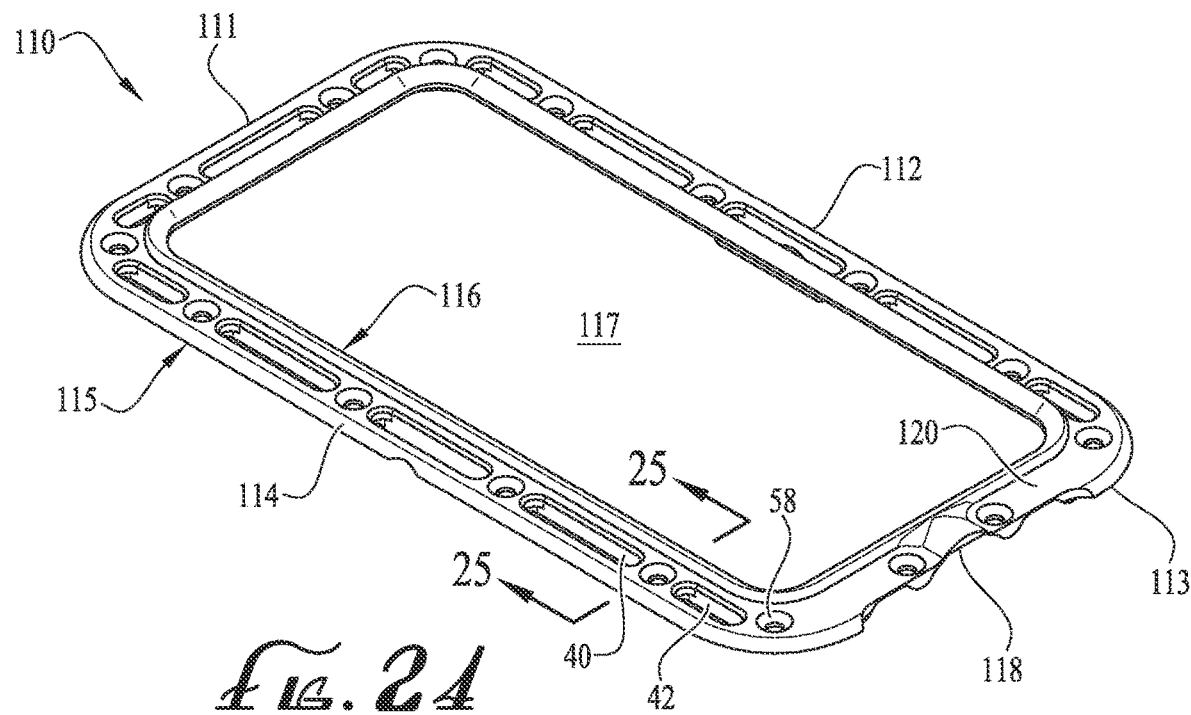
FIG. 24 is a top perspective of a first frame member disclosed herein.

As shown in FIG. 24, first frame member 110 comprises a first side 111, a second side 112, a third side 113 and a fourth side 114. In an exemplary embodiment, first, second, third and fourth sides 111, 112, 113, 114 form a four-sided structure, first side 111 is opposite and generally parallel to third side 113 with second side 112 spanning between first side 111 and third side 113 and being substantially perpendicular to first side 111 and third side 113. Fourth side 114 is opposite and generally parallel to second side 112 with fourth side 114 spanning between first side 111 and third side 113 and being substantially perpendicular to first side 111 and third side 113. The four-sided first frame member 110 thus formed comprises an outer perimeter 115, an inner perimeter 116 defining an open space 117. First frame member 110 comprises a plurality of engagement slots 40, 42 and though holes 58. In addition, in some embodiments, third side 113 of first frame member 110 comprises a portion of 118 configured to as part of a mortise for a tenon of a sealing plate disclosed herein.

Figure 25:
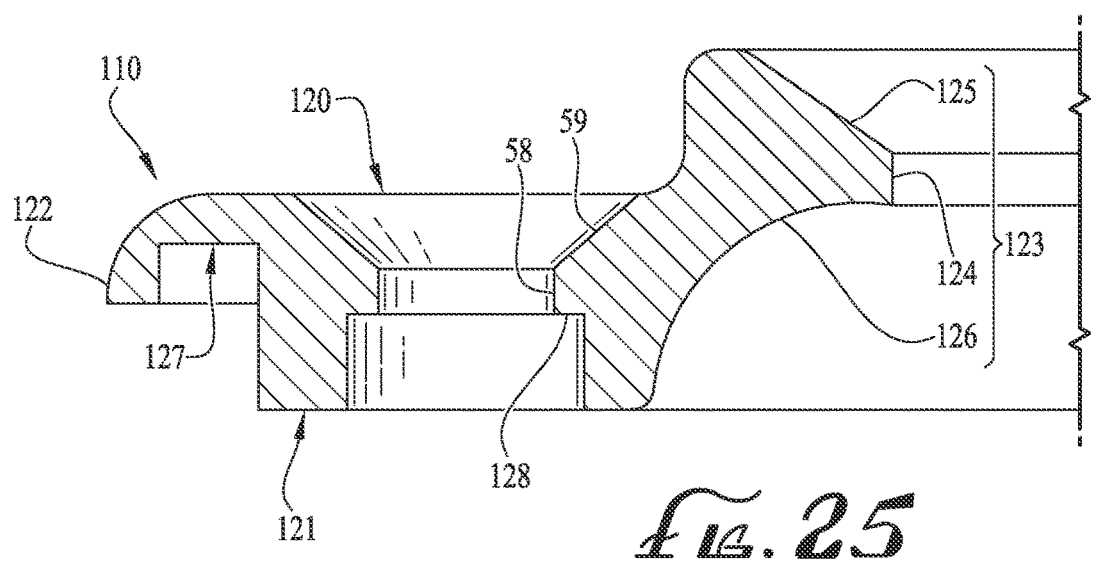
FIG. 25 is a magnified cross-sectional view of FIG. 24, taken at 25-25.

Referring now to FIG. 25, a cross sectional view of first frame member 110 shows that each of first, second, third and fourth sides 111, 112, 113, 114 comprise a top surface 120, a bottom surface 121, an outer surface 122, and an inner surface 123. Top surface 120 comprises countersink 59 at location of through hole 58, and corresponds to first engagement surface 30 of rail 20. Bottom surface 121 comprises a mortise 127 configured to receive a tendon 194 of sidewall frame member 150. At the location of through hole 58, bottom surface 121 comprises seat 128 configured to receive a threaded support barrel 102 (see FIGS. 33, 47 & 48). Inner surface 123 comprises a ridge 125 and a concave recess 126, with a front edge of both ridge 125 and concave recess 126 extending orthogonally into open space 117 to form an overhang 124. A cross sectional view of first frame member 110 at the location of either engagement slot 40 or engagement slot 42, countersink 59 and seat 128 would be replaced with through hole of engagement slot 40 or engagement slot 42 (not shown). Likewise, a cross sectional view of first frame member 110 at a flat surface location there would be no countersink 59 or seat 128 top surface 120 and bottom surface 121 would be flat surfaces (not shown). As mortise 127 extends over all or substantially all of the circumference of bottom surface 121, a stable assembly fit is achieved between mortise 127 of first frame member 110 and tenon 194 of sidewall frame member 150. In addition, as ridge 125 extends over all or substantially all of the circumference of inner perimeter 116, ridge 125 forms a ridged offset that protects device D1 from impact. Further, as concave recess 126 extends over all or substantially all of the circumference of inner perimeter 116, concave recess 126 forms a seat configured to receive a gasket, such as, e.g., gasket 240.

Figure 26:
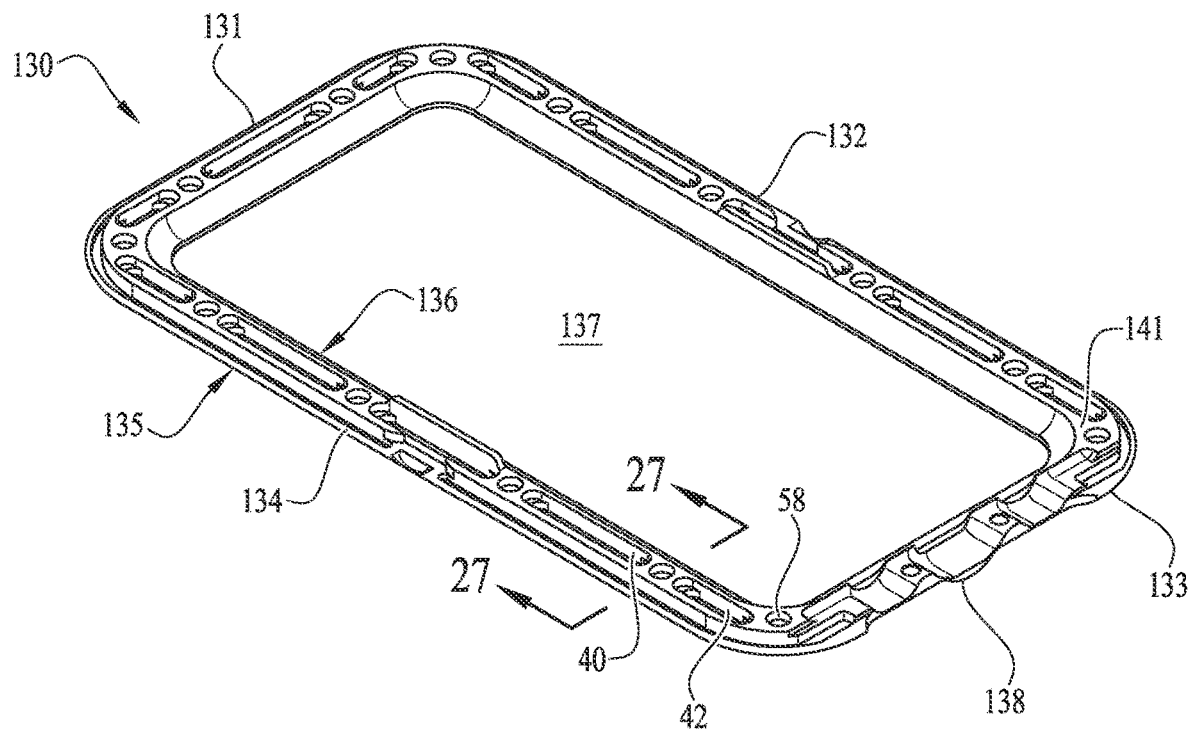
FIG. 26 is a top perspective of a second frame member disclosed herein.

As shown in FIG. 26, second frame member 130 comprises a first side 131, a second side 132, a third side 133 and a fourth side 134. In an exemplary embodiment, first, second, third and fourth sides 131, 132, 133, 134 form a four-sided structure, first side 131 is opposite and generally parallel to third side 133 with second side 132 spanning between first side 131 and third side 133 and being substantially perpendicular to first side 131 and third side 133. Fourth side 134 is opposite and generally parallel to second side 132 with fourth side 134 spanning between first side 131 and third side 133 and being substantially perpendicular to first side 131 and third side 133. The four-sided second frame member 130 thus formed comprises an outer perimeter 135, an inner perimeter 136 defining an open space 137. Second frame member 130 comprises a plurality of engagement slots 40, 42 and though holes 58. In addition, in some embodiments, third side 133 of second frame member 130 comprises a portion of 138 configured to as part of a mortise for a tenon of a sealing plate disclosed herein.

Figure 27:
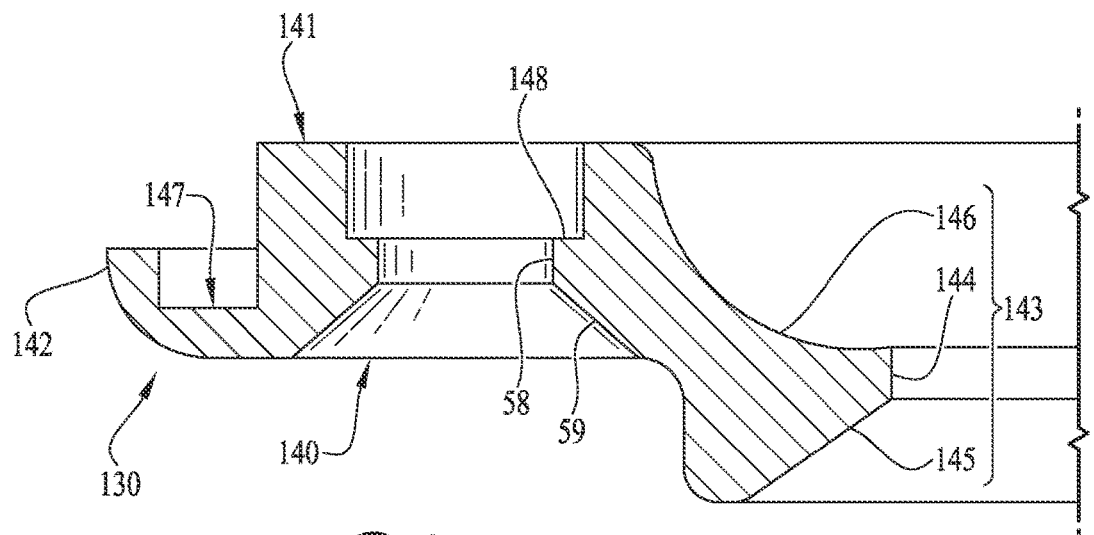
FIG. 27 is a magnified cross-sectional view of FIG. 26, taken at 27-27.

Referring now to FIG. 27, each of first, second, third and fourth sides 131, 132, 133, 134 comprise a top surface 140, a bottom surface 141, an outer surface 142, and an inner surface 143. Top surface 140 comprises countersink 59 at location of through hole 58, and corresponds to second engagement surface 32 of rail 20. Bottom surface 141 comprises a mortise 147 configured to receive a tendon 196 of sidewall frame member 150. At the location of through hole 58, bottom surface 141 comprises seat 148 configured to receive a threaded support barrel 102 (see FIGS. 33, 47 & 48). Inner surface 143 comprises a ridge 145 and a concave recess 146, with a front edge of both ridge 145 and seat 146 extending orthogonally into open space 137 to form an overhang 144. A cross sectional view of second frame member 130 at the location of either engagement slot 40 or engagement slot 42, countersink 59 and seat 148 would be replaced with through hole of engagement slot 40 or engagement slot 42 (not shown). Likewise, a cross sectional view of second frame member 130 at a flat surface location there would be no countersink 59 or seat 148 top surface 140 and bottom surface 141 would be flat surfaces (not shown). As mortise 147 extends over all or substantially all of the circumference of bottom surface 141, a stable assembly fit is achieved between mortise 147 of second frame member 130 and tenon 196 of sidewall frame member 150. In addition, as ridge 145 extends over all or substantially all of the circumference of inner perimeter 136, ridge 145 forms a ridged offset that protects device D1 from impact. Further, as concave recess 146 extends over all or substantially all of the circumference of inner perimeter 136, concave recess 146 forms a seat configured to receive a gasket, such as, e.g., gasket 240.

Figure 28:
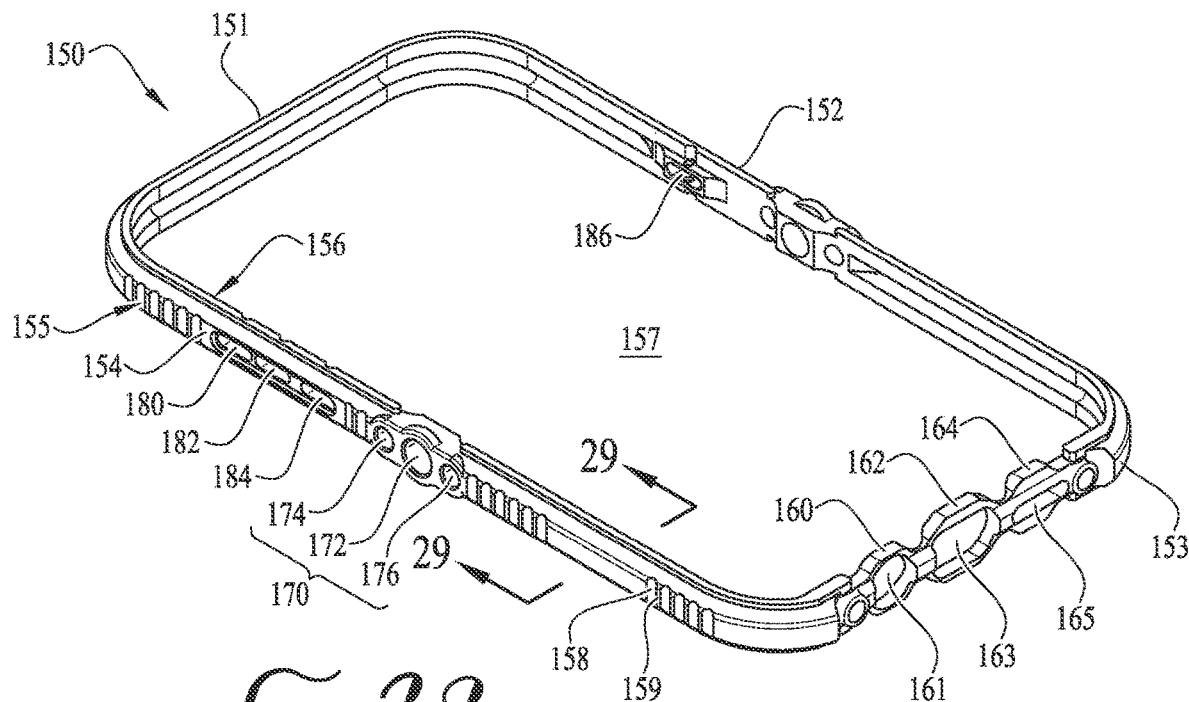
FIG. 28 is a top perspective of a sidewall frame member disclosed herein.

As shown in FIG. 28, sidewall frame member 150 comprises a first side 151, a second side 152, a third side 153 and a fourth side 154. In an exemplary embodiment, first, second, third and fourth sides 151, 152, 153, 154 form a four-sided structure, first side 151 is opposite and generally parallel to third side 153 with second side 152 spanning between first side 151 and third side 153 and being substantially perpendicular to first side 151 and third side 153. Fourth side 154 is opposite and generally parallel to second side 152 with fourth side 154 spanning between first side 151 and third side 153 and being substantially perpendicular to first side 151 and third side 153. The four-sided sidewall frame member 150 thus formed comprises an outer perimeter 155, an inner perimeter 156 defining an open space 157.

Figure 29:
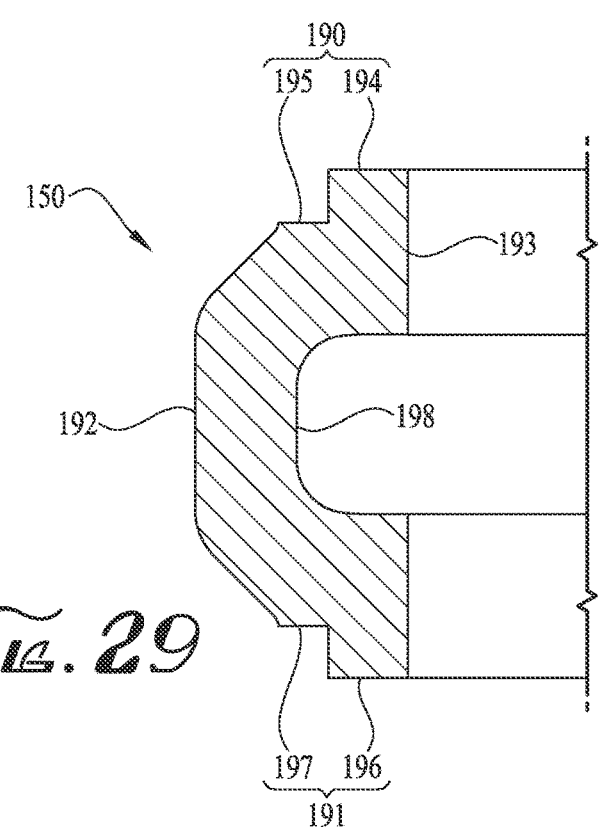
FIG. 29 is a magnified cross-sectional view of FIG. 28, taken at 29-29.

Referring now to FIG. 29, each of first, second, third and fourth sides 151, 152, 153, 154 comprise a top surface 190, a bottom surface 191, an outer surface 192, and an inner surface 193. Top surface 190 comprises tenon 194 configured to insert into mortise 127 of first frame member 110 and a notch 195 configured to abut outer surface 122 of second frame member 130. Bottom surface 191 comprises tenon 196 configured to insert into mortise 147 of second frame member 130 and a notch 197 configured to abut outer surface 142 of second frame member 130. Inner surface 193 comprises a concave recess 196. Outer surface 192, corresponds to third engagement surface 34 of rail 20. As tenons 194, 196 extends over all or substantially all of the circumference of top surface 190, a stable assembly fit is achieved between tenon 194 of sidewall frame member 150 and mortise 127 of first frame member 110, and tenon 196 of sidewall frame member 150 and mortise 147 of second frame member 130. Further, as concave recess 196 extends over all or substantially all of the circumference of inner perimeter 156, concave recess 196 forms a seat configured to receive a gasket, such as, e.g., gasket 240.

In some embodiments, a sidewall frame member disclosed herein can optionally include series of alternating locking slots and locking teeth configures so that two adjacent slots form a tooth therebetween. This series of alternating locking slots and locking teeth serve to provide a textured surface to facilitate gripping, holding or otherwise handling device case 100. In some embodiments, and referring to FIG. 28 but also FIGS. 22, 23, 33, & 35-41, outer surface 192 of sidewall frame member 150 includes series of alternating locking slots 158 and locking teeth 159.

In some embodiments, sidewall frame member disclosed herein includes one or more ports configured to provide access various cables for connection to various audio jacks, power jacks of device D1 as well as passageways to permit sound therethrough, e.g., sound emitting from a speakers and/or sound being picked up by a microphone present in device D1. For example, and referring to FIGS. 28 & 33, but see also FIGS. 44-46, sidewall frame member 150 includes a first port 160 including through hole 161, a second port 162 including through hole 163, and a third port 164 including through hole 165. First and second ports 160, 162 of sidewall frame member 150 are configured to received therein a first and a second hollow bosses 230, 234 of sealing plate 200, respectively. Although first, second and third ports 160, 162, 164 are shown located on third side 153, location of a port disclosed herein can change depending on the location of an audio jack, power jack, speaker, and/or microphone present in device D1. Additionally, the number of ports disclosed herein can vary depending on the number of audio jacks, power jacks, speakers, and/or microphones present on device D1.

Figure 33:
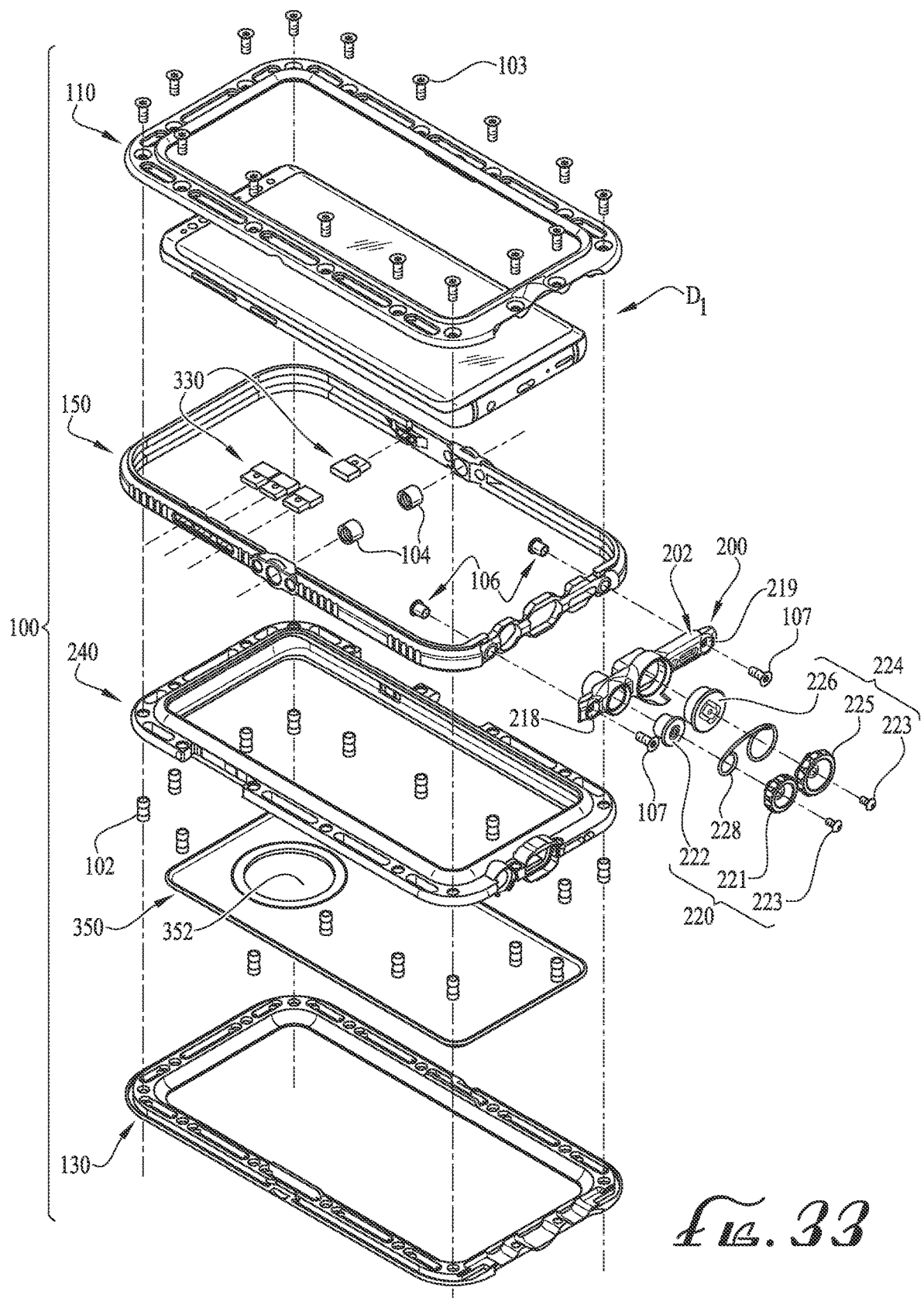
FIG. 33 is an exploded top perspective view of the rail of FIG. 22.

In some embodiments, an outer surface of sidewall frame member disclosed herein includes one or more attachment plates configured to receive and provide an attachment point to secure a connector disclosed herein, a component of a mounting system disclosed herein or another mounting system, a device or a component thereof, or other attachment. For example, an adaptor can be secured to an attachment plate in order to enable attachment of device case 100 to another adaptor or component of a mounting system disclosed herein or another mounting system. As another example, device D1 encased in device case 100 can be secured to a tripod using an attachment plate disclosed herein. In some embodiments, and as shown in FIG. 28 but also FIGS. 22, 33, 35, 38, & 39, an attachment plate 170 comprises an attachment port 172, a first indexing hole 174 and a second indexing hole 176. an attachment port 172 can be configured to be a through hole, a threaded through hole or a threaded blind hole. In some embodiments, when threaded, attachment port 172 is configured to receive any standard screw thread known in the art, including, without limitation, ¼-20 UNC thread, a ⅜-16 UNC thread, or any similar screw thread standards known in the art. In some embodiments, where attachment port 172 is a though hole, and as shown in FIG. 33, attachment port 172 is configured to receive a threaded insert 104 to enable acceptance of a threaded screw disclosed herein. threaded insert 104 is configured to receive any standard screw thread known in the art as discussed above.

Figure 30:
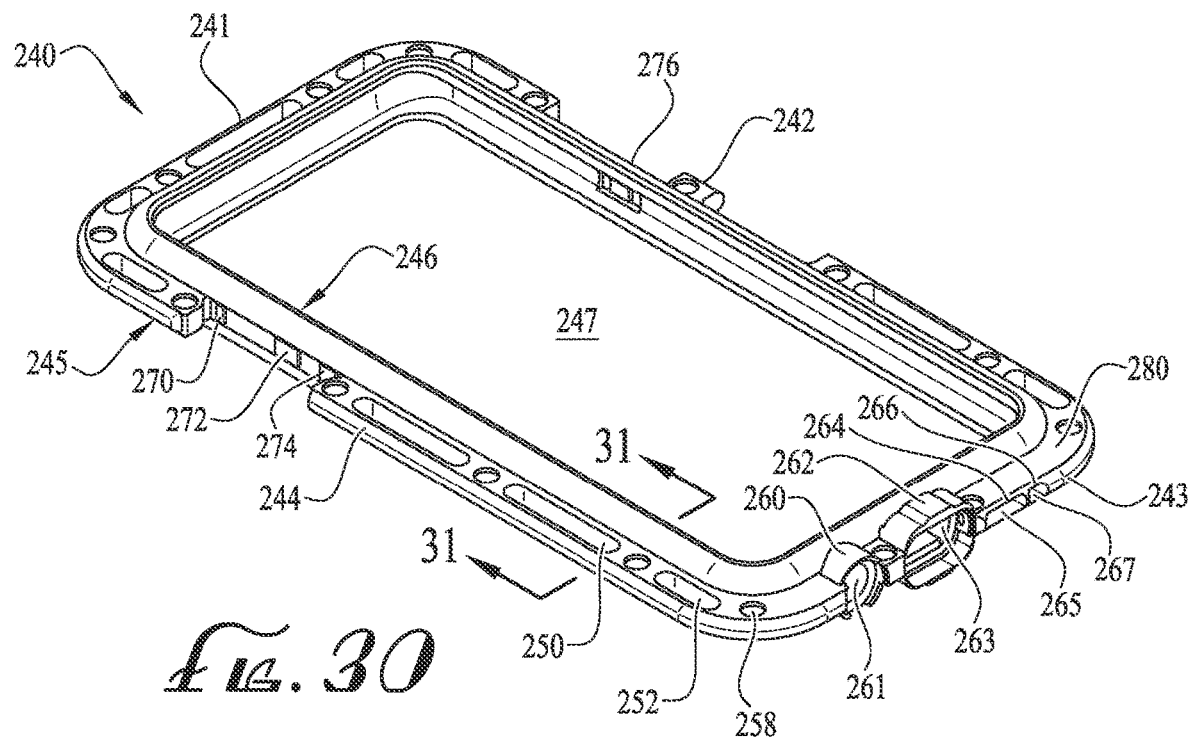
FIG. 30 is a top perspective of a gasket disclosed herein.

Still referring to FIG. 28 but also FIGS. 22, 33, 35, 38, & 39, First and second indexing holes 174, 176 facilitate properly orientation of another adaptor, device or component thereof being secured to device case 100 as well as to prevent misalignment of an attached another adaptor, device or component thereof while secured to device case 100. Although FIG. 30 shown sidewall frame member with two attachment plates 170, one of second side 152 and one on fourth side 154, the location of an attachment plate disclosed herein can vary depending on design preferences embodied by device case 100. Additionally, the number of attachment plates disclosed herein can vary depending design preferences embodied by device case 100. In one embodiment, device case 100 does not contain an attachment plate disclosed herein.

In some embodiments, a sidewall frame member disclosed herein includes one or more button insert ports configured to provide access to one or more control buttons of device D1. For example, and referring to FIGS. 28 & 33, but also FIGS. 49 & 50, sidewall frame member 150 includes a first button insert port 180 including through hole, a second button insert port 182 including through hole, and a third button insert port 184 including through hole, and a fourth button insert port 186 including through hole. Although first, second and third button inserts 180, 182, 184 are shown located on fourth side 154, and fourth button insert 186 is shown located on second side 152, location of a button insert disclosed herein can change depending on the location of a control button present in device D1. Additionally, the number of button insert ports disclosed herein can vary depending on the number of control buttons present on device D1.

A device case 100 can comprise a gasket. In some embodiments, device case 100 is preferably designed to be water resistant or waterproof. In such embodiments, a gasket disclosed herein is fitted around an outer perimeter of device D1. A gasket disclosed herein functions to form a barrier between device D1 and the outside environment, thereby providing water resistant or waterproof capabilities. All or part of a gasket disclosed herein is composed of an elastomeric material or other deformable or sealable material that deforms under the pressure of assembled device case 100 to fill gaps and create a water resistant or water-proof interior space for containing device D1, such sealable material including, without limitation, Buna-N rubber material, fluoroelastomer material (e.g., VITON), silicon, or other appropriate material or combination of materials.

In some embodiments, and as shown in FIGS. 30 & 33 gasket 240 comprises a first side 241, a second side 242, a third side 243 and a fourth side 244. In an exemplary embodiment, first, second, third and fourth sides 241, 242, 243, 244 form a four-sided structure, first side 241 is opposite and generally parallel to third side 243 with second side 242 spanning between first side 241 and third side 243 and being substantially perpendicular to first side 241 and third side 243. Fourth side 244 is opposite and generally parallel to second side 242 with fourth side 244 spanning between first side 241 and third side 243 and being substantially perpendicular to first side 241 and third side 243. The four-sided gasket 240 thus formed comprises an outer perimeter 245, an inner perimeter 246 defining an open space 247 configured to receive device D1 by fitting around an outer perimeter of device D1. Gasket 240 comprises a plurality of engagement slot through holes 250, 252 and though holes 258.

Figure 31:
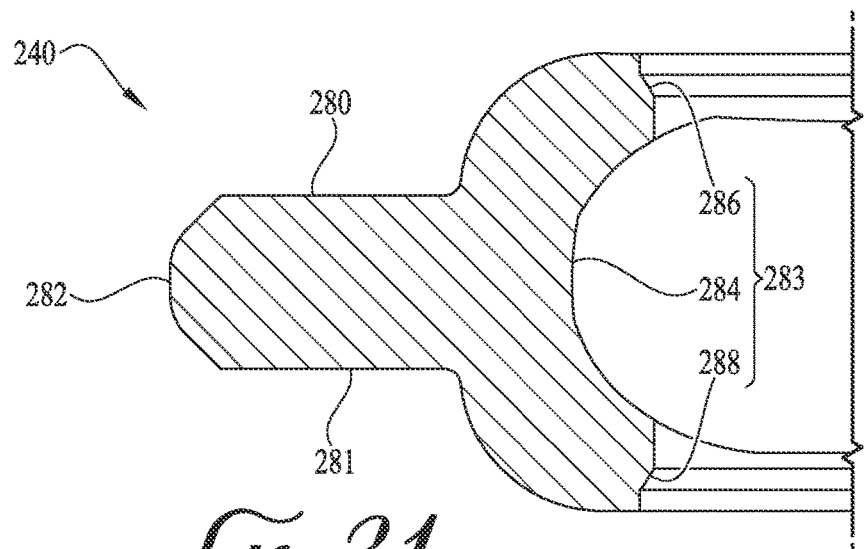
FIG. 31 is a magnified cross-sectional view of FIG. 30, taken at 31-31.

Referring now to FIG. 31, each of first, second, third and fourth sides 241, 242, 243, 244 comprise a top surface 280, a bottom surface 281, an outer surface 282, and an inner surface 283. In cross section, a portion of top and bottom surfaces 280, 281 and inner surface 283 form a concaved U-shaped structure from which the remainder of top and bottom surfaces 280, 281 and outer surface 282 extend perpendicularly. Inner surface 283 comprises a concave recess 284, and optionally a first notch 286 located near top surface 280 configured to receive top plate 340 and optionally a second notch 288 located near bottom surface 281 configured to receive bottom plate 350. As concave recess 284 extends over all or substantially all of the circumference of inner perimeter 246, concave recess 284 forms a seat configured to receive device D1. In addition, as first notch 286 extends over all or substantially all of the circumference of inner perimeter 246, first notch 286 forms a seat configured to receive top plate 340. Likewise, as second notch 288 extends over all or substantially all of the circumference of inner perimeter 246, second notch 288 forms a seat configured to receive bottom plate 350. Further, as the perpendicular extension formed by a portion of top and bottom surfaces 280, 281 and outer surface 282 extends over all or substantially all of the circumference of outer perimeter 245, concave recess 284 forms a gasket extension configured to sit within concave recess 196 od sidewall frame member 150.

In some embodiments, a gasket disclosed herein includes one or more ports configured to provide access various cables for connection to various audio jacks, power jacks of device D1 as well as passageways to permit sound therethrough, e.g., sound emitting from a speakers and/or sound being picked up by a microphone present in device D1. For example, and referring to FIG. 30, gasket 240 includes a first port 260 including through hole 261, a second port 262 including through hole 263, a third port 264 including closed or blind hole 265, and a fourth port 266 including closed or blind hole 267. Although first, second, third and fourth ports 260, 262, 264, 266 are shown located on third side 243, location of a port disclosed herein can change depending on the location of an audio jack, power jack, speaker, and/or microphone present in device D1. Additionally, the number of ports disclosed herein can vary depending on the number of audio jacks, power jacks, speakers, and/or microphones present on device D1.

In some embodiments, a gasket disclosed herein includes one or more button bosses configured to permit pushing of various buttons on device D1 while still maintaining a water resistant or waterproof properties of device case 100. For example, and referring to FIG. 30, outer surface 282 of gasket 240 includes a first button boss 270, a second button boss 272, and a third button boss 274, and a fourth button boss 276. Although first, second and third button bosses 270, 272, 274 are shown located on fourth side 244, and fourth button boss 276 is shown located on second side 242, location of a button boss disclosed herein can change depending on the location of a control button present in device D1. Additionally, the number of button bosses disclosed herein can vary depending on the number of control buttons present on device D1.

Figure 32:
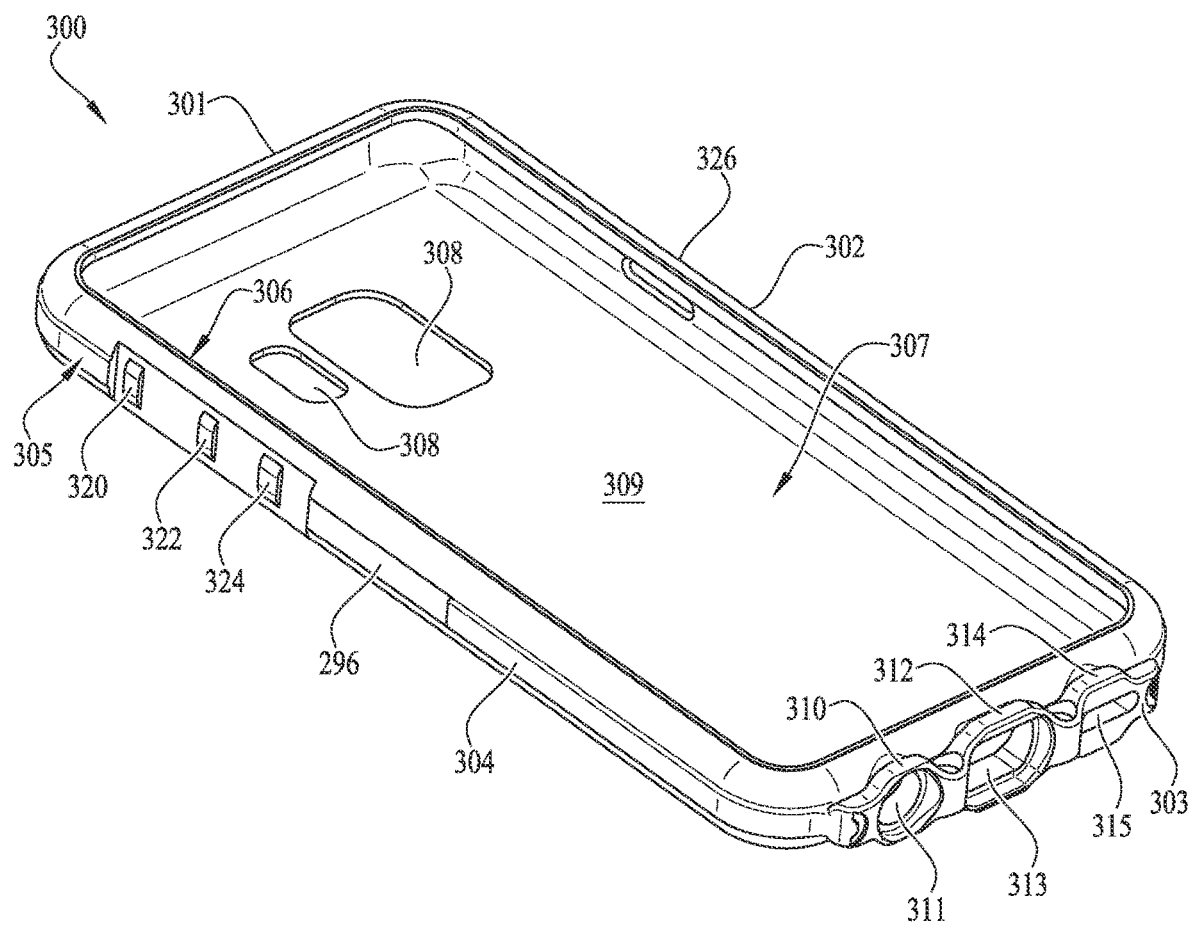
FIG. 32 is a top perspective of a gasket disclosed herein.

In some embodiments, and as shown in FIG. 32, gasket 300 comprises a first side 301, a second side 302, a third side 303, a fourth side 304, and a bottom 307. In an exemplary embodiment, first, second, third and fourth sides 301, 302, 303, 304 form a four-sided structure, first side 301 is opposite and generally parallel to third side 303 with second side 302 spanning between first side 301 and third side 303 and being substantially perpendicular to first side 301 and third side 303. Fourth side 304 is opposite and generally parallel to second side 302 with fourth side 304 spanning between first side 301 and third side 303 and being substantially perpendicular to first side 301 and third side 303. The four-sided gasket 300 thus formed comprises an outer perimeter 305, an inner perimeter 306 and bottom 307 defining an open compartment 309 configured to receive device D1 by fitting around an outer perimeter and back side of device D1 which functions similar to bottom cover 350, discussed below and is used in replacement of bottom cover 350. Bottom 307 of gasket 300 includes one or more open portions 308 configured to receive a transparent insert, such as a plastic or glass insert, and configured to permit the sight and use of flashes, flashlights, or other light requiring, emitting or detecting devices.

In some embodiments, gasket 300 includes one or more ports configured to provide access various cables for connection to various audio jacks, power jacks of device D1 as well as passageways to permit sound therethrough, e.g., sound emitting from a speakers and/or sound being picked up by a microphone present in device D1. For example, and referring to FIG. 32, gasket 300 includes a first port 310 including through hole 311, a second port 312 including through hole 313, and a third port 314 including through hole 315. Although first, second, and third ports 310, 312, 314 are shown located on third side 303, location of a port disclosed herein can change depending on the location of an audio jack, power jack, speaker, and/or microphone present in device D1. Additionally, the number of ports disclosed herein can vary depending on the number of audio jacks, power jacks, speakers, and/or microphones present on device D1.

In some embodiments, gasket 300 includes one or more button bosses configured to permit pushing of various buttons on device D1 while still maintaining a water resistant or waterproof properties of device case 100. For example, and referring to FIG. 32, outer surface 302 of gasket 300 includes a first button boss 320, a second button boss 322, and a third button boss 324, and a fourth button boss 326. Although first, second and third button bosses 320, 322, 324 are shown located on fourth side 304, and fourth button boss 326 is shown located on second side 302, location of a button boss disclosed herein can change depending on the location of a control button present in device D1. Additionally, the number of button bosses disclosed herein can vary depending on the number of control buttons present on device D1.

Furthermore, in some embodiments, device case 100 further optionally comprises a top cover placed atop device D1 and/or further optionally comprises a bottom cover placed beneath device D1 For example, device case 100 further optionally comprises a top cover 340 placed atop device D1 (best seen in FIGS. 22 & 45-48), and/or further optionally comprises a bottom cover 350 placed beneath device D1 (best seen in FIGS. 33 & 45-48). Top cover 340 is partially or entirely composed of a transparent material such as glass or plastic to permit the sight and use of touch screens and camera. Bottom cover 350 is partially or entirely composed of a transparent material such as glass or plastic to permit the sight and use of flashes, flashlights, or other light requiring, emitting or detecting devices. In some embodiments, bottom cover 350 includes a transparent portion, such as a window 352 composed of a transparent material such as glass or plastic to permit the sight and use of flashes, flashlights, or other light requiring, emitting or detecting devices. Both top cover 340 and bottom cover 350 function to form a barrier between device D1 and the outside environment, thereby providing protection against physical damage as well as enhancing water resistant or waterproof capabilities.

In some embodiments, a device case 100 can comprise a sealing plate. For example, as best seen in FIGS. 33, 34 & 44-46, sealing plate 200 comprises a body 202 having an outer surface 204 and an inner surface 206. Although sealing plate 200 is shown located on side comprising third side 113 of first frame member 110, third side 133 of second frame member 130 and third side 153 of sidewall frame member 150 location of a sealing plate disclosed herein can change depending on the location of an audio jack, power jack, speaker, and/or microphone present in device D1.

In some embodiments, sealing plate 200 includes one or more ports configured to provide access various cables for connection to various audio jacks, power jacks of device D1 as well as passageways to permit sound therethrough, e.g., sound emitting from a speakers and/or sound being picked up by a microphone present in device D1. For example, and referring to FIG. 34, sealing plate 200 includes a first port 210 including through hole 211, a second port 212 including through hole 213, a third port 214 including through hole 215, and a fourth port 216 including through hole 217. Although sealing plate 200 is shown comprising first, second, third and fourth ports 210, 212, 214, 216 the number of ports disclosed herein can vary depending on the number of audio jacks, power jacks, speakers, microphones present on device D1.

Figure 34:
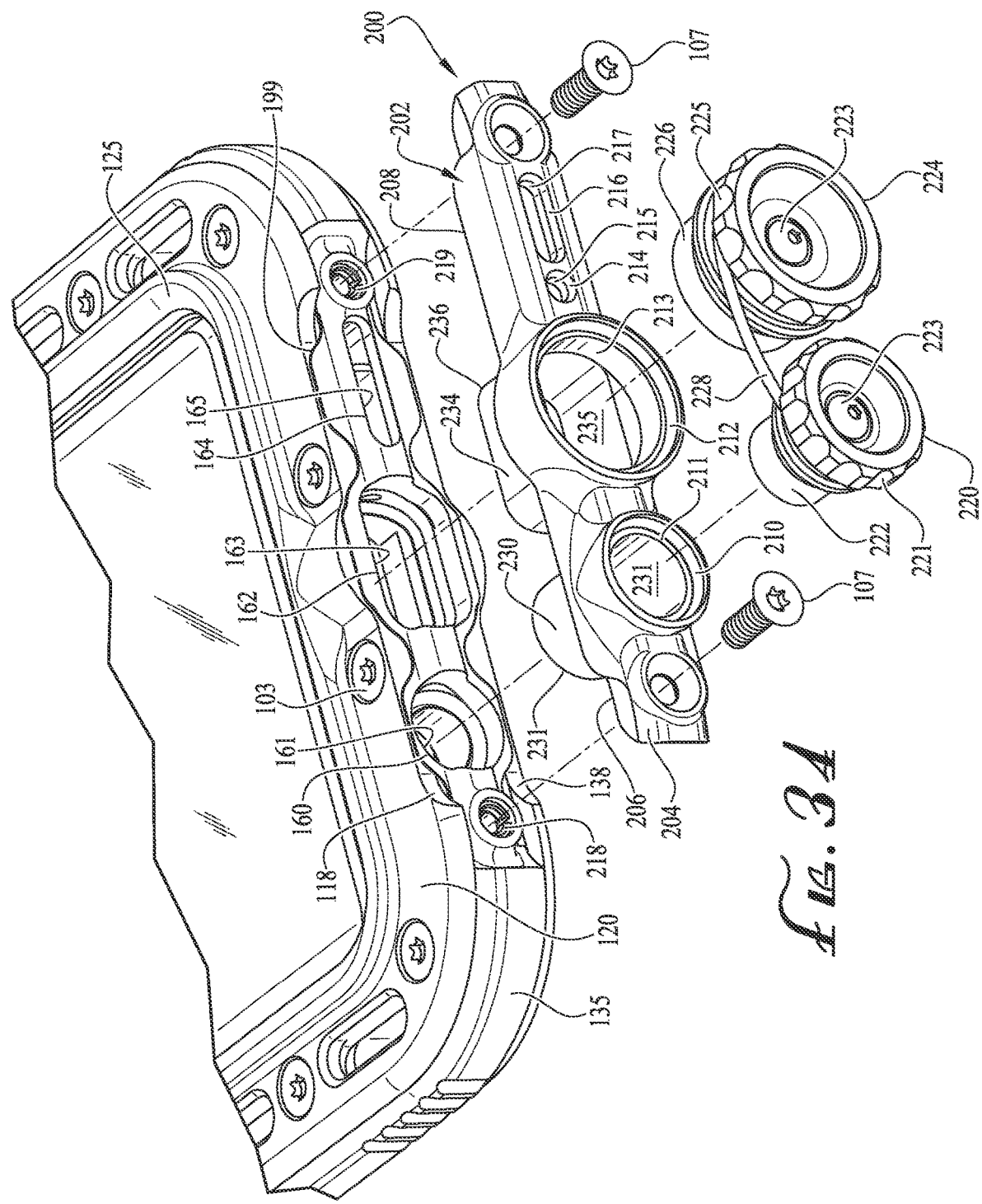
FIG. 34 is a magnified partially exploded top perspective view of the third side of the rail of FIG. 33.
Figure 35:
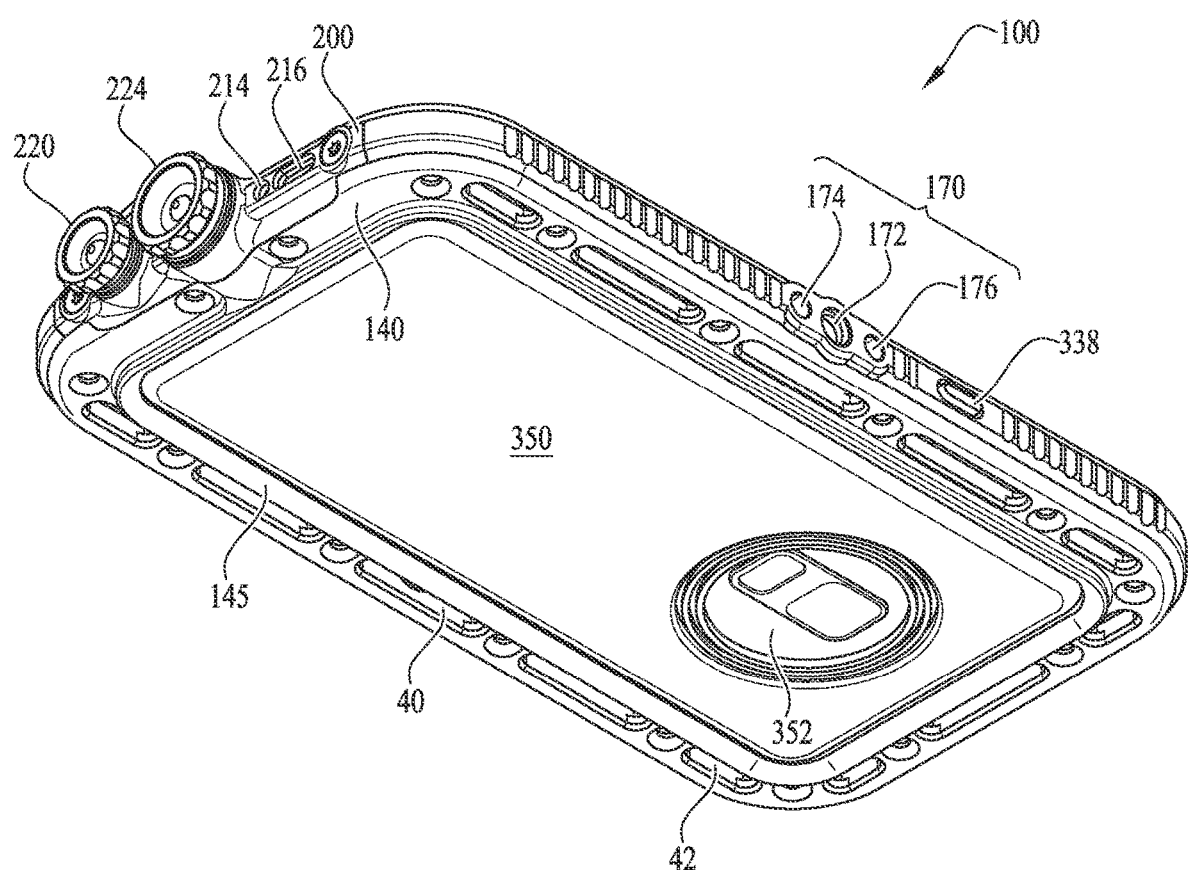
FIG. 35 is a bottom perspective of the rail of FIG. 22.
Figure 44:
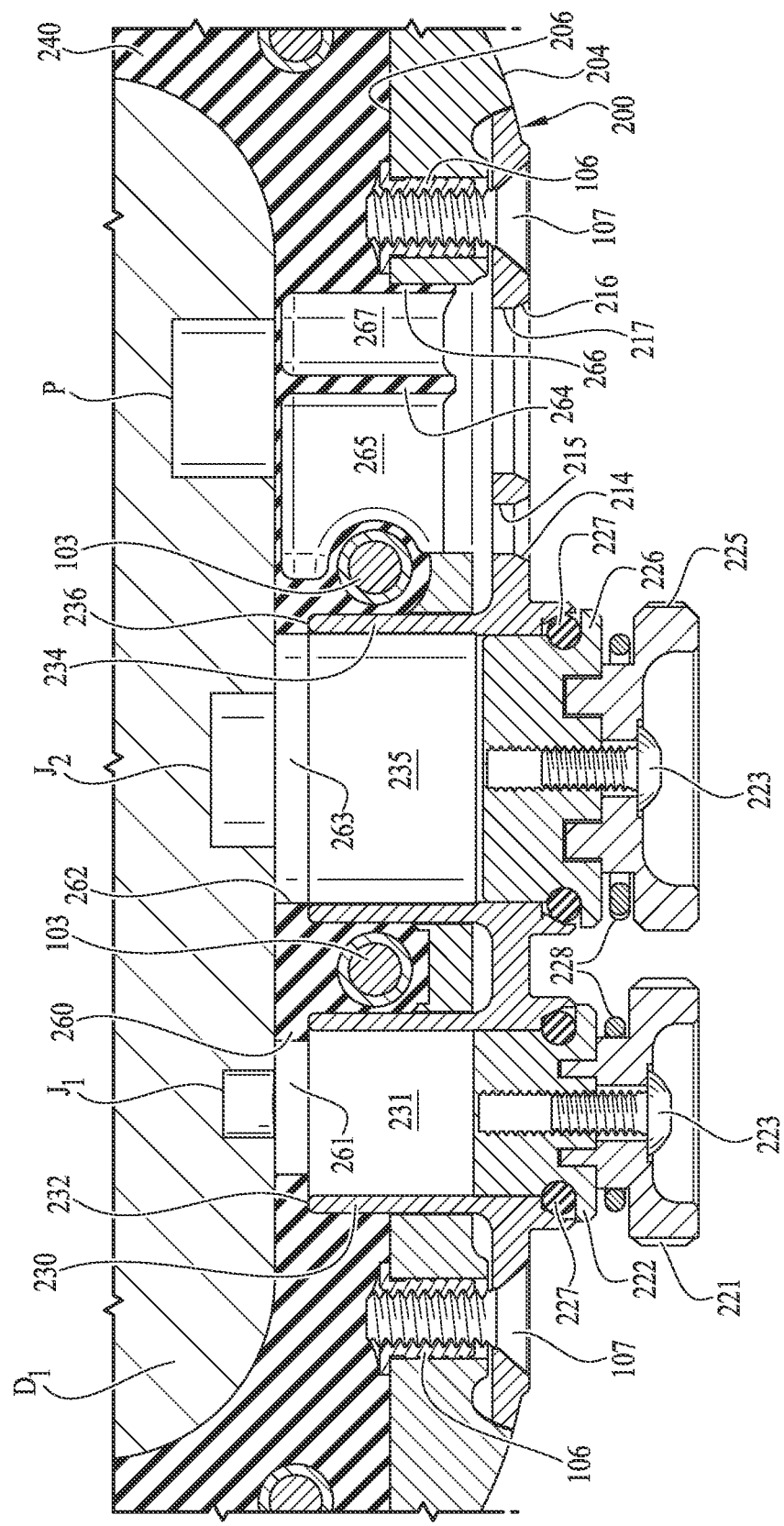
FIG. 44 is a magnified partial cross-sectional view of the rail of FIG. 41, taken at 44-44.

As shown in FIG. 34, inner surface of sealing plate 200 comprises a tenon portion 208 configured to insert into a mortise 199 in a manner where sealing plate 200 is in direct opposition to mortise 199. Mortise 199 is composed of mortise portion 118 of first frame member 110, mortise portion 138 of second frame member 130, and portions of third side 153 of sidewall frame member 150. Additionally, as best seen in FIGS. 34, 44, inner surface 206 comprises a first hollow boss 230 which extend perpendicularly from inner surface 206 and includes a leading edge 232 and through hole 231 in alignment with first port 210 and forming a continuous though hole with thought hole 211. Similarly, and as best seen in FIGS. 33, 44, inner surface 206 comprises a second hollow boss 234 which extend perpendicularly from inner surface 206 and includes a leading edge 236 and through hole 235 in alignment with second port 212 and forming a continuous though hole with thought hole 213.

Figure 45:
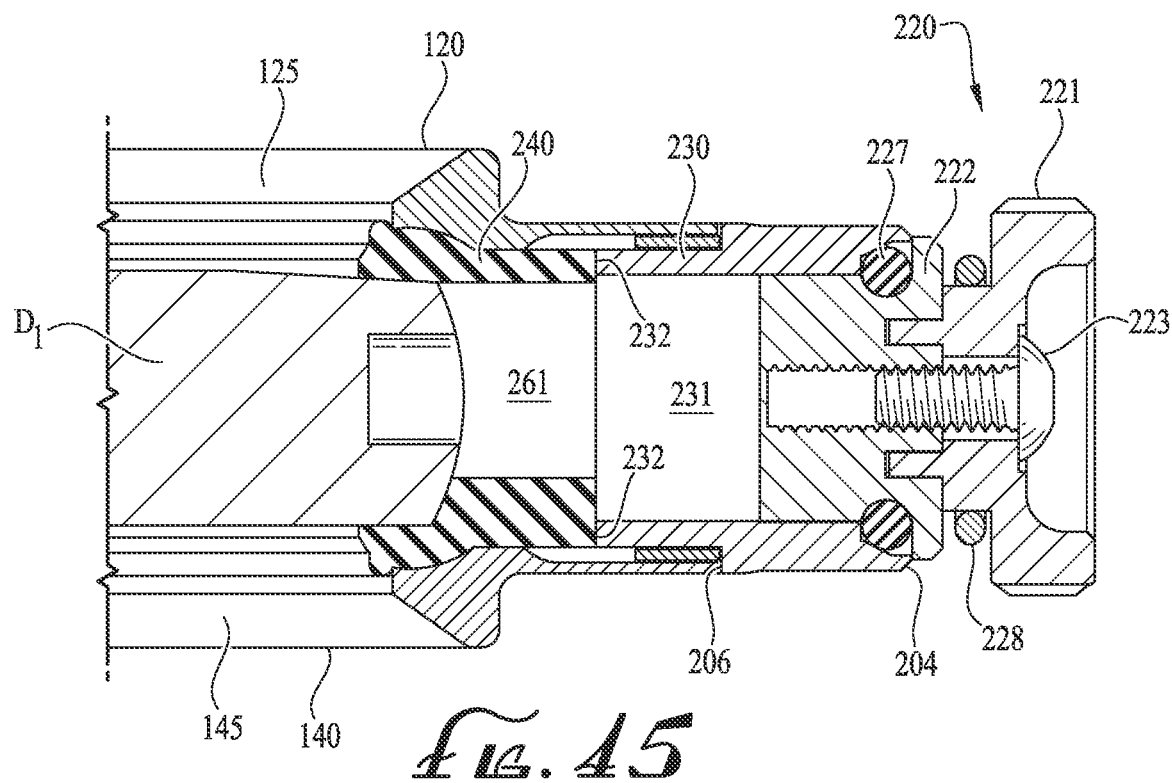
FIG. 45 is a magnified partial cross-sectional view of the mounting system of FIG. 36, taken at 45-45.

In some embodiments, sealing plate 200 includes one or more sealing caps configured to close access to one or more ports contained in sealing plate 200, preferably providing a water-tight seal like a water-resistant seal or waterproof seal. For example, and referring to FIG. 36, sealing plate 200 a sealing cap 220 for first port 210 and a sealing cap 224 for second port 212. As best seen in FIGS. 34, 44 & 45, sealing cap 220 comprises a griping portion 221 comprising a through hole, a plug portion 222 comprising a threaded blind hole. Sealing cap 220 further includes a screw 223 used to secure griping portion 221 to plug portion 222 by inserting screw 223 through griping portion 221 using the through hole and affixing screw 223 into threaded blind hole plug portion 222. As shown in FIGS. 44 & 45, sealing cap 220 further includes an O-ring 227 located on the inner surface of griping portion 221. Similarly, and as best seen in FIGS. 33, 44 & 45, sealing cap 224 comprises a griping portion 225 comprising a through hole, a plug portion 226 comprising a threaded blind hole. Sealing cap 224 further includes a screw 223 used to secure griping portion 225 to plug portion 226 by inserting screw 223 through griping portion 225 using the through hole and affixing screw 223 into threaded blind hole plug portion 226. As shown in FIGS. 44 & 45, sealing cap 224 further includes an O-ring 227 located on the inner surface of griping portion 221. Sealing caps 220 and 224 can be flexibly connected by a lanyard 228 that permits one cap to be removed and held by lanyard 228 to the other cap still threaded within sealing plate 200. Further, lanyard 228 permits sealing caps 220 and 224 to freely rotate for threading sealing caps 220 and 224 into and out of their respective threaded holes of first port 210 and second port 212.

In some embodiments, one or more ports of sealing plate 200 may not be associated with sealing cap, relying instead on a gasket disclosed herein, such as gasket 240 or gasket 300 to provide a water-tight seal like a water-resistant seal or waterproof seal. For example, as best shown in FIG. 44, third port 214 and fourth port 216 do not have sealing caps and instead relying on a gasket disclosed herein, such as gasket 240 or gasket 300 to provide a water-tight seal like a water-resistant seal or waterproof seal.

FIG. 33 shows an exploded view if device case 100. During assembly alignment, device D1 is inserted into gasket 240 and then encased within first frame member 110, sidewall frame member 150, and second frame member 130, which serve as the primary structural components of device case 100, and can be made from a tough material, preferably a polymer or metal or metal alloy, e.g., an aluminum or aluminum alloy. When assembly aligned, sidewall frame member 150 is sandwiched between first frame member 110 and second frame member 130. As best shown in FIGS. 25, 27, 29 & 47, first frame member 110 and second frame member 130 capture sidewall frame member 150 between the two using a mortise and tenon assembly. Tenon 194 of sidewall frame member 150 inserts and rest within mortise 127 of first frame member 110, and enables notch 195 of sidewall frame member 150 to rest upon a bottom surface of outer side surface 122 of first frame member 110. Similarly, tenon 196 of sidewall frame member 150 inserts and rest within mortise 147 of second frame member 130, and enables notch 197 of sidewall frame member 150 to rest upon a bottom surface of outer side surface 142 of second frame member 130.

Referring to FIGS. 33, 47 & 48, a plurality of support barrels 102 are inserted into seat 128 of first frame member 110 and/or seat 148 of second frame member 130 in a manner that aligns each of a plurality of through holes 58 present on first frame member 110 and second frame member 130. Support barrel 102 comprises a body and a first end and a second end, with each of first and second ends having a threaded hole. As such, support barrel 102 serves as a female-female threaded standoff. In addition, when first frame member 110, sidewall frame member 150, and second frame member 130 are composed of a soft polymer or metal material whose threaded portions of would be prone to strip, support barrel 102, which is made of a high-strength material like of stainless steel, will address this concern and provide loner durability of device case 100.

As shown in FIGS. 34 & 36, sealing plate 200 is assembly aligned by inserting boss 230 pass through hole 161 of first port 160 of sidewall frame member 150 and boss 234 pass through hole 163 of second port 162 of sidewall frame member 150, and then aligning and inserting tenon portion 208 of sealing plate 200 within mortise 199. Mortise 199 is formed from mortise portion 118 of first frame member 110, mortise portion 138 of second frame member 130, and portions of third side 153 of sidewall frame member 150. This mortise and tenon assembly facilitates alignment of first port 210 of sealing plate 200 with first port 160 of sidewall frame member 150, second port 212 of sealing plate 200 with second port 162 of sidewall frame member 150, and third and fourth ports 214, 216 of sealing plate 200 with third port 164 of sidewall frame member 150 in a manner where sealing plate 200 is in direct opposition to sidewall frame member 150.

As shown in FIGS. 33, 34 & 44, sealing plate 200 is configured to be detachably connected to device case 100 by inserting screws 107 pass through holes 218 and 219 of sealing plate 200 and securing into threaded portion of inserts 106. Insert 106 comprises a body, a first side with a threaded blind hole, and a second side, and is made of a high-strength material like of stainless steel.

In some embodiments, and as shown in FIG. 33, an attachment plate insert 104 is inserted into each attachment plate 170 in a manner that aligns attachment plate insert 104 with each attachment port 172. Attachment plate insert 104 comprises a body and threaded hole and is typically made of a high-strength material like of stainless steel. In some embodiments, and as shown in FIG. 48, attachment port 172 is threaded and the use of attachment plate insert 104 is optional.

Similarly, button inserts disclosed herein are assembled into sidewall frame member 150. As shown in FIG. 33, a first button insert 332 is inserted pass through hole 181 of first button insert port 180, a second button insert 334 is inserted pass through hole 183 of second button insert port 182, a third button insert 336 is inserted pass through hole 185 of third button insert port 184, and a first button insert 338 is inserted pass through hole 187 of fourth button insert port 186.

Once all component parts of device case 100 are assembly aligned, first frame member 110 is then firmly attached to second frame member 130 by tightening a plurality of screws 103 each of which insert pass through hole 58 and are secured into support barrel 102. Although screws 103 are only shown as being inserted from the top, i.e., from first a frame member 110 direction to a second frame member 130, direction, a plurality of screws 103 in a similar pattern can be threaded in from underneath, i.e., from second a frame member 130 direction to a first frame member 110, direction. In this assembly, first frame member 110 and second frame member 130 compressively bearing down on sidewall frame member 150.

Additionally, as first frame member 110 is drawn toward second frame member 130 by tightening the screws 103, gasket 240 is compressed until first and second frame members 110, 130 bear against their respective tenons 194, 196 of sidewall frame member 150, or until gasket 240 can no longer be compressed, e.g., even if there is a slight gap between first and second frame members 110, 130 and their respective tenons 194, 196. In this example, support barrels 102 act as standoffs between first and second frame members 110, 130 that is sized so that it limits the compression of gasket 240.

Once device case 100 is assembled, top surface 120 of first frame member 110, top surface 140 of second frame member 130, and outer surface 192 of sidewall frame member 150 come together to form a rail disclosed herein, such as rail 20. As shown in FIGS. 22, 23, & 35-41, top surface 120 of first frame member 110 is equivalent to first engagement surface 30, top surface 140 of first frame member 130 is equivalent to second engagement surface 32, and outer surface 192 of sidewall frame member 150 is equivalent to third engagement surface 34. In this configuration, bracket 400 of mounting system 10 can selectively locks to device case 100 by engaging one or more engagement slots 40, 42 formed on top surface 120 of first frame member 110 and top surface 140 of second frame member 130. For example, as shown in FIGS. 22, & 23, bracket 400 is illustrated as selectively locked to engagement slot 40.

Figure 42:
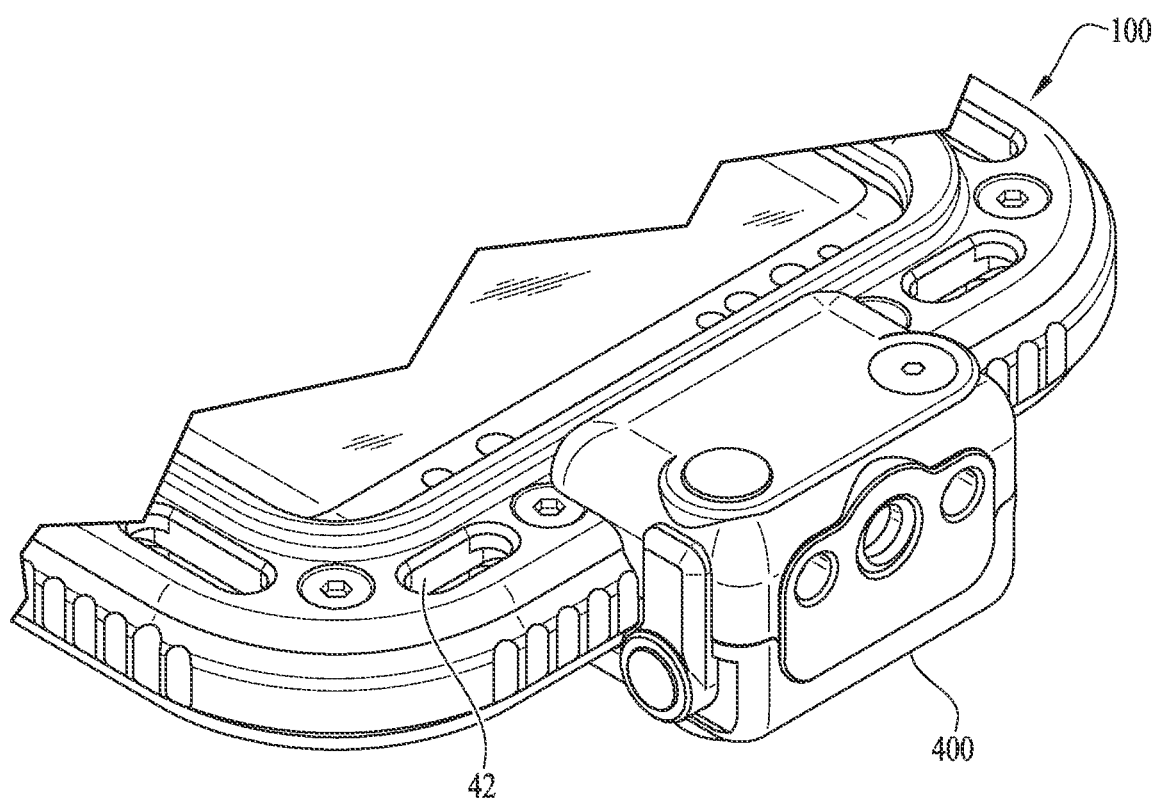
FIG. 42 is a magnified top perspective view of a mounting system disclosed herein, showing a bracket disclosed herein in a first position on the first end of a rail disclosed herein.
Figure 43:
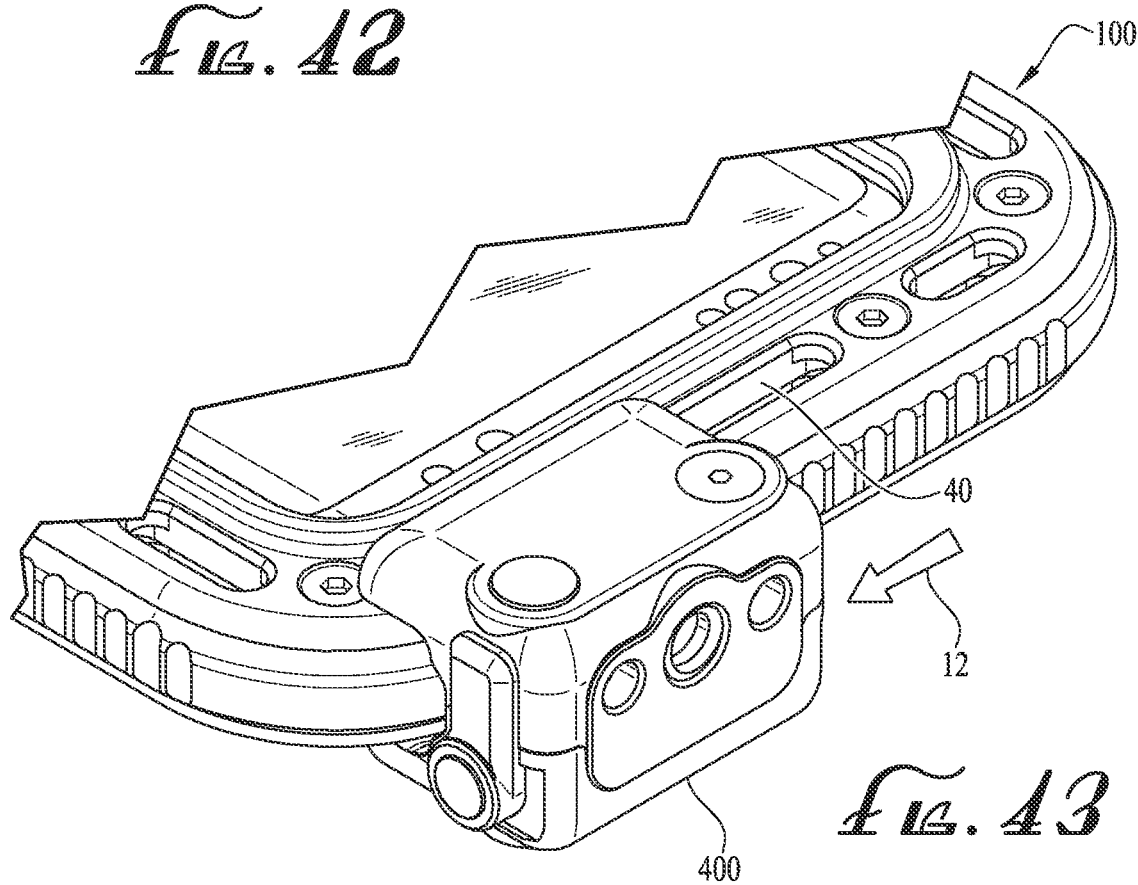
FIG. 43 is a magnified perspective view of the mounting system of FIG. 41, showing a bracket disclosed herein moved to a second position on the first end of a rail disclosed herein.

In some embodiments, and as shown in FIGS. 42 & 43, top surface 120 of first frame member 110 and top surface 140 of second frame member 130, each comprise engagement slots 40, 42. Mounting system 10 comprising device case 100 of FIGS. 42 & 43 further includes bracket 400 having first jaw 410 with two engagement bosses 424 and second jaw 510 with two engagement bosses 524 configured to properly attached to device case 100 of FIGS. 42 & 43. For example, each engagement boss 424 of first jaw 410 is sized and spaced apart so that 1) both can selectively fit into engagement slot 40, 2) both can straddle between two engagement slots 42 selectively fit into both engagement slots 42, and 3) both can straddle between engagement slots 40, 42 with one engagement boss 424 selectively fitting into engagement slot 40 and the other engagement boss 424 selectively fitting into engagement slot 42. Similarly, each engagement boss 524 of second jaw 510 is sized and spaced apart so that 1) both can selectively fit into engagement slot 40, 2) both can straddle between two engagement slots 42 selectively fit into both engagement slots 42, and 3) both can straddle between engagement slots 40, 42 with one engagement boss 524 selectively fitting into engagement slot 40 and the other engagement boss 524 selectively fitting into engagement slot 42.

In addition, and referring to FIG. 43, arrow 12 illustrates the movement of bracket 400 from being solely engaged within engagement slot 40 to being engaged within both engagement slot 40 and second engagement slot 42, with one engagement boss 424, 524 of first and second jaw members 410, 510 respectively being engaged within engagement slot 40, and the other engagement boss 424, 524 of first and second jaw members 410, 510 respectively being engaged within engagement slot 42, with bracket 400 spanning the gap between engagement slot 40 and engagement slot 42. Of course, when in the locked or clamped configuration, bracket 400 cannot be simply slid to the left as indicated by arrow 12. First, bracket 400 must be unlocked to disengage engagement bosses 424, 524 from engagement slot 58 achieved by separating first jaw member 410 from second jaw member 510 (which will be discussed in greater detail below). Next, bracket 400 can be either slid over rail comprising device case 100 or removed altogether from rail comprising device case 100 to reposition one engagement boss 424, 524 overtop engagement slot 42 and repositioning the other engagement boss 424, 524 overtop engagement slot 40. Thereafter, first jaw member 410 and second jaw member 510 are manually compressed toward each other to reengage engagement bosses 424, 524 to rail comprising device case 100, within engagement slot 40 and engagement slot 42.

Figure 46:
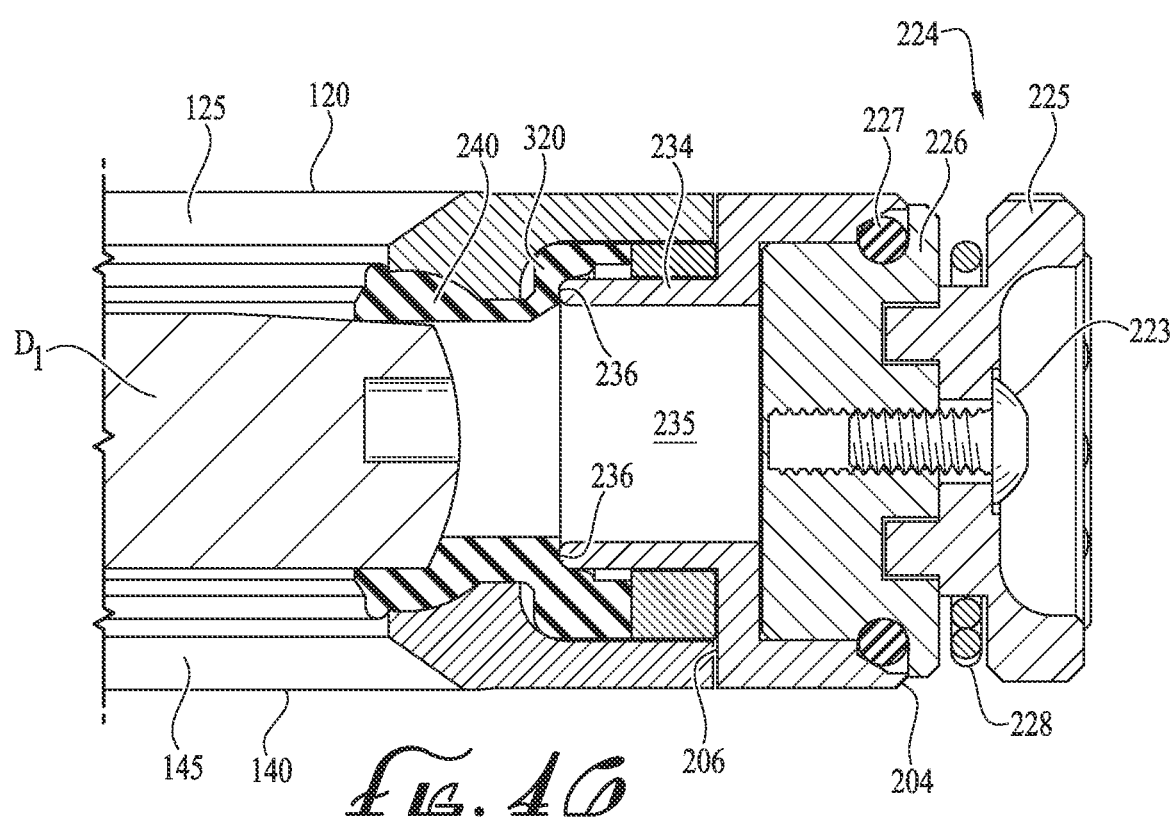
FIG. 46 is a magnified partial cross-sectional view of the mounting system of FIG. 36, taken at 46-46.
Figure 67:
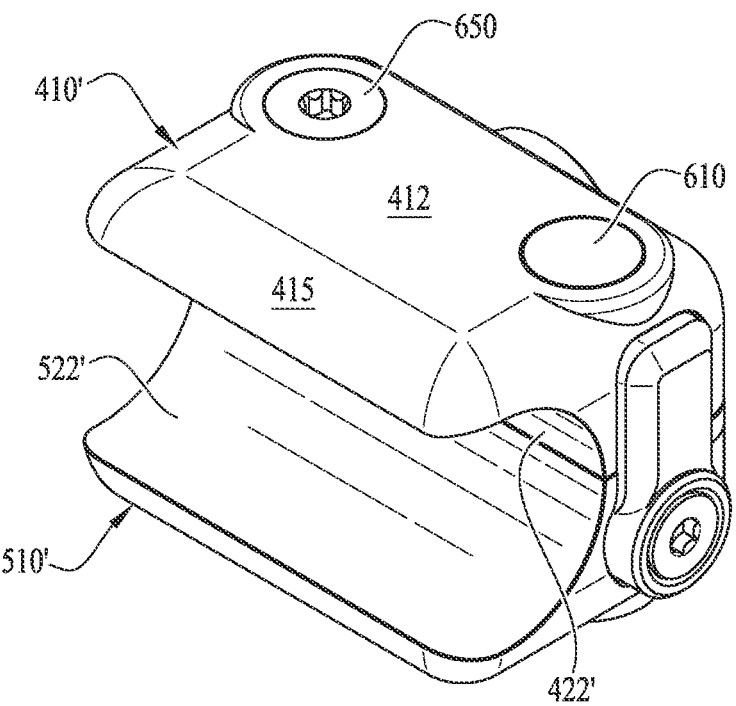
FIG. 67 is a front top perspective view of a bracket disclosed herein in the closed configuration.
Figure 68:
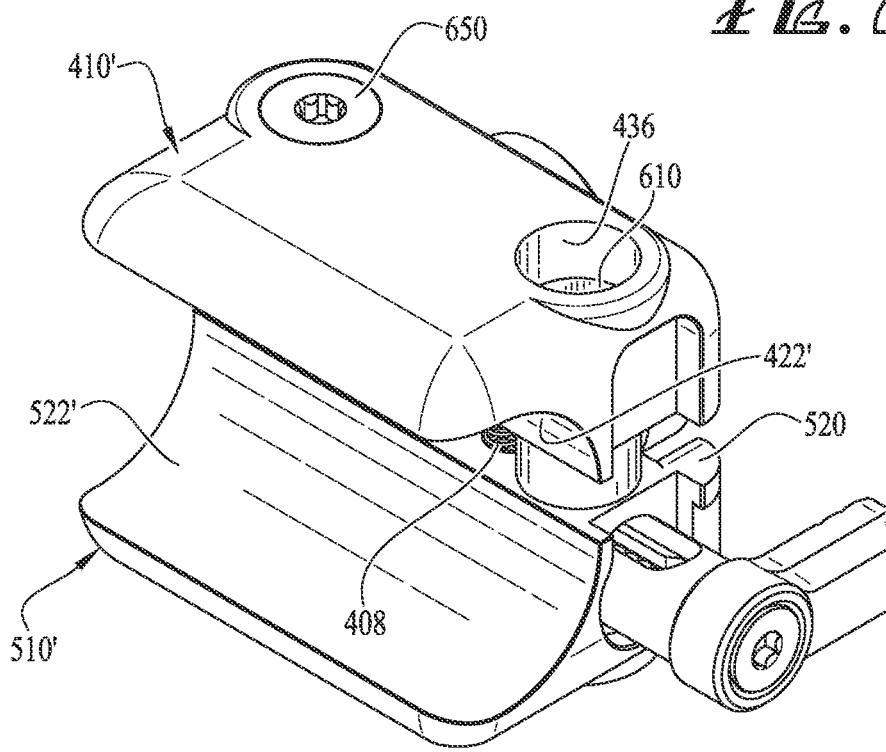
FIG. 68 is a front top perspective view of the bracket of FIG. 67 in the open configuration.
Figure 69:
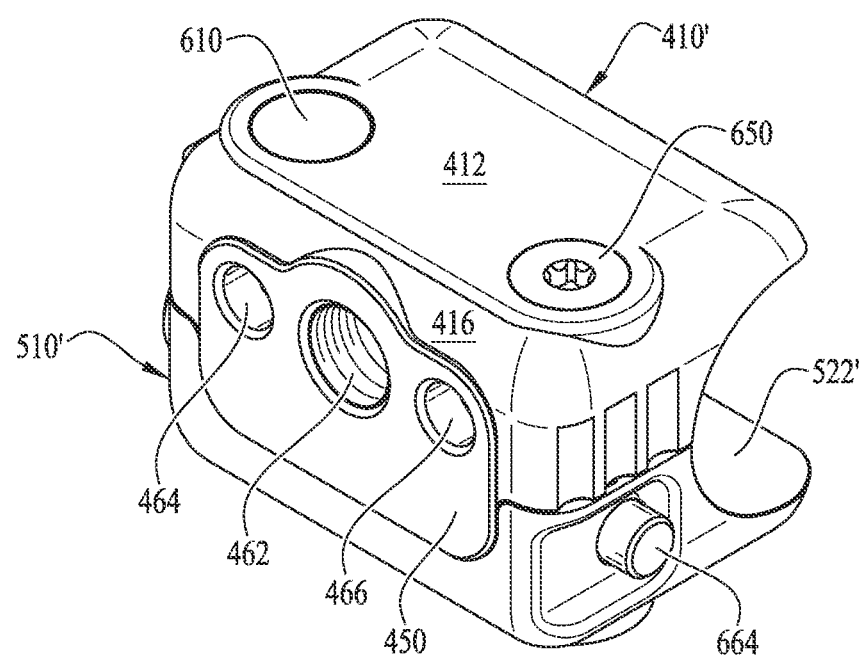
FIG. 69 is a back top perspective view of the bracket of FIG. 67 in the closed configuration.

A device case disclosed herein can further comprise a water-tight seal like a water-resistant seal or waterproof seal. For example, in some embodiments, and as shown in detail in FIGS. 44-50, gasket 240 is employed to form a water-tight seal for device case 100. Referring to FIGS. 44-46, gasket 240 creates a water-tight seal for the various audio jacks, power jacks, speakers, microphones present on device D1, yet permitting access various cables for connection to various audio jacks, power jacks of device D1 as well as passageways to permit sound therethrough, e.g., sound emitting from a speakers and/or sound being picked up by a microphone present in device D1.

For example, as shown in FIGS. 44 & 45, leading edge 232 of hollow boss 230 of first port 210 of sealing plate 200 is inserted pass through hole 161 of first port 160 of sidewall frame member 150 and abuts circumferential edge of first port 260 of gasket 240. Leading edge 232 is configured to be pushed against first port 260 of gasket 240, with leading edges 232 deforming first port 260 so that a water-tight seal is formed between first port 210 of sealing plate 200 and first port 260 of gasket 240. A continuous access though hole is formed from through holes 211, 231 of first port 210 of sealing plate 200 and though hole 261 of first port 260 of gasket 240. This continuous access though hole can be closed with a water-tight seal using sealing cap 220 of first port 210 of sealing plate 200. As sealing cap 220 is secured using threaded portion of first port 210, O-ring 227 is pushed against a circumference of first port 210 so that a water-tight seal is formed between sealing cap 220 and first port 210.

Similarly, as shown in FIGS. 44 & 46, leading edge 236 of hollow boss 234 of second port 212 of sealing plate 200 is inserted pass through hole 163 of second port 162 of sidewall frame member 150 and abuts circumferential edge of second port 262 of gasket 240. Leading edge 236 is configured to be pushed against second port 262 of gasket 240, with leading edges 236 deforming second port 262 so that a water-tight seal is formed between second port 212 of sealing plate 200 and second port 262 of gasket 240. A continuous access though hole is formed from through holes 213, 235 of second port 212 of sealing plate 200 and though hole 263 of second port 262 of gasket 240. This continuous access though hole can be closed with a water-tight seal using sealing cap 224 of second port 212 of sealing plate 200. As sealing cap 224 is secured using threaded portion of first port 210, O-ring 227 is pushed against a circumference of second port 212 so that a water-tight seal is formed between sealing cap 224 and second port 212.

Referring to FIG. 44, in some embodiments, third and fourth port 214, 216 of sealing plate 200 is inserted pass through hole 165 of third port 164 of sidewall frame member 150 and abuts circumferential edge of third and fourth ports 264, 266 of gasket 240. The leading edge of third and fourth port 214, 216 are configured to be pushed against third and fourth ports 264, 266 of gasket 240, with this leading edge deforming circumferential edge of third and fourth ports 264, 266 so that a water-tight seal is formed between third and fourth port 214, 216 of sealing plate 200 and third and fourth ports 264, 266 of gasket 240. A chamber is formed from through hole 215, 217 of third and fourth port 214, 216 of sealing plate 200 and closed or blind holes 265, 267 of third and fourth ports 264, 266 of gasket 240. Since third and fourth ports 264, 266 are hollow portions formed partially through gasket 240 leaving a thin wall, a water-tight passageway is formed which covers microphone/speaker port P yet permits transmission of sound through passageway, e.g., sound emitting from and/or sound being picked up by microphone/speaker port P present in device D1.

In addition, gasket 240 creates a water-tight seal for the body of device D1. As shown in FIGS. 47 & 48, first frame members 110 includes overhang 124 extending inwardly about inner perimeter 116 and configured directly or indirectly (e.g., through gasket 240) to bear against device D1 and/or if present top cover 340. In embodiments where top cover 340 and bottom cover 350 are not present in device case 100, and as shown in FIGS. 47 & 48, gasket member 240 is configured so that overhang 124 of first frame members 110 can bear down on gasket 240, which in turn bears down against device D1, so that a water-tight seal is formed between first frame members 110 and device D1. Similarly, as still referring to FIGS. 47 & 48, second frame member 130 includes overhang 144 extending inwardly about inner perimeter 136 and configured directly or indirectly (e.g., through gasket 240) to bear against device D1 and/or if present bottom cover 350. Gasket member 240 is configured so that overhang 144 of second frame members 130 can bear down on gasket 240, which in turn bears down against device D1, so that a water-tight seal is formed between second frame members 130 and device D1. Further, and as shown in FIGS. 47 & 48, gasket member 240 is configured to insert into seat 198 of sidewall frame member 150 so that seat 198 of sidewall frame member 150 can bear down on gasket 240, which in turn bears down against device D1, so that a water-tight seal is formed between sidewall frame member 150 and device D1.

In embodiments where top cover 340 and bottom cover 350 are present in device case 100 (see FIGS. 45-48), top and bottom perimeters of inner surface 283 of gasket 240 can optionally comprise groove 286, 288, respectively to receive top and bottom covers 340, 350. In addition, gasket 240 can be configured to fold over perimetral edges of top and bottom covers 340, 350 at groove 286, 288, respectively, so that overhang 124 of first frame member 110 and overhang 144 of second frame members 130 can bear down on gasket 240, which in turn bears down against top and bottom covers 340, 350, enhancing the water-tight seal of device case 100.

In addition, gasket 240 creates a water-tight seal for the various control buttons present on device D1, yet permitting operation of such control button by a user. As shown in FIGS. 26 & 27, when gasket 240 is affixed to device D1, first, second, third and fourth button protrusions 270, 272, 274, 276 are aligned with control buttons B1, B2, B3, respectively of device D1. Similarly, assembly alignment of first, second, third and fourth button inserts 332, 334, 336, 338 ensures that these inserts are aligned with first, second, third and fourth button protrusions 270, 272, 274, 276, respectively. In this configuration, a button insert can selectively be brought into contact with its respective button protrusion formed on gasket 290, which permit operation of the associated control buttons on device D1 while still maintaining a water-tight seal of device case 100. For example, as shown in FIGS. 26 & 27, first button insert 332 contacts first button protrusion 270 on gasket 240 for activating control button B1 of device D1, once pushed in by a user. Similarly, second button insert 334 contacts second button protrusion 272 on gasket 240 for activating control button B2 of device D1, once pushed in by a user; third button insert 336 contacts third button protrusion 274 on gasket 240 for activating control button B3 of device D1, once pushed in by a user; and fourth button insert 338 contacts fourth button protrusion 276 on gasket 240 for activating control button B4 of device D1, once pushed in by a user. In this configuration, second and third button protrusion 272, 274 act as a toggle to, e.g., by lowering or raising the volume of device D1.

The present specification also discloses an adjustable rail. An adjustable rail is one where the position of the rail can be adjusted by moving the rail left or right rail along the x-axis, moving the rail forward or backwards along the y-axis, and/or raising or lowering the height of the rail along the z-axis.

In some embodiments, an adjustable rail disclosed herein comprises many of the features embodied by rail 20. For example, an adjustable rail comprises a body that is a linear structure, the length of which can vary depending on the desired application. A body disclosed herein comprises a first end and a second end and has a first engagement surface, a second engagement surface, a third engagement surface, and an optional fourth engagement surface. A first engagement surface disclosed herein is opposite to a second engagement surface disclosed herein with third engagement surface disclosed herein spanning between the first engagement surface and the second engagement surface. A first engagement surface disclosed herein is generally parallel to a second engagement surface disclosed herein, with a third engagement surface disclosed herein being substantially perpendicular to the two. When present, a fourth engagement surface disclosed herein is opposite to the third engagement surface with the fourth engagement surface spanning between the first engagement surface and the second engagement surface, forming a four-sided structure. When a fourth engagement surface disclosed herein is not present, the first engagement surface, the second engagement surface and third engagement surface form three-sided, U-shaped structure. In some embodiments, each of the first, second and third engagement surfaces disclosed herein comprise a single engagement slot disclosed herein. In some embodiments, each of the first, second and third engagement surfaces disclosed herein can each comprise a plurality of engagement slots disclosed herein, with the plurality of engagement slots being identical in shape or composed of two or more different shapes. A though hole is located at one end of an adjustable rail disclosed herein, for example the second end. The through hole is configured to align with the first and second though holes of a first and a second arm of a rotatable pivot joint disclosed herein and to receive a pivot bolt.

In addition, an adjustable rail disclosed herein further comprises a mounting plate, a rotatable spring hinge assembly, an elevation knob assembly and a windage knob assembly. A mounting plate is a linear structure that conforms to the length and width of an adjustable rail disclosed herein with a top surface, a bottom surface, a first end, and a second end. A rotatable spring hinge assembly is located one end of the top surface of a mounting plate disclosed herein, for example the second end. A rotatable spring hinge assembly disclosed herein is a U-shaped structure having a base, a first arm, a second arm, and a tension spring. The base of the rotatable spring hinge assembly is secured to the top surface of the mounting plate by a rotatable joint that enables rotation of the rotatable spring hinge assembly. The first and second arms extend perpendicular from the base, the first arm being generally parallel to the second arm. The first and second arms of the rotatable spring hinge assembly each include a through hole, the first and second through holes aligned with each other and configured to receive a pivot bolt. A tension spring disclosed herein includes a though hole configured to receive the pivot bolt and to be located between the first and second arms once assembled.

The mounting plate disclosed herein is assembled with an adjustable rail disclosed herein in a manner that aligns the first and second through holes of the first and second arms of the rotatable spring hinge assembly with the though hole of the tension spring of the rotatable spring hinge assembly and the though hole of the adjustable rail in a manner that enables a pivot bolt to be inserted through the first though hole of the first arm, the through hole of the tension spring and the though hole of the adjustable rail, and finally though the second through hole of the second arm. Once assembled the tension spring of the rotatable spring hinge assembly exerts a downward force on the adjustable rail in a direction toward the top surface of the mounting plate. The rotatable joint located at the base of the rotatable spring hinge assembly allows movement of the adjustable rail relative to the mounting plate is a plane parallel to the top surface of the mounting plate to enable a side-to-side movement (or left-right movement, or horizontal movement, or windage movement). The pivot bolt allows movement of the adjustable rail relative to the mounting plate is a plane perpendicular to the top surface of the mounting plate to enable an up-down movement (or vertical movement, or canting movement, or elevation movement).

An adjustable rail disclosed herein also includes an elevation knob assembly and a windage knob assembly. An elevation knob assembly (also referred to as a canting knob assembly) is configured to control the up-down movement of the adjustable rail. In some embodiments, an elevation knob assembly disclosed herein is a screw-adjustment mechanism including an elevation knob and an adjustment screw configured to cause rotation of the adjustment screw when the elevation knob is turned. For example, turning the elevation knob clockwise can cause rotation of the adjustment screw in a manner that moves the adjustment screw upward in a direction perpendicular to the top surface of the mounting plate. This upward movement of the adjustment screw exerts an upward force on the adjustable rail causing the adjustable rail to pivot via the pivot bolt in an upward direction. Likewise, turning the elevation knob counter-clockwise can cause rotation of the adjustment screw in a manner that moves the adjustment screw downward in a direction perpendicular to the top surface of the mounting plate. This downward movement of the adjustment screw exerts a downward force on the adjustable rail (facilitated by the tension spring) causing the adjustable rail to pivot via the pivot bolt in a downward direction. In some embodiments, the up-down movement of an elevation knob assembly disclosed herein is calibrated based on a unit of angle system, for example Minutes of Angle (MOA). In some embodiments, the up-down movement of an elevation knob assembly disclosed herein is calibrated based on a unit of length. In some embodiments, an elevation knob assembly disclosed herein can include both a rough adjustment mechanism that causes gross up-down movement of an adjustable rail disclosed herein and a fine adjustment mechanism that causes minute up-down movement of an adjustable rail disclosed herein.

A windage knob assembly is configured to control the side-to-side movement of the adjustable rail. In some embodiments, a windage knob assembly disclosed herein is a screw-adjustment mechanism including a windage knob and an adjustment screw configured to cause rotation of the adjustment screw when the windage knob is turned. For example, turning the windage knob clockwise can cause rotation of the adjustment screw in a manner that moves the adjustment screw leftward in a direction parallel to the top surface of the mounting plate. This leftward movement of the adjustment screw exerts an leftward force on the adjustable rail causing rotation via the rotatable in a leftward direction. Likewise, turning the windage knob counter-clockwise can cause rotation of the adjustment screw in a manner that moves the adjustment screw rightward in a direction parallel to the top surface of the mounting plate. This rightward movement of the adjustment screw exerts a rightward force on the adjustable rail causing rotation via the rotatable joint in a rightward direction. In some embodiments, the side-to-side movement of a windage knob assembly disclosed herein is calibrated based on a unit of angle system, for example Minutes of Angle (MOA). In some embodiments, the side-to-side movement of a windage knob assembly disclosed herein is calibrated based on a unit of length. In some embodiments, a windage knob assembly disclosed herein can include both a rough adjustment mechanism that causes gross side-to-side movement of an adjustable rail disclosed herein and a fine adjustment mechanism that causes minute side-to-side movement of an adjustable rail disclosed herein.

A mounting system disclosed herein comprises one or more brackets disclosed herein. In some embodiments, and as shown in FIGS. 51-70, bracket 400 comprises a first jaw member 410 and a second jaw member 510. In some embodiments, and as shown in FIGS. 51-54, first jaw member 410 comprising an outer surface 412, an inner surface 414, a front side 415, a back side 416, a first side 417 and a second side 418. Referring to FIGS. 59, 60, & 96-99, outer surface 412 can include a counter sink 419 to properly seat a latching pin screw 650 and first open end of a guide pin bore 436 to allow movement of a guide pin 610 through first jaw 410. In some embodiments, counter sink 419 is located near first side 417 and guide pin bore 436 is located near second side 418. As shown in FIGS. 60, 65, 97, & 98, second side 418 can include a recessed portion 430 configured to receive a tab 690 in order to provide a lower profile of tab 690 when seated in recessed portion 430 (see, e.g., FIGS. 51, 56, & 99). Referring to FIGS. 52, 56, 60 & 64, back side 416 comprises back plate 450 configured to insert into a back plate recess 550.

As shown in FIGS. 63 & 77, inner surface 414 comprises a matting portion 420 and a clamping portion 422. In some embodiments, and referring to FIGS. 77, 78, & 96-99, matting portion 420 is a flat surface that includes a second open end of guide pin bore 436, a latching pin counter bore 440, a first blind hole that is a first seat 432 for a first jaw compression spring 406 and a second blind hole that is a second seat 434 for a second jaw compression spring 408. In some embodiments, latching pin counter bore 440 is located near first side 417 and guide pin bore 436 is located near second side 418 with first and second seats 432, 434 located between guide pin bore 436 and latching pin counter bore 440.

In some embodiments, clamping portion 422 comprises a single engagement boss. For example, FIG. 13 shows clamping portion 422 of first jaw member 410 with a single engagement boss 428. In some embodiments, clamping portion 422 comprises a plurality of engagement boss. For example, FIG. 63 shows clamping portion 422 of first jaw member 410 with a two engagement bosses 424 while FIG. 11 shows clamping portion 422 of first jaw member 410 with a six engagement bosses 426. In some embodiments, engagement bosses 424, 426, 428 can optionally be filleted to further enhance the secure connection of bracket 400 to rail 20 or device case 100. In some embodiments, engagement bosses 424, 426, 428 can optionally be fitted with an O-ring to further enhance the secure connection of bracket 400 to rail 20 or device case 100.

In some embodiments, and as shown in FIGS. 51-54, second jaw member 510 comprising an outer surface 512, an inner surface 514, a front side 515, a back side 516, a first side 517 and a second side 518. Referring to FIGS. 59, 60, & 96-99, outer surface 512 can include a counter sink 519 to properly seat a guide pin screw 620 and first open end of a latching pin bore 536 to allow movement of a latching pin 630 through second jaw 510. In some embodiments, latching pin bore 536 is located near first side 417 and counter sink 519 is located near second side 518. As shown in FIGS. 56, 57, 59, & 64, second side 518 can include a recessed portion 530 configured to receive tab 690 in order to provide a lower profile of tab 690 when seated in recessed portion 530. Referring to FIG. 64, back side 516 comprises back plate recess 550 configured to receive back plate 450 when bracket 400 is in a closed configuration.

Referring to FIG. 63, inner surface 514 comprises a matting portion 520 and a clamping portion 522. In some embodiments, and as shown in FIGS. 77, 78, 96-99, matting portion 520 is a flat surface that includes a second open end of latching pin bore 536, a guide pin counter bore 540, a first blind hole that is a first seat 532 for first jaw compression spring 406 and a second blind hole that is a second seat 534 for second jaw compression spring 408. In some embodiments, latching pin bore 536 is located near first side 517 and guide pin counter bore 540 is located near second side 518 with first and second seats 532, 534 located between latching pin bore 536 and guide pin counter bore 540.

In some embodiments, clamping portion 522 comprises a single engagement boss. For example, FIG. 13 shows clamping portion 522 of second jaw member 510 with a single engagement boss 528. In some embodiments, clamping portion 522 comprises a plurality of engagement boss. For example, FIG. 63 shows clamping portion 522 of second jaw member 510 with a two engagement bosses 524 while FIG. 11 shows clamping portion 522 of second jaw member 510 with a six engagement bosses 526. In some embodiments, engagement bosses 524, 526, 528 can optionally be filleted to further enhance the secure connection of bracket 400 to rail 20 or device case 100. In some embodiments, engagement bosses 524, 526, 528 can optionally be fitted with an O-ring to further enhance the secure connection of bracket 400 to rail 20 or device case 100.

In some embodiments, bracket 400 comprises first jaw member 410 having clamping portion 422 with one or more engagement bosses and second jaw 510 having clamping portion 522 with one or more engagement bosses. Engagement bosses disclosed herein located on first clamping portion 422 are arranged in opposition to engagement bosses located on second clamping portion 522. For example, as shown in FIGS. 9, 11, 13, 51-70, engagement bosses, such as, e.g., engagement boss 424, 426, 428, located on first clamping portion 422 of first jaw 410 are arranged in opposition to engagement bosses, such as, e.g., engagement boss 524, 526, 528, located on second clamping portion 522 of first jaw 510. This opposition can be in direct opposition or staggered opposition. In this configuration engagement bosses of first clamping portion 422 of first jaw member 410 engage one or more engagement slots, such as, e.g., engagement slots 40, 42, 44, 48, on a first engagement surface, such as, e.g., engagement surface 30 of rail 20 or top surface 120 of first frame member 110 of device case 100, and engagement bosses of second clamping portion 522 of second jaw 510 engage one or more engagement slots, such as, e.g., engagement slots 40, 42, 44, 48, on a second engagement surface, such as, e.g., engagement surface 32 of rail 20 or top surface 140 of first frame member 130 of device case 100.

In some embodiments, and as shown in FIGS. 55, 63, first clamping portion 422 of first jaw member 410 comprises two engagement bosses 424 and second clamping portion 522 of second jaw member 510 comprises two engagement bosses 524 configured to engage within one or more engagement slots, such as engagement slots 40 and or engagement slots 42. However, engagement bosses are optional and modifiable. For example, more or fewer engagement bosses 424, 524 can be arranged on first jaw member 410 and second jaw member 510, respectively, of bracket 400. In some embodiments, and as shown in FIGS. 66-75, first jaw member 410 and second jaw member 510 can lack engagement bosses. In some embodiments, and as illustrated in FIG. 11, first jaw member 410 and second jaw member 510 can include six engagement bosses 426, 526, respectively configured to engage within one or more engagement slots, such as engagement slots 46. In some embodiments, and as shown in FIG. 13, first jaw member 410 and second jaw member 510 each include a single engagement boss 428, 528, respectively configured to engage within one or more engagement slots, such as engagement slots 48. In other embodiments, engagement bosses can be excluded and replaced with an alternative engagement face, such as two opposing smooth faces, two opposing knurled faces, two opposing toothed faces, two opposing coated/covered faces (e.g., a layer of rubber or other elastomeric material), and/or any combination thereof, and/or other configuration. In these examples, bracket 400 can clamp to any number of attachment points compatible with the particular type of engagement face configuration. which may be on a rail or other object/base.

In addition, first clamping portion 422 of first jaw member 410 can include a different number of engagement bosses relative to second clamping portion 522 of second jaw member 510. In some embodiments, first clamping portion 422 of first jaw member 410 includes a single engagement boss and second clamping portion 522 of second jaw member 510 includes two or more engagement bosses. In some embodiments, first clamping portion 422 of first jaw member 410 includes two or more engagement bosses and second clamping portion 522 of second jaw member 510 includes a single engagement boss. In some embodiments, first clamping portion 422 of first jaw member 410 includes two or more engagement bosses and second clamping portion 522 of second jaw member 510 includes two or more engagement bosses where the number of engagement bosses present on first clamping portion 422 is different than the number of engagement bosses present on second clamping portion 522.

First jaw member 410 and second jaw member 510 are fixed together in a clamping arrangement, with first jaw member 410 and second jaw member 510 configured to slidably translate toward or away from one another. This movement brings first clamping portion 422 including engagement bosses 424 of first jaw member 410 toward or away from the corresponding second clamping portion 522, including engagement bosses 524 of second jaw member 510. Because first clamping portion 422 including engagement bosses 424 are opposed to second clamping portion 522 including engagement bosses 524, their respective first and second jaws 410, 510 are configured to be brought toward each other in a clamp-like action. Insertion, or even partial insertion, of one or more engagement bosses 424, 524 into their respective engagement slots, such as engagement slots 40 and or engagement slots 42 creates a strong clamping engagement between bracket 400 and rail 20, preventing separation of the two even under great force.

Regardless of the number and alignment, engagement bosses disclosed herein are sized and spaced apart so that each engagement boss selectively fits within a single engagement slot at any point on a rail disclosed herein. In some embodiments, a bracket 400 comprises first clamping portion 422 of first jaw member 410 comprising two engagement bosses 424 and second clamping portion 522 of second jaw member 510 comprising two engagement bosses 524, with both engagement bosses 424, and both engagement bosses 524 sized and spaced apart to straddle between two or more adjacent engagement slots 40, 42 so that each engagement boss selectively fits within each engagement slot of the two or more adjacent engagement slots 40, 42 of a rail disclosed herein. In this configuration, engagement bosses 424 of first jaw member 410 engage one set of engagement slots of a rail disclosed herein and engagement bosses 524 of second jaw member 510 engage a second set of engagement slots of the rail in order to firmly hold a bracket disclosed herein to rail disclosed herein.

As best seen in FIGS. 51, 57, 58, 59, 65 & 66, clamping portions 422, 522 each comprise a flat planer surface where engagement bosses 424, 524, respectively, are located, This flat planer surface then extends perpendicularly where it meets the perimeter edge of matting portions 420, 520, respectively. As shown in FIGS. 58 & 66, this surface configuration of clamping portions 442, 522, appears roughly as an L-shaped profile for clamping portion 442 when viewed from side 417, and a reversed L-shaped profile for clamping portion 522, when viewed from side 517. The perpendicular extension of clamping region 422, 522 are each configured to include a recess portion, which when viewed from sides 417, 517 is located at the distal half of each arm of the L and reverse L-shaped profiles (see FIGS. 58 & 66). As shown in FIG. 58, when bracket 400 is in the closed or locked configuration, each recess portion of clamping region 422, 522 come together to form an open trough or channel to provide clearance for a rail portion disclosed herein, such as, e.g., third engagement surface 34 of rail 20 or sidewall frame member 150 of device case 100. In addition, this recessed portion also prevent suction forces to occur when bracket 400 is in the closed configuration as well as facilitate removal of debris, thereby ensuring and maintaining proper operability of bracket 400.

Figure 70:
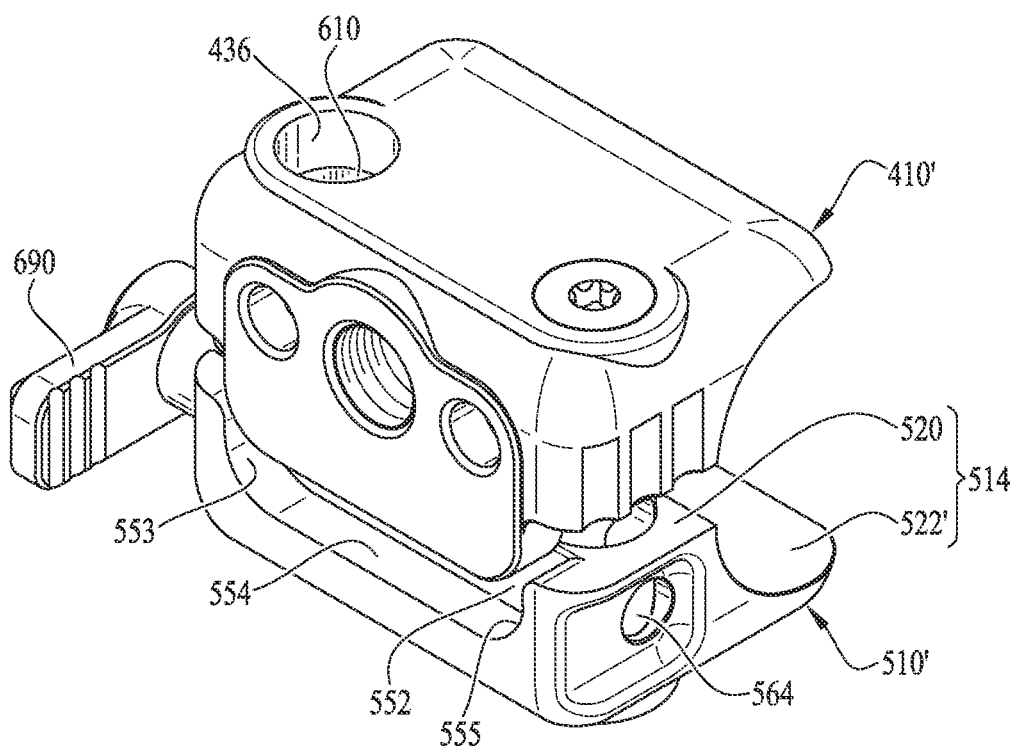
FIG. 70 is a back top perspective view of the bracket of FIG. 67 in the open configuration.
Figure 72:
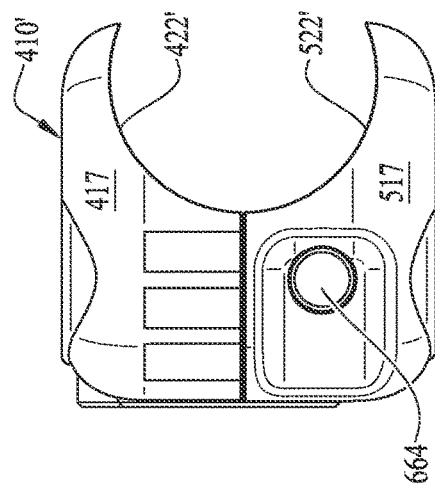
FIG. 72 is a first side plan view of the bracket of FIG. 67 in the closed configuration.
Figure 74:
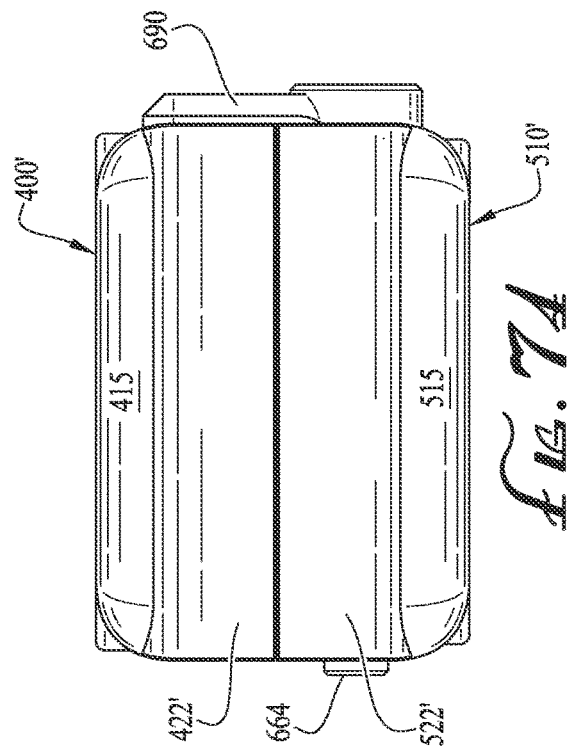
FIG. 74 is a front plan view of the bracket of FIG. 67 in the closed configuration.
Figure 71:
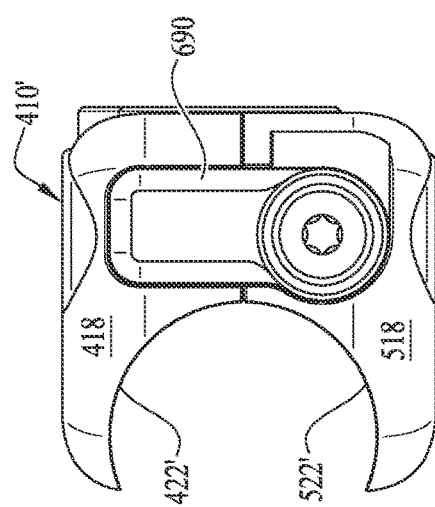
FIG. 71 is a second side plan view of the bracket of FIG. 67 in the closed configuration.
Figure 73:
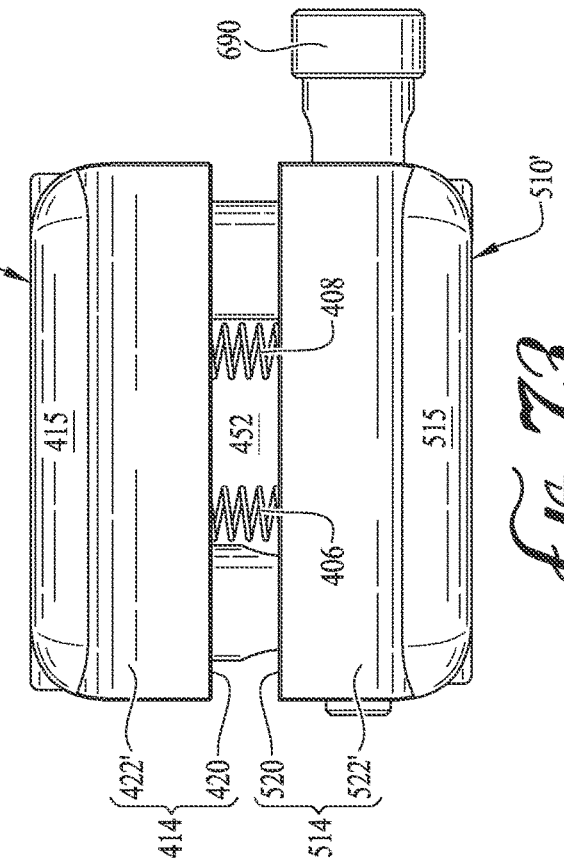
FIG. 73 is a front plan view of the bracket of FIG. 67 in the open configuration.
Figure 75:
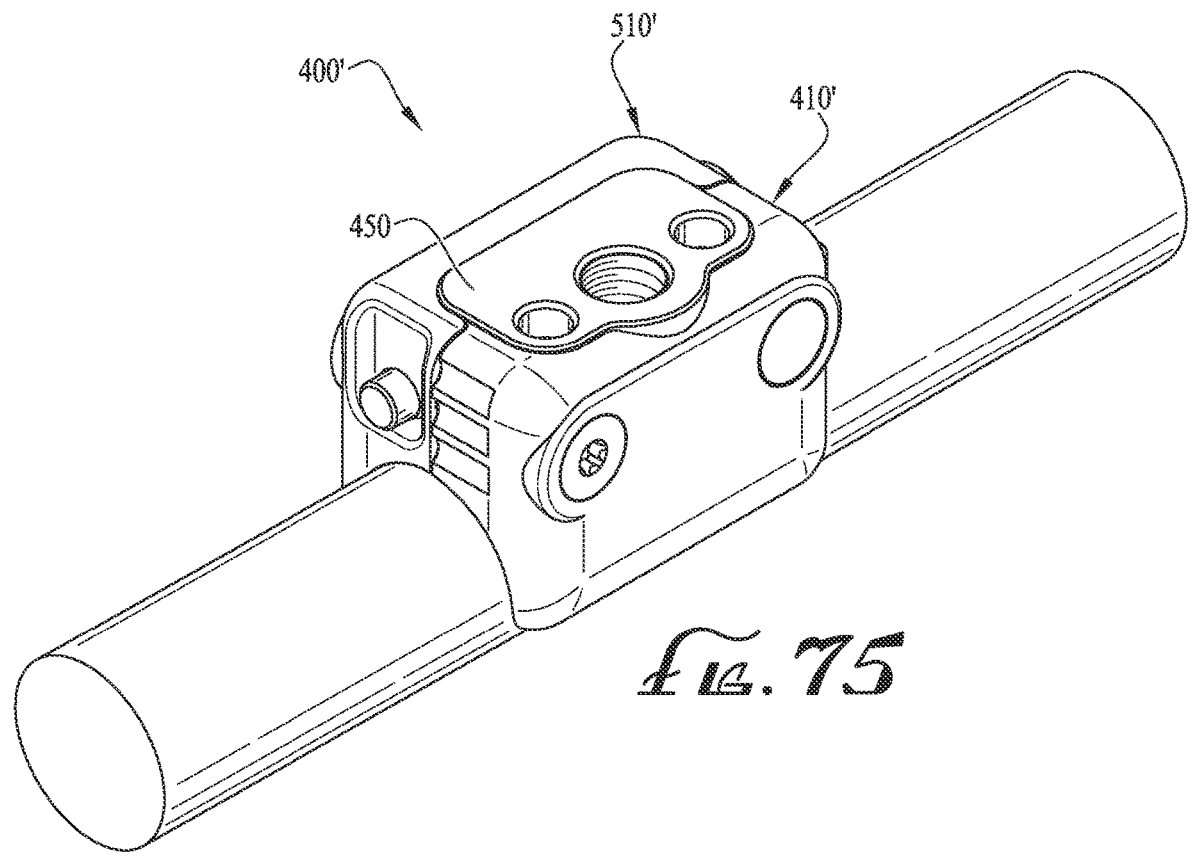
FIG. 75 is a front top perspective view of bracket of FIG. 67 attached to a pipe.
Figure 76:
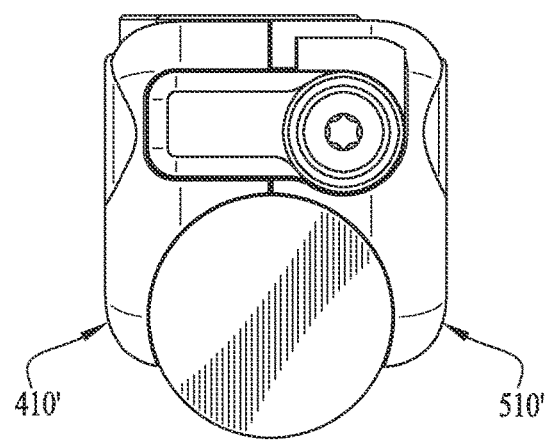
FIG. 76 is a second side plan view of bracket of FIG. 75.

However, other surface configurations of clamping portions 422, 522 are possible. For example, FIGS. 9, 11, 13, & 67-74 illustrate an alternative embodiment where clamping portions 422', 522' of bracket 400' each comprise an entirely curved surface. As best seen in FIGS. 71 & 72 the curved surface of clamping portions 422', 522' is arced from the perimeter edge where clamping portions 422', 522' meet front sides 415, 515, respectively until the perimeter edge where clamping portions 422', 522' meet matting portions 420, 520, respectively. In these embodiments, clamping portions 422', 522' do not include an open trough or channel to provide clearance for a rail portion disclosed herein (although in alternative embodiments, an open trough or channel could be included). As shown in FIGS. 8, 10, 75 & 76, bracket 400' comprising curved clamping portions 422', 522' are useful for attaching to an arc-angle structure like an open-curved rail or a closed-curved rail disclosed herein. In some embodiments, an arc-curved rail is a closed-curved rail 20 (FIGS. 8 10, & 12), or closed-curved structure as shown in FIGS. 75 & 76.

A bracket disclosed herein comprises a back plate that provides additional guidance and strength to the bracket as it is clamped down on a rail disclosed herein and opened to release bracket from the rail. In some embodiments, and as best seen in FIGS. 60, 64, 77, & 85, back plate 450 extends cantilevered from first jaw member 410 toward second jaw member 510. In some embodiments, and as shown in FIGS. 63-66, back plate 450 comprises an outer surface 451, an inner surface 452, a first side 453, a second side 454 and a third side 455. In some embodiments, and referring to FIGS. 60, 64, & 70, second jaw member 510 includes a back-plate recess 550 configured to receive back plate 450, permitting back plate 450 to slide within back-plate recess 550. Back-plate recess 550 includes a back wall 552, a first side 553, a second side 554 and a third side 555. Of course, this arrangement can be reversed, where, in one example, back plate 450 is cantilevered from second jaw member 510 and back-plate recess 550 is formed on first jaw member 410. In some embodiments, and as shown in FIGS. 64, 70, & 78, back wall 552 of back recess 550 is arranged as being planar parallel to the direction of travel of back plate 450. First, second and third sidewalls 553, 554, 555 are configured to form three contiguous and/or adjacent sides. First and second sidewalls 553, 554 aid in limiting side-to-side tilt of first jaw member 410 relative to second jaw member 510 when in a locked configuration, due to back plate 450 contacting one or both of first and second sidewalls 553, 554. Further, back wall 552 prevents back tilt of first jaw member 410 relative to second jaw member 510 due to back plate 450 contacting back wall 552. This is particularly important is designs where one or more engagement bosses 424 are spread apart from one or more engagement bosses 524 due to back tilt. Thus, because side-to-side tilt and back tilt is sufficiently limited or prohibited, one or more engagement bosses 424, 524 are prevented from disengaging their respective engagement slots, such as engagement slots 40, 42, creating an exceptionally strong clamp for secure mounting on bracket 400 of further accessories. Although back plate 450 is an optional feature, without back plate 450, more stress would be carried by pin assembly 600 of bracket 400. Nonetheless, bracket 400 would still function in an embodiment without back plate 450.

A bracket disclosed herein comprises one or more attachment plates disclosed herein configured to receive and provide an attachment point to secure a connector disclosed herein, a component of a mounting system disclosed herein or another mounting system, a device or a component thereof, or other attachment, to a bracket disclosed herein. For example, a bracket connector disclosed herein can be secured to an attachment plate in order to enable attachment of bracket disclosed herein to another connector, a component of a mounting system disclosed herein or another mounting system, or a device or a component thereof. In some embodiments, and as shown in FIGS. 8, 10, 12, 52, 56, 60, 64, 69, 70, 75, & 78, back plate 450 of a bracket disclosed herein includes an attachment plate 460 comprising a threaded attachment port 462, a first indexing hole 464 and a second indexing hole 466. Threaded attachment port 462 is configured to receive any standard screw thread known in the art, including, without limitation, ¼-20 UNC thread, a ⅜-16 UNC thread, or any similar screw thread standards known in the art. First and second indexing holes 464, 466 facilitate properly orientation of another adaptor, device or component thereof being secured to bracket 400 as well as to prevent misalignment of a connector disclosed herein, a component of a mounting system disclosed herein or another mounting system, a device or a component thereof, or other attachment while secured to bracket 400.

Movement of a first jaw member disclosed herein relative to a second jaw member disclosed herein is guided by a pin assembly. In some embodiments, a pin assembly disclosed herein includes a guide pin and a latching pin. In some embodiments, and referring to FIGS. 63, 77, 78 & 96-99, a pin assembly disclosed herein comprising guide pin 610 and latching guide pin 630. In some embodiments, a pin assembly disclosed herein includes a latching pin. In some embodiments, a pin assembly disclosed herein includes latching pin 630.

Figure 79:
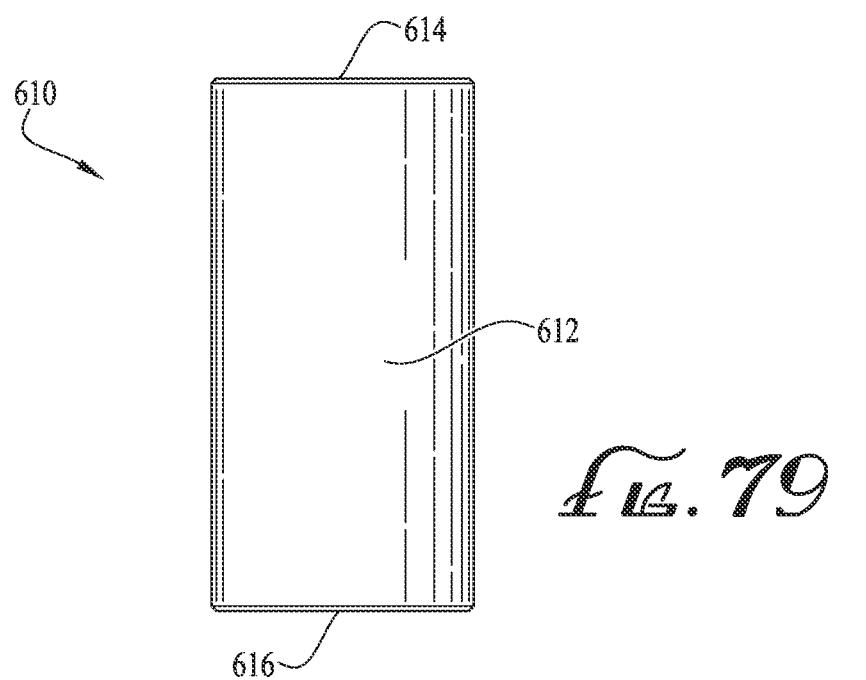
FIG. 79 is a first side plan view of a guide pin disclosed herein.
Figures 80, 81:
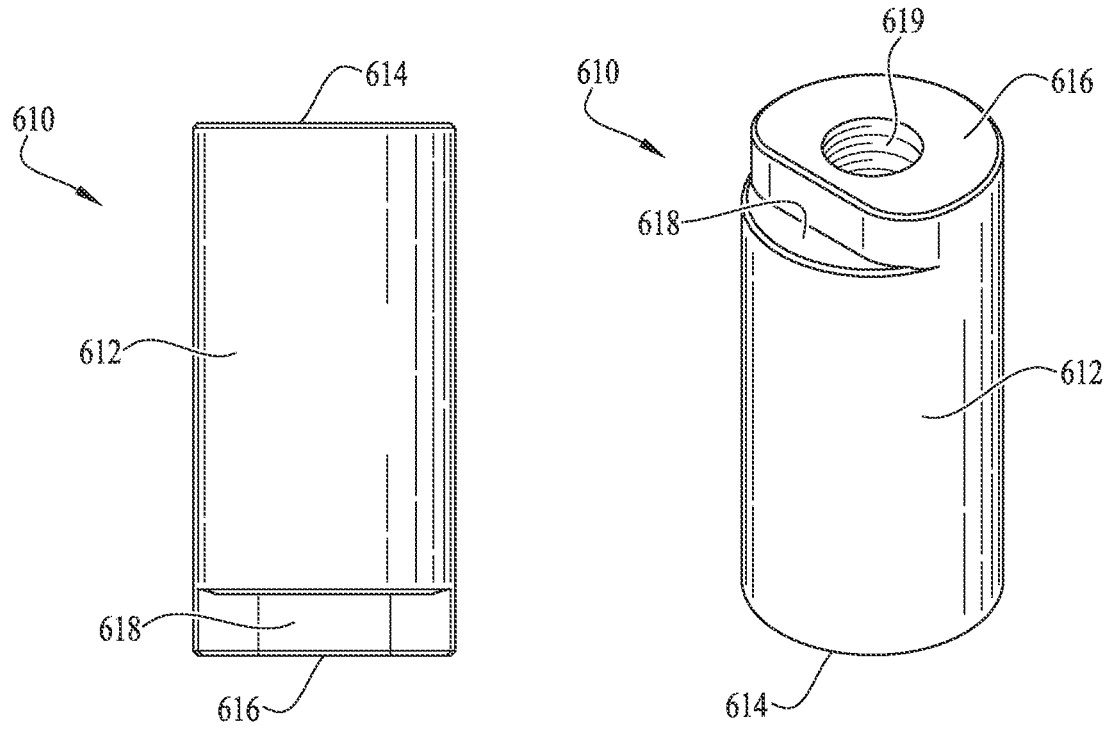
FIG. 80 is a first side plan view of a guide pin disclosed herein.
FIG. 81 is a bottom perspective view of the guide pin of FIG. 79.
Figure 82:
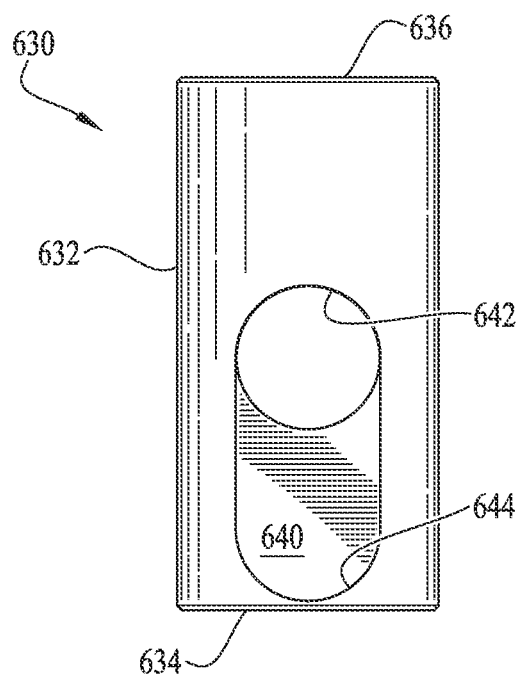
FIG. 82 is a first side plan view of a latching pin disclosed herein.
Figure 83:
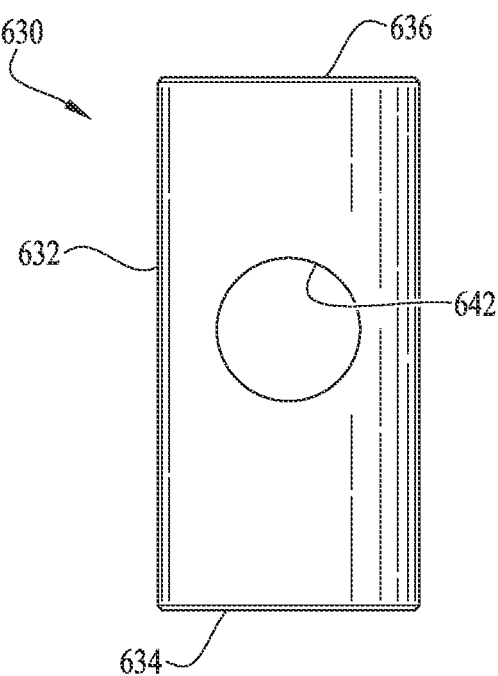
FIG. 83 is a second side plan view of a latching pin disclosed herein.
Figure 84:
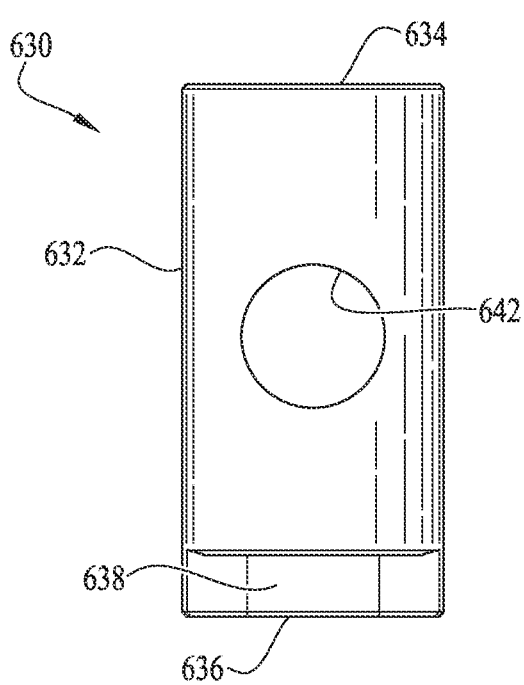
FIG. 84 is a second side plan view of a latching pin of FIG. 82.
Figure 85:
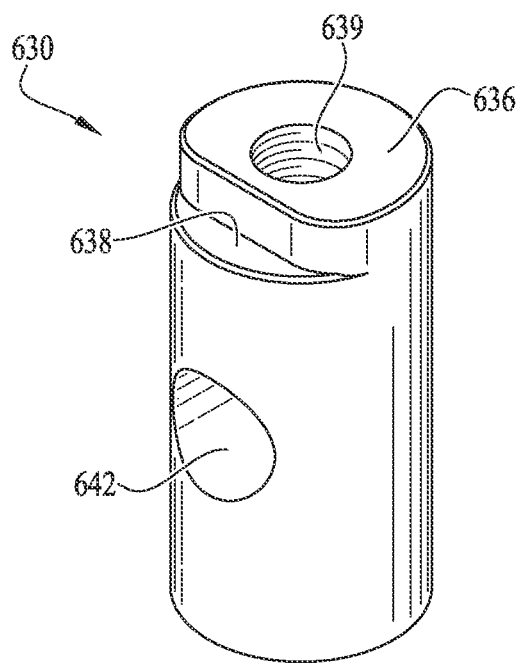
FIG. 85 is a bottom perspective view of the latching pin of FIG. 82.

In some embodiments, guide pin 610 serves to guide the movement of a first jaw member disclosed herein relative to a second jaw member disclosed herein. In some embodiments, and referring to FIGS. 79-81, guide pin 610 comprises a body 612 having a first end 614 and a second end 616. Second end 616 includes a threaded blind hole 619 formed axially through second end 616 and configured to receive guide pin screw 620. In some embodiments, second end 616 also includes a notch 618

In some embodiments, guide pin 610 is oriented parallel or substantially parallel to the direction of first and second jaw member travel, In some embodiments, and referring to FIGS. 77, 78, & 96-99, guide pin 610 is positioned within a guide pin bore 436 of first jaw member 410, with first end 614 of guide pin 610 facing outer surface 412 of first jaw member 410. In some embodiments, and as shown in FIGS. 77, 78, & 96-99, guide pin bore 436 is a through hole formed perpendicularly through first jaw member 410 from first mating portion 420 to outer surface 412. Guide pin 610 is configured to slide within guide pin bore 436; thus, the tolerance of the two parts should be designed to form a sliding fit. A guide pin counterbore 540 is formed perpendicularly on second mating portion 520 of second jaw member 510 and is configured to receive second end 616 of guide pin 610. Bottom surface 542 of guide pin counterbore 540 includes a step 543 that is configured to receive notch 618 of second end 616 of guide pin 610. The notch and step configuration of notch 618 and step 543 configuration prevents guide pin 610 from rotating and/or becoming misaligned within guide pin bore 636 and guide pin counterbore 540. Guide pin counterbore 540 also includes a through hole 544 formed perpendicularly though bottom surface 542 of guide pin counterbore 540 to outer surface 512 of second jaw member 510. Through hole 544 of guide pin counterbore 540 is configured to receive therethrough a threaded portion 624 of guide pin screw 620. Guide pin screw 620 inserts through second jaw member 510 and threaded portion 624 threads tightly into threaded blind hole 619 of second end of guide pin 610 to fasten guide pin 610 to second jaw member 510. Countersink 519 can be formed on outer surface 512 of second jaw member 510 to provide clearance for receiving guide pin screw 620 head flush to or beneath the plane of outer surface 512.

Once secured, guide pin screw 620 (or other appropriate fastener, adhesive, weld, braze, or other appropriate bonding or fastening means) firmly holds guide pin 610 within the larger hole of guide pin counterbore 540. In this way, guide pin 610 serves to guide the movement of first jaw member 410 relative to second jaw member 510 with guide pin 610 held to second jaw member 510 via guide pin screw 620. Although described as being perpendicular to first mating portion 420, guide pin bore 436 and guide pin counterbore 540 can also be oriented parallel to the direction of jaw travel, if first mating portion 420 is irregular or angled. Guide pin 610 is an optional feature, without guide pin 610, more stress would be carried by pin assembly 600 of bracket 400. Nonetheless, bracket 400 would still function in an embodiment without guide pin 610.

In some embodiments, latching pin 630 serves to guide the movement of a first jaw member disclosed herein relative to a second jaw member disclosed herein as well comprises a lock assembly along with latch bolt assembly to form a locking mechanism disclosed herein for a bracket disclosed herein. In some embodiments, and referring to FIGS. 82-85, latching pin 630 comprises a body 632 having a first end 634 and a second end 636. Second end 636 includes a threaded blind hole 639 formed axially through second end 636 and configured to receive latching pin screw 650. Latching pin screw 650 includes a smooth portion 652 and a threaded portion 654. In some embodiments, second end 636 also includes a notch 638. Latching pin 630 also comprises a bolt channel 640 including a bolt stop 644, and a latch bolt through hole 642. Bolt channel 640 runs along the length of latching pin 630 to an appropriate depth to define bolt stop 644 on a shelf-like area. Latch bolt through hole 642 is radially formed within bolt channel 640 nearest second end 636, perpendicular to and through the longitudinal axis of latching pin 630. Bolt channel 640 is formed closer in proximity first end 634 of latching pin 630 (e.g., bolt channel 640 is offset from the middle of latching pin 630, and toward first end 634). As discussed below, latching pin 630 additionally receives a latch bolt disclosed herein through a latch bolt through hole disclosed herein.

In some embodiments, latching pin 630 is oriented parallel or substantially parallel to the direction of first and second jaw member travel, In some embodiments, and referring to FIGS. 77, 78, & 96-99, latching pin 630 is positioned within latching pin bore 536 of second jaw member 510, with first end 634 of latching pin 630 facing outer surface 512 of second jaw member 510. In some embodiments, and as shown in FIGS. 77, 78, & 96-99, latching pin bore 536 is a through hole formed perpendicularly through second jaw member 510 from second mating portion 530 to outer surface 512. Latching pin 630 is configured to slide within latching pin bore 536; thus, the tolerance of the two parts should be designed to form a sliding fit. A latching pin counterbore 440 is formed perpendicularly on first mating portion 420 of first jaw member 410 and is configured to receive second end 636 of latching pin 630. A bottom surface 442 of latching pin counterbore 440 includes a step 443 that is configured to receive notch 638 of second end 636 of latching pin 630. This notch and step configuration of notch 638 and step 443 configuration prevents latching pin 630 from rotating and/or becoming misaligned within latching pin bore 536 and latching pin counterbore 440. Latching pin counterbore 440 also includes a through hole 444 formed perpendicularly though bottom surface 442 of latching pin counterbore 440 to outer surface 412 of first jaw member 410. Through hole 444 of latching pin counterbore 440 is configured to receive therethrough a latching pin screw 650 that is threaded into threaded blind hole 444 formed axially through second end 636 of latching pin 630. Latching pin screw 650 inserts through first jaw member 410 and threads tightly into threaded blind hole 639 of second end 636 of latching pin 630 to fasten latching pin 630 to first jaw member 410. Countersink 419 can be formed on outer surface 412 of first jaw member 410 to provide clearance for receiving latching pin screw 650 head flush to or beneath the plane of outer surface 412.

Once secured, latching pin screw 650 (or other appropriate fastener, adhesive, weld, braze, or other appropriate bonding or fastening means) firmly holds latching pin 630 within the larger hole of latching pin counterbore 440. In this way, latching pin 630 serves to guide the movement of second jaw member 510 relative to the first jaw member 410 with latching pin 630 held to first jaw member 410 via latching pin screw 650. As discussed further below, but for a latch bolt disclosed herein checking its motion, latching pin 630 would be permitted to slide up and down axially within latching pin bore 536. Although described as being perpendicular to second mating portion 520, latching pin bore 536 and latching pin counterbore 440 can also be oriented parallel to the direction of jaw travel, if second mating portion 520 is irregular or angled.

As shown in FIGS. 77, 78, & 96-99, first and second jaw compression springs 406, 408 of bracket 400 are located between first jaw member 410 and second jaw member 510. First and second jaw compression springs 406, 408 are positioned in bracket 400 by a first and a second ends within respective locating holes formed in first and second mating portions 420, 520 of first and second jaw members 410, 510 respectively. As discussed further below, but for a latch bolt disclosed herein checking its motion, first and second jaw compression springs 406, 408 provide a separating bias that forces first jaw member 410 and second jaw member 510 apart.

Bracket 400 also comprises a latch bolt assembly. A latch bolt assembly disclosed herein comprises a lock assembly with latch pin and participates in a locking mechanism disclosed herein for a bracket disclosed herein. In some embodiments, a lock assembly disclosed herein has a latch bolt assembly comprising a latch bolt and a latch bolt bore where the latch bolt is configured to slidably fits within latch bolt bore and enables a locking mechanism disclosed herein to lock and unlock a bracket disclosed herein. In some embodiments, a latch pin disclosed herein is located through the center of and perpendicular to the longitudinal axes of a first and second jaw member). In some embodiments, latch bolt assembly is housed within of second jaw member 510.

In some embodiments, a latch pin bore disclosed herein is a counterbored through hole configured to house a latch bolt and enables a latch bolt to slide within the latch bolt bore to lock and unlock a bracket disclosed herein. In some embodiments, a latch bolt bore interests a latching pin bore and latching pin counterbore. For example, as best shown in FIGS. 96-99, a latch bolt bore 560 interests both latching pin bore 536 and latching pin counterbore 440. In some embodiments, latch bolt bore 560 comprising a larger diameter portion 562 configured to receive and allow a latch bolt disclosed herein to slide within, and a smaller diameter portion configured to receive and allow a latch bolt pin disclosed herein to slide within. Latch bolt bore 560 firmly holds and guides a latch bolt disclosed herein. In some embodiments, latch bolt bore 560 running through the length of second jaw member 510, with a small diameter portion intersecting latching pin bore 536.

Figure 86:
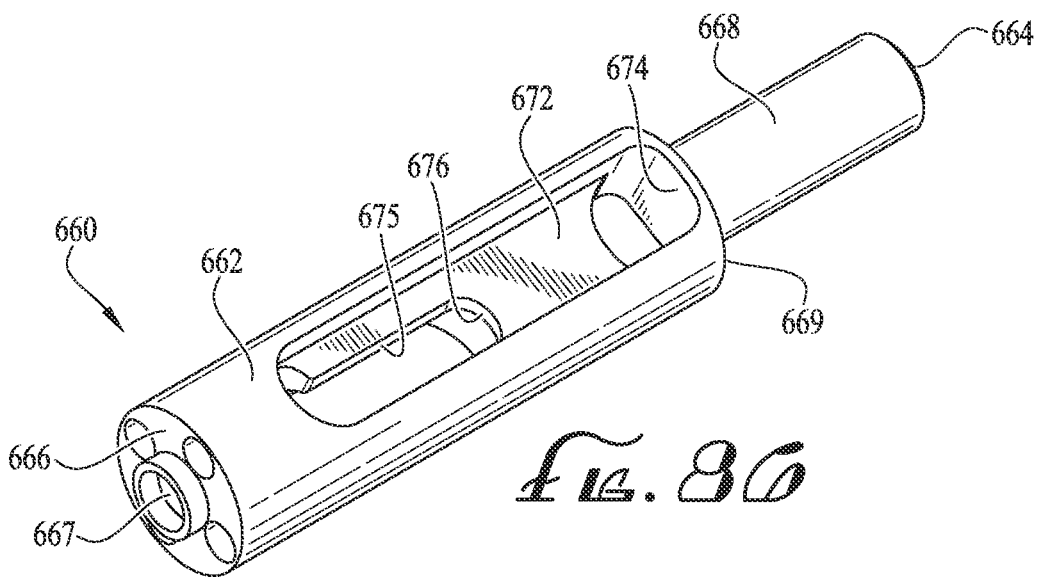
FIG. 86 is a top perspective view of a latch bolt disclosed herein.
Figure 87:
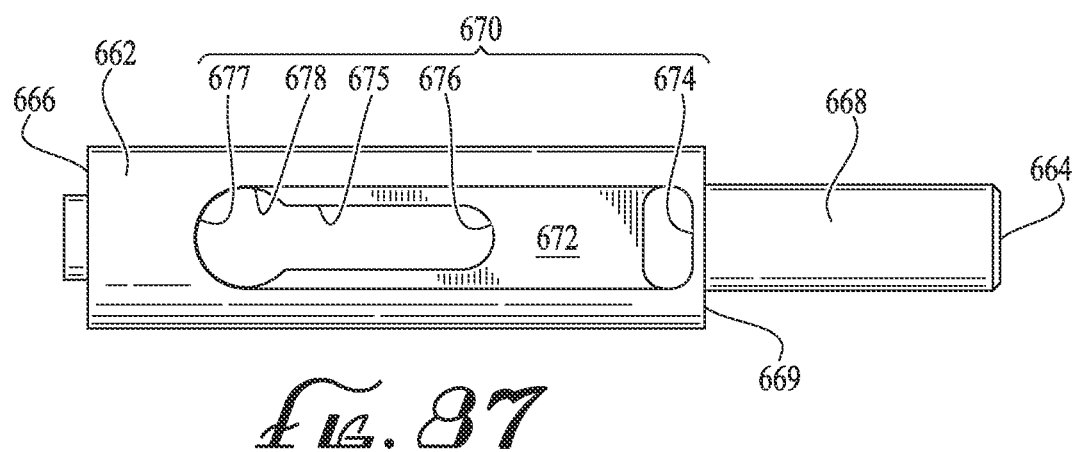
FIG. 87 is a top plan view of a latch bolt of FIG. 86.
Figure 88:
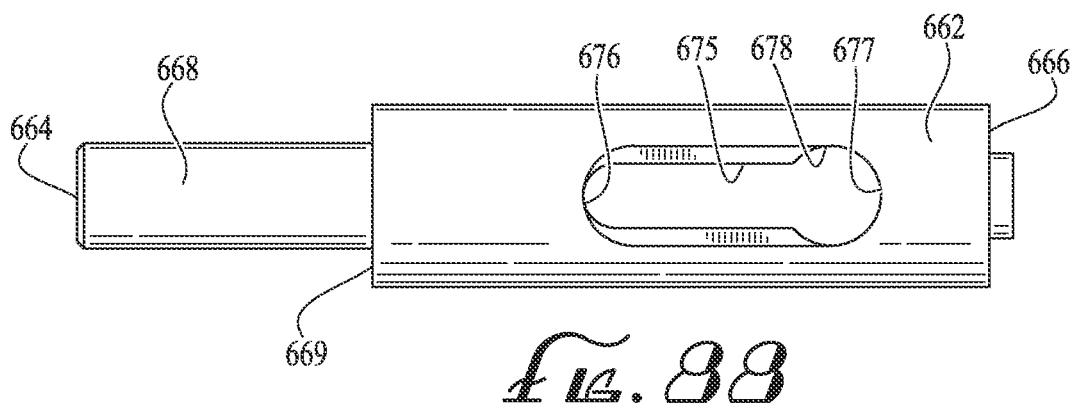
FIG. 88 is a bottom plan view of a latch bolt of FIG. 86.
Figure 89:
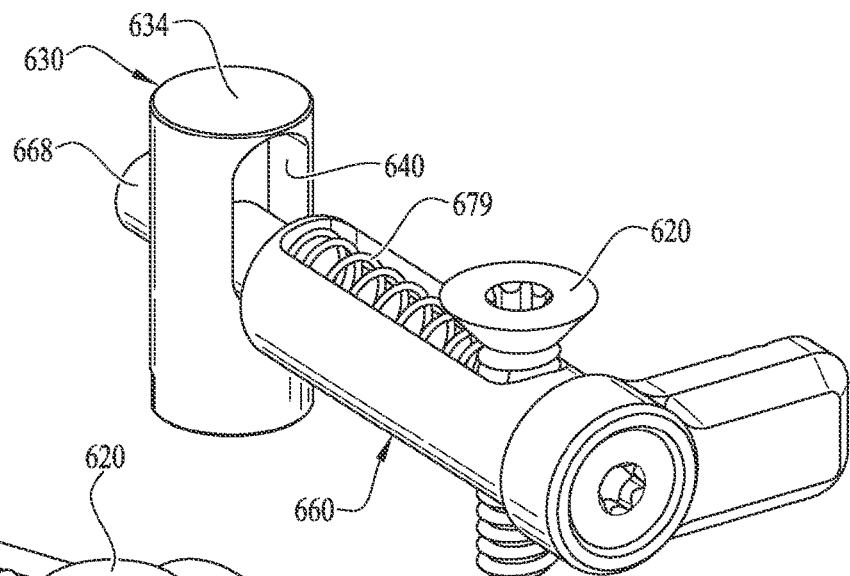
FIG. 89 is a front top perspective view of a latch mechanism disclosed herein in a locked configuration.
Figure 90:
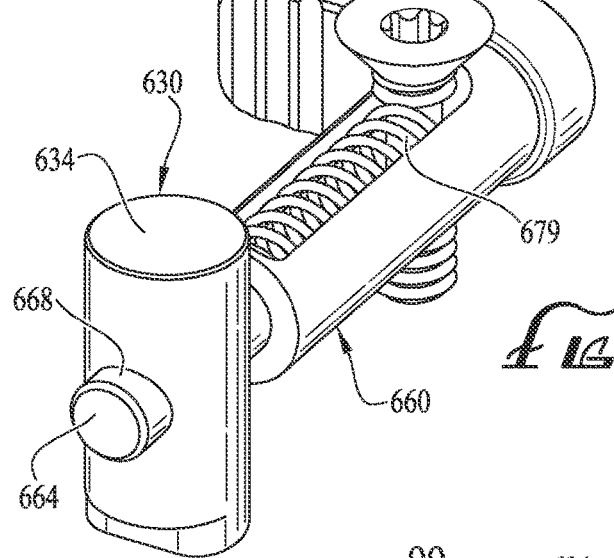
FIG. 90 is a back top perspective view of latch mechanism of FIG. 89.

In some embodiments, and referring to FIGS. 86-88, a latch bolt 660 of latch bolt assembly includes a cylindrical body 662 having a first end 664 and a second end 666. Is some embodiments, and referring to FIGS. 77, 78, & 86-88, second end 666 optionally includes a threaded blind hole 667 to receive tab screw 699 that secures tab 690 to latch bolt 660. As shown in FIGS. 86-88, a portion of cylindrical body 662 narrows in diameter forming a latch bolt pin 668, the juncture of this narrowing forming an annular shoulder 669. A compression spring housing 670 runs the length of cylindrical body 662 to form an enclosure for a latch bolt compression spring 679 (see FIGS. 77, 78, & 89-95). Compression spring housing 670 comprises a channel 672 running perpendicular to and through the longitudinal axis of cylindrical body 662 (i.e., along the radial direction) to an appropriate depth to define a space with a shelf-like area to receive latch bolt compression spring 679. Channel 672 includes a limiter slot 675 having a first limiter wall 676 and a second limiter wall 677, and a guide pin screw through hole 678 for guide pin screw 620 (which serves as a limiter pin). Guide pin screw through hole 678 for guide pin screw 620 is radially formed within cylindrical body 662 nearest first end 666 cylindrical body 662 of latch bolt 660, with second limiter wall 677 partially forming guide pin screw through hole 678. Channel 672 has a first end which serves as a seat 674 for compression spring 679 and a second end which defines a second limiter wall 678 as well as encompasses the guide pin screw through hole for guide pin screw 620. Limiter slot 675 prevents latch bolt compression spring 679 from contacting guide pin 610 and latching pin screw 650.

A latch bolt disclosed herein of a latch bolt assembly disclosed herein can optionally include a tab to assist in the rotational movement of a latch bolt with a latch bolt bore disclosed herein. In some embodiments, and referring to FIGS. 96-99, tab 690 can optionally be fastened to first end 666 of latch bolt 660 by screw 699 into threaded hole 667, and is permitted to rotate relative to latch bolt 660. Optionally, and referring to FIG. 77, one or more detents 698 are formed within a cup on tab 690 and configured to engage with a detent plunger 680 on end 666 on latch bolt 660. This detent plunger mechanism permits tab 690 to rotate, yet give a user the option to stop rotation at the detent's discrete angles so that tab 690 can be pushed or pulled, by deploying or stowing tab 690 within tab recess 430.

In some embodiments, the cup on tab 690 comprises one or more detents 698 organized in a circular ring that is organized around an inside perimeter of the cup of tab 690 and configured to engage with a detent plunger 680. In some embodiments, each detent 698 is slopped or ramped on the left-hand side to provide stop mechanism in a clock-wise direction. In some embodiments, the cup of tab 690 comprises 2, 3, 4, 5, 6, 7, 8, 9, 10, 11, 12, 13, 14, 15, or 16 detents 698. In some embodiments, one or more detents 698 comprise 1 to 12 detents, such as, e.g., 1 to 2 detents, 1 to 4 detents, 2 to 6 detents, 4 to 6 detents, 2 to 8 detents, 4 to 8 detents, 6 to 8 detents, 2 to 10 detents, 4 to 10 detents, 6 to 10 detents, 8 to 10, detents, 2 to 12 detents, 4 to 12 detents, 6 to 12 detents, 8 to 12 detents, or 10 to 12 detents. In some embodiments, one or more detents 698 are each the same or similar size. In some embodiments, one or more detents 698 can be of two or more different sizes.

In some embodiments, and as best seen in FIGS. 97 & 98, detent plunger 680 include a detent cylinder 682 comprising an open first end 684 and a closed second end 686 opposite open end, and a detent ball 688 and a detent compression spring 689. The detent ball 688 and the detent compression spring 689 are captured within the detent cylinder 682 during assembly, with detent compression spring 689 outwardly biasing the detent ball 688 toward open end of the detent cylinder in a manner that causes the detent ball to protrude from the open end 684 of the detent cylinder 682. One or more detent plungers 680 are located within cylindrical body 662. One or more detents 698 located on an inner surface of tab 690 are aligned in a manner that the detent ball protruding from an open end will be seated in each of the one or more detents 698 of tab 690. As tab 690 is rotated, detent 698 move out of alignment with detent balls 688, detent balls 688 are pushed against detent compression spring 689, compressing them, until detent balls 688 realigns with neighboring detent 698, catching detent balls 688 which also temporarily catches the motion of tab 690.

Figure 91:
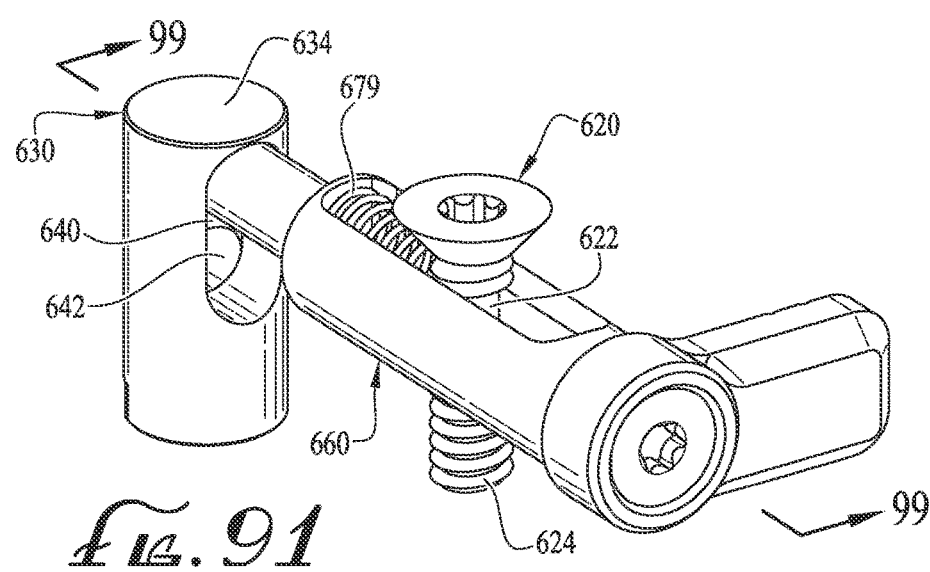
FIG. 91 is a front top perspective view of latch mechanism of FIG. 89 in an unlocked configuration.
Figure 102:
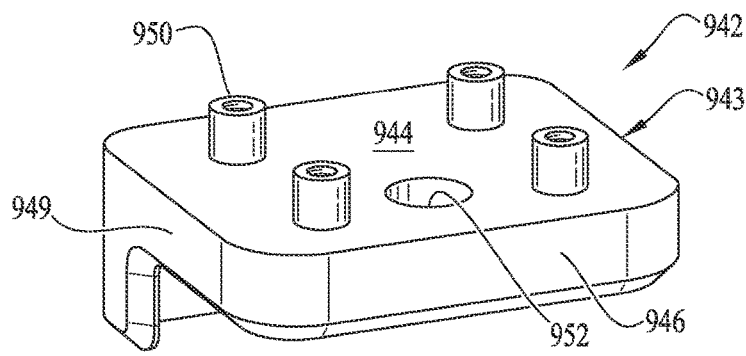
FIG. 102 is a front top perspective view of a bracket mount disclosed herein.
Figure 103:
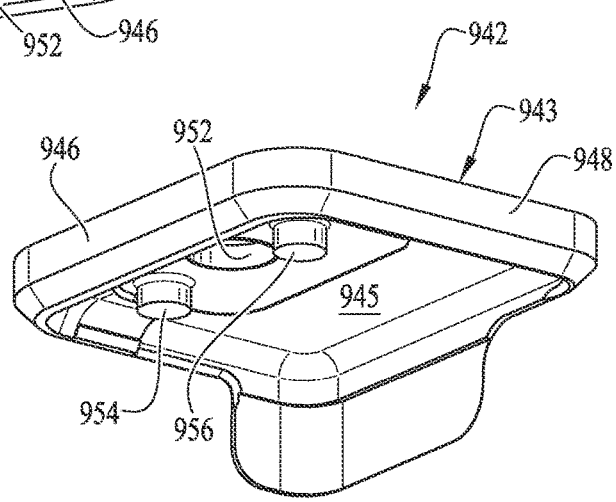
FIG. 103 is a front bottom perspective view of the bracket mount of FIG. 110.
Figure 104:
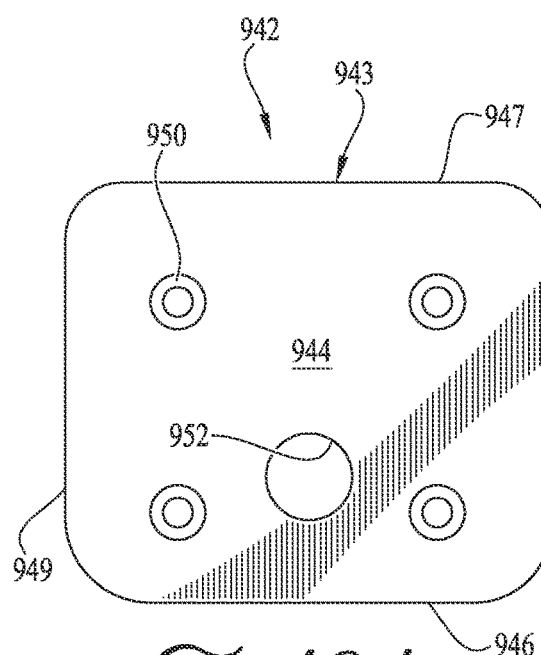
FIG. 104 is a top plan view of the bracket mount of FIG. 110.
Figure 105:
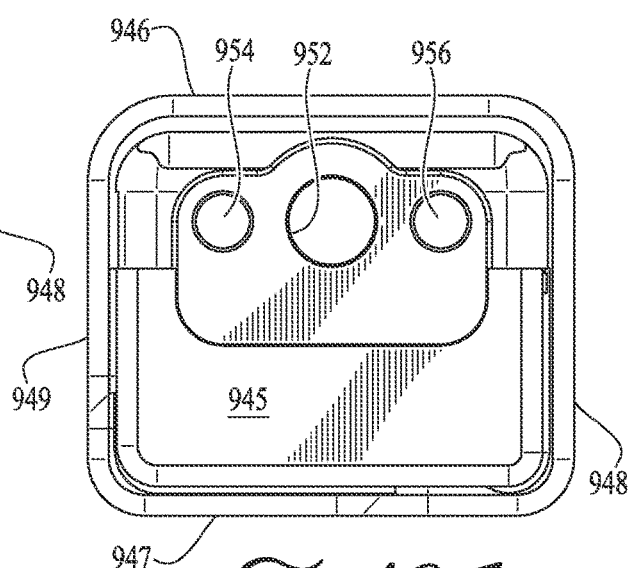
FIG. 105 is a bottom plan view of the bracket mount of FIG. 110.
Figure 106:
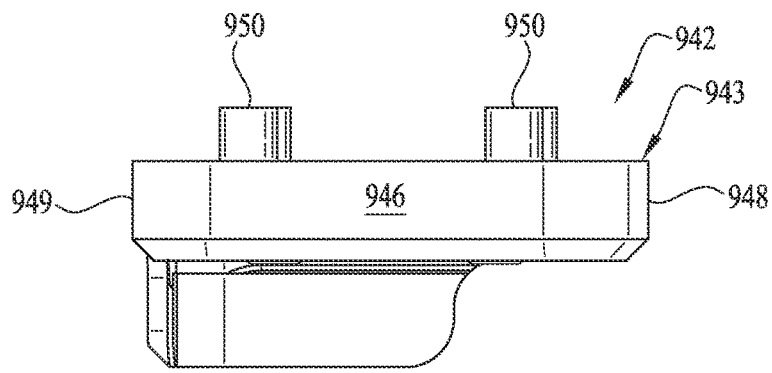
FIG. 106 is a front plan view of the bracket mount of FIG. 110.
Figure 107:
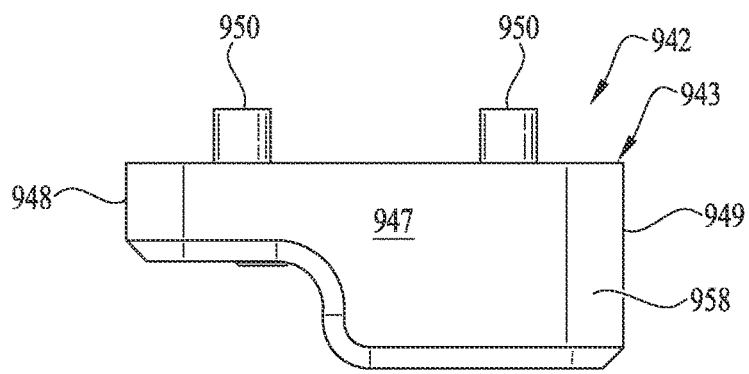
FIG. 107 is a back plan view of the bracket mount of FIG. 110.
Figures 108, 109:
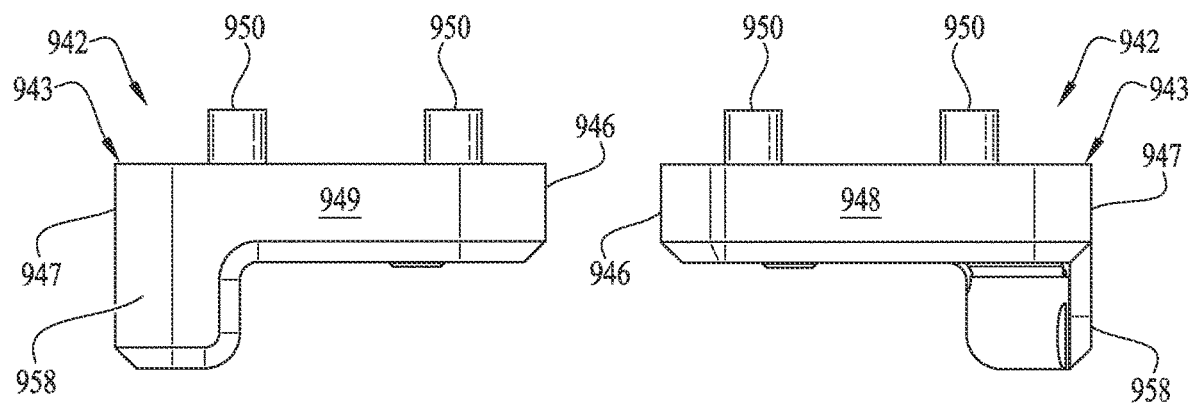
FIG. 108 is a first side plan view of the bracket mount of FIG. 110.
FIG. 109 is a second side plan view of the bracket mount of FIG. 110.
Figure 111:
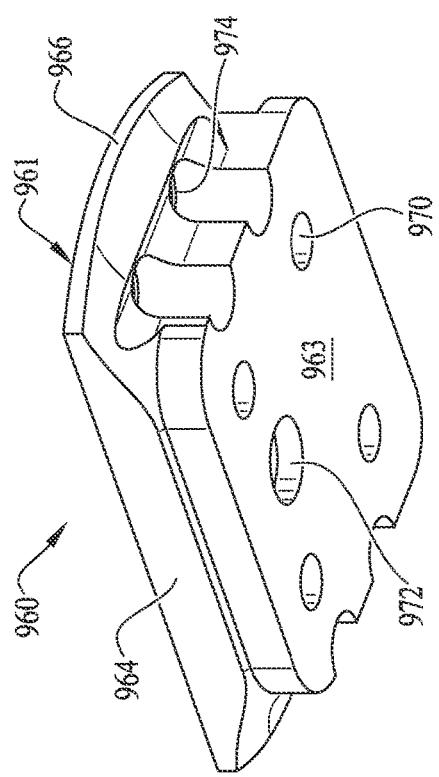
FIG. 111 is a front bottom perspective view of the device mount of FIG. 102.
Figure 113:
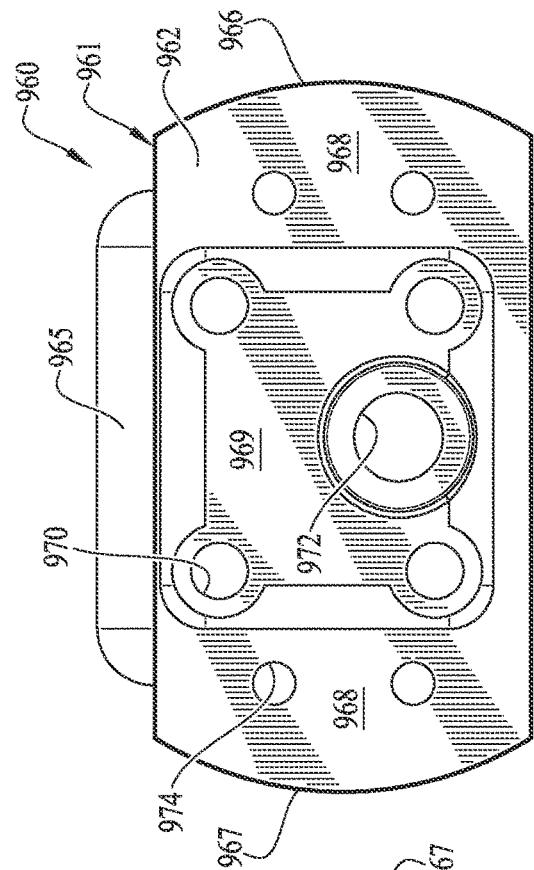
FIG. 113 is a top plan view of the device mount of FIG. 102.
Figure 110:
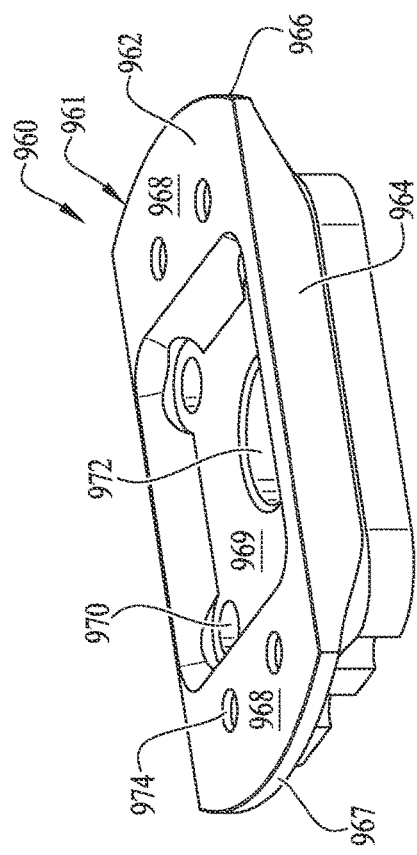
FIG. 110 is a front top perspective view of a device mount disclosed herein.
Figure 112:
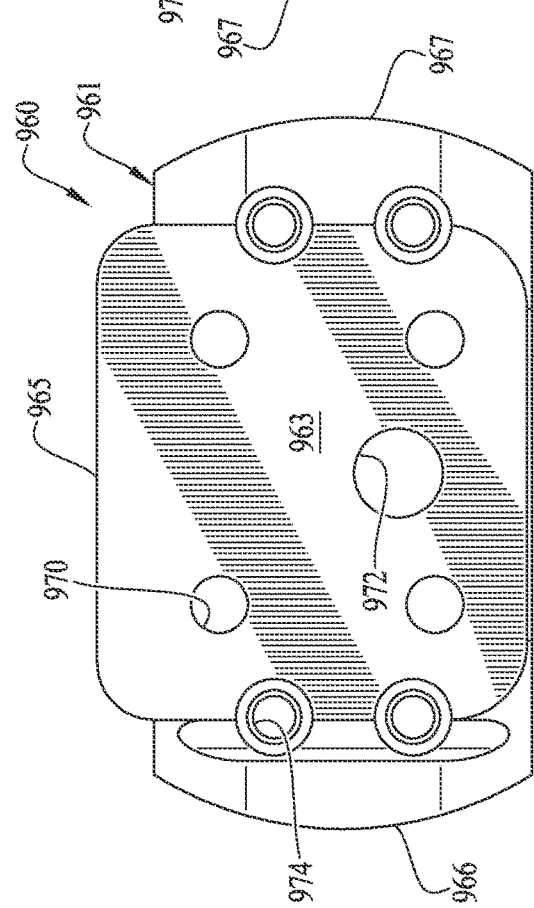
FIG. 112 is a bottom plan view of the device mount of FIG. 102.
Figure 114:
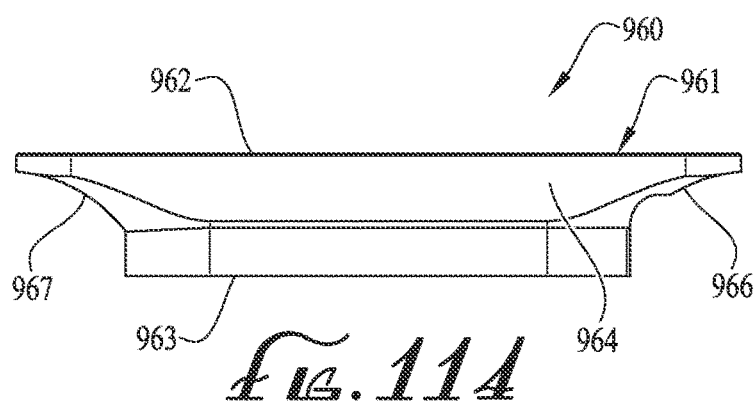
FIG. 114 is a front plan view of the device mount of FIG. 102.
Figure 115:
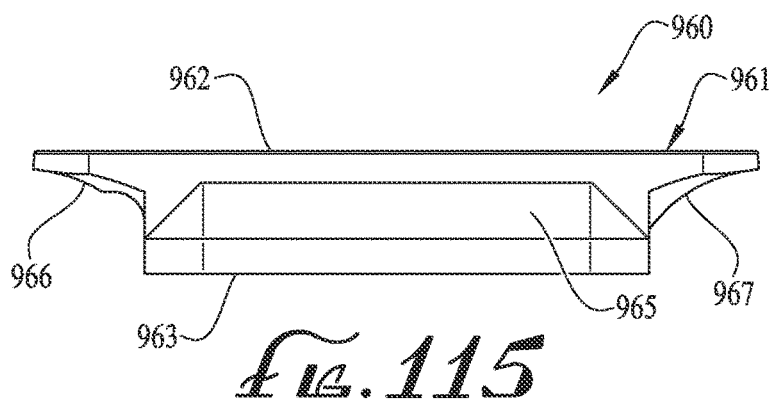
FIG. 115 is a back plan view of the device mount of FIG. 102.
Figure 116:
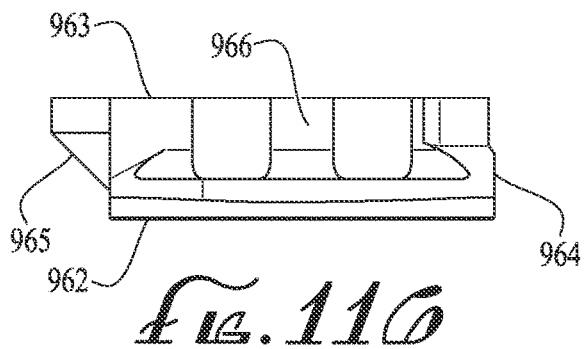
FIG. 116 is a first side plan view of the device mount of FIG. 102.
Figure 117:
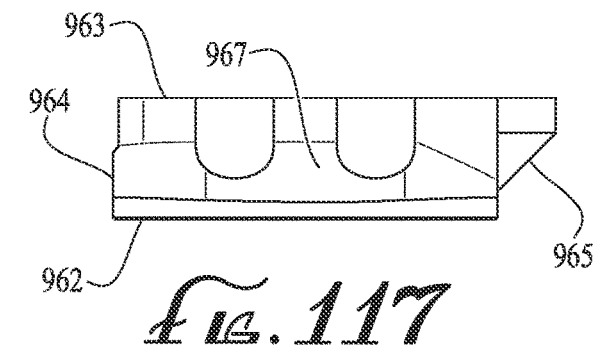
FIG. 117 is a second side plan view of the device mount of FIG. 102.

A latch bolt assembly disclosed herein engages with a latching pin disclosed herein to form a lock assembly to lock and unlock a bracket disclosed herein. For example, as shown in FIGS. 89-99, latch bolt 660 engages with latching pin 630 to lock and unlock bracket 400. For example, second end 664 and an adjacent portion of latch bolt pin 668 is configured to move within the entire length of bolt channel 640 of latching pin 630. As shown in FIGS. 91, 92, & 95, in the open or unlocked configuration, latch bolt 660 is withdrawn inwardly into latch bolt bore 560 in a manner that second end 664 and an adjacent portion of latch bolt pin 668 of latch bolt 660 reside against bolt stop 644 of bolt channel 640. Withdrawal of latch bolt 660 creates an outwardly biasing force because guide pin screw 620 rests against first limiter slot 676, thereby compressing latch bolt compression spring 679. This biases latch bolt 660 outwardly from latch bolt bore 560, which in turn causes second end 664 and an adjacent portion of latch bolt pin 668 of latch bolt 660 press against bolt stop 644 of bolt channel 640. Referring to FIGS. 89, 90, 93 & 94, latching pin 630 is configured to additionally receives latch bolt pin 668 of latch bolt 640 through latch bolt through hole 642 when a bracket disclosed herein is in the closed or locked configuration. In operation, as second end 664 and an adjacent portion of latch bolt pin 668 of latch bolt 660 move through bolt channel 640 (see arrow 14 of FIGS. 92 & 98), at some point second end 664 and an adjacent portion of latch bolt pin 668 clears bolt channel 640 and the outwardly biasing force of latch bolt compression spring 679 inserts second end 664 and an adjacent portion of latch bolt pin 668 through latch bolt through hole 642 of latching pin 630 (see arrow 15 of FIGS. 93 & 99). At the same time, an upwardly biasing force is created in the closed or locked configuration by comprising springs perpendicular to latch bolt compression spring 679. This upwardly biasing force downwardly moves second end 664 and an adjacent portion of latch bolt pin 668 of latch bolt 660 along bolt channel 640 of latching pin 630 (see arrow 17 of FIG. 95) until movement of second end 664 and an adjacent portion of latch bolt pin 668 of latch bolt 660 is halted by bolt stop 644 of bolt channel 640.

In an example assembly method, latching pin 630 is fastened to first jaw member 410. Guide pin 610 is fastened to second jaw member 510. First and second jaw compression springs 406, 408 are each seated within their respective locating holes 432, 532 and 434, 534 respectively. Latch bolt compression spring 679 is positioned within channel 672 of compression spring housing 670 of latching bolt 660. First jaw member 410 is initially manually coupled to second jaw member 510 by inserting latching pin 630 into latching pin bore 536 (guide pin 610 is not yet inserted). First and second jaw compression springs 406, 408 are then manually compressed between first and second jaw members 410, 510 to bring latch bolt through hole 642 into alignment with small diameter portion 564 of latch bolt bore 560. While holding this alignment, latch bolt 660 is inserted into latch bolt bore 560 with channel 672 facing toward second mating portion 520, and with latch bolt pin 668 inserted though cylindrical latch bolt through hole 642 and small diameter portion 564 of latch bolt bore 560, with first end 664 of latch bolt 660 protruding externally from small diameter portion 564 of latch bolt bore 560. Guide pin screw 620 is inserted through guide pin counterbore 540, transversely through limiter slot 675 of channel 672 of latch bolt 660, and threaded into guide pin 610 (where the guide pin 610 was inserted through guide pin bore 436 from the outside). In this manner, guide pin screw 620 traps latch bolt compression spring 679 between spring seat 674 and smooth portion 622 of guide pin screw 620, with latch bolt bore 560 enclosing channel 672 to restrict latch bolt compression spring 679 within channel 672 of compression spring housing 670 of latching bolt 660.

Once guide pin screw 620 is threaded into guide pin 610, latch bolt 660 is trapped within latch bolt bore 560. This is because guide pin screw 620 is inserted completely through limiter slot 675, with guide pin screw 620 configured to traverse the length of limiter slot 675 and thus serving the function of a limiter pin (with latch bolt 660 being pushed or pulled relative to guide pin screw 620, manually and by latch bolt compression spring 679). As guide pin screw 620 reaches an end of limiter slot 675, smooth portion 622 of guide pin screw 620 contacts one of first or second limiter walls 676, 678, which checks the travel of latch bolt 660. In this way, the travel (e.g., axial translation) of latch bolt 660 limited to the length of limiter slot 675.

Assembly of the components of bracket 400 create a positive latching mechanism by which first jaw member 410 is slidably translatable relative to second jaw member 510 by which bracket 400 can adopt a closed configuration (or locked configuration) or an open configuration (or unlocked configuration). In an open or unlocked configuration, as shown in FIGS. 59-66, 92, 95, & 98, latch bolt 660 is retracted and against the bias of latch bolt compression spring 679, and first jaw member 410 and second jaw member 510 are forced apart by the force of first and second jaw compression springs 406, 408. Retraction of latch bolt 660 also causes tab 690 to extend from bracket 400. In an open or unlocked configuration, first mating portion 420 and/or engagement bosses 424 of first jaw member 410 are the furthest apart from second mating portion 520 and/or engagement bosses 524 of second jaw member 510. In an open or unlocked configuration, bracket 400 can be easily removed from a rail disclosed herein and/or repositioned to a different location of a rail disclosed herein.

In a closed or locked configuration, as shown in FIGS. 51-58, 93, 94, 96, & 99, latch bolt 660 is forced into latch bolt through hole 642 of latching pin 630 by the force of latch bolt compression spring 679 and first jaw member 410 and second jaw member 510 are in close proximity to each other and against the bias of first and second jaw compression springs 406, 408. In addition, movement of latch bolt 660 into latch bolt through hole 642 causes tab 690 to become seated in tab recess 430 of bracket 400. In a closed or locked configuration, first mating portion 420 and/or engagement bosses 424 of first jaw member 410 are in close proximity to second mating portion 520 and/or engagement bosses 524 of first jaw member 510. In a closed or locked configuration, bracket 400 can be secured in place on a rail disclosed herein.

In operation, referring to FIGS. 96 & 97, and presuming that bracket 400 is initially in a locked configuration as shown in FIG. 96, a user grasps bracket 400 (and/or a rail disclosed herein and/or any appropriate attached accessory or purchase) and manually presses in first end 666 of latch bolt pin 660, which forces latch bolt 660 to translate, as shown by arrow 16 such that tab 690 is pushed out of tab recess 430. Tab recess 430 provides a cavity within which tab 690 normally rests when in a locked configuration, so that tab 690 is not inadvertently rotated and/or becomes snagged, thus unintentionally causing bracket 400 to unlock. Additionally, tab recess 430 can be expanded to permit locking when tab 690 is rotated ninety degrees. With tab 690 positioned out of tab recess 430, a user can rotate tab 690 relative to latch bolt 660, as shown by arrow 18, so that tab 690 extends beyond and/or at a sufficient distance from body of bracket 400 to permit a user to manually further pull tab 690, thus further pulling latch bolt 660 axially out of latch bolt bore 560, as shown by arrow 16 of FIG. 97. The axial travel of latch bolt 660 is outwardly limited by guide pin screw 620 contacting second limiter wall 678. Latch bolt 660 is spring biased inward, such that latch bolt 660 is biased to retract into latch bolt bore 560.

When in a locked configuration (as in FIG. 96), latch bolt pin 668 is inserted through latch bolt through hole 642 (generally fully through, but at least partially within) of latching pin 630, which prohibits latching guide pin 630 from traveling axially within latching pin bore 536. Preferably, first end 664 of latch bolt 660 extends out of small diameter portion 564 of latch bolt bore 560 to permit a user to press first end 664, which serves as a button and/or actuator to initiate a first step of an unlocking process. As a user pulls tab 690, latch bolt pin 668 of latch bolt 660 is pulled out of latch bolt through hole 642 of latching pin 630 such that first end 664 of latch bolt 660 is positioned within bolt channel 640 of latching pin 630, where first limiter wall 676 contacting guide pin screw 620 prevents first end 664 of latch bolt 660 from being further retracted out of bolt channel 640. Thus, first end 664 of latch bolt 660 (and a portion of latch bolt pin 668 near first end 664) remain within bolt channel 640, when in a second step in an unlocking process is completed and bracket 400 is in the unlocked configuration. This two-step unlocking process reduces inadvertent unlocking events, due to a user having to both push first end 664 of latch bolt 660 to expose tab 690 and then pulling tab 690 fully pull-out latch bolt 660 to open bracket 400 (i.e., the open or unlocked configuration).

First and second jaw compression springs 406, 408 apply a continuous bias to separate first jaw member 410 and second jaw member 510, the motion of which is checked by latch bolt pin 668, with either first end 664 of latch bolt 660 being positioned within bolt channel 640 of latching pin 630 and/or latch bolt pin 668 positioned within latch bolt through hole 642 of latching pin 630. When latch bolt pin 668 is positioned within latch bolt through hole 642, bracket 400 is in the locked configuration, where first jaw member 410 and second jaw member 510 are in close proximity to one another. Once latch bolt pin 668 is removed from latch bolt though hole 642 to position first end 664 of latch bolt 660 within bolt channel 640 of latching pin 630, first jaw member 410 with attached latching pin 630 is permitted to travel away from second jaw member 510. The distance of travel of latching guide pin 630 is limited by the length of bolt channel 640.

As shown in FIG. 98, as a user pulls tab 690, second end 664 and an adjacent portion of latch bolt pin 668 becomes aligned with bolt channel 640, first and second jaw compression springs 406, 408 push first and second jaw members 410, 510 apart, as shown by arrow 14, snapping to the open configuration where first and second jaw members 410, 510 are furthest away from one another. As latching pin 630 moves relative to first end 664 of latch bolt 660, latch bolt pin 668 becomes misaligned with latch bolt through hole 642 of latching pin 630 and becomes aligned with bolt channel 640 latching pin 630 (which is, in this example embodiment, the floor of channel 672). At this point the, the bias of first and second jaw compression springs 406, 408 force second end 664 and an adjacent portion of latch bolt pin 668 though bolt channel 640 until halted by bolt stop 644. Thus, when a user releases tab 690, latch bolt compression spring 679 within latch bolt 660 forces first end 664 of latch bolt 660 into contact with bolt stop 644. So long as latch bolt pin 668 is at least partially misaligned with latch bolt through hole 642, latch bolt 660 will protrude from latch bolt bore 560, holding tab 690 out from body of bracket 400.

To lock (or latch) bracket 400 (on a rail disclosed herein, in isolated, or otherwise), a user manually pinches first jaw member 410 toward second jaw member 510. As first end 664 of latch bolt 660 slides across bolt channel 640 of latching pin 630, latch bolt pin 668 becomes aligned once again with latch bolt through hole 642 (due to the latching guide pin 630 moving deeper within latching pin bore 536), latch bolt compression spring 679 (still under compression within channel 672 of compression spring housing 670) immediately forces latch bolt pin 668 through latch bolt through hole 642, as shown by arrow 15 of FIG. 99, immediately locking first and second jaw members 410, 510 together.

As discussed briefly above, tab 690 is capable of rotating relative to latch bolt 660 when tab 690 is pushed out of tab recess 430, to permit a user to reposition tab 690 so tab 690 can be easily pulled away from body of bracket 400. While within tab recess 430, tab 690 is substantially restricted from rotating, due to mechanical interference of tab recess 430. Thus, once tab 690 is rotated to align it with tab recess 430, first end 664 of latch bolt 660 is permitted to push back through small diameter portion 564 of latch bolt bore 560, protruding from body of bracket 400. As best shown in FIGS. 96 & 99, although first end 664 of latch bolt 660 is described as protruding from body of bracket 400 to serve as a button, first end 664 of latch bolt 660 may protrude from a button recess 568 formed in body of bracket 400 surrounding opening small diameter portion 564 of latch bolt bore 560. The distance of the protrusion of first end 664 of latch bolt 660 is less than the depth of button recess 568, so that inadvertent depression of first end 664 of latch bolt 660 is substantially prevented.

At least one of the purposes of bracket 400 is to create a connection between a rail disclosed herein and one or more devices or components thereof (e.g., a camera, a compass, an altimeter, a GPS unit, a night vision goggle (NVG), a battery pack, and/or a large variety of electronic and analog devices and other equipment), where bracket 400 connects directly to the device or component thereof or to the device or component thereof through a positioning arm, a rotating joint, a tilting joint, a hinge joint, a branched arm, and/or a variety of appropriate connectors and/or couplers and the like.

As discussed above, an attachment plate disclosed herein can be employed as an attachment point for another component, such as, e.g., a connector disclosed herein, a component of a mounting system disclosed herein or a third-party mounting system, a device or a component thereof, or other attachment. In some embodiments, a connector disclosed herein bracket adaptor. A bracket adaptor is a connector configured to be secured to a bracket disclosed herein and serves as an attachment point for another component, such as, e.g., a connector disclosed herein, a component of a mounting system disclosed herein or a third-party mounting system, a device or a component thereof, or other attachment. In some embodiments, a bracket adaptor disclosed herein attaches to attachment plate 460 and employs attachment port 462. In some embodiments, a bracket adaptor disclosed herein attaches to attachment plate 460 and employs attachment port 462 as well as first and second indexing holes 464, 466.

In some embodiments, a bracket adaptor comprises a device mount that interfaces directly with an attachment plate disclosed herein. For example, as shown in FIGS. 100 & 101, a bracket adaptor 900, in this case, a GoPro mount adaptor, comprises a device mount 920 including an adaptor screw 902. Adaptor screw 902 comprises a plate 904 having a top surface 906 and a bottom surface 908 and a threaded portion 912 centrally located on bottom surface 908 and extending perpendicularly from the bottom surface 908. Device mount 920 interfaces directly with attachment plate 460 of back plate 450 and comprises a top surface 922, a bottom surface 924, a device attachment portion 926 and a through hole 927 configured to align with threaded attachment port 462 once device mount 920 is properly oriented with attachment plate 460. Device mount 920 is secured to attachment plate 460 by passing threading adaptor screw 902 through hole 927 and securing into threaded attachment port 462. Bottom surface 924 includes a first indexing pin 928 and a second indexing pin 929 extending perpendicularly from bottom surface 924. First and second indexing pins 928, 929 are configured to align and insert into first and second indexing holes 464, 466 in a manner that properly orientates bracket adaptor 900 to back plate 450 and prevents misalignment while secured. When assembled, threaded portion 912 of adaptor screw 902 is insert pass through hole 927 and a retaining clip 916 is secured to a groove 914 on threaded portion 912 on side of bottom surface 424 of device mount 920.

A bracket adaptor, e.g., bracket adaptor 900, can further comprise a detent mechanism to controllably rotate and temporarily fix the rotation of adaptor screw 902 relative to back plate 450 of bracket 400. In some embodiments, detent mechanism includes a detent plunger or equivalent mounted to bracket adaptor 900 and one or more detents 910 (hemispherical depressions formed as concavities). One or more detents 910 are positioned on bottom surface 908 of plate 904 and organized in a circular ring around adaptor screw 902 and configured to engage with a detent plunger 930. In some embodiments, each detent 910 is slopped or ramped on the left-hand side to provide stop mechanism in a clock-wise direction. In some embodiments, bottom surface 908 comprises 2, 3, 4, 5, 6, 7, 8, 9, 10, 11, 12, 13, 14, 15, or 16 detents. In some embodiments, one or more detents 910 comprise 1 to 12 detents, such as, e.g., 1 to 2 detents, 1 to 4 detents, 2 to 6 detents, 4 to 6 detents, 2 to 8 detents, 4 to 8 detents, 6 to 8 detents, 2 to 10 detents, 4 to 10 detents, 6 to 10 detents, 8 to 10, detents, 2 to 12 detents, 4 to 12 detents, 6 to 12 detents, 8 to 12 detents, or 10 to 12 detents. In some embodiments, and as shown in FIG. 101, detents 910 are the same or similar size. In some embodiments, one or more detents 910 can be of two or more different sizes.

In some embodiments, detent plunger 930 include a detent cylinder comprising an open first end and a closed second end opposite open end, and a detent ball and a detent compression spring. The detent ball and the detent compression spring are captured within the detent cylinder during assembly, with the detent compression spring outwardly biasing the detent ball toward the open end of the detent cylinder in a manner that causes the detent ball to protrude from the open end of the detent cylinder. One or more detent plungers are located on a side that will be in contact with bottom surface 908 of plate 904 of adaptor screw 902. One or more detents 910 of bottom surface 908 of plate 904 of adaptor screw 902 are aligned in a manner that the detent ball protruding from an open end will be seated in each of the one or more detents 910 as adaptor screw 902 is screwed into threaded attachment port 462 of attachment plate 460. This detent mechanism ensures that bracket adaptor 900 will remain secured in place and adaptor screw 902 will not become loosened over time.

In some embodiments, a bracket adaptor comprises a device mount that interfaces indirectly with an attachment plate disclosed herein via a bracket mount. For example, and as shown in FIGS. 102-119, a bracket adaptor 940 comprises a bracket mount 942 and a device mount 960. In this example, bracket mount 942 interfaces directly with attachment plate 460 of back plate 450 and device mount 960 interfaces directly with bracket mount 942, and thus indirectly with attachment plate 460.

Referring to FIGS. 102-109, bracket mount 942 comprises a body 943 having a top surface 944, a bottom surface 945, a front 946, a back 947, a first side 948, and a second side 949. Body 943 also has a through hole 952 located in a manner to align with threaded attachment port 462 of attachment plate 460. Top surface 944 include one or more threaded blind hole 950 used to secure device mount 960 to bracket mount 942 of bracket adaptor 940 with one or more screws 976. Bottom surface 945 includes a first indexing pin 954 and a second indexing pin 956 extending perpendicularly from bottom surface 945. First and second indexing pins 954, 956 are configured to align and insert into first and second indexing holes 464, 466 in a manner that properly orientates bracket adaptor 940 to back plate 450 and prevents misalignment while secured. Bracket mount 942 can optionally include a plate extension to provide added stability and security when bracket mount 942 is attached to a bracket disclosed herein. A plate extension orthogonally extends from back 947 and optionally first side 948, second side 949, or both first and second sides 948, 949. A plate extension can extent from the entire length of back 947 and/or first and second sides 948, 949, or only extent from a portion of back 947 and/or first and second sides 948, 949. In some embodiments, and as best shown in FIGS. 111, & 106-108, plate extension 958 extends from a portion of back 947 and a portion of second side 949.

Figure 118:
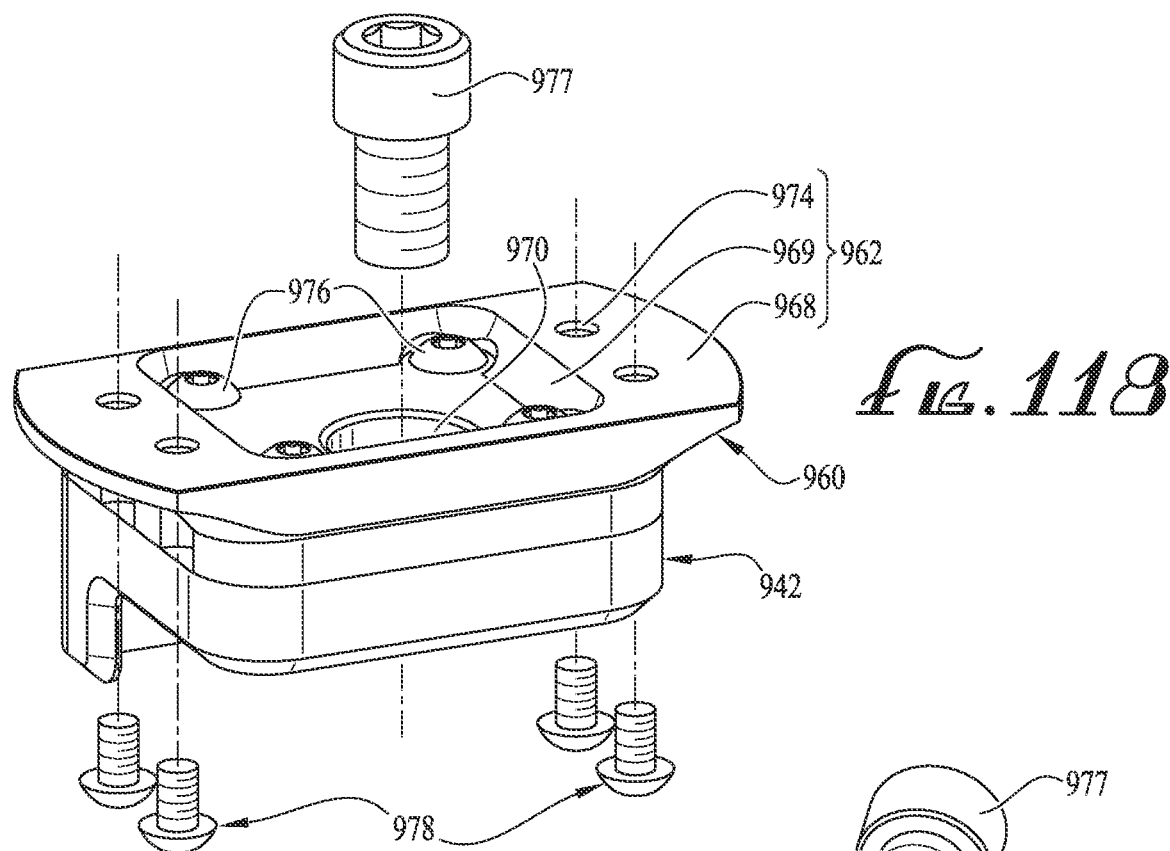
FIG. 118 is an exploded top perspective view of a bracket adaptor device mount disclosed herein.
Figure 119:
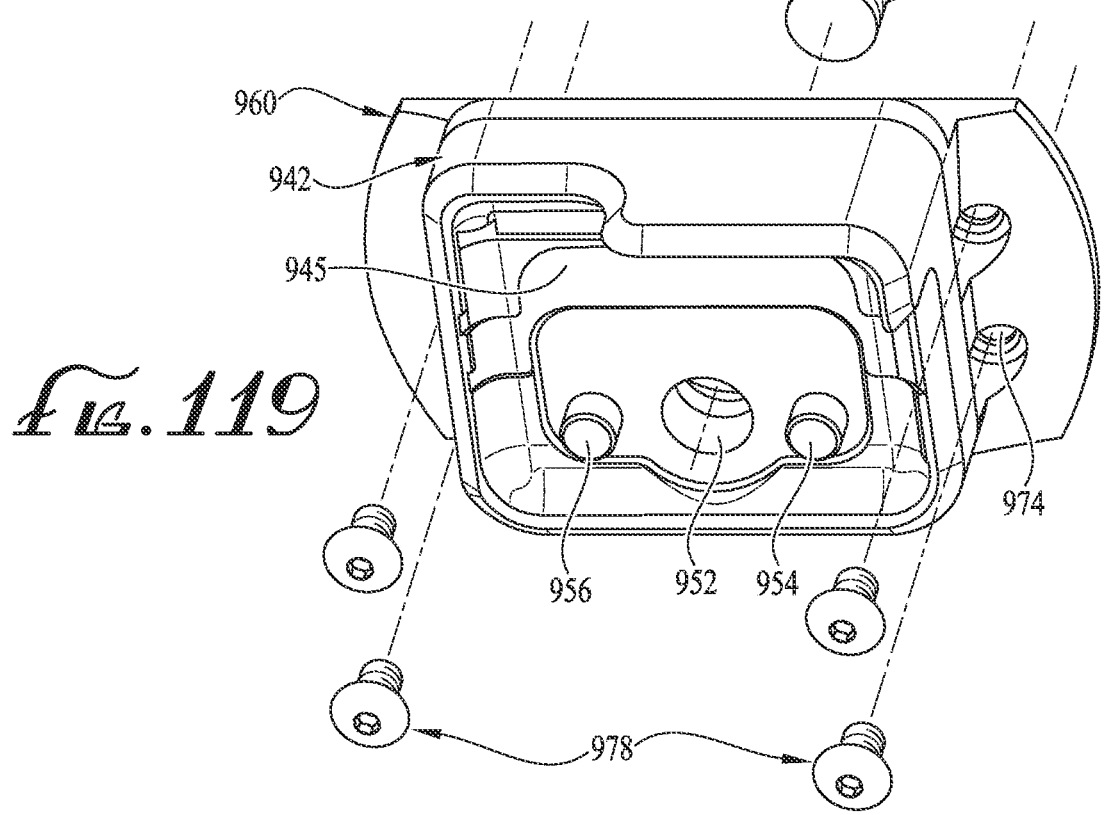
FIG. 119 is an exploded bottom perspective view of the bracket adaptor device mount of FIG. 118.
Figure 121:
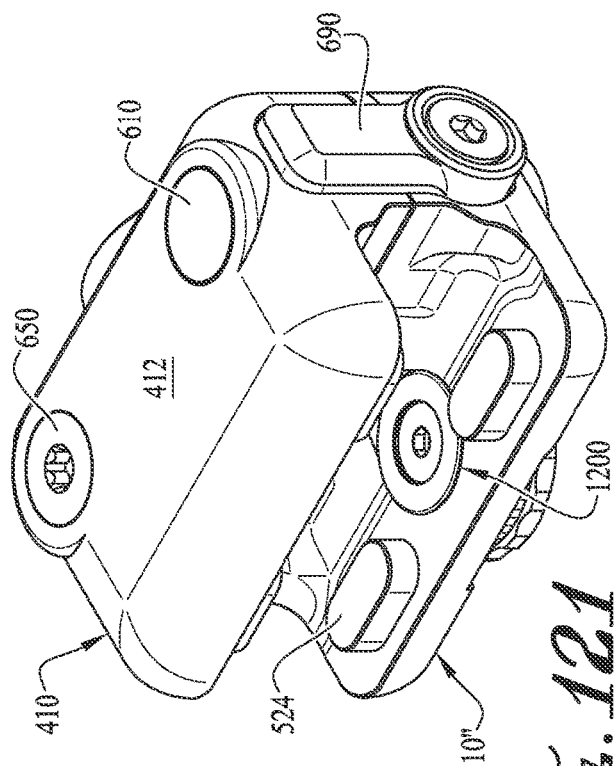
Figure 123:
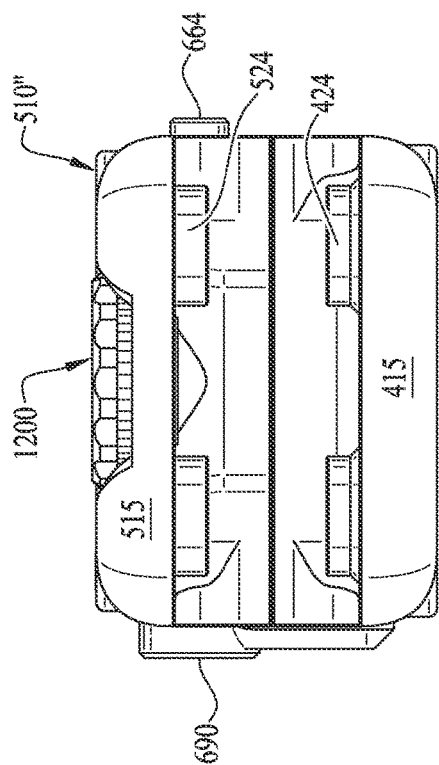
Figure 120:
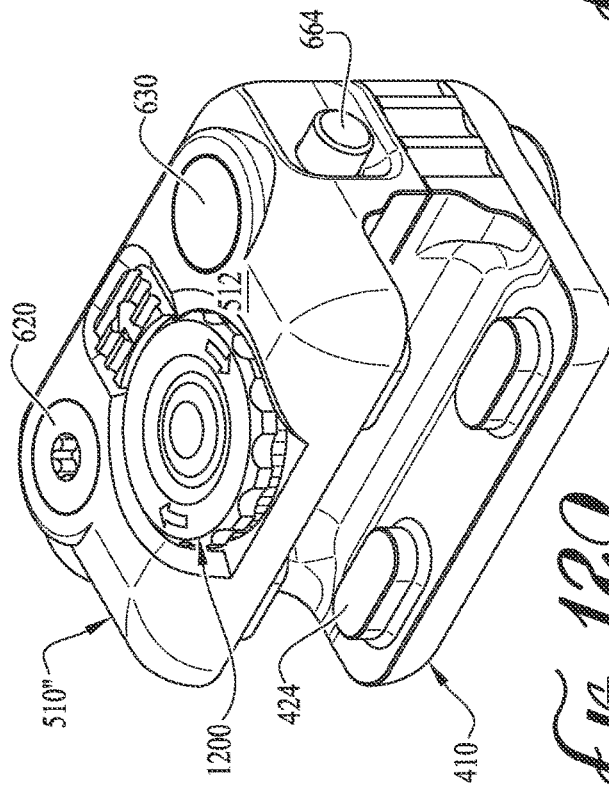
Figure 122:
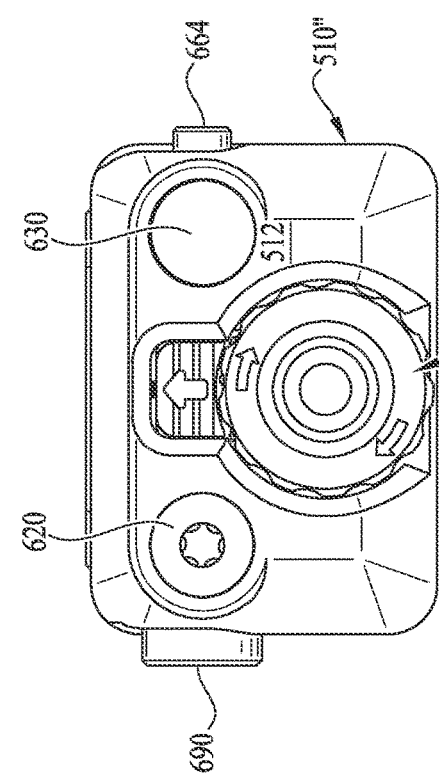

Device mount 960 interfaces with bracket mount 940 as well as a device to be mounted to a bracket disclosed herein. Referring to FIGS. 110-117, device mount 960 comprises a body 961 having a top surface 962, a bottom surface 963, a front 964, a back 965, a first side 966, and a second side 967. As best seen in FIGS. 110, 113, 118 & 119, top surface 962 comprises a mounting surface 968 and a recessed portion 969 with recessed portion 669 centrally located within mounting surface 968. Mounting surface 968 serves to interface directly with a device being mounting on bracket adaptor 940 and comprises one or more through holes 974 used to pass device screws 978 through device mount 960 and secure a device being mounting on bracket adaptor 940. Recessed portion 969 includes one or more through holes 970 and a through hole 972. One or more through holes 970 of recessed portion 969 are used to pass bracket mount screws 976 through device mount 960 and bracket mount 942 and secure bracket adaptor 940 to a bracket disclosed herein. Through hole 972 of recessed portion 969 is used to pass bracket screw 977 through device mount 960 and secure device mount 960 to bracket mount 942. Referring to FIG. 118, recessed portion 969 is configured to provide an internal compartment to lower bracket mount screws 976 and bracket screw 977 below the plane of mounting surface 968 to enable a proper mounting of a device to bracket adaptor 940 without any interference from bracket mount screws 976 and bracket screw 977. Bracket adaptor 940 is attached to back plate 450 of bracket 400 by aligning and inserting first and second protrusions 954, 956 into first and second indexing holes 464, 466 and affixing bracket screw 977 to back plate 450 of bracket 400 by screwing into threaded attachment port 462 of attachment plate 460.

The present specification also discloses alternate embodiments of bracket 400. In these embodiments, a bracket disclosed herein attaches to a rail disclosed herein in the same or substantially the same manner. As such, an alternative bracket disclosed herein comprises a first jaw and a second jaw, along with all components thereof, and functionality thereof as described herein and illustrated herein.

As an example, a bracket disclosed herein can comprise a cinching assembly. A cinching assembly disclosed herein serves to further tighten a bracket disclosed herein, when in the closed or locked configuration, to a rail disclosed herein. In some embodiments, a cinching assembly is integrally formed on first and/or second jaw members 410", 510" as a single component by any known mechanism or process, such as, e.g., by being molded, cast, machined, etc. In some embodiments, a cinching assembly is a separate component that is attached to first and/or second jaw members 410", 510" by any known mechanism or process, such as, e.g., by being screwed, welded, brazed, adhered, or other appropriate fastening means.

In some embodiments, bracket 400" can comprise a cinching assembly positioned on first jaw member 410" or second jaw member 510". In some embodiments, bracket 400" can comprise two cinching assemblies with one positioned on first jaw member 410" and the other positioned on second jaw member 510". In some embodiments, bracket 400" can comprise a cinching assembly and a hinged socket disclosed herein, or a cinching assembly and a hinged coupler disclosed herein, with the cinching assembly positioned on first jaw member 410" and a hinged socket or hinged coupler positioned on second jaw member 510". Alternatively, a cinching assembly can be positioned on second jaw member 510" and a hinged socket or hinged coupler positioned on first jaw member 410".

Referring to FIGS. 120-126, second jaw member 510" comprises cinching assembly 1200. In some embodiments, and referring to FIGS. 124-126, cinching assembly 1200 comprises an adjustment plate 1210, a cinching plate 1230, and a release 1250. Adjustment plate 1210 includes an adjustment dial 1212 and a threaded hollow boss 1220. Adjustment dial 1212 includes a top surface 1214, a bottom surface 1216, and a side 1217. Side 1217 comprises a portion comprising a series gripping slots 1218 positioned around the entire circumference of side 1217 and next to top surface 1214, and a portion comprising a series teeth slots 1219 positioned around the entire circumference of side 1217 and next to bottom surface 1216. The portion of side 1217 containing teeth slots 1219 is uniformly inset from the portion of side 1217 containing gripping slots 1218 thereby creating an overhang where the portion of side 1217 containing gripping slots 1218 extend beyond the portion of side 1217 containing teeth slots 1219. Gripping slots 1218 facilitate the movement of adjustment dial 1212 by a user desiring to adjust s cinching assembly 1200. Teeth slots 1219 operationally engage with a series locking teeth 1260 of release 1250, which together form a locking mechanism to prevent unwanted movement of adjustment dial 1212.

Figure 126:
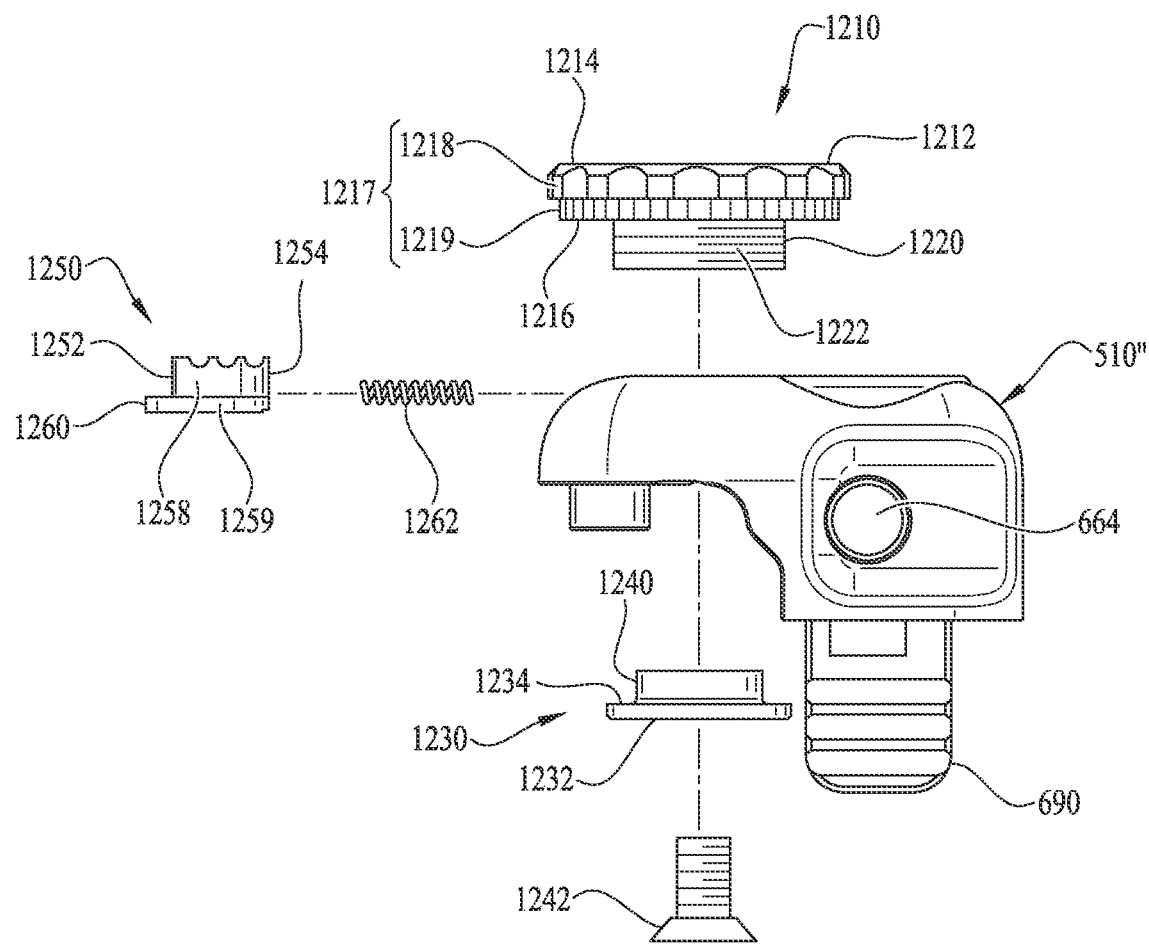

Referring to FIGS. 124-126, threaded hollow boss 1220 extends perpendicularly from and is centrally located on bottom surface 1216 of adjustment dial 1212. Threaded hollow boss 1220 includes a wall having an exterior threaded surface 1222 and an internal surface 1224 defining an internal compartment 1216, with internal compartment 1216 having a bottom 1228 with a threaded blind hole 1229 configured to receive a cinching plate screw 1242. Internal compartment 1216 is configured to receive an insert portion 1240 of cinching plate 1230.

As shown in FIGS. 124-126, cinching plate 1230 has a top surface 1232 and a bottom surface 1234. Top surface 1232 includes a cinching pad portion 1236 and a threaded through hole 1238 with a countersink portion. Bottom surface 1234 has insert portion 1240 that extends perpendicularly from and is centrally located on bottom surface 1234 of cinching plate 1230. Insert portion 1240 is configured to insert into internal compartment 1226 of adjustment plate 1210.

As shown in FIGS. 124 & 125, release 1250 comprises a front side 1252, a back side 1254, a first side 1256, and a second side 1258. Front side 1252 includes an series of locking teeth 1260 configured to operably engage with teeth slots 1219 of adjustment dial 1212 of adjustment plate 1230. Back side 1254 includes a blind hole that serves as a seat for compression spring 1262. First side 1256 includes a tongue 1257 and second side 1258 includes a tongue 1259, where first and second tongues 1257, 1259 are configured to insert into first and second grooves 582, 584 of a release compartment 580 of a cinching assembly housing 570 located on second jaw 510".

As shown in FIG. 124, second jaw member 510" comprises cinching assembly housing 570, a recess centrally located in outer surface 512 between countersink 519 of guide pin screw 520 and latch pin bore 536. Cinching assembly housing 570 comprises a bottom surface 571, an open front 572, a back side 574, a first side 576, and a second side 578. Cinching assembly housing 570 comprises two compartments, a release compartment 580 and an adjustment plate compartment 586. Cinching assembly housing 570 is configured to receive release 1250 in release compartment 580 and adjustment plate 1210 in adjustment plate compartment 586, the later in a manner where adjustment dial 1212 extends beyond open front 572 of adjustment plate compartment 578 in a manner that enables a user to properly operate adjustment dial 1212. Release compartment 580 is located near back side 516 of second jaw member 510" and is defined by back side 574 and portions of first and second sides 576, 578 cinching assembly housing 570. Release compartment 580 includes a first groove 584 and a second groove 586 located at bottom surface 571. First groove 584 is defined by bottom surface 571 and a channel within first side 576 and second groove 586 is defined by bottom surface 571 and a channel within second side 578. Adjustment plate compartment 586 is located near front side 516 of second jaw member 510" being positioned in front of release compartment 580. Adjustment plate compartment 586 is defined by release compartment 580 in the back, and by portions of first and second sides 576, 578, and open front 572 of cinching assembly housing 570. A through hole 588 in bottom surface 571 is centrally located in adjustment plate compartment 586.

In addition, second jaw 510 comprises a cinching plate housing 590, a recess centrally located in clamping portion 522. In some embodiments, and as illustrated in FIG. 125, cinching plate housing 590 is positioned substantially behind and in between engagement bosses 524. In some embodiments, where engagement bosses are positioned across the entire front portion of clamping portion 522, as illustrated FIGS. 11 & 13, cinching plate housing is positioned behind these engagement bosses. Cinching plate housing 590 is configured to receive cinching plate 590 of cinching assembly 580 and in a manner where cinching pad 1236 can be adjustably positioned either above or below the surface place of clamping portion 522.

When assembled, and as best shown in FIGS. 124 & 125, compression spring 1262 is inserted into a blind hole located in back side 1254 of release 1250 and release 1250 is then inserted into release compartment 580 of cinching assembly housing 570 by sliding togues 1257, 1259 of release 1250 into first and second grooves 584, 586, respectively. In this configuration, compression spring 1262 becomes captured in blind hole of release 1250 and back side 574 of release compartment 580 of cinching assembly housing 570 (which optionally can also have a blind hole configured to serve as a seat for compression spring 1262).

As shown in FIGS. 124 & 125, threaded hollow boss 1220 of adjustment plate 1210 is inserted pass through hole 588 of adjustment plate compartment 586 so that bottom surface 1216 is in contact with bottom surface of adjustment plate compartment 586 and locking teeth 1062 of release 1250 become operably engaged with teeth slots 1219 of adjustment dial 1212. Once adjustment plate 1210 is properly positioned within adjustment plate compartment 586, release 1250 becomes captured within release compartment 580, with adjustment plate 1210 in front of release 1250 and back side 574 of cinching assembly housing 570 at its back. In this configuration, cinching assembly 1200 is in a locked configuration because compression spring 1262 outwardly biases release 1250 against adjustment plate 1212 causing locking teeth 1260 to operationally engage teeth slots 1219. In addition, once adjustment plate 1212 is properly positioned in cinching assembly housing 570, insert portion 1240 of cinching plate 1230 can be inserted into internal compartment 1226 of adjustment plate 1210. Cinching plate screw 1242 can then be inserted passed through hole 1238 of cinching plate 1230 and secured into threaded blind hole 1229 located in internal compartment 1226 of adjustment plate 1210, thereby affixing cinching plate 1230 to adjustment plate 1210. In this configuration, cinching assembly 1200 is securely affixed to second jaw member 510".

In operation, bracket 400" comprising second jaw member 510" with cinching assembly housing 580 can be attached to a rail disclosed herein as described herein. Once attached, release 1250 is pushed toward back wall of cinching assembly housing 570 to disengage locking teeth 1260 of release 1250 from teeth slots 1219 of adjustment dial 1212. Once disengaged, adjustment plate 1212 can be turned in a manner that extends cinching plate 1230 causing cinching pad 1236 to exert pressure on a side of a rail disclosed herein, thereby creating a tighter attachment relative to the sole use of engagement bosses disclosed herein.

As another example, a bracket disclosed herein can comprise a hinged socket. A hinged socket serves to securely engage with a coupler disclosed herein or otherwise disclosed and enable a user to positional adjust a device or other component attached to the coupler or socket. In some embodiments, a hinged socket is integrally formed on first and/or second jaw members 410''', 510''' as a single component by any known mechanism or process, such as, e.g., by being molded, cast, machined, etc. In some embodiments, a hinged socket is a separate component that is attached to first and/or second jaw members 410''', 510''' by any known mechanism or process, such as, e.g., by being screwed, welded, brazed, adhered, or other appropriate fastening means.

In some embodiments, bracket 400''' can comprise hinged socket positioned on first jaw member 410''' or second jaw member 510''. In some embodiments, bracket 400" can comprise two hinged sockets with one positioned on first jaw member 410''' and the other positioned on second jaw member 510'''. In some embodiments, bracket 400''' can comprise a hinged socket and a cinching assembly disclosed herein, or a hinged socket and a hinged coupler disclosed herein, with the hinged socket positioned on first jaw member 410''' and a cinching assembly or hinged coupler positioned on second jaw member 510'''. Alternatively, a hinged socket can be positioned on second jaw member 510''' and a cinching assembly or hinged coupler positioned on first jaw member 410'''.

In some embodiments, and as shown in FIGS. 127-131, a bracket disclosed herein can comprise a hinged socket 700. Although hinged socket 700 is shown in the illustrated embodiments as being connected or integral with bracket 400''', hinged socket 700 is useful in itself and/or in connection with other devices, known or unknown. For example, hinged socket 700 can be used is a variety of applications where one component is required to be rotated relative to a second component connected through hinged socket 700. In a further example, latching socket assembly 730 of hinged socket 700 can be used separately (e.g., without necessarily being permanently attached to another component) to temporarily attach to a second component.

Referring to FIGS. 127-131, first jaw member 410''' comprises hinged socket 700 comprising a hinged base 710

(which is integrally formed into first jaw member 410′′′) and a latching socket assembly 730 and is configured to reversibly engage a connector disclosed herein, such as, e.g., a coupler disclosed herein, such as coupler 980 (see FIG. 134). In some embodiments, and as illustrated in FIGS. 127-130 &134, a surface of hinged base 710 is contoured to form recess 719 configured to resemble the shape of hinged socket 700 to provide a fitted seat of hinged socket 700 when in close proximity to hinged base 710. In some embodiments, and referring to FIGS. 130-134, 139, & 140, latching socket assembly 730 comprises an inner knuckle 740 and a socket housing 770.

In some embodiments, and referring to FIG. 134, hinged base 710 includes a first outer knuckle 712 with through hole 713, a second outer knuckle 714 with through hole 715, and a hinge pin 716. Hinge pin 716 is configured to properly attach inner knuckle 740 hinged base 710. In some embodiments, hinge pin 716 is a single piece. In some embodiments, and as shown in FIG. 134, hinge pin 716 includes two-parts, a pin component 717 and a screw component 718 with pin component 717 including a threaded blond hole configured to receive screw component 718. Inner knuckle 740 of latching socket assembly 730 rotatably connects to hinged base 710 using first outer knuckle 712, second outer knuckle 714, and hinge pin 716. For example, pin portion 717 can be inserted past through hole 715 of second outer knuckle 714, through hole 744 of inner outer knuckle 740, and through hole 713 of first outer knuckle 712 where screw portion 718 is affixed to pin portion 717 by screwing into threaded blind hole of pin portion 717.

Hinge pin 716 permits inner knuckle 740 to rotate about hinged base 710. In some embodiments, the range of angular rotation of latching socket assembly 730 about hinged base 710 in about 90 degrees to about 270 degrees. In some embodiments, the range of angular rotation of latching socket assembly 730 about hinged base 710 in about 135 degrees to about 270 degrees. In some embodiments, the range of angular rotation of latching socket assembly 730 about hinged base 710 in about 135 degrees to about 225 degrees. In some embodiments, the range of angular rotation of latching socket assembly 730 about hinged base 710 in about 180 degrees to about 225 degrees. In some embodiments, the range of angular rotation of latching socket assembly 730 about hinged base 710 in about 90 degrees to about 180 degrees. In some embodiments, the range of angular rotation of latching socket assembly 730 about hinged base 710 in about 180 degrees to about 225 degrees. In some embodiments, the range of angular rotation of latching socket assembly 730 about hinged base 710 in about 135 degrees to about 180 degrees.

Inner knuckle 740 of latching socket assembly 730 can be rotated relative to hinged base 710 in a controlled and temporarily fixed position, such as, e.g., a locking mechanism, a friction hinge, or other appropriate means to control or catch the rotation of inner knuckle 740. In some embodiment, hinged socket 700 comprises a detent mechanism to controllably rotate and temporarily fix the rotation of inner knuckle 740 of latching socket assembly 730 relative to hinged base 710. In some embodiments, detent mechanism includes one or more detent plungers or equivalent mounted to hinged base 710 and one or more detents (hemispherical depressions formed as concavities) positioned on inner knuckle 740. In some embodiments, detent plunger includes a detent ball captured in a cylinder and spring loaded to bias the detent ball toward the open end of the cylinder.

For example, an exemplary embodiment of a detent mechanism to controllably rotate and temporarily fix the rotation of inner knuckle 740 relative to hinged base 710 is shown in FIGS. 134 & 135. In this example, hinged base 710 comprises a first detent plunger 680 and a second detent plunger 680′ and inner knuckle 740 includes first and second rows of one or more detents 746, 748 that are annularly spaced apart and aligned and configured to engage with first and second detent plungers 680, 680′ respectively. A detent mechanism disclosed herein enables the radial or angular position of inner knuckle 740 relative to hinged base 710 to be incrementally controlled and arrested at any one of the detents in the series, acting as incremental catches. Rotation or angular positions are controlled by the spacing of detents 746, 748. In addition, factors such as spring constant of detent compression springs 689, 689′ and the depth of detents 746, 748 control the degree of force required to change the position of inner knuckle 740.

Referring to FIG. 135, each of detent plungers 680, 680′ comprises a detent cylinder 682 including an open end 684 and a closed end 686 opposite open end 684 and a detent ball 688 and a detent compression spring 689. Detent ball 688 and detent compression spring 689 are captured in detent cylinder 682 during assembly, with detent compression spring 689 loaded to outwardly bias detent ball 688 toward open end 684 of detent cylinder 682 in a manner that causes detent ball 688 to protrude from open end 684 of detent cylinder 682. First and second detent plungers 680, 680′ are positioned inside of first and second outer knuckles 712, 714 respectively and in a manner where the outwardly biasing first and second detent balls 688 are directed toward and in contact with inner knuckle 740, with first detent ball 688 in alignment with parallel row of detents 746 in a manner where detent ball 688 is seated in one detent of row of detents 746, and second detent ball 688′ in alignment with parallel row of detents 748 in a manner where detent ball 688′ is seated in one detent of row of row of detents 748.

Referring to FIGS. 134, 135, 139 & 140, inner knuckle 740 includes a rotation portion 742. Rotation portion 742 is a cylindrical drum comprising through hole 744, a first row of one or more detents 746, and a second rows of one or more detents 748, with first and second rows of detents 746, 748 being parallel to each other and positioned about at least a portion of the circumference of the cylindrical surface of rotation portion 742 of inner knuckle 740. First and second rows of one or more detents 746, 748 of inner knuckle 740 are annularly spaced apart and aligned and configured to engage with a detent plunger 680. In some embodiments, each of first and second rows of one or more detents 746, 748 comprises 2, 3, 4, 5, 6, 7, 8, 9, 10, 11, 12, 13, 14, 15, or 16 detents. In some embodiments, each of first and second rows of one or more detents 746, 748 comprise 1 to 20 detents, such as, e.g., 4 to 12 detents, 6 to 12 detents, 8 to 12 detents, 4 to 16 detents, 6 to 16 detents, 8 to 16 detents, 10 to 16 detents, 12 to 16 detents, 4 to 20 detents, 6 to 20 detents, 8 to 20 detents, 10 to 20 detents, 12 to 20 detents, or 16 to 20 detents. In some embodiments, as shown in FIG. 134, each of first and second rows of one or more detents 746, 748 of inner knuckle 740 are the same or similar size. In some embodiments, as shown in FIGS. 139 & 140, each of first and second rows of one or more detents 746, 748 of inner knuckle 740 can be of two or more different sizes.

Examples of some of the rotation or angular positions possible with latching socket assembly 730 relative to hinged base 710 using a detent mechanism disclosed herein are illustrated in FIGS. 136-138. In FIG. 136, latching socket assembly 730 is adjusted to a first angular position approximately corresponding to 9 o'clock. In FIG. 137, latching socket assembly 730 is adjusted to a second angular position approximately corresponding to 2 o'clock. In FIG. 138, latching socket assembly 730 is adjusted to a third angular position approximately corresponding to 10 o'clock. Of course other angular positions are possible. For example, in the illustrated example embodiment, the range of angular rotation is between 9 o'clock and 6 o'clock (e.g., 270 degrees) with one or more catch points to temporarily arrest the motion of latching socket assembly 730 relative to hinged base 710.

In addition to rotation of inner knuckle 740 relative to hinged base 710, socket housing 770 of latching socket assembly 730 can also be rotated relative to inner knuckle 740 and hinged base 710. In some embodiments, socket housing 770 can be rotated relative to inner knuckle 740 in a controlled and temporarily fixed position, such as, e.g., a locking mechanism, a friction hinge, or other appropriate means to control or catch the rotation of socket housing 770. In some embodiment, and similar to the detent mechanism described above, latching socket assembly 730 comprises a detent mechanism to controllably rotate and temporarily fix the rotation of socket housing 770 relative to inner knuckle 740. In preferred embodiments, complete or 360 degrees of rotation is enabled.

For example, an exemplary embodiment of a detent mechanism used to controllably rotate and temporarily fix the rotation of socket housing 770 relative to inner knuckle 740 is shown in FIGS. 139 & 140. In this example, inner knuckle 740 comprises one or more detent plunger mechanisms 760 and socket housing 770 includes a circular ring of detents 773 that are aligned and configured to engage with one or more detent plungers 760. A detent mechanism disclosed herein enables the rotational position of socket housing 770 relative to inner knuckle 740 to be incrementally controlled and arrested at any one of the detents in the series, acting as incremental catches. Rotation or angular positions are controlled by the spacing of detents of one or more detents 773. In addition, factors such as spring constant of compression spring 769 and the depth of detents 773 control the degree of force required to change the position of socket housing 770.

Referring to FIGS. 139 & 140, inner knuckle 740 includes a body housing 750. Body housing 750 comprises a sleeve wall 752, a bottom 754 which in conjunction with sleeve wall 752 which extends perpendicularly from bottom 754 defines chamber 756. Bottom 754 includes a centrally located threaded blind hole 758 and one or more detent plunger mechanisms 760 (four detent plunger mechanisms are illustrated) positioned around threaded blind hole 758. Referring to FIG. 139, each detent plungers 760 comprises a detent cylinder 762 including an open end 764 and a closed end 766 opposite open end 764 and a detent ball 768 and a detent compression spring 769. Detent ball 768 and detent compression spring 769 are captured in detent cylinder 672 during assembly, with detent compression spring 769 loaded to outwardly bias detent ball 768 toward open end 764 of detent cylinder 762 in a manner that causes detent ball 768 to protrude from open end 764 of detent cylinder 762. Each detent plunger mechanism 760 is positioned in a manner where the outwardly biasing of each detent ball 768 is directed toward and in contact with the bottom surface of inner knuckle engagement portion 771, with each detent ball 768 in alignment with one or more detents 773 in a manner where each detent ball 768 is seated in one detent of one or more detents 773.

Referring to FIGS. 139 & 140, socket housing 770 comprises latching pin housing 774, inner knuckle engagement portion 771, with inner knuckle engagement portion 771 configured to insert into chamber 756 inner knuckle 740. Bottom surface 772 of inner knuckle engagement portion 771 includes a centrally located through hole 778 and one or more detents 773 organized around through hole 778 in a curvilinear path following at least a portion of the circumference of bottom surface 772 of inner knuckle engagement portion 771. In some embodiments, and as shown in FIG. 140, one or more detents 773 are organized as a circular ring of detents around through hole 772 and configured to engage with a detent plunger 760. In assembly, inner knuckle engagement portion 771 is inserted into chamber 756 and screw 779 is inserted past through hole 778 of socket housing 770 and secured into threaded blind hole 758 of inner knuckle 740. In some embodiments, bottom surface 772 comprises 2, 3, 4, 5, 6, 7, 8, 9, 10, 11, 12, 13, 14, 15, or 16 detents 773. In some embodiments, one or more detents 773 comprise 1 to 12 detents, such as, e.g., 1 to 2 detents, 1 to 4 detents, 2 to 6 detents, 4 to 6 detents, 2 to 8 detents, 4 to 8 detents, 6 to 8 detents, 2 to 10 detents, 4 to 10 detents, 6 to 10 detents, 8 to 10, detents, 2 to 12 detents, 4 to 12 detents, 6 to 12 detents, 8 to 12 detents, or 10 to 12 detents. In some embodiments, as shown in FIG. 140, detents 773 are the same or similar size. In some embodiments, one or more detents 773 can be of two or more different sizes.

As shown in FIGS. 134, 139, & 141-154, latch pin housing 774 of socket housing 770 includes a body wall defining a socket 775 oriented parallel to the body wall of socket housing 770, and a first latching pin housing 780, and a second latching pin housing 810 oriented perpendicular to the body wall of socket housing 770.

Referring to FIGS. 141 & 142, socket 775 includes an internal wall defining an internal space configured to receive a coupler disclosed herein, e.g., coupler 980 therewithin, or another connector disclosed herein configured to securely engage into socket 775. The internal space of socket 775 includes a lower attachment chamber 776 configured to receive an attachment portion of a coupler disclosed herein and an upper latching pin chamber 777 where one or more latching pins disclosed herein traverse socket 775. In the example embodiment shown in FIGS. 134, 139, 153 & 154, socket 775 has an internal wall having a perimeter that is a hexagonal-shape and is configured for receiving a hexagonal head 984 of a coupler 980. Such hexagonally shaped wall prevents rotation between socket 775 and coupler 980. However, other socket wall shapes are compatible with socket 775 of socket housing 770, including circular, elliptical, polygonal, including octagonal, dodecagonal and hexadecagonal, unique shapes, and other shapes which may allow or restrict rotation of the coupler.

The size of a socket disclosed herein can be any size and is typically determined by the particular application and the various parameters and requirements associated with that application, including, without limitation, material composition of the socket, force constraints like shear strength, load-bearing minimums and maximums, space limitations or constraints, and the like. In some embodiments, a socket can have a size from 4 mm to 80 mm in cross-sectional width. In some embodiments, a socket can have a size from 5/32 inch to 3⅛ inch in cross-sectional width.

Referring to FIGS. 128, 129, 131, 134, 141, & 143, first latching pin housing 780 comprises a bore 781 and a spring cup 785. As best seen in FIGS. 141 & 143, bore 781 houses a first open end 782, a second open end 783 opposite first open end 782 and a through hole 784 therewithin, with first open end 782 facing the outer surface of first latching pin housing 780 and second open end 783 facing the interior space defined by the internal wall of socket 775. In some embodiments, through hole 784 is oblong or oval in cross-section shape and serves to prevent rotation of first latching pin 790 within first latching pin housing 780. As best seen in FIGS. 141 & 143, spring cup 785 houses a spring seat 786, a blind chamber located internally in spring cup 785 and having a first open end 787 and a second closed end 788 opposite first open end 787. First open end 787 faces the interior space defined by the internal wall of socket 775. Through hole 784 defined by first and second ends 782, 783 of bore 781 and first open end 787 of spring seat 786 are aligned with one another in a manner that enables first latching pin 790 to be inserted through bore 781 and into spring seat 786 of spring cup 785. As such, first latching pin housing 780 configured to receive first latching pin 790.

Referring to FIGS. 134, & 145-148, first latching pin 790 includes a body 792 having a first end 794 and a second end 796, with second end 796 including a blind hole 798. The diameter or circumference of first latching pin 790 is configured to enable insertion into first latching pin housing 780. In some embodiments, body 792 is oblong or oval in cross-section shape and serves to prevent rotation of first latching pin 790 within a similarly oblong or oval in cross-section shape of through hole 784 of first latching pin housing 780 (see FIG. 147). The diameter or circumference of blind hole 798 is smaller than the diameter or circumference of first latching pin 790 and is configured to receive compression a spring 808. As best seen in FIGS. 145, 147, & 148, first latching pin 790 can also include a shoulder 804 formed near and spaced apart from first end 794. In some embodiments, shoulder 804 is oblong or oval in cross-section shape and serves to prevent rotation of first latching pin 790 within a similarly oblong or oval in cross-section shape through hole 784 of latching pin housing 780. Body 792 also includes a keyway cutout 800 and a limiter slot 806, with limiter slot 806 near first end 794 formed longitudinally through a portion of body 797 and a portion of shoulder 804.

As assembled, and referring to FIGS. 134, 142, 144, 153, & 154, first latching pin 790 is contained within first latching pin housing 780 with second end 796 of first latching pin 790 oriented into the chamber of spring cup 785. First latching pin 790 is positioned so that the shape of keyway cutout 800 faces the internal space of socket 775 in a manner that when first latching pin 790 is fully depressed the shape of keyway cutout 800 aligns with the perimeter shape of the internal wall of socket 775 (see FIG. 154). In addition, first latching pin 790 is positioned so that limiter slot 806 is aligned with a pin hole 789 of first latching pin housing 780 which extends perpendicularly from the outer surface of first latching pin housing 780 to through hole 784 of bore 781. One end of compression spring 808 is seated within spring seat 788 of spring cup 785 while the other end of compression spring 808 is seated within blind hole 798 of first latching pin 790. In this configuration, first latching pin housing 780 holds compression spring 808 in a manner that compression spring 808 creates a force biasing first latching pin 790 outwardly from first latching pin housing 780. A pin 809 (which can be threaded) is inserted pass through hole 789 of first latching pin housing 780 until it is positioned in close proximity or in contact with limiter slot 806. In this configuration, movement of first latching pin 790 within first latching pin housing 780 is limiting by the distance defined by limiter slot 806. In addition, the outwardly biasing force of spring 808 on first latching pin 790 offsets keyway cutout 800 from the internal wall of socket 775 with a first side 801 (also referred to as a locking edge) of keyway cutout 800 extending into the internal space of socket 775 (see FIG. 153).

Similarity, and as shown in FIGS. 127, 129, 130, 134, & 143, second latching pin housing 810 comprises a bore 811 and a spring cup 815. As best seen in FIG. 143, bore 811 houses a first open end 812, a second open end 813 opposite first open end 812 and a through hole 814 therewithin, with first open end 812 facing the outer surface of first latching pin housing 810 and second open end 813 facing the interior space defined by the internal wall of socket 775. In some embodiments, through hole 814 is oblong or oval in cross-section shape and serves to prevent rotation of second latching pin 820 within second latching pin housing 810. As best seen in FIG. 143, spring cup 815 houses a spring seat 816, a blind chamber located internally in spring cup 815 and having a first open end 817 and a second closed end 818 opposite first open end 817. First open end 817 faces the interior space defined by the internal wall of socket 775. Through hole 814 defined by first and second ends 812, 813 of bore 811 and first open end 817 of spring seat 816 are aligned with one another in a manner that enables first latching pin 820 to be inserted through bore 811 and into spring seat 816 of spring cup 815. As such, first latching pin housing 810 configured to receive first latching pin 820.

Referring to FIGS. 134, & 149-152, second latching pin 820 includes a body 822 having a first end 824 and a second end 826, with second end 826 including a blind hole 828. The diameter or circumference of second latching pin 820 is configured to enable insertion into second latching pin housing 810. In some embodiments, body 822 is oblong or oval in cross-section shape and serves to prevent rotation of second latching pin 820 within a similarly oblong or oval in cross-section shape of through hole 814 of second latching pin housing 810 (see FIG. 151). The diameter or circumference of blind hole 828 is smaller than the diameter or circumference of second latching pin 810 and is configured to receive a compression spring 808. As best seen in FIGS. 149, 151, & 152, second latching pin 820 can also include a shoulder 834 formed near and spaced apart from first end 824. In some embodiments, shoulder 834 is oblong or oval in cross-section shape and serves to prevent rotation of second latching pin 820 within a similarly oblong or oval in cross-section shape through hole 814 of second latching pin housing 810. Body 822 also includes a keyway cutout 830 and a limiter slot 836, with limiter slot 836 near first end 824 formed longitudinally through a portion of body 822 and a portion of shoulder 834.

As assembled, and referring to FIGS. 134, 144, 153, & 154, second latching pin 820 is contained within second latching pin housing 810 with second end 826 of second latching pin 820 oriented into the chamber of spring cup 815. Second latching pin 820 is positioned so that the shape of keyway cutout 830 faces the internal space of socket 775 in a manner than when second latching pin 820 is fully depressed the shape of keyway cutout 830 aligns with the perimeter shape of the internal wall of socket 775 (see FIG. 154). In addition, second latching pin 820 is positioned so that limiter slot 836 is aligned with a pin hole 819 of second latching pin housing 810 which extends perpendicularly from the outer surface of second latching pin housing 810 to through hole 814 of bore 811. One end of compression spring 838 is seated within spring seat 818 of spring cup 815 while the other end of compression spring 838 is seated within blind hole 828 of second latching pin 820. In this configuration, second latching pin housing 810 holds compression spring 838 in a manner that compression spring 838 creates a force biasing second latching pin 820 outwardly from second latching pin housing 810. A pin 839 (which can be threaded) is inserted pass through hole 819 of second latching pin housing 810 until it is positioned in close proximity or in contact with limiter slot 836. In this configuration, movement of second latching pin 820 within second latching pin housing 810 is limiting by the distance defined by limiter slot 836. In addition, the outwardly biasing force of spring 838 on second latching pin 820 offsets keyway cutout 830 from the internal wall of socket 775 with a first side 831 (also referred to as locking edge) of keyway cutout 830 extending into the internal space of socket 775 (see FIG. 153).

As shown in FIGS. 134, & 145-148 first and second latching pins 790, 820 each include keyway cutout 800, 830, respectively. Each of keyway cutout 800, 830 is a notch formed longitudinally through and parallel with the length of body 792, 822 of first and second latching pins 790, 820, respectively. First and second latching pins 790, 820 each include the same or similar keyway cutout shape. In addition, the shape of a keyway cutout is configured to be the same or substantially similar to a portion of the perimeter or circumrenal shape of socket 775 and/or coupler 980. For instance, in the illustrated example of FIGS. 134 & 144, socket 775 and coupler 980 are hexagonal in shape and keyway cutouts 800, 830 each have a shape that is the same of substantially the same to one-half of a hexagon, i.e., three sides of a hexagon (see first, second and third sides 801, 802, 803 of keyway cutout 800 and first, second and third sides 831, 832, 833 of keyway cutout 830). However, other keyway cutout shapes are possible so long as the keyway cutout shape is compatible with the shape of coupler 980, including circular, elliptical, polygonal, including octagonal, dodecagonal and hexadecagonal, unique shapes, and other shapes which allow the keyway cutout to engage the circumferential groove 986 of coupler thereby securing coupler to socket 775. In addition, each of keyway cutouts 800, 830 of first and second latching pins 790, 820 is configured to be arranged opposite to one another, so that first and second latching pins 790, 820 can be moved within their respective latching pin housings 780, 810 so that each keyway cutout aligns with the interior wall of socket 775.

Socket 775 of socket housing 770 of socket hinge 700 is configured to reversibly engage a connector disclosed herein. In some embodiments, a connector is a coupler disclosed herein. In some embodiments, a coupler disclosed herein comprises a body including one or more attachment portions, and one or more circumferential grooves, where each of the one or more circumferential grooves lie between the body and each of the one or more attachment portions.

In some embodiments, and referring to FIG. 134, coupler 980 comprises a body 982, first and second attachment portions comprising first and second heads 984, 994 and first and second circumferential grooves 986, 996. First circumferential groove 988 is defined by a first shoulder 987 of body 982 and a shoulder 988 of first head 984. Similarly, second circumferential groove 996 is defined by a second shoulder 997 of body 982 and a should 998 of first head 994. On the side opposite of shoulder 988, first head 984 is radiused (or beveled or otherwise configured obliquely) to form a leading edge 985. Similarly, on the side opposite of shoulder 998, second head 994 is radiused (or beveled or otherwise configured obliquely) to form a leading edge 995. Leading edges, 985, 995 of first and second heads 984, 994, respectively, serve to facilitate insertion of coupler 980 into socket 775 or any other socket configured to receive coupler 980.

In operation, and as best seen in FIGS. 144 & 153, the default position of first and second latching pins 790, 820 is one where the outwardly biasing force of compression springs 808, 838 offsets keyway cutouts 800, 830 from the internal wall of socket 775 with first side 801 of keyway cutout 800 and first side 831 of keyway cutout 830 each extending into the internal space of socket 775. When insertion of a coupler, like coupler 890 into socket 775 is desired, Referring to FIGS. 144, 153 & 154, in operation, first and second latching pins 790, 820 are each normally outwardly biased by compression springs 808, 838, respectively, causing first and second latching pins 790, 820 to adopted an offset or misaligned configuration. In this offset configuration, first side 801 of keyway cutout 800 and first side 831 of keyway cutout 830 to each extend into the internal space of socket 775 (see FIGS. 144 & 153).

In order to securely engage coupler 980 into socket 775, a user inserts leading edge 985 of first head 984 (or leading edge 995 of second head 994) into socket 775. Leading edge 985 is configured to obliquely contact a beveled edge (or radiused or otherwise configured obliquely) of first sides 801, 831 of keyway cutout 800, 830 respectively, as leading edge 985 is inserted into socket 775. Insertion of leading edge 985 into latching pin chamber 777 of socket 775 pushes against first sides 801, 831 of keyway cutout 800, 830 respectively, which causing compression springs 808, 838 of first and second latching pins 790, 820 to compress within their respective blind holes 798, 828 and pushes second sides 816, 826 of first and second latching pins 790, 820 into the chambers of first and second spring cups 795, 815, respectively. This movement enables first and second latching pins 790, 820 to laterally retract inward through latching pin bores 791, 811 of first and second latching pin housings 780, 810. This retraction enables leading edge 985 to push past first sides 801, 831 of keyway cutout 800, 830 of first and second latching pins 790, 820 and into attachment chamber 776 of socket 775. When coupler 980 is fully inserted into attachment chamber 776 of socket 775, first circumferential groove 986 of coupler 980 aligns with keyway cutout 800, 830 of first and second latching pins 790, 820, which provides clearance for first and second latching pins 790, 820 to immediately extend outward through their respective latching pin housings. This extension is due to the outwardly biasing force of compression springs 808, 838 which cause first and second latching pins 790, 820 to automatically readopted an offset configuration. With coupler 980 now fully inserted into socket 775, first side 801 of keyway cutout 800 and first side 831 of keyway cutout 830 to each extend within circumferential groove 286 and over shoulder 988 of head 984. Because shoulder 988 and first sides 801, 831 of keyway cutouts 800, 830 have faces substantially parallel to one another, first sides 801, 831 provide mechanical interference by contacting shoulder 988 which locks coupler 980 into attachment chamber 776 of socket 775 and prevents inadvertent withdrawal of coupler 980. As such, coupler 980 is firmly held within socket 775 by first and second latching pins 790, 820.

In order to remove securely engaged coupler 980 from socket 775, a user simultaneously presses on first ends 794, 824 of first and second latching pins 790, 820, respectively, for example, by pinching first ends 794, 824 with a forefinger and thumb. This pressure pushing latching pins 790, 820 inwardly back into first and second latching pin houses 780, 810, respectively, causing compression springs 808, 838 of first and second latching pins 790, 820, to compress within their respective blind holes 798, 828. This laterally inward force relieves the mechanical interference caused by first sides 801, 831 of keyway cutout 800, 830 contacting shoulder 988 by positioning first sides 801, 831 into the chambers of first and second spring cups 795, 815, respectively (see FIG. 154). With first sides 801, 831 of keyway cutout 800, 830 withdrawn from circumferential groove 986 there is clearance to allow coupler 980 to be freely removed from socket 775. Releasing the pressure on first ends 794, 824 of first and second latching pins 790, 820 cause first and second latching pins 790, 820 to immediately extend outwardly ward through their respective latching pin housings and back into an offset configuration (see FIG. 153).

Coupler 980 selectively forms a connection between bracket 400' and another component, e.g., an accessory for a device, another device, or an adaptor or connector for another component. In particular, head 984 of coupler 980 inserts within socket 775 (as shown ready to occur in FIG. 134), with head 994' at the opposite end ready to receive a component having a socket like socket 775. This entire assembly can also be mounted to rail disclosed herein through bracket 400'. A component includes, without limitation, a device, a flashlight, LED lights, armor back plates, knives, pepper spray, alarms, magnetic mounts, grip attachments permitting remote or local control of a device, any device-mounted accessory, sirens, tethers, lanyards, locks, mounts, suction cups, straps, timepieces, writing instruments, weapons, batteries, an attachment to motor vehicles or bicycles or aircraft, stationary or mobile object with clams, anything that attaches to a screw thread, and so on, or other mechanical or electronic component. Examples of screw threads include ¼-20 UNC thread, a ⅜-16 UNC thread, or any other similar screw thread standards known in the art.

FIG. 134 shows an exemplary coupler 980 comprises a centrally located body 982 with a first end including a first attachment portion 983 and a second end comprising a second attachment portion 993. A coupler disclosed herein can be of any length with most of this length variation due to the length of body 982. The length of a coupler disclosed herein can be any size and is typically determined by the particular application and the various parameters and requirements associated with that application, including, without limitation, material composition of the coupler, force constraints like shear strength, load-bearing minimums and maximums, space limitations or constraints, and the like. In some embodiments, a coupler can have a length from 4 mm to 300 mm. In some embodiments, a socket can have a size from 5/32 inch to 12 inch.

In addition, although body 982 of coupler 980 is illustrated as a linear component with first and second ends, body 982 can furcate into two or more branches, where a terminus of each branch includes head, each configured for selectively receiving an accessory. In some embodiments, coupler 980 is comprised of three bodies 982 each having a terminus and arranged, e.g., in a T-shaped or Y-shaped configuration, with head located at each terminus. In some embodiments, coupler 980 is comprised of four bodies 982 each having a terminus and arranged, e.g., in a x-shaped or cross-shaped configuration, with head located at each terminus. In some embodiments, coupler 980 is comprised of five bodies 982 each having a terminus and arranged, e.g., in a star-shaped configuration, with head located at each terminus.

The perimeter or circumferential shape of an attachment portion disclosed herein comprising a head, such as, e.g., head 984, is configured to conform or substantially conform to the perimeter or circumferential shape of socket 775. For example, as shown in example embodiment of FIG. 134, first and second heads 984, 994 each have a perimeter or circumferential shape that is hexagonal and conform or substantially conform to the perimeter or circumferential shape of socket 775. Similarly, perimeter or circumferential shape of body 982 of coupler 980 is hexagonal and conforms or substantially conforms to the perimeter or circumferential shape of socket 775. However, as with socket 775, the perimeter or circumferential shape of heads as well as the perimeter or circumferential shape of all or substantially all of coupler 980 can be any shape, including circular, elliptical, polygonal, including octagonal, dodecagonal and hexadecagonal, unique shapes, and other shapes so long as that shape conforms or substantially conforms to the perimeter or circumferential shape of socket 775.

The size of a coupler disclosed herein can be any size and is typically determined by the size of the socket the coupler is designed to securely engage into. In addition, the size of a coupler disclosed herein can be any size and is typically determined by the particular application and the various parameters and requirements associated with that application, including, without limitation, material composition of the coupler, force constraints like shear strength, load-bearing minimums and maximums, space limitations or constraints, and the like. In some embodiments, a coupler can have a size from 4 mm to 80 mm in cross-sectional width. In some embodiments, a socket can have a size from 5/32 inch to 3⅛ inch in cross-sectional width. In some embodiments, a socket can have a size from 2 inches to 12 inch in cross-sectional width.

In addition, while at least one or more attachment portion disclosed herein each comprise a head configured to conform or substantially conform to the perimeter or circumferential shape of socket 775, one or more other attachment portion disclosed herein can be configured to receive alternative sockets or adaptors. in some embodiments, while first attachment portion 983 comprises head 984 configured to conform or substantially conform to the perimeter or circumferential shape of socket 775, attachment portion 993 is configured as a yoke adaptor comprising two or more yoke spindles and a though hole configured to receive a securing pin. For example, as illustrated in FIGS. 155 & 156, attachment portion 993 is configured as a Go-Pro adaptor.

In some embodiments, while first attachment portion 983 of a connector disclosed herein comprises head 984 configured to conform or substantially conform to the perimeter or circumferential shape of socket 775, attachment portion 993 is configured as a screw adaptor. For example, as illustrated in FIGS. 157 & 158, attachment portion 993 is configured as a screw adaptor comprising a gripping portion and a threaded portion.

Other variation to attachment portion 993 of a connector disclosed herein are possible. For example, in some embodiments, while first attachment portion 983 comprises head 984 configured to conform or substantially conform to the perimeter or circumferential shape of socket 775, attachment portion 993 is configured as a suction cup. In some embodiments, while first attachment portion 983 comprises head 984 configured to conform or substantially conform to the perimeter or circumferential shape of socket 775, attachment portion 993 is configured as a magnet. In some embodiments, while first attachment portion 983 comprises head 984 configured to conform or substantially conform to the perimeter or circumferential shape of socket 775, attachment portion 993 is configured as a ball joint. In some embodiments, while first attachment portion 983 comprises head 984 configured to conform or substantially conform to the perimeter or circumferential shape of socket 775, attachment portion 993 is configured as a surface comprising an adhesive. In some embodiments, while first attachment portion 983 comprises head 984 configured to conform or substantially conform to the perimeter or circumferential shape of socket 775, attachment portion 993 is configured as a male-female or female-male connector including, without limitation, a snap-fit connector, e.g. a jack and plug connector; or a pressure fit connector, e.g., a prong connector.

Attachment portion 993 of a connector disclosed herein can further include a cinching assembly. For example, a connector disclosed herein can be a coupler with cinching assembly 1000. In some embodiments, and as shown in FIGS. 159-161, a coupler with cinching assembly 1000 comprises coupler 980 and a second attachment portion 993''' comprising an indexing plate 1002, an adaptor base 1020, and a retaining clip 1129, such as, e.g., a C clip. Referring to FIGS. 160 & 161, indexing plate 1002 is typically disc-shaped and comprises a top surface 1004 and a bottom surface 1006, and a through hole 1008 which is centrally located in indexing plate 1002. Top surface 1004 of indexing plate 1002 comprises one or more detents 1014 organized in a circular ring that is positioned around through hole 1008 and configured to engage with a detent plunger 1030. In some embodiments, each detent 1014 is slopped or ramped on the left-hand side to provide stop mechanism in a clock-wise direction. In some embodiments, indexing plate 1002 comprises 2, 3, 4, 5, 6, 7, 8, 9, 10, 11, 12, 13, 14, 15, or 16 detents 1014. In some embodiments, one or more detents 1014 comprise 1 to 12 detents, such as, e.g., 1 to 2 detents, 1 to 4 detents, 2 to 6 detents, 4 to 6 detents, 2 to 8 detents, 4 to 8 detents, 6 to 8 detents, 2 to 10 detents, 4 to 10 detents, 6 to 10 detents, 8 to 10 detents, 2 to 12 detents, 4 to 12 detents, 6 to 12 detents, 8 to 12 detents, or 10 to 12 detents. In some embodiments, and as shown in FIG. 161, detents 1014 are the same or similar size. In some embodiments, detents 1014 can be of two or more different sizes. Bottom surface 1006 of indexing plate 1002 includes a first indexing pin 1010 and a second indexing pin 1012 extend perpendicularly from bottom surface 1006. First and second indexing pins 1010, 1012 are configured to align with and insert into indexing holes disclosed herein, such as, e.g., indexing holes 174, 176 of attachment plate 170 of device case 100 and indexing holes 464, 466 of attachment plate 460 of bracket 400. First and second indexing pins 1010, 1012 serve to properly orientates coupler with cinching assembly 1000 to an attachment plate disclosed herein and prevent misalignment while secured.

As shown in FIGS. 160 & 161, adaptor base 1020, is typically disc-shaped and comprises a top surface 1022 and a bottom surface 1024. Top surface 1022 of adaptor base 1020 comprises coupler 980 that is centrally located and extends perpendicularly from top surface 1022. Attachment portion 983 of coupler 980 comprises body 982 and first attachment portion 983 comprising first head 984 and first circumferential groove 986, with first circumferential groove 988 defined by first shoulder 987 of body 982 and shoulder 988 of first head 984. Head 984 is configured to conform or substantially conform to the perimeter or circumferential shape of socket 775. Bottom surface 1024 of adaptor base 1020 comprises a threaded screw 1026 that is centrally located and extends perpendicularly from bottom surface 1024. Threaded screw 1026 is configured to be received by a threaded port of an attachment plate disclosed herein, such as, e.g., attachment port 172 of attachment plate 170 or threaded attachment port 462 of attachment plate 460. Threaded screw 1026 includes a grove 1028 configured to receive retaining clip 1029. As assembled, threaded screw 1026 is inserted pass through hole 1008 in a manner that faces back surface 1006 of indexing plate 1002 with back surface 1024 of adaptor base 1020. In this configuration, groove 1028 is exposed beyond bottom surface 1006 of indexing plate 1002, and once retaining clip 1029 is secured in groove 1028 of threaded screw 1026, indexing plate 1002 is affixed to adaptor base 1020.

In some embodiments, adaptor base 1020 can further comprise one or more detent plunders to controllably rotate and temporarily fix the rotation of adaptor base 1020 relative an attachment plate disclosed herein, such as, e.g., attachment plate 170 of device case 100 and attachment plate 460 of bracket 400. As shown in FIGS. 160 & 161, which illustrates only two of the six detent plungers, detent plunger 1030 includes a detent cylinder 1032 comprising an open end 1034 and open threaded end 1036 opposite open end 1034, a detent ball 1038, and a detent compression spring 1039. Detent ball 1034 and detent compression spring 1038 are captured within detent cylinder 1032 by a set screw 1037 secured to open threaded end 1036, with detent compression spring 1039 outwardly biasing detent ball 1038 toward open end 1034 of detent cylinder 1032 in a manner that causes detent ball 1038 to protrude from open end 1034 of detent cylinder 1032 Each detent plunger 1030 is located on a side that will be in contact with bottom surface 1006 of indexing plate 1002. Each detent 1014 of indexing plate 1002 is aligned in a manner that each detent ball 1038 protruding from an open end 1034 will each be seated in detent 1014 of indexing plate 1002 when assembled. This detent mechanism ensures that coupler with cinching assembly 1000 will remain secured in place and that threaded screw 1026 of adaptor base 1020 will not become loosened over time once secured to an adaptor plate disclosed herein.

As another example, a connector disclosed herein can be a coupler with cinching assembly 1040. In some embodiments, and as shown in FIGS. 162-164, coupler with cinching assembly 1040 comprises coupler 980 and a second attachment portion 993'''' comprising an indexing plate 1042, an adaptor screw 1060, an adaptor base 1070, and two screws 1057. Referring to FIGS. 163 & 164, indexing plate 1042 comprises a top surface 1044 and a bottom surface 1046, and a through hole 1048 which is centrally located in indexing plate 1042. Top surface 1044 of indexing plate 1042 includes a first indexing pin 1050 and a second indexing pin 1052 extend perpendicularly from top surface 1044. First and second indexing pins 1050, 1052 are configured to align with and insert into indexing holes disclosed herein, such as, e.g., indexing holes 174, 176 of attachment plate 170 of device case 100 and indexing holes 464, 466 of attachment plate 460 of bracket 400. First and second indexing pins 1050, 1052 serve to properly orientates coupler with cinching assembly 1000 to an attachment plate disclosed herein and prevent misalignment while secured. Bottom surface 1046 of indexing plate 1042 comprises a first threaded blind hole 1054 and a second threaded blind hole 1056. In some embodiments, first and second threaded blind holes 1054, 1056 are positioned so that the holes are centered underneath the location of first and second indexing pins 1050, 1052.

As shown in FIGS. 163 & 164, adaptor screw 1060 comprises a disc-shaped plate 1062 with a top surface 1064 and a bottom surface 1066. Top surface 1064 of adaptor screw 1060 comprises a threaded screw 1068 that is centrally located and extends perpendicularly from top surface 1064. Threaded screw 1068 is configured to be received by a threaded port of an attachment plate disclosed herein, such as, e.g., attachment port 172 of attachment plate 170 or threaded attachment port 462 of attachment plate 460. Bottom surface 1066 of adaptor screw 1060 comprises a plurality of detents 1069 organized in a circular ring that is centrally located with each detent 1069 uniformly positioned from the perimeter edge of bottom surface 1066. In some embodiments, each detent 1069 is slopped or ramped on the left-hand side to provide stop mechanism in a clock-wise direction. In some embodiments, a plurality of detents 1069 comprise 1 to 12 detents, such as, e.g., 1 to 2 detents, 1 to 4 detents, 2 to 6 detents, 4 to 6 detents, 2 to 8 detents, 4 to 8 detents, 6 to 8 detents, 2 to 10 detents, 4 to 10 detents, 6 to 10 detents, 8 to 10, detents, 2 to 12 detents, 4 to 12 detents, 6 to 12 detents, 8 to 12 detents, or 10 to 12 detents. In some embodiments, and as shown in FIG. 164, detents 1069 are the same or similar size. In some embodiments, detents 1069 can be of two or more different sizes.

As shown in FIGS. 163 & 164, adaptor base 1070, comprises a top surface 1072 and an internal housing 1078. Top surface 1072 of adaptor base 1070 comprises coupler 980 that is centrally located and extends perpendicularly from top surface 1072. Coupler 980 comprises body 982 and first attachment portion 983 comprising first head 984 and first circumferential groove 986, with first circumferential groove 988 defined by first shoulder 987 of body 982 and shoulder 988 of first head 984. Head 984 is configured to conform or substantially conform to the perimeter or circumferential shape of socket 775. Top surface 1072 also includes a first through hole 1074 and a second through hole 1076.

Internal housing 1078 of adaptor base 1070 is configured to receive disc-shaped plate 1062 in an centrally positioned recess as well as receive indexing plate 1042. Internal housing 1078 of adaptor base 1070 also includes two detent plungers 1080 which controllably rotate and temporarily fix the rotation of adaptor screw 1060 relative an attachment plate disclosed herein, such as, e.g., attachment plate 170 of device case 100 and attachment plate 460 of bracket 400. As shown in FIGS. 163 & 164, each detent plunger 1080 includes a detent cylinder 1082 comprising an open end 1084 and closed end 1086 opposite open end 1084, a detent ball 1088, and a detent compression spring 1089. Detent ball 1084 and detent compression spring 1088 are captured within detent cylinder 1082 during assembly, with detent compression spring 1089 outwardly biasing detent ball 1088 toward open end 1084 of detent cylinder 1082 in a manner that causes detent ball 1088 to protrude from open end 1084 of detent cylinder 1082 Each detent plunger 1080 is located on a side that will be in contact with bottom surface 1066 of adaptor screw 1060. Each detent 1069 of adaptor screw 1060 is aligned in a manner that each detent ball 1088 protruding from open end 1084 will each be seated in detent 1069 of adaptor screw 1060 when assembled. This detent mechanism ensures that coupler with cinching assembly 1040 will remain secured in place and that threaded screw 1068 of adaptor screw 1060 will not become loosened over time once secured to an adaptor plate disclosed herein.

When assembled, each of two detent plungers 1080, located centrally positioned recess, are each assembled as discussed below, and adaptor screw 1060 is fitted into centrally positioned recess thereby covering detent plungers 1080. Indexing plate 1042 is then placed on adaptor base 1070 by inserting threaded screw 1068 pass through hole 1048 of indexing plate 1042 and positioning indexing plate 1042 in a manner that covers internal housing 1078 and aligns first threaded blind hole 1054 of indexing plate 1042 with first through hole 1074 of adaptor base 1070 and second threaded blind hole 1056 of indexing plate 1042 with second through hole 1076 od adaptor base 1070. Indexing plate 1042 is then affixed to adaptor plate 1070 by securing screw 1057 into first and second threaded blind hole 1054, 1056 thereby trapping adaptor screw 1060 within internal housing 1078.

As yet another example, a connector disclosed herein can be a coupler with cinching assembly 1080. In some embodiments, and as shown in FIGS. 165 & 166, coupler with cinching assembly 1090 comprises coupler 980 and a second attachment portion 993''' comprising an indexing plate 1092, an adaptor screw 1060, an adaptor base 1070, and two screws 1057. Referring to FIGS. 165 & 166, indexing plate 1092 comprises a top surface 1094 and a bottom surface 1096, and a through hole 1098 which is centrally located in indexing plate 1092. Top surface 1094 of indexing plate 1092 includes a non-slip surface 1095 configured partially, substantially or completely cover top surface 1094. Non-slip surface 1095 is configured to directly interface with an attachment plate disclosed herein, such as, e.g., attachment plate 170 of device case 100 and attachment plate 460 of a bracket 400. Non-slip surface 1095 serves to properly orientates coupler with cinching assembly 1090 to an attachment plate disclosed herein and prevent misalignment while secured. Bottom surface 1096 of indexing plate 1092 comprises a first threaded blind hole and a second threaded blind hole. In some embodiments, first and second threaded blind holes are positioned in a location similar to first and second threaded blind holes 1054, 1056 of coupler with cinching assembly 1040. Adaptor screw 1060, an adaptor base 1070, screws 1057 are as described for coupler with cinching assembly 1040, discussed above.

As another example, a bracket disclosed herein can comprise a hinged coupler. A hinged coupler serves to securely engage with a socket disclosed herein or otherwise disclosed and enable a user to positional adjust a device or other component attached to the coupler or socket. In some embodiments, a hinged coupler is integrally formed on first and/or second jaw members 410"", 510"" as a single component by any known mechanism or process, such as, e.g., by being molded, cast, machined, etc. In some embodiments, a hinged coupler is a separate component that is attached to first and/or second jaw members 410"", 510"" by any known mechanism or process, such as, e.g., by being screwed, welded, brazed, adhered, or other appropriate fastening means.

In some embodiments, bracket 400"" can comprise a hinged coupler positioned on first jaw member 410"" or second jaw member 510"". In some embodiments, bracket 400"" can comprise two hinged couplers, with one positioned on first jaw member 410"" and the other positioned on second jaw member 510"". In some embodiments, bracket 400"" can comprise a hinged coupler and a cinching assembly disclosed herein, or a hinged coupler and a hinged socket disclosed herein, with the hinged coupler positioned on first jaw member 410"" and a cinching assembly or hinged coupler positioned on second jaw member 510"". Alternatively, a hinged coupler can be positioned on second jaw member 510"" and a cinching assembly or hinged coupler positioned on first jaw member 410"". In some embodiments, and as shown in FIG. 167, a bracket disclosed herein can comprise a hinged coupler 840. Although hinged coupler 840 is shown in the illustrated embodiments as being connected or integral with one another and with bracket 400"", hinged coupler 840 is useful in itself and/or in connection with other devices, known or unknown. For example, hinged coupler 840 can be used is a variety of applications where one component is required to be rotated relative to a second component connected through hinged coupler 840. In a further example, coupler assembly 890 of hinged coupler 840 can be used separately (e.g., without necessarily being permanently attached to another component) to temporarily attach to a second component.

Referring to FIG. 167, first jaw member 410"" comprises hinged coupler 840 comprising a hinged base 850 and a coupler assembly 890. Hinged base 850 includes a first outer knuckle 852 with through hole 853, a second outer knuckle 854 with through hole 855, and a hinge pin 856. In some embodiments, hinge pin 856 includes two parts, pin component 857 and screw component 858 with pin component 857 including a threaded blind hole configured to receive screw component 858. First outer knuckle 852, second outer knuckle 854, and hinge pin 856 are used to rotatably connect hinged base 850 to coupler assembly 890. In some embodiments, and as illustrated in FIG. 167, a surface of hinged base 850 is contoured to form a recess 859 configured to resemble the shape of coupler assembly 890 to provide a fitted seat of hinged coupler 840 when in close proximity to hinged base 850.

Referring to FIG. 167, coupler assembly 890 comprises inner knuckle 892. Inner knuckle 892 includes a rotation portion 893 and a coupler base 898. Rotation portion 893 is a cylindrical drum comprising through hole 894 and two parallel rows of detents 895, 896 positioned about at least a portion of the circumference of the cylindrical surface of rotation portion 893 of inner knuckle 892. Coupler base 898 comprises a coupler disclosed herein. In some embodiments, a coupler disclosed herein is centrally located on coupler base 898. In some embodiments, coupler base 898 comprises coupler 980 having first attachment base 983. In some embodiments, and as shown in FIG. 167, coupler 980 comprises body 982 and first attachment portion 983 comprising first head 984 and first circumferential groove 986, with first circumferential groove 988 defined by first shoulder 987 of body 982 and shoulder 988 of first head 984. Head 984 is configured to conform or substantially conform to the perimeter or circumferential shape of socket 775.

In some embodiments, coupler base 898 comprises coupler 980 having a second attachment base 993 and all its variations described herein. In an embodiment, coupler base 898 comprises coupler 980 having a second attachment base 993'. In an embodiment, coupler base 898 comprises coupler 980 having a second attachment base 993". In an embodiment, coupler base 898 comprises coupler 980 having a second attachment base 993'". In an embodiment, coupler base 898 comprises coupler 980 having a second attachment base 993"". In an embodiment, coupler base 898 comprises coupler 980 having a second attachment base 993""'. In an embodiment, coupler base 898 comprises coupler 980 having a second attachment base 993 configured as a suction cup. In an embodiment, coupler base 898 comprises coupler 980 having a second attachment base 993 configured as a magnet. In an embodiment, coupler base 898 comprises coupler 980 having a second attachment base 993 configured as a ball joint. In an embodiment, coupler base 898 comprises coupler 980 having a second attachment base 993 configured as a surface comprising an adhesive. In an embodiment, coupler base 898 comprises coupler 980 having a second attachment base 993 configured as a male-female or female-male connector. In an embodiment, coupler base 898 comprises coupler 980 having a second attachment base 993 configured as a snap-fit connector. In an embodiment, coupler base 898 comprises coupler 980 having a second attachment base 993 configured as a jack and plug connector. In an embodiment, coupler base 898 comprises coupler 980 having a second attachment base 993 configured as a pressure fit connector. In an embodiment, coupler base 898 comprises coupler 980 having a second attachment base 993 configured as a prong connector.

Hinge pin 856 permits inner knuckle 892 to rotate about hinged base 850. In some embodiments, the range of angular rotation of coupler assembly 890 about hinged base 850 in about 90 degrees to about 270 degrees. In some embodiments, the range of angular rotation of coupler assembly 890 about hinged base 850 in about 135 degrees to about 270 degrees. In some embodiments, the range of angular rotation of coupler assembly 890 about hinged base 850 in about 135 degrees to about 225 degrees. In some embodiments, the range of angular rotation of latching socket assembly 730 about hinged base 710 in about 180 degrees to about 225 degrees. In some embodiments, the range of angular rotation of coupler assembly 890 about hinged base 850 in about 90 degrees to about 180 degrees. In some embodiments, the range of angular rotation of coupler assembly 890 about hinged base 850 in about 180 degrees to about 225 degrees. In some embodiments, the range of angular rotation of coupler assembly 890 about hinged base 850 in about 135 degrees to about 180 degrees.

Inner knuckle 892 of hinged coupler 840 can be rotated relative to hinged base 850 in a controlled and temporarily fixed position, such as, e.g., a locking mechanism, a friction hinge, or other appropriate means to control or catch the rotation of inner knuckle 892. In some embodiment, hinged coupler 840 comprises a detent plunger mechanism to controllably rotate and temporarily fix the rotation of inner knuckle 892 relative to hinged base 850. In some embodiments, detent mechanism includes one or more detent plungers or equivalent mounted to hinged base 850 and one or more detents positioned on inner knuckle 892. In some embodiments, as discussed above, detent plunger includes a detent ball captured in a cylinder and spring loaded to bias the detent ball toward the open end of the cylinder. In some embodiments, two parallel rows of detents 895, 896 are annularly spaced apart and aligned on rotation portion 893 of inner knuckle 892. In some embodiments, each of two parallel rows of detents 895, 896 comprise 1 to 20 detents, such as, e.g., 4 to 12 detents, 6 to 12 detents, 8 to 12 detents, 4 to 16 detents, 6 to 16 detents, 8 to 16 detents, 10 to 16 detents, 12 to 16 detents, 4 to 20 detents, 6 to 20 detents, 8 to 20 detents, 10 to 20 detents, 12 to 20 detents, or 16 to 20 detents. In some embodiments, detents 895, 896 are the same or similar size. In some embodiments, detents 895, 896 can be of two or more different sizes.

A detent plunger mechanism employed by hinged base 850 and inner knuckle 892 of hinged coupler 840 is substantially similar to the detent plunger mechanism employed by hinged base 710 and inner knuckle 740 of hinged socket 700. Such a detent plunger mechanism is used controllably rotate and temporarily fix the rotation of inner knuckle 892 relative to hinged base 850.

In some embodiments, hinged base 850 comprises a first detent plunger 860 and a second detent plunger 860'. Each of detent plungers 860, 860' comprises a detent cylinder 862 including an open end 864 and a closed end 866 opposite open end 864 and a detent ball 868 and a detent compression spring 869. Detent ball 868 and detent compression spring 869 are captured in detent cylinder 862 during assembly, with detent compression spring 869 loaded to outwardly bias detent ball 868 toward open end 864 of detent cylinder 862 in a manner that causes detent ball 868 to protrude from open end 864 of detent cylinder 862. First and second detent plungers 860, 860' are positioned inside of first and second outer knuckles 852, 854 respectively and in a manner where the outwardly biasing first and second detent balls 868 are directed toward and in contact with inner knuckle 892, with first detent ball 868 in alignment with parallel row of detents 895 in a manner where detent ball 868 is seated in one detent of row of detents 895, and second detent ball 868' in alignment with parallel row of detents 896 in a manner where detent ball 868' is seated in one detent of row of row of detents 896.

A detent mechanism disclosed herein enables the radial or angular position of inner knuckle 892 relative to hinged base 850 to be incrementally controlled and arrested at any one of the detents in the series, acting as incremental catches. Rotation or angular positions are controlled by the spacing of detents 895, 896. In addition, factors such as spring constant of detent compression springs 869, 869' and the depth of detents 895, 896 control the degree of force required to change the position of inner knuckle 892. Examples of some of the rotation or angular positions possible with coupler assembly 890 relative to hinged base 850 using a detent mechanism disclosed herein substantially similar to the positions illustrated FIGS. 136-138 achieved by latching socket assembly 730 relative to hinged base 710.

In some embodiments, a hinged base can be modified to include additional functionality besides its involvement to rotatably connect and control an angular position of a latching socket assembly or coupler assembly disclosed herein. In some embodiments, a hinged base can be modified to include one or more device holders.

A hinged coupler can also be a component distinct from a bracket disclosed herein. In some embodiments, a stand-alone hinged coupler can comprise a hinged base modified to include one or more device holders. For example, as shown in FIGS. 170-171, stand-alone hinged coupler comprises a hinged base 1120 comprises a first outer knuckle 1122 with through hole 1123, a second outer knuckle 1124 with through hole 1125, and a hinge pin 1126. Furthermore, FIGS. 170 & 171, illustrate hinged base 1120 further includes two device holders 1140, 1142. In this example, an outer surface of first outer knuckle 1122 has been modified to include device holder 1140 while an outer surface of second outer knuckle 1124 has been modified to include device holder 1142. In this exemplary embodiment, device holders 1140, 1142 form an integral part of hinged base 1120. In aspects of this embodiment, and referring to FIG. 172, device holder 1140 is configured to receive and secure ground positioning system (GPS) device D2, and device holder 1142 is configured to receive and secure compass D3 and flashlight D4.

In some embodiments, a surface of hinged base 1120 is contoured to form a recess configured to resemble the shape of a latching socket assembly or coupler assembly disclosed herein to provide a fitted seat of a hinged socket or a hinged coupler disclosed herein when in close proximity to hinged base 1120. For example, and as illustrated in FIGS. 169 & 170, a surface of hinged base 1120 is contoured to form a recess 1129 configured to resemble the shape of coupler assembly 890 to provide a fitted seat of hinged coupler 840 when in close proximity to hinged base 1120. For example, as shown in FIGS. 168 & 169, hinged coupler 840 is shown attached to hinged base 1120 using hinge pin 1126. Additionally, hinged base 1120 also includes an engagement slot, such as, e.g., engagement slot 40 for attachment of a bracket disclosed herein.

In some embodiments, hinge pin 1126 includes two parts, pin component 1127 and screw component 1128 with pin component 1126 including a threaded blind hole configured to receive screw component 1128. First outer knuckle 1122, second outer knuckle 1124, and hinge pin 1126 are used to rotatably connect hinged base 1120 to a latching socket assembly or coupler assembly disclosed herein, such as, e.g., latching socket assembly 730 or coupler assembly 890. In addition, first outer knuckle 1122 with through hole 1123, second outer knuckle 1124 with through hole 1125, hinge pin 1126 as well as the other features of hinged base 1120 are substantially similar to and the functional equivalent of the corresponding elements present in hinged base 710 and hinged base 850. For example, hinged base 1120 can controlled and temporarily fixed a position a latching socket assembly or coupler assembly disclosed herein using, e.g., a detent plunger mechanism disclosed herein. As such, hinged base 1120 rotatably connects and control an angular position of a latching socket assembly or coupler assembly disclosed herein secured thereto.

A bracket disclosed herein can also be integrated with another component that increases the functionality of a bracket disclosed herein. In some embodiments, a bracket disclosed herein can also be integrated with a grip or other component that facilitates a user's ability to hold a bracket disclosed herein. Such a grip can be an integral part of a bracket disclosed herein or be configured to be attached to a bracket disclosed herein. For example, as shown in FIGS. 173-175, a bracket disclosed herein is integrated into a grip 1300. As shown in FIGS. 173 & 174, grip 1300 comprises a body 1302 having a first end 1304 and a second end 1306 opposite first end 1304 where a bracket disclosed herein can be positioned at first end 1304. Grip 1300 is configured to be comfortably held in a hand of a user and is generally cylindrical in shape. In an embodiment, grip 1300 can include a gripping portion 1308 comprising undulating section of grooves and ridges contoured to comfortably fit one or more fingers of a user's hand. As shown in FIG. 175, a rail disclosed herein, for example, rail 20 of FIG. 4, can be secured to the bracket associated with grip 1300, thereby forming a hand-held support structure for which other components can then be attached.

Another example of an alternative embodiment of a bracket disclosed herein, bracket 400 can also be integrated with an illuminating device that facilitates a user's ability to illuminate an area. Such an illuminating device can be an integral part of a bracket disclosed herein or be configured to be attached to a bracket disclosed herein. In some embodiments, where an illuminating device is an integral part of a bracket disclosed herein, back plate 450 can be modified to incorporate an illuminating device disclosed herein. In some embodiments, where an illuminating device is configured to be attached to a bracket disclosed herein, such attachment can be via adaptor attachment plate 460 of back plate 450.

In some embodiments, bracket 400'''' can comprise an illuminating device positioned on back plate 450. In some embodiments, bracket 400'''' can comprise an illuminating device positioned on back plate 450 and a hinged socket disclosed herein or a hinged coupler disclosed herein, positioned on first jaw member 410'''' and/or second jaw member 510''''.

Referring to FIGS. 176-183, back plate 450 of bracket 400'''' comprises an illuminating device 1320. Bracket 400'''' attaches to a rail disclosed herein in the same or substantially the same manner. As such, an alternative bracket disclosed herein comprises a first jaw and a second jaw, along with all components thereof, and functionality thereof as described herein and illustrated herein.

In some embodiments, and referring to FIGS. 176-182, illuminating device 1320 comprises a head 1330 and a body 1340. Head 1330 comprises a face cap 1332, a transparent lens 1334, and a light housing (not shown), an internal compartment configured to house a reflector (not shown) and a light source, such as, e.g., a bulb (not shown). A reflector disclosed herein is configured to redirects light rays provided by a light source disclosed herein through lens 1334 in a manner that enables a light beam to illuminate an object. In some embodiments, a light source disclosed herein emits visible light in the wavelength range of 400 nm to 700 nm. In some embodiments, a light source disclosed herein emits infrared light in the wavelength range above 700 nm. In some embodiments, a light source disclosed herein emits ultraviolet light in the wavelength range below 400 nm.

Still referring to FIGS. 176-182, body 1340 includes a switch 1342, a battery housing (not shown), an internal compartment having an electrical connector system (not shown) and optionally a tail cap (not shown), and configured to house a power source, such as, e.g., one or more batteries. An electrical connector system, such as, e.g., a spring and/or a contact strips of metal (typically copper or brass) configured to make an electrical connection between a power source disclosed herein, a lamp disclosed herein, and switch 1342 when in the "on" position. In operation, when switch 1342 it "turned on", it makes contact between components of an electrical connector system disclosed herein which begin a flow of electricity powered from a power source disclosed herein. In some embodiments, a battery housing disclosed herein is accessed by removing face cap 1332 from body 1330 of illuminating device 1320 thereby providing access to battery housing. In some embodiments, a battery housing disclosed herein is accessed by removing tail cap, if present, from body 1330 of illuminating device 1320 thereby providing access to battery housing. O-rings can optionally be positioned between the face cap 1332 and lens 1334, face cap 1332 and body 1340, and/or tail cap (not shown) and body 1330 to provide a water-tight seal.

In some embodiments, and as shown in FIG. 183, illuminating device 1350 is reversibly detachable from a bracket disclosed herein. For example, a cinching assembly as disclosed in FIGS. 162-164 and comprising an indexing plate 1042, an adaptor screw 1060, and an adaptor base 1070 (but excluding coupler 980) can be incorporated into illuminating device 1320 on a surface that operationally engages with adaptor attachment plate 460 of back plate 450. In this configuration, first and second indexing pins 1050, 1052 of illuminating device 1350 are configured to align with and insert into indexing holes 464, 466 of attachment plate 460 of bracket 400''''' and threaded screw 1068 is configured to be received by threaded attachment port 462 of attachment plate 460. In this way, illuminating device 1350 can be removed from bracket 400''''' was well as reattached to bracket 400''''' based on the needs of the user. Although shown attached to a bracket disclosed herein, illuminating device 1350 can also be attached to a device case disclosed herein, such as device case 100. In these embodiments, first and second indexing pins 1050, 1052 of illuminating device 1350 are configured to align with and insert into indexing holes 174, 176 of attachment plate 170 of device case 100 and threaded screw 1068 is configured to be received by threaded attachment port 172 of attachment plate 170.

Aspects of the present specification can be described as follows:

1. A bracket comprising a) a first jaw member, the first jaw member comprising an inner surface including a first mating portion and a first clamping portion, the first clamping portion including one or more engagement bosses, b) a second jaw member, the second jaw member comprising an inner surface including a second mating portion and a second clamping portion, the second clamping portion including one or more engagement bosses, c) a pin assembly comprising a latching pin including a latch bolt hole and a guide pin, the latching pin and the guide pin being perpendicular to the first and second clamping portions of the first and second jaw members, and d) a latch bolt assembly comprising a latch bolt slidably insertable through a latch bolt bore, the latch bolt having cylindrical body and including a first end and a second end, wherein the latch bolt assembly is housed in the second jaw member, wherein the pin assembly connects the first and second jaw members, wherein the pin assembly is configured to slidably translate the first and second jaw members toward one another in a first direction or away from one another in a direction opposite the first direction, and wherein the bracket can adopt an open configuration and a closed configuration.

2. The bracket of embodiment 1, wherein the latching pin is secured to the first jaw member and slidably insertable through a latching pin bore present on second jaw member, 3. The bracket of embodiment 1 or 2, wherein the guide pin is secured to the second jaw member and slidably insertable through a guide pin bore present on first jaw member.

4. The bracket of any one of embodiments 1-3, wherein the latch bolt assembly is located in a direction perpendicular to the second clamping portion of the second jaw member.

5. The bracket of any one of embodiments 1-4, further comprising one or more jaw compression springs, each of the one or more jaw compression springs including a first end and a second end, wherein the first end is seated in a locating hole present on the first mating portion of the first jaw member and the second end is seated in a locating hole present on the second mating portion of the second jaw member, wherein one or more jaw compression springs provide a separating bias that forces the first jaw member and the second jaw member apart.

6. The bracket of any one of embodiments 1-5, wherein the latch bolt further comprises latch bolt spring that provides a separating bias that forces the latch bolt in a direction outward of latch bolt bore.

7. The bracket of any one of embodiments 1-6, wherein the latch bolt further comprises an elongated channel perpendicular to the longitudinal axis of the latch bolt, the elongated channel forming an enclosure to house the latch bolt spring.

8. The bracket of any one of embodiments 1-7, wherein the elongated channel further comprises a limiter slot.

9. The bracket of any one of embodiments 1-8, wherein the latch bolt further comprises a latch bolt pin protruding axially from the second end of the latch bolt, the latch bolt pin being cylindrical in shape and of smaller diameter than the cylindrical body of the latch bolt.

10. The bracket of any one of embodiments 1-9, wherein the latch bolt further comprises a tab attached to the first end of the latch bolt.

11. The bracket of any one of embodiments 1-10, wherein when in the closed configuration, first and second jaw members are in close proximity to one another and the latch bolt is inserted in latch bolt hole of the latching pin.

12. The bracket of any one of embodiments 1-11, wherein when in the open configuration, first and second jaw members are apart from one another and the latch bolt is removed from latch bolt hole of the latching pin.

13. The bracket of any one of embodiments 1-12, wherein the one or more engagement bosses of the first clamping portions are two engagement bosses.
14. The bracket of any one of embodiments 1-13, wherein the one or more engagement bosses of the second clamping portion are two engagement bosses.
15. The bracket of any one of embodiments 1-14, further comprising a back plate and a back-plate recess, the back plate is cantilevered from the first jaw member and the back-plate recess is formed on the second jaw member.
16. The bracket of embodiment 15, wherein the back plate further comprises an attachment point and one or more indexing holes.
17. A device case comprising a) a first frame member, the first frame member including a first engagement surface comprising one or more engagement slots and a plurality of through holes, b) a second frame member, the second frame member including a second engagement surface comprising one or more engagement slots and a plurality of through holes, c) a sidewall frame member, the sidewall frame member including a third engagement surface, and d) a gasket, the gasket being composed of an elastomeric material and shaped to configure to at least fit around an outer perimeter of a device and align in close proximity with an inside surface of the sidewall frame member, wherein the sidewall frame member is sandwiched between and spaces apart the first frame member and the second frame member, and in a manner that forming an interior space for a device to fit therein and aligns each through hole of the plurality of through holes from the first frame member with each through hole of the plurality of through holes from the second frame member to form a plurality of paired through holes, wherein the first frame member and the second frame member compressively bear down on the sidewall frame member by securing the first frame member to the second frame member using a plurality of screws, each screw of the plurality of screws inserted through a paired through hole of the plurality of paired through holes from the first and second frame member, and wherein the device case forms a water-tight seal preventing moisture from entering the interior space.
18. The device case of embodiment 17, further comprising a plurality of inserts, each insert of plurality of inserts aligned with each paired through hole of the plurality of paired through holes from the first and second frame member.
19. The device case of embodiment 17 or 18, wherein a front inner perimeter the sidewall frame member includes a front ridge and a back inner perimeter the sidewall frame member includes a back ridge, the front ridge being inserted within a slot of first frame member and the back ridge being inserted within a slot of second frame member.
20. The device case of any one of embodiments 17-19, wherein the sidewall frame member further comprises an attachment point and one or more indexing holes.
21. The device case of any one of embodiments 17-20, wherein the gasket comprises one or more contacts protrusions, the one or more contacts protrusion located in the vicinity of one or more buttons present of the device to be encased.
22. The device case of any one of embodiments 17-21, wherein the gasket comprises one or more thin portions that are water-tight and located in the vicinity of one or more speaker or microphone ports present of the device to be encased.
23. The device case of any one of embodiments 17-22, further comprising a sealing plate, the sealing plate comprising one or more through ports.
24. The device case of embodiment 23, wherein a portion of the sidewall frame member is configured to receive the sealing plate.
25. The device case of embodiment 24, wherein a portion of the first frame member, the second frame member, or both the first and second frame members is configured to receive the sealing plate.
26. The device case of embodiment 23, wherein at least one of the one or more through ports include a sealing cap, the sealing cap comprising an O-ring.
27. The device case of embodiment 23, wherein at least one of the one or more through ports is located in the vicinity of one or more audio or power jacks present of the device to be encased.
28. The device case of any one of embodiments 17-27, further comprising one or more button inserts, the one or more button inserts being secured by the sidewall frame member.
29. An adaptor comprising a) an indexing plate, the indexing plate being disc-shaped and including a top surface, a bottom surface and a through hole centrally located in the indexing plate, the top surface of the indexing plate including a circular ring of detents positioned around the through hole, and the bottom surface of the indexing plate including one or more indexing pins extending perpendicularly from the bottom surface, b) an adaptor plate, the adaptor plate being disc-shaped and including a top surface, a bottom surface, the adaptor plate housing one or more detent plungers, the top surface of the adaptor plate including a coupler extending perpendicularly from the top surface, and the bottom surface of the adaptor plate including a threaded screw extending perpendicularly from the bottom surface, wherein each of the one or more detent plungers comprising a detent cylinder with an open end and an open threaded end opposite the open end and a detent ball and a detent compression spring, and wherein the detent ball and the detent compression spring captured within the detent cylinder by a set screw secured to open threaded end, the detent compression spring outwardly biasing detent ball toward the open end of the detent cylinder in a manner that causes the detent ball to protrude from the open end of the detent cylinder, and c) a retaining clip, the retaining clip securing the indexing plate to the adaptor plate, wherein each of the one or more detent plungers is aligned with the ring of detents in a manner that the detent ball protruding from the open end of the detent cylinder of each of the one or more detent plungers will be seated in a detent from the ring of detents, and wherein a rotational position of the adaptor plate is selectively controlled when a detent from the from the ring of detents is selectively brought into alignment with the detent ball of each of the one or more detent plungers by relative rotation between the adaptor plate and the indexing plate.
30. A rail comprising a rail body, the rail body comprising a) a first engagement surface comprising one or more engagement slots, b) a second engagement surface comprising one or more engagement slots, c) a third surface, wherein the first engagement surface is adjacent the third surface, the second engagement surface is adjacent the third surface and the second engagement surface is parallel, spaced apart and facing oppositely the first engagement surface, with the third surface spanning between the first engagement surface and the second engagement surface.
31. The rail of embodiment 30, wherein the third engagement surface further comprises a plurality of through holes.
32. The rail of embodiment 30 or 31, further comprising a base support.
33. The rail of embodiment 32, wherein the base support comprises an adhesive layer on the side that will come in contact with a mounting support.
34. The rail of embodiment 32, wherein the base support comprises one or more tabs configured for inserted into one or more pockets or pouches on a base support mount.
35. A mounting system comprising a) a bracket of any one of embodiments 1-16, and b) a rail of any one of embodiments 30-34, wherein the one or more engagement slots of the first engagement surface of the rail body are configured to receive the one or more engagement bosses of the first jaw member of the bracket and the one or more engagement slots of the second engagement surface of the rail body are configured to receive the one or more engagement bosses of the second jaw member of the bracket.
36. A mounting system comprising a) a bracket of any one of embodiments 1-16, and b) a rail, the rail comprising a rail body, the rail body comprising i) a first engagement surface comprising one or more engagement slots, ii) a second engagement surface comprising one or more engagement slots, and iii) a third surface, wherein the first engagement surface is adjacent the third surface, the second engagement surface is adjacent the third surface and the second engagement surface is parallel, spaced apart and facing oppositely the first engagement surface, with the third surface spanning between the first engagement surface and the second engagement surface, and wherein the one or more engagement slots of the first engagement surface of the rail body are configured to receive the one or more engagement bosses of the first jaw member of the bracket and the one or more engagement slots of the second engagement surface of the rail body are configured to receive the one or more engagement bosses of the second jaw member of the bracket.
37. The rail of embodiment 36, wherein the third engagement surface further comprises a plurality of through holes.
38. The rail of embodiment 36 or 37, further comprising a base support.
39. The rail of embodiment 38, wherein the base support comprises an adhesive layer on the side that will come in contact with a mounting support.
40. The rail of embodiment 38, wherein the base support comprises one or more tabs configured for inserted into one or more pockets or pouches on a mounting support.
41. A mounting system comprising a) a device case of any one of embodiments 17-28, the sidewall frame member further comprises an attachment point and one or more indexing holes, and b) a device case adaptor, the device case adaptor comprising an indexing plate and an adaptor plate, the indexing plate including one or more indexing pins configured to align and insert into one or more indexing holes and the adaptor plate including a coupler on a first surface of the adaptor plate and a threaded screw on a second surface of the adaptor plate.
42. A hinged coupler bracket comprising a bracket of any one of embodiments 1-16 and further comprising a hinged coupler.
43. The hinged coupler bracket of embodiment 42, wherein the hinged coupler comprises a hinged base including a first outer knuckle and a second outer knuckle, an inner knuckle and a latching socket including a socket body and a socket formed within the socket body.
44. The hinged coupler bracket of embodiment 42 or 43, wherein the inner knuckle is rotatably coupled to the hinged base by a hinge pin inserted through the first outer knuckle, the inner knuckle and the second outer knuckle.
45. The hinged coupler bracket of any one of embodiments 42-44, wherein the hinged base further comprises a first detent plunger and a second detent plunger, the first and second detent plungers each comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the inner knuckle further comprises a first row of detents that are annularly spaced apart and aligned and a second row of detents that are annularly spaced apart and aligned, the first and second row of detents being parallel to each other, wherein the first and second detent plungers are aligned with the first and second row of detents respectively, in a manner that the detent ball protruding from the open end of the detent cylinder will be seated in a detent from the first and second row of detents, and wherein an angular position of the inner knuckle is selectively controlled when a detent from the first and second row of detents is selectively brought into alignment with the detent ball of first and second detent plungers by relative rotation between the inner knuckle and the hinged base.
46. The hinged coupler bracket of embodiment 45, wherein the first detent plunger is positioned by the first outer knuckle and oriented radially toward the inner knuckle and the second detent plunger is positioned by the second outer knuckle and oriented radially toward the inner knuckle.
47. The hinged coupler bracket of any one of embodiments 42-46, wherein the inner knuckle is rotatably coupled to the latching socket by a detent mechanism, wherein a cylindrical drum portion of the latching socket is inserted into a cylindrical sleeve portion of the inner knuckle causing an end surface portion of the cylindrical sleeve portion to come into close proximity to an end surface of the cylindrical drum portion, wherein the inner knuckle further comprises one or more detent plungers, each of the one or more detent plungers comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the end surface of the cylindrical drum portion of the latching socket further comprises a ring of detents that are annularly spaced apart and located near the perimeter of the end surface of the cylindrical drum portion, wherein each of the one or more detent plungers is aligned with the ring of detents in a manner that the detent ball protruding from the open end of the detent cylinder of each of the one or more detent plungers will be seated in a detent from the ring of detents, and wherein a rotational position of the latching socket is selectively controlled when a detent from the from the ring of detents is selectively brought into alignment with the detent ball of each of the one or more detent plungers by relative rotation between the latching socket and the inner knuckle.

48. The hinged coupler bracket of any one of embodiments 42-47, wherein the latching socket includes a) a latching pin bore formed blindly in the body transversely to the socket and intersecting the socket, a spring bore being formed at a blind end of the latching pin bore and an open end of the latching pin bore opening through the socket body, b) a latching pin slidably fitted within the latching pin bore, the latching pin having a keyway notched laterally therein, the keyway including a locking edge, a purchase end of the latching pin protruding from the open end and a spring end positioned within the spring bore; c) a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in a unlocked configuration, the first end of the latching pin is manually pressed axially further into the latching pin bore to move the locking edge toward the spring bore.

49. The hinged coupler bracket of embodiment 48, wherein the latching pin bore is formed orthogonally to the socket.

50. The hinged coupler bracket of embodiment 48 or 49, wherein the latching socket further comprises a) a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and b) a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.

51. The hinged coupler bracket of embodiment 50, wherein the latching pin bore and the second latching pin bore are formed orthogonally to the socket, with the latching pin bore and the second latching pin bore axially parallel to one another.

52. The hinged coupler bracket of any one of embodiments 48-51, wherein the locking edge of the keyway is configured to be engaged with the latch engagement portion of the attachment when the attachment is inserted within the socket in the locked configuration.

53. The hinged coupler bracket of any one of embodiments 43-52, wherein the socket has a circumference that is hexagonal, octagonal, dodecagonal, or hexadecagonal.

54. A hinged coupler bracket comprising a) a first jaw member, the first jaw member comprising an inner surface including a first mating portion and a first clamping portion, the first clamping portion including one or more engagement bosses, and an outer surface comprising a hinged coupler, b) a second jaw member, the second jaw member comprising an inner surface including a second mating portion and a second clamping portion, the second clamping portion including one or more engagement bosses, c) a pin assembly comprising a latching pin including a latch bolt hole and a guide pin, the latching pin and the guide pin being perpendicular to the first and second clamping portions of the first and second jaw members, and d) a latch bolt assembly comprising a latch bolt slidably insertable through a latch bolt bore, the latch bolt having cylindrical body and including a first end and a second end, wherein the latch bolt assembly is housed in the second jaw member, wherein the pin assembly connects the first and second jaw members, wherein the pin assembly is configured to slidably translate the first and second jaw members toward one another in a first direction or away from one another in a direction opposite the first direction, and wherein the bracket can adopt an open configuration and a closed configuration.

55. The hinged coupler bracket of embodiment 54, wherein the hinged coupler comprises a hinged base including a first outer knuckle and a second outer knuckle, an inner knuckle and a latching socket including a socket body and a socket formed within the socket body.

56. The hinged coupler bracket of embodiment 54 or 55, wherein the inner knuckle is rotatably coupled to the hinged base by a hinge pin inserted through the first outer knuckle, the inner knuckle and the second outer knuckle.

57. The hinged coupler bracket of any one of embodiments 54-56, wherein the hinged base further comprises a first detent plunger and a second detent plunger, the first and second detent plungers each comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the inner knuckle further comprises a first row of detents that are annularly spaced apart and aligned and a second row of detents that are annularly spaced apart and aligned, the first and second row of detents being parallel to each other, wherein the first and second detent plungers are aligned with the first and second row of detents respectively, in a manner that the detent ball protruding from the open end of the detent cylinder will be seated in a detent from the first and second row of detents, and wherein an angular position of the inner knuckle is selectively controlled when a detent from the first and second row of detents is selectively brought into alignment with the detent ball of first and second detent plungers by relative rotation between the inner knuckle and the hinged base.

58. The hinged coupler bracket of embodiment 57, wherein the first detent plunger is positioned by the first outer knuckle and oriented radially toward the inner knuckle and the second detent plunger is positioned by the second outer knuckle and oriented radially toward the inner knuckle.

59. The hinged coupler bracket of any one of embodiments 54-58, wherein the inner knuckle is rotatably coupled to the latching socket by a detent mechanism, wherein a cylindrical drum portion of the latching socket is inserted into a cylindrical sleeve portion of the inner knuckle causing an end surface portion of the cylindrical sleeve portion to come into close proximity to an end surface of the cylindrical drum portion, wherein the inner knuckle further comprises one or more detent plungers, each of the one or more detent plungers comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the end surface of the cylindrical drum portion of the latching socket further comprises a ring of detents that are annularly spaced apart and located near the perimeter of the end surface of the cylindrical drum portion, wherein each of the one or more detent plungers is aligned with the ring of detents in a manner that the detent ball protruding from the open end of the detent cylinder of each of the one or more detent plungers will be seated in a detent from the ring of detents, and wherein a rotational position of the latching socket is selectively controlled when a detent from the from the ring of detents is selectively brought into alignment with the detent ball of each of the one or more detent plungers by relative rotation between the latching socket and the inner knuckle.

60. The hinged coupler bracket of any one of embodiments 54-59, wherein the latching socket includes a) a latching pin bore formed blindly in the body transversely to the socket and intersecting the socket, a spring bore being formed at a blind end of the latching pin bore and an open end of the latching pin bore opening through the socket body, b) a latching pin slidably fitted within the latching pin bore, the latching pin having a keyway notched laterally therein, the keyway including a locking edge, a purchase end of the latching pin protruding from the open end and a spring end positioned within the spring bore, c) a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in a unlocked configuration, the first end of the latching pin is manually pressed axially further into the latching pin bore to move the locking edge toward the spring bore.

61. The hinged coupler bracket of embodiment 60, wherein the latching pin bore is formed orthogonally to the socket.

62. The hinged coupler bracket of embodiment 60 or 61, wherein the latching socket further comprises a) a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and b) a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.

63. The hinged coupler bracket of embodiment 62, wherein the latching pin bore and the second latching pin bore are formed orthogonally to the socket, with the latching pin bore and the second latching pin bore axially parallel to one another.

64. hinged coupler bracket of any one of embodiments 60-63, wherein the locking edge of the keyway is configured to be engaged with the latch engagement portion of the attachment when the attachment is inserted within the socket in the locked configuration.

65. The hinged coupler bracket of any one of embodiments 55-64, wherein the socket has a circumference that is hexagonal, octagonal, dodecagonal, or hexadecagonal.

66. A hinged joint comprising: an inner knuckle rotatably coupled to an outer knuckle by a hinge pin passing through the inner knuckle and the outer knuckle; a detent mechanism that checks the relative motion about the hinge pin between the inner knuckle and the outer knuckle, the detent mechanism includes a detent plunger configured to engage a detent, wherein an angular position of the inner knuckle is selectively held when the detent plunger is engaged within the detent.

67. The hinged joint of embodiment 66 wherein the detent plunger is positioned on an outer knuckle body and oriented radially toward the inner knuckle, the detent is positioned on the inner knuckle and is selectively brought into alignment with the detent plunger by relative rotation between the inner knuckle and the outer knuckle.

68. The hinged joint of embodiment 66 or 67, wherein the detent is a plurality of depressions formed about the inner knuckle.

69. A bracket comprising: a first jaw member; a second jaw member slidably translatable parallel to a first direction, the second jaw member sliding relative to the first jaw member, a latching pin bore formed in the second jaw member arranged parallel to the first direction, a latch bolt bore being formed in the second jaw member arranged parallel to a second direction and perpendicular to the first direction, the latch bolt bore intersecting the latching guide pin bore; a latching pin extending from the first jaw member arranged parallel to the first direction and slidably inserted within the latching pin bore to guide travel of the second jaw member relative to the first jaw member in the first direction, a bolt channel being formed lengthwise on the latching pin, a bolt hole being formed within the bolt channel and being deeper than the bolt channel; and a latch bolt slidably inserted within the latch bolt bore, a terminus of the latch bolt being inserted within the bolt hole in a locked configuration where movement of the second jaw member away from the first jaw member is substantially prevented, the terminus of the latch bolt configured to be positioned out of the bolt hole and within the bolt channel in an unlocked configuration where sliding of the second jaw member away from the first jaw member is permitted, with the terminus riding within the bolt channel as the second jaw member moves away from the first jaw member.

70. The bracket of embodiment 69 further comprising: a guide pin extending from the second jaw member arranged parallel to the first direction and slidably inserted within a guide pin bore formed in the first jaw member arranged parallel to the first direction to guide travel of the first jaw member relative to the second jaw member in the first direction.

71. The bracket of embodiment 69 or 70 further comprising: a jaw expanding spring positioned between the first jaw member and the second jaw member, the jaw expanding spring configured to normally bias the first jaw member and the second jaw member away from one another; wherein, in the unlocked configuration, the first jaw member and the second jaw member are forced to slide away from one another by the jaw expanding spring.

72. The bracket of any one of embodiments 69-71, wherein the bolt channel limits travel of the first jaw member away from the second jaw member due to the terminus of the latch bolt being restricted to travel within the bolt channel.

73. The bracket of any one of embodiments 69-72, wherein the latch bolt comprises a limiter slot is formed lengthwise on the latch bolt, wherein a limiter extends through the limiter slot to limit travel of the latch bolt within the latch bolt bore as the latch bolt travels relative to the limiter.

74. The bracket of embodiment 73, wherein the latch bolt further comprises a body and a bolt axially extending from the body, the terminus distally located on the bolt, a spring channel being formed lengthwise on the body, the limiter slot located within the spring channel.

75. The bracket of embodiment 74, wherein the limiter slot includes a spring seat closest to the bolt, a retraction spring is positioned within the spring channel between the spring seat and the limiter, wherein, as the terminus of the latch bolt is manually forced from the bolt hole, the retraction spring biases the latch bolt back toward the latching guide pin due to the retraction spring being compressed between the spring seat and the limiter.

76. The bracket of embodiment 75, wherein a bolt stop is defined within the bolt channel adjacent to the bolt hole, the terminus of the bolt is configured to pushed against the bolt stop in the unlocked configuration under the bias of the retraction springe.

77. The bracket of embodiment 76, wherein, as the latching guide pin is moved relative to the terminus of the bolt, the terminus of the bolt is configured to ride against the bolt stop during the transition from the unlocked configuration to the locked configuration, wherein, when the bolt hole is brought into alignment with the terminus of the bolt, the retraction spring forces the bolt into the bolt hole to complete the transition to the locked configuration.

78. The bracket of any one of embodiments 69-77, wherein the latch bolt bore is formed completely through the second jaw member, and wherein the latch bolt is configured to extend through the latching guide such that the terminus of the latch bolt protrudes from the second jaw member in the locked configuration.

79. The bracket of embodiment 78, wherein the latch bolt bore comprises a tab on an end of the latch bolt opposite the terminus, the tab configured to rotate relative to the latch bolt, and wherein the tab is positioned closely adjacent to the second jaw member in the locked configuration, to initiate the transition from the locked configuration to the unlocked configuration, the terminus is manually pushed into the latch bolt bore which causes the tab to move away from second jaw member which provides clearance for manual purchase of the tab for further pulling.

80. The bracket of embodiment 79, wherein a tab recess is formed on the second jaw member adjacent to the latch bolt bore and configured to receive the tab when in the locked configuration to prevent inadvertent rotation of the tab.

81. The bracket of embodiment 79, wherein the tab includes a detent mechanism interfacing between the end of the latch bolt and the tab to temporarily arrest the rotation of the tab at predetermined angular positions, wherein the tab is configured to be rotated to an angular position where a portion of the tab overhangs the second jaw member for improving manual purchase.

82. The bracket of any one of embodiments 69-81, wherein the first jaw member includes a first clamping face and the second jaw member includes a second clamping face spaced apart from and opposing the first clamping face in a clamping arrangement.

83. The bracket of embodiment 82, wherein a first engagement boss protrudes from the first clamping face and a second engagement boss protrudes from the second clamping face.

84. The bracket of embodiment 83, wherein the first engagement boss and the second engagement boss are each configured as an elongated boss.

85. The bracket of any one of embodiments 69-84, wherein a throat region is defined between the first jaw member and the second jaw member, a back side of the bracket defined opposite the throat region, a back plate is configured to slide within a back-plate recess to prevent undue flexure between the first jaw member and the second jaw member.

86. The bracket of embodiment 85, wherein the back plate is cantilevered from the first jaw member and the back-plate recess is formed on the second jaw member.

87. A bracket comprising: a first jaw member, a latching portion extending from the first jaw member arranged parallel to a first direction, a bolt channel being formed lengthwise on the latching portion, a bolt hole being formed within the bolt channel and being deeper than the bolt channel; a second jaw member slidably translatable relative to the first jaw member parallel to the first direction, a latching bore formed in the second jaw member arranged parallel to the first direction, a latch bolt bore being formed in the second jaw member arranged parallel to a second direction and perpendicular to the first direction, the latch bolt bore intersecting the latching guide pin bore, the latching portion slidably inserted within the latching bore; and a latch bolt slidably inserted within the latch bolt bore, a terminus of the latch bolt being inserted within the bolt hole in a locked configuration where movement of the second jaw member away from the first jaw member is substantially prevented, the terminus of the latch bolt configured to be positioned out of the bolt hole and within the bolt channel in an unlocked configuration where sliding of the second jaw member away from the first jaw member is permitted, with the terminus riding within the bolt channel as the second jaw member moves away from the first jaw member.

88. The bracket of embodiment 87, wherein the latching portion is a latching guide pin slidably inserted within the latching bore to guide travel of the second jaw member relative to the first jaw member in the first direction.

89. A rail for receiving a clamp having a first engagement boss spaced apart and in-line with a second engagement boss, the first engagement boss and the second engagement boss each having a boss width and a boss length, a first distance being defined between a first innermost edge of the first engagement boss and a second innermost edge of the second engagement boss, a second distance being defined between a first outermost edge of the first engagement boss and a second outermost edge of the second engagement boss, the rail comprising: a rail body having a first engagement surface, a second surface adjacent to the first engagement surface, and a third surface parallel, spaced apart, and facing oppositely of the first engagement surface with the second surface spanning between the first engagement surface and the third surface; a first engagement slot formed on the first engagement surface and configured to receive the first engagement boss and the second engagement boss, the first engagement slot having a first slot length at least as long as the second distance, and a first slot width at least as wide as the boss width; and a second engagement slot formed on the first engagement surface spaced apart and in-line with the first engagement slot, a slot spacing length between the first engagement slot and the second engagement slot, the slot spacing length at most as long as the first distance, and a second slot width at least as wide as the boss width; wherein, the combination of one or more of the first slot length, the first slot width, the slot spacing length, and the second slot width providing a fit that locates the first engagement boss and the second engagement boss of the clamp within at least the first engagement slot and prevents substantial movement of the clamp relative to the rail.

90. The rail of embodiment 89, wherein the first engagement slot and the second engagement slot are through slots.

91. The rail of embodiment 89 or 90, wherein the first engagement slot and the second engagement slot are the same length.

92. The rail of any one of embodiments 89-91, wherein the first engagement slot is longer than the second engagement slot.

93. The rail of embodiment 92, wherein the second engagement slot having a second slot length longer than the boss length and shorter than the second distance.

94. The rail of any one of embodiments 89-93, wherein the first engagement slot and the second engagement slot include a lead-in to ease the transition between the first engagement surface and each of the first engagement slot and the second engagement slot.

95. The rail of embodiment 94, wherein the lead-in is one or both of a chamfer and a fillet.

96. The rail of any one of embodiments 89-95, wherein the first engagement slot provides a locational clearance fit for receiving the first engagement boss and the second engagement boss for locating the clamp relative to the rail.

97. The rail of any one of embodiments 89-96, wherein the third surface is configured as a third engagement surface with a third engagement slot and a fourth engagement slot, the third engagement slot aligned with and matching the first engagement slot, the fourth engagement slot aligned with and matching the second engagement slot.

98. The rail of any one of embodiments 89-97, wherein the rail body comprises a first frame member, a second frame member, and a sidewall member, the first engagement surface being defined on a first frame member, the third surface being defined on a second frame member, and the second surface being defined on a sidewall frame member, the sidewall member being sandwiched between and spacing apart the first frame member and the second frame member, with the first frame member fastened to the second frame member.

99. The rail of embodiment 98, wherein a plurality of female threaded standoffs extend between the second frame member and the first frame member, a plurality of male threaded fasteners extend through each of the first frame member and the second frame member to thread into the plurality of female threaded standoffs to firmly fasten the first frame member and the second frame member.

100. The rail of embodiment 98 or 99, wherein the rail body is configured as a device protective case for a portable electronic device, and is configured to enclose a perimeter of the portable electronic device, the rail further comprising: a top cover plate configured to cover a screen of the portable electronic device and a bottom cover plate configured to cover a back of the portable electronic device; wherein, when assembled, the first frame member overlaps the top cover plate, the second frame member overlaps the bottom cover plate, the portable electronic device is configured to be sandwiched between the top cover plate and the bottom cover plate, the top cover plate is configured to be sandwiched between the first frame member and the screen, and the bottom cover plate is configured to be sandwiched between the second frame member and the back; and wherein, fastening the first frame member to the second frame member firmly holds device protective case and the portable electronic device therein firmly together in assembly.

101. The rail of embodiment 100 further comprising: an elastomeric gasket member having a groove configured to receive a perimeter edge of the portable electronic device with the elastomeric gasket member surrounding the perimeter edge; wherein the elastomeric gasket member is positioned between the first frame member and the top cover plate and positioned between the second frame member and the bottom cover; and wherein a water-tight seal is formed between the elastomeric gasket member and both the top cover plate and the bottom cover plate.

102. An adaptor comprising a) a hinged coupler comprising a hinged base and an inner knuckle, the inner knuckle comprising a barrel portion with a first end and a second end and a coupler extending perpendicularly from barrel portion, and b) a first device holder, the first device holder attached to the first end of the barrel portion of the inner knuckle, 103. An adaptor of embodiment 102 further comprising a second device holder, the second device holder attached to the second end of the barrel portion of the inner knuckle, 104. An adaptor of embodiment 102 or 103, wherein the inner knuckle is rotatably coupled to the hinged base.

105. An adaptor of embodiment 104, wherein the hinged base further comprises a first detent plunger and a second detent plunger, the first and second detent plungers each comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the inner knuckle further comprises a first row of detents that are annularly spaced apart and aligned and a second row of detents that are annularly spaced apart and aligned, the first and second row of detents being parallel to each other, wherein the first and second detent plungers are aligned with the first and second row of detents respectively, in a manner that the detent ball protruding from the open end of the detent cylinder will be seated in a detent from the first and second row of detents, and wherein an angular position of the inner knuckle is selectively controlled when a detent from the first and second row of detents is selectively brought into alignment with the detent ball of first and second detent plungers by relative rotation between the inner knuckle and the hinged base.

106. An adaptor comprising a hinged base including a first outer knuckle and a second outer knuckle, an inner knuckle and a latching socket including a socket body and a socket formed within the socket body.

107. The adaptor of embodiment 106, wherein the inner knuckle is rotatably coupled to the hinged base by a hinge pin inserted through the first outer knuckle, the inner knuckle and the second outer knuckle.

108. The adaptor of any one of embodiments 106 or 107, wherein the hinged base further comprises a first detent plunger and a second detent plunger, the first and second detent plungers each comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the inner knuckle further comprises a first row of detents that are annularly spaced apart and aligned and a second row of detents that are annularly spaced apart and aligned, the first and second row of detents being parallel to each other, wherein the first and second detent plungers are aligned with the first and second row of detents respectively, in a manner that the detent ball protruding from the open end of the detent cylinder will be seated in a detent from the first and second row of detents, and wherein an angular position of the inner knuckle is selectively controlled when a detent from the first and second row of detents is selectively brought into alignment with the detent ball of first and second detent plungers by relative rotation between the inner knuckle and the hinged base.

109. The adaptor of embodiment 108, wherein the first detent plunger is positioned by the first outer knuckle and oriented radially toward the inner knuckle and the second detent plunger is positioned by the second outer knuckle and oriented radially toward the inner knuckle.

110. The adaptor of any one of embodiments 106-109, wherein the inner knuckle is rotatably coupled to the latching socket by a detent mechanism, wherein a cylindrical drum portion of the latching socket is inserted into a cylindrical sleeve portion of the inner knuckle causing an end surface portion of the cylindrical sleeve portion to come into close proximity to an end surface of the cylindrical drum portion, wherein the inner knuckle further comprises one or more detent plungers, each of the one or more detent plungers comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the end surface of the cylindrical drum portion of the latching socket further comprises a ring of detents that are annularly spaced apart and located near the perimeter of the end surface of the cylindrical drum portion, wherein each of the one or more detent plungers is aligned with the ring of detents in a manner that the detent ball protruding from the open end of the detent cylinder of each of the one or more detent plungers will be seated in a detent from the ring of detents, and wherein a rotational position of the latching socket is selectively controlled when a detent from the from the ring of detents is selectively brought into alignment with the detent ball of each of the one or more detent plungers by relative rotation between the latching socket and the inner knuckle.

111. The adaptor of any one of embodiments 106-110, wherein the latching socket includes a) latching pin bore formed blindly in the body transversely to the socket and intersecting the socket, a spring bore being formed at a blind end of the latching pin bore and an open end of the latching pin bore opening through the socket body, b) a latching pin slidably fitted within the latching pin bore, the latching pin having a keyway notched laterally therein, the keyway including a locking edge, a purchase end of the latching pin protruding from the open end and a spring end positioned within the spring bore, c) a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in a unlocked configuration, the first end of the latching pin is manually pressed axially further into the latching pin bore to move the locking edge toward the spring bore.

112. The adaptor of embodiment 111, wherein the latching pin bore is formed orthogonally to the socket.

113. The adaptor of embodiment 111 or 112, wherein the latching socket further comprises a) a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and b) a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.

114. The adaptor of embodiment 113, wherein the latching pin bore and the second latching pin bore are formed orthogonally to the socket, with the latching pin bore and the second latching pin bore axially parallel to one another.

115. The adaptor of any one of embodiments 111-114, wherein the locking edge of the keyway is configured to be engaged with the latch engagement portion of the attachment when the attachment is inserted within the socket in the locked configuration.

116. The adaptor of any one of embodiments 106-115, wherein the socket has a circumference that is hexagonal, octagonal, dodecagonal, or hexadecagonal.

Aspects of the present specification can be described as follows:

1. A bracket, the bracket comprising a first jaw member, the first jaw member comprising an inner surface including a first mating portion and a first clamping portion, a second jaw member, the second jaw member comprising an inner surface including a second mating portion, a second clamping portion, and a cinching assembly, a pin assembly comprising a latching pin including a latch bolt hole and a guide pin, the latching pin and the guide pin being perpendicular to the first and second clamping portions of the first and second jaw members, and a latch bolt assembly comprising a latch bolt slidably insertable through a latch bolt bore, the latch bolt having cylindrical body and including a first end and a second end, wherein the latch bolt assembly is housed in the second jaw member, wherein the pin assembly connects the first and second jaw members, wherein the pin assembly is configured to slidably translate the first and second jaw members toward one another in a first direction or away from one another in a direction opposite the first direction, wherein the bracket can adopt an open configuration and a closed configuration, and wherein the bracket can reversable connect to a rail using the first and second mating portions of the first and second jaws respectively.

2. The bracket of embodiment 1, further comprises one or more jaw compression springs, each of the one or more jaw compression springs including a first end and a second end, wherein the first end is seated in a locating hole present on the first mating portion of the first jaw member and the second end is seated in a locating hole present on the second mating portion of the second jaw member, wherein one or more jaw compression springs provide a separating bias that forces the first jaw member and the second jaw member apart.
3. The bracket of embodiment 1 or 2, wherein the latch bolt of the bracket further comprises a latch bolt spring that provides a separating bias that forces the latch bolt in a direction outward of latch bolt bore.
4. The bracket of any one of embodiments 1-3, wherein when the bracket is in the closed configuration, first and second jaw members are in close proximity to one another and the latch bolt is inserted in latch bolt hole of the latching pin.
5. The bracket of any one of embodiments 1-4, wherein when the bracket is in the open configuration, first and second jaw members are apart from one another and the latch bolt is removed from latch bolt hole of the latching pin.
6. The bracket of any one of embodiments 1-5, wherein the bracket further comprises a back plate and a back-plate recess, the back plate is cantilevered from the first jaw member and the back-plate recess is formed on the second jaw member.
7. The bracket of any one of embodiments 1-6, wherein the first and second clamping portions lack engagement bosses.
8. The bracket of any one of embodiments 1-6, wherein the first and second clamping portions each comprise one or more engagement bosses.
9. The bracket of any one of embodiments 1-8, wherein the first and second clamping portions each comprise a flat planer surface.
10. The bracket of any one of embodiments 1-8, wherein the first and second clamping portions each comprise a curved surface.
11. The bracket of any one of embodiments 1-10, wherein the cinching assembly comprises an adjustment plate, a cinching plate, and a release.
12. The bracket of any one of embodiments 1-11, wherein when the bracket is in the closed configuration, the cinching assembly is capable of tightening the first and second mating portions of the first and second jaws respectively to the rail.
13. The bracket of any one of embodiments 1-12, wherein the bracket further comprises an outer surface comprising a hinged coupler, the hinged coupler comprising a hinged base including a first outer knuckle and a second outer knuckle, and a coupler assembly including an inner knuckle and a coupler.
14. The bracket of embodiment 13, wherein the inner knuckle is rotatably coupled to the hinged base by a hinge pin inserted through the first outer knuckle, the inner knuckle and the second outer knuckle.
15. The bracket of embodiment 13 or 14, wherein the coupler has a body that is hexagonal, octagonal, dodecagonal, or hexadecagonal in shape.
16. The bracket of any one of embodiments 1-12, wherein the bracket further comprises an outer surface comprising a hinged socket, the hinged socket comprising a hinged base including a first outer knuckle and a second outer knuckle, an inner knuckle and a latching socket including a socket body and a socket formed within the socket body.
17. The bracket of embodiment 16, wherein the inner knuckle is rotatably coupled to the hinged base by a hinge pin inserted through the first outer knuckle, the inner knuckle and the second outer knuckle.
18. The bracket of embodiment 16 or 17, wherein the inner knuckle is rotatably coupled to the latching socket.
19. The bracket of any one of embodiments 16-18, wherein the latching socket includes a) a latching pin bore formed blindly in the body transversely to the socket and intersecting the socket, a spring bore being formed at a blind end of the latching pin bore and an open end of the latching pin bore opening through the socket body; b) a latching pin slidably fitted within the latching pin bore, the latching pin having a keyway notched laterally therein, the keyway including a locking edge, a purchase end of the latching pin protruding from the open end and a spring end positioned within the spring bore; c) a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in a unlocked configuration, the first end of the latching pin is manually pressed axially further into the latching pin bore to move the locking edge toward the spring bore.
20. The bracket of embodiment 19, wherein the latching socket further comprises a) a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and b) a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.
21. The bracket of any one of embodiments 16-20, wherein the socket has a socket wall that is hexagonal, octagonal, dodecagonal, or hexadecagonal in shape.
22. A bracket, the bracket comprising a first jaw member, the first jaw member comprising an inner surface including a first mating portion and a first clamping portion, a second jaw member, the second jaw member comprising an inner surface including a second mating portion, and a second clamping portion, an outer surface comprising a hinged coupler, the hinged coupler comprising a hinged base including a first outer knuckle and a second outer knuckle, and a coupler assembly including an inner knuckle and a coupler, a pin assembly comprising a latching pin including a latch bolt hole and a guide pin, the latching pin and the guide pin being perpendicular to the first and second clamping portions of the first and second jaw members, and a latch bolt assembly comprising a latch bolt slidably insertable through a latch bolt bore, the latch bolt having cylindrical body and including a first end and a second end, wherein the latch bolt assembly is housed in the second jaw member, wherein the pin assembly connects the first and second jaw members, wherein the pin assembly is configured to slidably translate the first and second jaw members toward one another in a first direction or away from one another in a direction opposite the first direction, wherein the bracket can adopt an open configuration and a closed configuration.

23. The bracket of embodiment 22, further comprises one or more jaw compression springs, each of the one or more jaw compression springs including a first end and a second end, wherein the first end is seated in a locating hole present on the first mating portion of the first jaw member and the second end is seated in a locating hole present on the second mating portion of the second jaw member, wherein one or more jaw compression springs provide a separating bias that forces the first jaw member and the second jaw member apart.

24. The bracket of embodiment 22 or 23, wherein the latch bolt of the bracket further comprises a latch bolt spring that provides a separating bias that forces the latch bolt in a direction outward of latch bolt bore.

25. The bracket of any one of embodiments 22-24, wherein when the bracket is in the closed configuration, first and second jaw members are in close proximity to one another and the latch bolt is inserted in latch bolt hole of the latching pin.

26. The bracket of any one of embodiments 22-25, wherein when the bracket is in the open configuration, first and second jaw members are apart from one another and the latch bolt is removed from latch bolt hole of the latching pin.

27. The bracket of any one of embodiments 22-26, wherein the bracket further comprises a back plate and a back-plate recess, the back plate is cantilevered from the first jaw member and the back-plate recess is formed on the second jaw member.

28. The bracket of any one of embodiments 22-27, wherein the first and second clamping portions lack engagement bosses.

29. The bracket of any one of embodiments 22-27, wherein the first and second clamping portions each comprise one or more engagement bosses.

30. The bracket of any one of embodiments 22-29, wherein the first and second clamping portions each comprise a flat planer surface.

31. The bracket of any one of embodiments 22-29, wherein the first and second clamping portions each comprise a curved surface.

32. The bracket of any one of embodiments 22-31, wherein the inner knuckle is rotatably coupled to the hinged base by a hinge pin inserted through the first outer knuckle, the inner knuckle and the second outer knuckle.

33. The bracket of any one of embodiments 33-32, wherein the coupler has a body that is hexagonal, octagonal, dodecagonal, or hexadecagonal in shape.

34. A bracket, the bracket comprising a first jaw member, the first jaw member comprising an inner surface including a first mating portion and a first clamping portion, a second jaw member, the second jaw member comprising an inner surface including a second mating portion, and a second clamping portion, an outer surface comprising a hinged socket, the hinged socket comprising a hinged base including a first outer knuckle and a second outer knuckle, an inner knuckle and a latching socket including a socket body and a socket formed within the socket body, a pin assembly comprising a latching pin including a latch bolt hole and a guide pin, the latching pin and the guide pin being perpendicular to the first and second clamping portions of the first and second jaw members, and a latch bolt assembly comprising a latch bolt slidably insertable through a latch bolt bore, the latch bolt having cylindrical body and including a first end and a second end, wherein the latch bolt assembly is housed in the second jaw member, wherein the pin assembly connects the first and second jaw members, wherein the pin assembly is configured to slidably translate the first and second jaw members toward one another in a first direction or away from one another in a direction opposite the first direction, wherein the bracket can adopt an open configuration and a closed configuration.

35. The bracket of embodiment 34, further comprises one or more jaw compression springs, each of the one or more jaw compression springs including a first end and a second end, wherein the first end is seated in a locating hole present on the first mating portion of the first jaw member and the second end is seated in a locating hole present on the second mating portion of the second jaw member, wherein one or more jaw compression springs provide a separating bias that forces the first jaw member and the second jaw member apart.

36. The bracket of embodiment 34 or 35, wherein the latch bolt of the bracket further comprises a latch bolt spring that provides a separating bias that forces the latch bolt in a direction outward of latch bolt bore.

37. The bracket of any one of embodiments 34-36, wherein when the bracket is in the closed configuration, first and second jaw members are in close proximity to one another and the latch bolt is inserted in latch bolt hole of the latching pin.

38. The bracket of any one of embodiments 34-37, wherein when the bracket is in the open configuration, first and second jaw members are apart from one another and the latch bolt is removed from latch bolt hole of the latching pin.

39. The bracket of any one of embodiments 34-38, wherein the bracket further comprises a back plate and a back-plate recess, the back plate is cantilevered from the first jaw member and the back-plate recess is formed on the second jaw member.

40. The bracket of any one of embodiments 34-39, wherein the first and second clamping portions lack engagement bosses.

41. The bracket of any one of embodiments 34-39, wherein the first and second clamping portions each comprise one or more engagement bosses.

42. The bracket of any one of embodiments 34-41, wherein the first and second clamping portions each comprise a flat planer surface.

43. The bracket of any one of embodiments 34-41, wherein the first and second clamping portions each comprise a curved surface.

44. The bracket of any one of embodiments 34-43, wherein the inner knuckle is rotatably coupled to the hinged base by a hinge pin inserted through the first outer knuckle, the inner knuckle and the second outer knuckle.

45. The bracket of any one of embodiments 34-44, wherein the inner knuckle is rotatably coupled to the latching socket.

46. The bracket of any one of embodiments 34-45, wherein the latching socket includes a) a latching pin bore formed blindly in the body transversely to the socket and intersecting the socket, a spring bore being formed at a blind end of the latching pin bore and an open end of the latching pin bore opening through the socket body; b) a latching pin slidably fitted within the latching pin bore, the latching pin having a keyway notched laterally therein, the keyway including a locking edge, a purchase end of the latching pin protruding from the open end and a spring end positioned within the spring bore; c) a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in a unlocked configuration, the first end of the latching pin is manually pressed axially further into the latching pin bore to move the locking edge toward the spring bore.

47. The bracket of embodiment 46, wherein the latching socket further comprises a) a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and b) a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.

48. The bracket of any one of embodiments 34-47, wherein the socket has a socket wall that is hexagonal, octagonal, dodecagonal, or hexadecagonal in shape.

49. A bracket, the bracket comprising a first jaw member, the first jaw member comprising an inner surface including a first mating portion and a first clamping portion, a second jaw member, the second jaw member comprising an inner surface including a second mating portion, and a second clamping portion, a pin assembly comprising a latching pin including a latch bolt through hole and a bolt channel, the latching pin being perpendicular to the first and second clamping portions of the first and second jaw members; a latch bolt assembly comprising a latch bolt slidably insertable through a latch bolt bore, the latch bolt assembly being housed in the second jaw member parallel to the second mating portion, the latch bolt including a latch bolt body and a latch bolt pin, the latch bolt body having a longitudinal axis defined by a first body end and a second body end and including a compression spring housing and a latch bolt compression spring, the compression spring housing including a channel having a first channel end, a second channel end and configured to receive the latch bolt compression, the channel running parallel to the longitudinal axis of the latch bolt body with the first channel end position on same end as the first body end and the second channel end position on same end as the second body end, the latch bolt compression spring capable of adopting a bias against the first channel end of the channel and capable generating a force parallel to the longitudinal axis the body when the bias is released, and the latch bolt pin extending from the first body end of the body and parallel to the longitudinal axis of the body, the latch bolt pin being configured to slidably fit within the latch bolt through hole and enable a locking mechanism, wherein the pin assembly connects the first and second jaw members and is configured to slidably translate the first and second jaw members toward one another in a first direction or away from one another in a direction opposite the first direction, wherein the bracket can adopt an unlocked position or a locked position, wherein in the unlocked position, the latch bolt assembly is retracted against the bias of the latch bolt compression spring with the latch bolt pin residing within the bolt channel of the latching pin, and wherein in the locked position, the latch bolt pin of the latch bolt assembly is inserted into latch bolt through hole of the latching pin by the force of the latch bolt compression spring.

50. The bracket of embodiment 49, further comprising a jaw compression spring capable of adopting a bias against first and second mating portions and capable generating a force perpendicular to the longitudinal axis the latch bolt body when the bias is released, wherein in the unlocked position, the jaw compression spring forces apart the first and second jaw members causing the latch bolt pin of the latch bolt assembly to slide into the bolt channel of the latching pin, and wherein in the locked position, the latch bolt pin of the latch bolt assembly is inserted into the latch bolt through hole of the latching pin against the bias of the jaw compression spring.

51. A bracket, the bracket comprising a first jaw member, the first jaw member comprising an inner surface including a first mating portion and a first clamping portion, a second jaw member, the second jaw member comprising an inner surface including a second mating portion, and a second clamping portion, a pin assembly comprising a latching pin including a latch bolt hole and a guide pin, the latching pin and the guide pin being perpendicular to the first and second clamping portions of the first and second jaw members, and a latch bolt assembly comprising a latch bolt slidably insertable through a latch bolt bore, the latch bolt having cylindrical body and including a first end and a second end, wherein the latch bolt assembly is housed in the second jaw member, wherein the pin assembly connects the first and second jaw members, wherein the pin assembly is configured to slidably translate the first and second jaw members toward one another in a first direction or away from one another in a direction opposite the first direction, wherein the bracket can adopt an open configuration and a closed configuration, and wherein the bracket can reversable connect to a rail using the first and second mating portions of the first and second jaws respectively.

52. The bracket of embodiment 51, further comprises one or more jaw compression springs, each of the one or more jaw compression springs including a first end and a second end, wherein the first end is seated in a locating hole present on the first mating portion of the first jaw member and the second end is seated in a locating hole present on the second mating portion of the second jaw member, wherein one or more jaw compression springs provide a separating bias that forces the first jaw member and the second jaw member apart.

53. The bracket of embodiment 51 or 52, wherein the latch bolt of the bracket further comprises a latch bolt spring that provides a separating bias that forces the latch bolt in a direction outward of latch bolt bore.

54. The bracket of any one of embodiments 51-53, wherein when the bracket is in the closed configuration, first and second jaw members are in close proximity to one another and the latch bolt is inserted in latch bolt hole of the latching pin.

55. The bracket of any one of embodiments 51-54, wherein when the bracket is in the open configuration, first and second jaw members are apart from one another and the latch bolt is removed from latch bolt hole of the latching pin.

56. The bracket of any one of embodiments 51-55, wherein the bracket further comprises a back plate and a back-plate recess, the back plate is cantilevered from the first jaw member and the back-plate recess is formed on the second jaw member.

57. The bracket of any one of embodiments 51-56, wherein the first and second clamping portions lack engagement bosses.

58. The bracket of any one of embodiments 51-56, wherein the first and second clamping portions each comprise one or more engagement bosses.

59. The bracket of any one of embodiments 51-58, wherein the first and second clamping portions each comprise a flat planer surface.

60. The bracket of any one of embodiments 51-58, wherein the first and second clamping portions each comprise a curved surface.

61. The bracket of any one of embodiments 51-61, wherein the bracket further comprises an outer surface comprising a hinged coupler, the hinged coupler comprising a hinged base including a first outer knuckle and a second outer knuckle, and a coupler assembly including an inner knuckle and a coupler.

62. The bracket of embodiment 61, wherein the inner knuckle is rotatably coupled to the hinged base by a hinge pin inserted through the first outer knuckle, the inner knuckle and the second outer knuckle.

63. The bracket of embodiment 61 or 62, wherein the coupler has a body that is hexagonal, octagonal, dodecagonal, or hexadecagonal in shape.

64. The bracket of any one of embodiments 51-61, wherein the bracket further comprises an outer surface comprising a hinged socket, the hinged socket comprising a hinged base including a first outer knuckle and a second outer knuckle, an inner knuckle and a latching socket including a socket body and a socket formed within the socket body.

65. The bracket of embodiment 64, wherein the inner knuckle is rotatably coupled to the hinged base by a hinge pin inserted through the first outer knuckle, the inner knuckle and the second outer knuckle.

66. The bracket of embodiment 64 or 65, wherein the inner knuckle is rotatably coupled to the latching socket.

67. The bracket of any one of embodiments 64-66, wherein the latching socket includes a) a latching pin bore formed blindly in the body transversely to the socket and intersecting the socket, a spring bore being formed at a blind end of the latching pin bore and an open end of the latching pin bore opening through the socket body; b) a latching pin slidably fitted within the latching pin bore, the latching pin having a keyway notched laterally therein, the keyway including a locking edge, a purchase end of the latching pin protruding from the open end and a spring end positioned within the spring bore; c) a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in a unlocked configuration, the first end of the latching pin is manually pressed axially further into the latching pin bore to move the locking edge toward the spring bore.

68. The bracket of embodiment 67, wherein the latching socket further comprises a) a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and b) a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.

69. The bracket of any one of embodiments 64-68, wherein the socket has a socket wall that is hexagonal, octagonal, dodecagonal, or hexadecagonal in shape.

70. The bracket of embodiments 1-69, wherein the bracket is integrated into a handle.

71. The bracket of embodiments 1-69, further comprises a back plate extending cantilevered from the first jaw member toward the second jaw member.

72. The bracket of embodiment 71, wherein the back plate comprises an adaptor attachment plate including a first indexing hole, a second indexing hole and a threaded port.

73. The bracket of embodiment 71, wherein the back plate includes an illuminating device.

74. The bracket of embodiments 1-73, wherein the latch bolt further comprises a tab located at the first end of the latch bolt, the tab configured to assist in rotational movement of the latch bolt with the latch bolt bore.

75. The bracket of embodiment 74, wherein the latch bolt further comprises a detent mechanism comprising one or more detents located on a surface of the tab interfacing with the first end of the latch bolt and a detent plunger located in a latch bolt body of the latch bolt, the detent plunger operationally aligned with the one or more detents, the detent mechanism configured to controllably rotate and temporarily fix the rotation of the tab relative to the latch bolt.

76. The bracket of embodiments 74 or 75, wherein the first and second jaws include a recess portion configured to receive the tab.

Aspects of the present specification can be described as follows:

1. A lock comprising a housing and a latch bolt assembly, the latch bolt assembly including a latch bolt pin and a latch bolt through hole, the latch bolt pin configured to slidably insert within the latch bolt through hole to enable a locking mechanism, the latch bolt assembly configured to adopt a unlocked position and a locked position, wherein a first spring action is capable of causing insertion of the latch bolt pin into the latch bolt through hole to adopted a locked position, and wherein a second spring action is capable of causing withdrawal of the latch bolt pin from the latch bolt through hole to adopted an unlocked position.

2. The lock of embodiment 1, wherein the first spring action is activated by release of a bias from a first compression spring housed in the latch bolt assembly.

3. The lock of embodiment 1 or 2, wherein the second spring action is activated by release of a bias of a second compression spring contained in the housing.

4. The lock of any one of embodiments 1-3, wherein the bias of the first compression spring is oriented parallel to the direction that the latch bolt pin slidably inserts into the latch bolt through hole.

5. The lock of any one of embodiments 1-4, wherein the bias of the second compression spring is oriented perpendicular to the direction that the latch bolt pin slidably inserts into the latch bolt through hole.

6. The lock of any one of embodiments 1-5, wherein the latch bolt assembly further including a latch bolt body, the latch bolt body having a longitudinal axis defined by a first body end and a second body end, the latch bolt pin extending from the first body end of the latch bolt body and parallel to the longitudinal axis of the latch bolt body.
7. The lock of embodiment 6, wherein the latch bolt body further comprises a compression spring housing, the compression spring housing containing the first compression spring.
8. The lock of embodiment 7, wherein the compression spring housing includes a channel having a first channel end, a second channel end and configured to receive the first compression spring, the channel running parallel to the longitudinal axis of the latch bolt body with the first channel end position on same end as the first body end and the second channel end position on same end as the second body end.
9. The lock of embodiment 8, wherein the first compression spring is capable of adopting a bias against the first channel end of the channel and capable generating a force parallel to the longitudinal axis the body when the bias is released, wherein in the unlocked position, the latch bolt assembly is retracted against the bias of the first compression spring with the latch bolt pin withdrawn from the latch bolt through hole, and wherein in the locked position, the latch bolt pin of the latch bolt assembly is inserted into the latch bolt through hole of the latching pin by the force of the first compression spring.
10. The lock of any one of embodiments 8 or 9, wherein the latch bolt assembly further includes a limiter slot and limiter pin, the limiter slot having a first limiter slot end and a second limiter slot end and configured to receive the limiter pin, the limiter slot running parallel to the longitudinal axis of the channel with the first limiter slot end position on same end as the first channel end and the second limiter slot end position on same end as the second channel end, and the limiter pin capable of slidably traverse the limiter slot in a direction parallel to the longitudinal axis of the channel, wherein the limiter pin limits the movement of the latch bolt assembly by a distance defined by the first and second ends of the limiter slot.
11. A lock comprising a housing and a latch bolt assembly, the latch bolt assembly including a positive action locking mechanism comprising a latch bolt and a latch bolt compression spring, wherein the latch bolt assembly is configured to adopt a unlocked position and a locked position, wherein in the unlocked position, the latch bolt is retracted against the bias of the latch bolt compression spring, and wherein in the locked position, the latch bolt is inserted into a latch bolt through hole by the force of the latch bolt compression spring.
12. A lock comprising a housing and a latch bolt assembly, the latch bolt assembly including a latch bolt body and a latch bolt pin, the latch bolt body having a longitudinal axis defined by a first body end and a second body end and including a compression spring housing and a latch bolt compression spring, the compression spring housing including a channel having a first channel end, a second channel end and configured to receive the latch bolt compression, the channel running parallel to the longitudinal axis of the latch bolt body with the first channel end position on same end as the first body end and the second channel end position on same end as the second body end, the latch bolt compression spring capable of adopting a bias against the first channel end of the channel and capable generating a force parallel to the longitudinal axis the body when the bias is released, the latch bolt pin extending from the first body end of the body and parallel to the longitudinal axis of the body; and the latching pin comprising a bolt channel and a latch bolt through hole; wherein the latch bolt pin is configured to slidably fit within the latch bolt through hole and enable a locking mechanism, wherein the latch bolt assembly is configured to adopt a unlocked position and a locked position, wherein in the unlocked position, the latch bolt assembly is retracted against the bias of the latch bolt compression spring with the latch bolt pin residing within the bolt channel of the latching pin, and wherein in the locked position, the latch bolt pin of the latch bolt assembly is inserted into the latch bolt through hole of the latching pin by the force of the latch bolt compression spring.
13. The lock of embodiment 12, further comprising a compression spring capable of adopting a bias against the latch bolt body and capable generating a force perpendicular to the longitudinal axis the latch bolt body when the bias is released, wherein in the unlocked position, the latch bolt pin of the latch bolt assembly is inserted into the bolt channel of the latching pin by the force of the compression spring, and wherein in the locked position, the latch bolt pin of the latch bolt assembly is inserted into the latch bolt through hole of the latching pin against the bias of the compression spring.
14. The lock of embodiment 12 or 13, wherein the latch bolt assembly further includes a limiter slot and limiter pin, the limiter slot having a first limiter slot end and a second limiter slot end and configured to receive the limiter pin, the limiter slot running parallel to the longitudinal axis of the channel with the first limiter slot end position on same end as the first channel end and the second limiter slot end position on same end as the second channel end, and the limiter pin capable of slidably traverse the limiter slot in a direction parallel to the longitudinal axis of the channel, wherein the limiter pin limits the movement of the latch bolt assembly by a distance defined by the first and second ends of the limiter slot.

Aspects of the present specification can be described as follows:
1. A lock assembly comprising a latch bolt assembly, the latch bolt assembly including a latch bolt pin and a latch bolt through hole, the latch bolt pin configured to slidably insert within the latch bolt through hole to enable a locking mechanism, the latch bolt assembly configured to adopt a unlocked position and a locked position, wherein a first spring action is capable of causing insertion of the latch bolt pin into the latch bolt through hole to adopted a locked position, and wherein a second spring action is capable of causing withdrawal of the latch bolt pin from the latch bolt through hole to adopted an unlocked position.
2. The lock assembly of embodiment 1, wherein the first spring action is activated by release of a bias from a first compression spring housed in the latch bolt assembly.
3. The lock assembly of embodiment 1 or 2, wherein the second spring action is activated by release of a bias of a second compression spring.
4. The lock assembly of any one of embodiments 1-3, wherein the bias of the first compression spring is oriented parallel to the direction that the latch bolt pin slidably inserts into the latch bolt through hole.
5. The lock assembly of any one of embodiments 1-4, wherein the bias of the second compression spring is oriented perpendicular to the direction that the latch bolt pin slidably inserts into the latch bolt through hole.

6. The lock assembly of any one of embodiments 1-5, wherein the latch bolt assembly further including a latch bolt body, the latch bolt body having a longitudinal axis defined by a first body end and a second body end, the latch bolt pin extending from the first body end of the latch bolt body and parallel to the longitudinal axis of the latch bolt body.

7. The lock assembly of embodiment 6, wherein the latch bolt body further comprises a compression spring housing, the compression spring housing containing the first compression spring.

8. The lock assembly of embodiment 7, wherein the compression spring housing includes a channel having a first channel end, a second channel end and configured to receive the first compression spring, the channel running parallel to the longitudinal axis of the latch bolt body with the first channel end position on same end as the first body end and the second channel end position on same end as the second body end.

9. The lock assembly of embodiment 8, wherein the first compression spring is capable of adopting a bias against the first channel end of the channel and capable generating a force parallel to the longitudinal axis the body when the bias is released, wherein in the unlocked position, the latch bolt assembly is retracted against the bias of the first compression spring with the latch bolt pin withdrawn from the latch bolt through hole, and wherein in the locked position, the latch bolt pin of the latch bolt assembly is inserted into the latch bolt through hole of the latching pin by the force of the first compression spring.

10. The lock assembly of any one of embodiments 8 or 9, wherein the latch bolt assembly further includes a limiter slot and limiter pin, the limiter slot having a first limiter slot end and a second limiter slot end and configured to receive the limiter pin, the limiter slot running parallel to the longitudinal axis of the channel with the first limiter slot end position on same end as the first channel end and the second limiter slot end position on same end as the second channel end, and the limiter pin capable of slidably traverse the limiter slot in a direction parallel to the longitudinal axis of the channel, wherein the limiter pin limits the movement of the latch bolt assembly by a distance defined by the first and second ends of the limiter slot.

11. A lock assembly comprising a latch bolt assembly, the latch bolt assembly including a positive action locking mechanism comprising a latch bolt and a latch bolt compression spring, wherein the latch bolt assembly is configured to adopt a unlocked position and a locked position, wherein in the unlocked position, the latch bolt is retracted against the bias of the latch bolt compression spring, and wherein in the locked position, the latch bolt is inserted into a latch bolt through hole by the force of the latch bolt compression spring.

12. A lock assembly comprising a latch bolt assembly and a latching pin, the latch bolt assembly including a latch bolt body and a latch bolt pin, the latch bolt body having a longitudinal axis defined by a first body end and a second body end and including a compression spring housing and a latch bolt compression spring, the compression spring housing including a channel having a first channel end, a second channel end and configured to receive the latch bolt compression, the channel running parallel to the longitudinal axis of the latch bolt body with the first channel end position on same end as the first body end and the second channel end position on same end as the second body end, the latch bolt compression spring capable of adopting a bias against the first channel end of the channel and capable generating a force parallel to the longitudinal axis the body when the bias is released, the latch bolt pin extending from the first body end of the body and parallel to the longitudinal axis of the body; and the latching pin comprising a bolt channel and a latch bolt through hole; wherein the latch bolt pin is configured to slidably fit within the latch bolt through hole and enable a locking mechanism, wherein the lock assembly is configured to adopt a unlocked position and a locked position, wherein in the unlocked position, the latch bolt assembly is retracted against the bias of the latch bolt compression spring with the latch bolt pin residing within the bolt channel of the latching pin, and wherein in the locked position, the latch bolt pin of the latch bolt assembly is inserted into latch bolt through hole of the latching pin by the force of the latch bolt compression spring.

13. The lock assembly of embodiment 12, further comprising a compression spring capable of adopting a bias against the latch bolt body and capable generating a force perpendicular to the longitudinal axis the latch bolt body when the bias is released, wherein in the unlocked position, the latch bolt pin of the latch bolt assembly is inserted into the bolt channel of the latching pin by the force of the compression spring, and wherein in the locked position, the latch bolt pin of the latch bolt assembly is inserted into the latch bolt through hole of the latching pin against the bias of the compression spring.

14. The lock assembly of embodiment 12 or 13, wherein the latch bolt assembly further includes a limiter slot and limiter pin, the limiter slot having a first limiter slot end and a second limiter slot end and configured to receive the limiter pin, the limiter slot running parallel to the longitudinal axis of the channel with the first limiter slot end position on same end as the first channel end and the second limiter slot end position on same end as the second channel end, and the limiter pin capable of slidably traverse the limiter slot in a direction parallel to the longitudinal axis of the channel, wherein the limiter pin limits the movement of the latch bolt assembly by a distance defined by the first and second ends of the limiter slot.

15. The lock assembly of any one of embodiments 12-14, contained in a housing.

16. The lock assembly of embodiment 15, wherein the housing includes a latch bolt bore configured to slidably receive the latch bolt assembly.

17. The lock assembly of embodiment 16, wherein the latch bolt bore is contained in a jaw member of a bracket.

Aspects of the present specification can be described as follows:

1. A bracket adaptor comprises an adaptor screw and a device mount, the adaptor screw operationally secured to the device mount, the device mount capable of directly interfacing with an attachment plate of a bracket and a device, the adaptor screw comprising a plate having a first surface, a second surface opposite the first surface, and a threaded portion centrally located on second surface and extending perpendicularly from the second surface, the threaded portion configured to reversible thread into a threaded attachment port of the attachment plate of the bracket, the device mount comprising a device body having a first mount surface, a second mount surface opposite the first mount surface, a bracket through hole, the first mount surface of the device mount configured to interface with the second surface of the adaptor screw, and the second mount surface including a first indexing pin and a second indexing pin, each of first and second indexing pins being configured to align with a first indexing hole and a second indexing hole the attachment plate of the bracket.
2. The bracket adaptor of embodiment 1, wherein the bracket adaptor further includes a detent mechanism comprising one or more detents located on the second surface of the adaptor screw and a detent plunger located on first mount surface of the device mount, the detent plunger operationally aligned with the one or more detents, the detent mechanism configured to controllably rotate and temporarily fix the rotation of the adaptor screw relative to the attachment plate of the bracket.
3. The bracket adaptor of embodiment 1 or 2, wherein the device mount further comprises an attachment portion configured as a yoke comprising two or more yoke spindles and a though hole configured to receive a securing pin.
4. The bracket adaptor of embodiment 1 or 2, wherein the device mount further comprises an attachment portion configured as a screw.
5. The bracket adaptor of embodiment 1 or 2, wherein the device mount further comprises an attachment portion configured as a suction cup.
6. The bracket adaptor of embodiment 1 or 2, wherein the device mount further comprises an attachment portion comprising a magnet.
7. The bracket adaptor of embodiment 1 or 2, wherein the device mount further comprises an attachment portion configured as a male connector of a male-female connector assembly.
8. The bracket adaptor of embodiment 1 or 2, wherein the device mount further comprises an attachment portion configured as a female connector of a male-female connector assembly.
9. The bracket adaptor of embodiment 7 or 8, wherein the male-female connector assembly a snap-fit connector or a pressure fit connector.
10. The bracket adaptor of embodiment 9, wherein the snap-fit connector is a jack and plug connector.
11. The bracket adaptor of embodiment 9, wherein the pressure fit connector is a prong connector.
12. A bracket adaptor comprising a bracket mount and a device mount, the bracket mount capable of directly interfacing with an attachment plate of a bracket and the device mount capable of directly interfacing with the bracket mount and a device.
13. A bracket adaptor of embodiment 12, wherein the bracket mount comprises a bracket body having a first bracket surface, a second bracket surface, a bracket through hole, the first bracket surface including one or more threaded blind holes configured to secure the device mount to the bracket mount using one or more screws, each of the one or more screws configured to reversible thread into each of the one or more threaded blind holes, the second bracket surface including a first indexing pin and a second indexing pin, each of first and second indexing pins being configured to align with a first indexing hole and a second indexing hole the attachment plate of the bracket, the device mount comprising a device body having a first device surface, a second device surface, a device through hole, the first device surface includes a recessed portion and a mounting surface, the recess portion includes one or more bracket mount through holes and a bracket through hole, each of the one or more bracket mount through holes being configured to align with each of one or more threaded blind holes of the bracket mount, the bracket through hole being configured to align with a threaded attachment port of the attachment plate of the bracket, the mounting surface including one or more device through holes and configured to interface with a device, each of the one or more device through holes being configured to receive a screw used to reversibly secure the device to the device mount.
14. A bracket adaptor of embodiment 12 or 13, wherein the bracket mount further comprises a plate extension, the plate extension orthogonally extends from a back and optionally a first side, a second side, or both the first and second sides of the bracket mount.

Aspects of the present specification can be described as follows:
1. A coupler comprises a body, the body having a first end defining a first attachment portion and a second end defining a second attachment portion opposite the first attachment portion; the first attachment portion including a first circumferential grove and a first head, the first circumferential grove defined by a first shoulder of the body and a shoulder of the first head, the first head being radiused to form a leading edge opposite the shoulder of the first head; and a second attachment portion.
2. The coupler of embodiment 1, wherein the second attachment portion includes a second circumferential grove and a second head, the second circumferential grove defined by a second shoulder of the body and a shoulder of the second head, the second head being radiused to form a leading edge opposite the shoulder of the second head.
3. The coupler of embodiment 2, wherein the size and dimension of the first and second attachment portions are substantially the same.
4. The coupler of embodiment 2, wherein the size and dimension of the first attachment portion is different from the size and dimension of second first attachment portion.
5. The coupler of embodiment 1, wherein the second attachment portion is configured as a yoke comprising two or more yoke spindles and a though hole configured to receive a securing pin.
6. The coupler of embodiment 1, wherein the second attachment portion is configured as a screw.
7. The coupler of embodiment 1, wherein the second attachment portion is configured as a suction cup.
8. The coupler of embodiment 1, wherein the second attachment portion comprising a magnet.
9. The coupler of embodiment 1, wherein the second attachment portion is configured as a male connector of a male-female connector assembly.
10. The coupler of embodiment 1, wherein the second attachment portion is configured as a female connector of a male-female connector assembly.
11. The coupler of embodiment 9 or 10, wherein the male-female connector assembly a snap-fit connector or a pressure fit connector.
12. The coupler of embodiment 11, wherein the snap-fit connector is a jack and plug connector.
13. The coupler of embodiment 11, wherein the pressure fit connector is a prong connector.
14. The coupler of embodiments 1-13, wherein the second attachment portion further comprises a cinching assembly.
15. The coupler of embodiment 14, wherein the cinching assembly comprises an indexing plate and an adaptor base, the indexing plate comprising a first plate surface and a second plate surface opposite the first plate surface, the second plate surface including a first indexing pin and a second indexing pin, each of first and second indexing pins being configured to align with a first indexing hole and a second indexing hole an attachment plate of a bracket, and the adaptor base comprising a first base surface and a second base surface opposite the first base surface, the first base surface having the body of the coupler centrally located and extending perpendicularly from the first base surface, and the second base surface being configured to interface with the first plate surface of the indexing plate 16. The coupler of embodiment 15, wherein the cinching assembly further includes a detent mechanism comprising one or more detents located on the first plate surface of the indexing plate and a detent plunger located on second base surface of the adaptor base, the detent plunger operationally aligned with the plurality of detents, the detent mechanism configured to controllably rotate and temporarily fix the rotation of the second attachment portion of the coupler relative to an attachment plate of a bracket.
17. The coupler of embodiment 14, wherein the cinching assembly comprises an indexing plate and an adaptor screw, the indexing plate comprising a first plate surface and a second plate surface opposite the first plate surface, and the adaptor base comprising an internal housing, a first housing surface, and an adaptor screw, the housing configured to receive the first plate surface of the indexing plate to form an enclosed space, the adaptor screw including a plate having a first surface, a second surface opposite the first surface, and a threaded portion centrally located on second surface and extending perpendicularly from the second surface, the threaded portion configured to reversible thread into a threaded attachment port of an attachment plate of a bracket, the plate being contained within the enclosed space of the internal housing with the threaded portion extending through the indexing plate.
18. The coupler of embodiment 17, wherein the cinching assembly further includes a detent mechanism comprising one or more detents located on the first surface of the adaptor screw and a detent plunger located the internal housing of the adaptor base, the detent plunger operationally aligned with the one or more detents, the detent mechanism configured to controllably rotate and temporarily fix the rotation of the second attachment portion of the coupler relative to an attachment plate of a bracket.
19. The coupler of embodiments 17 or 18, wherein the second plate surface of the indexing plate includes a first indexing pin and a second indexing pin, each of first and second indexing pins being configured to align with a first indexing hole and a second indexing hole an attachment plate of a bracket.
20. The coupler of any one of embodiments 17-19, wherein the indexing plate forms a platform and the second plate surface includes a non-skid pad.

EXAMPLES

The following non-limiting examples are provided for illustrative purposes only in order to facilitate a more complete understanding of representative embodiments now contemplated. These examples should not be construed to limit any of the embodiments described in the present specification, including those pertaining to the systems, devices, or methods and uses disclosed herein.

Example 1

This example illustrates how to employ a mounting system disclosed herein to attach a video recorder onto a helmet.

A user has an motorcycle helmet and desires to secure a video recorder to the helmet. The user obtains a rail disclosed herein as shown in FIG. 5 and secures this rail, peels off a protective sheet from an adhesive layer present on the bottom side of the rail, and affixes the rail to an exterior surface portion of the helmet. The user then secures a bracket comprising a hinged socket as shown in FIG. 127 to the rail by engaging the engagement bosses of first and second jaw members the bracket comprising a hinged coupler to engagement slots present on the rail. The use then attaches the video recorder to the helmet by screwing the threaded screw of a coupler disclosed herein as shown in FIG. 157 into a threaded hole present on the video recorder and then attaches the video recorder to the motorcycle helmet by inserting the other end of the coupler into the socket the hinged coupler thereby securing the video recorder to the motorcycle helmet.

In an alternative example, instead of employing a bracket comprising a hinged coupler as shown in FIG. 127, the user employs a bracket a shown in FIG. 51 and a bracket adaptor comprising a plate including first and second threaded screws centrally located, with the first threaded screw perpendicular to the top surface of the plate and the second threaded screw perpendicular to the bottom surface of the disc. The user attaches the bracket adaptor to the video recorder by screwing the first threaded screw of bracket adaptor into a threaded hole present on the video recorder. Either before or after attachment of bracket to rail affixed to the motorcycle helmet, the user attaches the video recorder to the bracket by screwing the second threaded screw of bracket adaptor into a threaded hole of an attachment point present on the bracket. If not already attached, the user then attaches the video recorder to the helmet by engaging the engagement bosses of first and second jaw members the bracket to engagement slots present on the rail, thereby securing the video recorder to the motorcycle helmet.

In an alternative example, the video recorder is a Go-Pro video recorder, and the user employs a bracket a shown in FIG. 51 and the bracket adaptor is the one shown at FIG. 100. Either before or after attachment of bracket to rail affixed to the helmet, the user attaches the bracket adaptor to the bracket by screwing the threaded screw of bracket adaptor into a threaded hole of an attachment point present on the bracket. The user then attaches the video recorder by aligning the holes present on the bracket adaptor and the bracket present on the video recorder, inserting a treaded pin and securing the threaded pin in a manner that attached the video recorder to the bracket attachment. In not already attached, the user then secures the bracket to the rail by engaging the engagement bosses of first and second jaw members the bracket to engagement slots present on the rail, thereby securing the video recorder to the motorcycle helmet.

In an alternative example to the ones above, the helmet is a bicycle helmet.

Example 2

This example illustrates how to employ a mounting system disclosed herein to attach a night vision goggle onto a helmet.

A user has an ACH helmet comprising a shroud bracket and desires to secure a night vision google (NVG) using this bracket. The user obtains a rail disclosed herein as shown in FIG. 6 and secures this rail into the shroud bracket. The use then obtains a rail disclosed herein as shown in FIG. 2 and secures this rail to a portion of the NVG. The user then secures a bracket comprising a hinged socket as shown in FIG. 127 to the rail secured on the shroud bracket by engaging the engagement bosses of first and second jaw members the bracket comprising a hinged coupler to engagement slots present on the rail. The user similarly secures a bracket comprising a hinged socket as shown in FIG. 127 to the rail secured on the NVG by engaging the engagement bosses of first and second jaw members the bracket comprising a hinged coupler to engagement slots present on the rail. The use then attaches the NVG to the helmet by inserting a coupler disclosed herein as shown in FIG. 134 into the sockets of both hinged couplers thereby securing the NVG to the helmet. In this set-up, when the user desires to stow away the NVG, the user can fold the NVG up in close proximity to the rail affixed to the helmet. Likewise, when use is desired, the use can move the NVG downward from the helmet in a manner that aligns the optical sights of the NVG with one or both eyes of the user to view the environment using the NVG.

Example 3

This example illustrates how to employ a mounting system disclosed herein to attach a device in a device case disclosed herein onto a load bearing equipment vest.

A user has a smart phone and desires to secure the phone to a load bearing equipment vest, like a MOLLE load bearing system, a PALS load bearing system, an IIFS load bearing system, or an ALICE load bearing system. The user obtains a rail disclosed herein as shown in FIG. 3 and secures this rail on the load bearing equipment vest using screws, rivets or both. The user then obtains a rail disclosed herein designed as a device case as shown in FIG. 22 and encloses the phone inside the device case. The user then secures a bracket comprising a hinged socket as shown in FIG. 127 to the rail secured on the load bearing equipment vest by engaging the engagement bosses of first and second jaw members the bracket comprising a hinged coupler to engagement slots present on the rail. The user similarly secures a bracket comprising a hinged socket as shown in FIG. 127 to the device case by engaging the engagement bosses of first and second jaw members the bracket comprising a hinged coupler to engagement slots present on the device case. The user then attaches the device case to the load bearing equipment vest by inserting a coupler disclosed herein as shown in FIG. 134 into the sockets of both hinged couplers thereby securing the device case to the load bearing equipment vest. In this set-up, when the user desires to stow away the device case, the user can fold the device case in close proximity to the load bearing equipment vest. Likewise, when use is desired, the use can extend the device case away from the load bearing equipment vest to view the device encased in the device case.

In an alternative example, instead of employing both brackets comprising a hinged socket as shown in FIG. 127, the user employs a bracket a shown in FIG. 51 and a bracket adaptor comprising a plate including first and second threaded screws centrally located, with the first threaded screw perpendicular to the top surface of the plate and the second threaded screw perpendicular to the bottom surface of the disc. The user attaches the bracket adaptor to the device case by screwing the first threaded screw of bracket adaptor into a threaded hole of an attachment point present on the device case. Either before or after attachment of bracket to rail affixed to the load bearing equipment vest, the user attaches the device case to the bracket by screwing the second threaded screw of bracket adaptor into a threaded hole of an attachment point present on the bracket. If not already attached, the user then attaches the device case to the load bearing equipment vest by engaging the engagement bosses of first and second jaw members the bracket to engagement slots present on the rail, thereby securing the device case to the load bearing equipment vest.

Example 4

This example illustrates how to employ a mounting system disclosed herein to attach a device in a device case disclosed herein onto a dashboard of a vehicle.

A user has a smart phone and desires to secure the phone to the dashboard of a car. The user obtains a rail disclosed herein as shown in FIG. 3 and secures this rail, peels off a protective sheet from an adhesive layer present on the bottom side of the rail, and affixes the rail to an exterior surface portion of the dashboard. The user then obtains a rail disclosed herein designed as a device case as shown in FIG. 22 and encloses the phone inside the device case. The user then secures a bracket comprising a hinged socket as shown in FIG. 127 to the rail secured on the dashboard by engaging the engagement bosses of first and second jaw members the bracket comprising a hinged coupler to engagement slots present on the rail. The user similarly secures a bracket comprising a hinged socket as shown in FIG. 127 to the device case by engaging the engagement bosses of first and second jaw members the bracket comprising a hinged coupler to engagement slots present on the device case. The user then attaches the device case to the dashboard by inserting a coupler disclosed herein as shown in FIG. 134 into the sockets of both hinged couplers thereby securing the device case to the dashboard.

In an alternative example, instead of employing both brackets comprising a hinged socket as shown in FIG. 127, the user employs a bracket a shown in FIG. 51 and a bracket adaptor comprising a plate including first and second threaded screws centrally located, with the first threaded screw perpendicular to the top surface of the plate and the second threaded screw perpendicular to the bottom surface of the disc. The user attaches the bracket adaptor to the device case by screwing the first threaded screw of bracket adaptor into a threaded hole of an attachment point present on the device case. Either before or after attachment of bracket to rail affixed to the dashboard, the user attaches the device case to the bracket by screwing the second threaded screw of bracket adaptor into a threaded hole of an attachment point present on the bracket. If not already attached, the user then attaches the device case to the dashboard by engaging the engagement bosses of first and second jaw members the bracket to engagement slots present on the rail, thereby securing the device case to the dashboard.

In an alternative example to the ones above, the rail is affixed to an interior surface of a window present in the car, like a windshield, rear window, driver window or passenger window.

Example 5

This example illustrates how to employ a mounting system disclosed herein to attach a video recorder onto a dashboard of a vehicle.

A user has a video recorder and desires to secure the video recorder to the dashboard of a car. The user obtains a rail disclosed herein as shown in FIG. 3 and secures this rail, peels off a protective sheet from an adhesive layer present on the bottom side of the rail, and affixes the rail to an exterior surface portion of the dashboard. The user then secures a bracket comprising a hinged socket as shown in FIG. 127 to the rail by engaging the engagement bosses of first and second jaw members the bracket comprising a hinged coupler to engagement slots present on the rail. The use then attaches the video recorder to the dashboard by screwing the threaded screw of a coupler disclosed herein as shown in FIG. 153 into a threaded hole present on the video recorder and then attaches the video recorder to the dashboard by inserting the other end of the coupler into the socket the hinged coupler thereby securing the video recorder to the dashboard.

In an alternative example, instead of employing a bracket comprising a hinged socket as shown in FIG. 127, the user employs a bracket a shown in FIG. 51 and a bracket adaptor comprising a plate including first and second threaded screws centrally located, with the first threaded screw perpendicular to the top surface of the plate and the second threaded screw perpendicular to the bottom surface of the disc. The user attaches the bracket adaptor to the video recorder by screwing the first threaded screw of bracket adaptor into a threaded hole present on the video recorder. Either before or after attachment of bracket to rail affixed to the dashboard, the user attaches the video recorder to the bracket by screwing the second threaded screw of bracket adaptor into a threaded hole of an attachment point present on the bracket. If not already attached, the user then attaches the video recorder to the dashboard by engaging the engagement bosses of first and second jaw members the bracket to engagement slots present on the rail, thereby securing the video recorder to the dashboard.

In an alternative example, the video recorder is a Go-Pro video recorder, and the user employs a bracket a shown in FIG. 51 and the bracket adaptor is the one shown at FIG. 100. Either before or after attachment of bracket to rail affixed to the dashboard, the user attaches the bracket adaptor to the bracket by screwing the threaded screw of bracket adaptor into a threaded hole of an attachment point present on the bracket. The user then attaches the video recorder by aligning the holes present on the bracket adaptor and the bracket present on the video recorder, inserting a treaded pin and securing the threaded pin in a manner that attached the video recorder to the bracket attachment. In not already attached, the user then secures the bracket to the rail by engaging the engagement bosses of first and second jaw members the bracket to engagement slots present on the rail, thereby securing the video recorder to the dashboard.

In an alternative example to the ones above, the rail is affixed to an interior surface of a window present in the car, like a windshield, rear window, driver window or passenger window.

Example 6

This example illustrates how to employ a mounting system disclosed herein to attach a device in a device case disclosed herein onto a load bearing equipment vest and additional components of the mounting system disclosed herein to the device case.

A user attaches a device case to a rail secured on a load bearing equipment vest using any of the procedures described in Example 3. The user then secures a bracket comprising a hinged socket as shown in FIG. 127 to the device in a position opposite the location of where the device case is attached to the rail by engaging the engagement bosses of first and second jaw members the bracket comprising a hinged coupler to engagement slots present on the rail. The user then obtains an adaptor as shown in adaptor and attaches the adaptor to the device case by inserting a coupler disclosed herein as shown in FIG. 170 into the socket of the hinged coupler thereby securing the adaptor to the device case. The user then attached a GPS, a compass and a flashlight to the adaptor as shown in FIG. 172. In this set-up, when the user desires to stow away the devices, the user can fold the adaptor in close proximity to one side of the device case and then fold the device case-adaptor assembly in close proximity to the load bearing equipment vest. Likewise, when use is desired, the use can extend the device case-adaptor assembly away from the load bearing equipment vest to view the device encased in the device case, and then further extend the adaptor to view the devices contained therein.

Example 7

This example illustrates how to employ a mounting system disclosed herein to attach a device in a device case disclosed herein alternatively onto a dashboard or a load bearing equipment vest.

A user secures a rail disclosed herein as shown in FIG. 3 to a load bearing equipment vest using any of the procedures described in Example 3. The user secures a rail disclosed herein as shown in FIG. 3 to a dashboard using any of the procedures described in Example 4. The user encases a device in a device case disclosed herein as shown in FIG. 22 as described in Example 3. In use, when entering a vehicle the user can attach the device case to the rail secured on dashboard using any of the procedures described in Example 4. When leaving the vehicle the user can detach the device case from the rail on the dashboard and then attach the device case to the rail secured on the load bearing equipment vest using any of the procedures described in Example 3.

In an alternative example, instead of the device case, the user employs the mounting system disclosed herein for a video recorder. In this case, when entering a vehicle the user can attach the video recorder to the rail secured on dashboard using any of the procedures described in Example 5. When leaving the vehicle the user can detach the video recorder from the rail on the dashboard and then attach the video recorder to the rail secured on the load bearing equipment vest using any of the procedures described in Example 3 or attach the video recorder to the rail secured on a helmet using any of the procedures described in Example 1.

Example 8

This example illustrates how to employ a mounting system disclosed herein to detachable secure lighting and/or sound system equipment to a stage, a cinema, a theater, a stadium and/or any other location where such lighting and/or sound system equipment is used, replacing currently used rigging components and clamps.

A user obtains lighting and/or sound system equipment comprising a bracket disclosed herein, such as, e.g., bracket 400' of FIG. 11, 13, or 67-76. Such lighting and/or sound system equipment can have bracket 400' securely connected to the equipment using a bracket adaptor disclosed herein, such as, e.g., bracket adaptor 900 or by replacing a current mounting system with bracket 400'. Alternatively, bracket 400' could be designed into the equipment during manufacturing an integrated component. Alternatively, use of a bracket comprising a hinged coupler disclosed herein, such as, e.g., bracket 400 with first jaw 410', can be used in conjunction with a coupler disclosed herein, such as, e.g., coupler 980 and a second attachment portion 993, 993', 993", 993''', 993'''', 993'''''. In this alternative, second attachment portion 993, 993', 993", 993''', 993'''', 993''''' would be securely connected to the lighting and/or sound system equipment and first attachment portion 983 would be securely connected to socket 775 of a bracket comprising a hinged coupler disclosed herein. The user then secures the lighting and/or sound system equipment to existing rigging or using a rail disclosed herein, such as, e.g., closed curve rail 20 of FIGS. 8, 10, 12 as a replacement to such rigging. During tear-down of the location, a user simply detaches the lighting and/or sound system equipment by releasing bracket 400' from the rigging.

Example 9

This example illustrates how to employ a mounting system disclosed herein to detachable secure bicycle component, such as, e.g., a brake, a gear shifter, or other operational equipment, to a bicycle to enable quick and easy attachment and removal of these bicycle components.

A user obtains bicycle component comprising a bracket disclosed herein, such as, e.g., bracket 400' of FIG. 11, 13, or 67-76. Such bicycle component can have bracket 400' securely connected to the component using a bracket adaptor disclosed herein, such as, e.g., bracket adaptor 900 or by replacing a current mounting system with bracket 400'. Alternatively, bracket 400' could be designed into the bicycle component during manufacturing an integrated component. Alternatively, use of a bracket comprising a hinged coupler disclosed herein, such as, e.g., bracket 400 with first jaw 410', can be used in conjunction with a coupler disclosed herein, such as, e.g., coupler 980 and a second attachment portion 993, 993', 993", 993''', 993'''', 993'''''. In this alternative, second attachment portion 993, 993', 993", 993''', 993'''', 993''''' would be securely connected to the bicycle component and first attachment portion 983 would be securely connected to socket 775 of a bracket comprising a hinged coupler disclosed herein. The user then secures the bicycle component to existing structure on the bicycle, such as, e.g., a handlebar, or using a rail disclosed herein, such as, e.g., closed curve rail 20 of FIGS. 8, 10, 12 as a replacement to the handlebar. To remove the bicycle component, a user simply detaches the component by releasing bracket 400' from the handlebar.

In closing, it is to be understood that, although aspects of the present specification are highlighted by referring to specific embodiments, one skilled in the art will readily appreciate that these described embodiments are only illustrative of the principles of the subject matter disclosed herein. The specific embodiments are not intended to be exhaustive or to limit the invention to the precise forms disclosed. Therefore, it should be understood that the disclosed subject matter is in no way limited to a particular compound, composition, article, apparatus, methodology, protocol, and/or reagent, etc., described herein, unless expressly stated as such. In addition, those of ordinary skill in the art will recognize that certain changes, modifications, permutations, alterations, additions, subtractions and sub-combinations thereof can be made in accordance with the teachings herein without departing from the spirit of the present specification. It is therefore intended that the scope of the invention is not to be limited by this detailed description. Furthermore, it is intended that the following appended claims and claims hereafter introduced are interpreted to include all such changes, modifications, permutations, alterations, additions, subtractions and sub-combinations as are within their true spirit and scope.

Certain embodiments of the present invention are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the present invention to be practiced otherwise than specifically described herein. Accordingly, this invention includes all modifications and equivalents of the subject matter recited in the claims appended hereto as permitted by applicable law. Moreover, any combination of the above-described embodiments in all possible variations thereof is encompassed by the invention unless otherwise indicated herein or otherwise clearly contradicted by context.

Groupings of alternative embodiments, elements, or steps of the present invention are not to be construed as limitations. Each group member may be referred to and claimed individually or in any combination with other group members disclosed herein. It is anticipated that one or more members of a group may be included in, or deleted from, a group for reasons of convenience and/or patentability. When any such inclusion or deletion occurs, the specification is deemed to contain the group as modified, thus fulfilling the written description of all Markush groups used in the appended claims.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

Unless otherwise indicated, all numbers expressing a characteristic, item, quantity, parameter, property, term, and so forth used in the present specification and claims are to be understood as being modified in all instances by the term "about." As used herein, the term "about" means that the characteristic, item, quantity, parameter, property, or term so qualified encompasses a range of plus or minus ten percent above and below the value of the stated characteristic, item, quantity, parameter, property, or term. Accordingly, unless indicated to the contrary, the numerical parameters set forth in the specification and attached claims are approximations that may vary. For instance, as mass spectrometry instruments can vary slightly in determining the mass of a given analyte, the term "about" in the context of the mass of an ion or the mass/charge ratio of an ion refers to +/−0.50 atomic mass unit. At the very least, and not as an attempt to limit the application of the doctrine of equivalents to the scope of the claims, each numerical indication should at least be construed in light of the number of reported significant digits and by applying ordinary rounding techniques.

Notwithstanding that the numerical ranges and values setting forth the broad scope of the invention are approximations, the numerical ranges and values set forth in the specific examples are reported as precisely as possible. Any numerical range or value, however, inherently contains certain errors necessarily resulting from the standard deviation found in their respective testing measurements. Recitation of numerical ranges of values herein is merely intended to serve as a shorthand method of referring individually to each separate numerical value falling within the range. Unless otherwise indicated herein, each individual value of a numerical range is incorporated into the present specification as if it were individually recited herein.

Use of the terms "may" or "can" in reference to an embodiment or aspect of an embodiment also carries with it the alternative meaning of "may not" or "cannot." As such, if the present specification discloses that an embodiment or an aspect of an embodiment may be or can be included as part of the inventive subject matter, then the negative limitation or exclusionary proviso is also explicitly meant, meaning that an embodiment or an aspect of an embodiment may not be or cannot be included as part of the inventive subject matter. In a similar manner, use of the term "optionally" in reference to an embodiment or aspect of an embodiment means that such embodiment or aspect of the embodiment may be included as part of the inventive subject matter or may not be included as part of the inventive subject matter. Whether such a negative limitation or exclusionary proviso applies will be based on whether the negative limitation or exclusionary proviso is recited in the claimed subject matter.

The terms "a," "an," "the" and similar references used in the context of describing the present invention (especially in the context of the following claims) are to be construed to cover both the singular and the plural, unless otherwise indicated herein or clearly contradicted by context. Further, ordinal indicators—such as, e.g., "first," "second," "third," etc.—for identified elements are used to distinguish between the elements, and do not indicate or imply a required or limited number of such elements, and do not indicate a particular position or order of such elements unless otherwise specifically stated. All methods described herein can be performed in any suitable order unless otherwise indicated herein or otherwise clearly contradicted by context. The use of any and all examples or exemplary language (e.g., "such as") provided herein is intended merely to better illuminate the present invention and does not pose a limitation on the scope of the invention otherwise claimed. No language in the present specification should be construed as indicating any non-claimed element essential to the practice of the invention.

When used in the claims, whether as filed or added per amendment, the open-ended transitional term "comprising", variations thereof such as, e.g., "comprise" and "comprises", and equivalent open-ended transitional phrases thereof like "including," "containing" and "having", encompass all the expressly recited elements, limitations, steps, integers, and/or features alone or in combination with unrecited subject matter; the named elements, limitations, steps, integers, and/or features are essential, but other unnamed elements, limitations, steps, integers, and/or features may be added and still form a construct within the scope of the claim. Specific embodiments disclosed herein may be further limited in the claims using the closed-ended transitional phrases "consisting of" or "consisting essentially of" (or variations thereof such as, e.g., "consist of", "consists of", "consist essentially of", and "consists essentially of") in lieu of or as an amendment for "comprising." When used in the claims, whether as filed or added per amendment, the closed-ended transitional phrase "consisting of" excludes any element, limitation, step, integer, or feature not expressly recited in the claims. The closed-ended transitional phrase "consisting essentially of" limits the scope of a claim to the expressly recited elements, limitations, steps, integers, and/or features and any other elements, limitations, steps, integers, and/or features that do not materially affect the basic and novel characteristic(s) of the claimed subject matter. Thus, the meaning of the open-ended transitional phrase "comprising" is being defined as encompassing all the specifically recited elements, limitations, steps and/or features as well as any optional, additional unspecified ones. The meaning of the closed-ended transitional phrase "consisting of" is being defined as only including those elements, limitations, steps, integers, and/or features specifically recited in the claim, whereas the meaning of the closed-ended transitional phrase "consisting essentially of" is being defined as only including those elements, limitations, steps, integers, and/or features specifically recited in the claim and those elements, limitations, steps, integers, and/or features that do not materially affect the basic and novel characteristic(s) of the claimed subject matter. Therefore, the open-ended transitional phrase "comprising" (and equivalent open-ended transitional phrases thereof) includes within its meaning, as a limiting case, claimed subject matter specified by the closed-ended transitional phrases "consisting of" or "consisting essentially of." As such, the embodiments described herein or so claimed with the phrase "comprising" expressly and unambiguously provide description, enablement, and support for the phrases "consisting essentially of" and "consisting of."

All patents, patent publications, and other references cited and identified in the present specification are individually and expressly incorporated herein by reference in their entirety for the purpose of describing and disclosing, for example, the compositions and methodologies described in such publications that might be used in connection with the present invention. These publications are provided solely for their disclosure prior to the filing date of the present application. Nothing in this regard is or should be construed as an admission that the inventors are not entitled to antedate such disclosure by virtue of prior invention or for any other reason. All statements as to the date or representation as to the contents of these documents are based on the information available to the applicant and do not constitute any admission as to the correctness of the dates or contents of these documents.

Lastly, the terminology used herein is for the purpose of describing particular embodiments only and is not intended to limit the scope of the present invention, which is defined solely by the claims. Accordingly, the present invention is not limited to that precisely as shown and described.

The invention claimed is:

1. A lock assembly comprising a latch bolt assembly, the latch bolt assembly including a latch bolt pin and a latch bolt through hole, the latch bolt pin configured to slidably insert within the latch bolt through hole to enable a locking mechanism, the latch bolt assembly configured to adopt an unlocked position and a locked position,
wherein a first spring action is capable of causing insertion of the latch bolt pin into the latch bolt through hole to adopt a locked position, and
wherein a second spring action is capable of causing withdrawal of the latch bolt pin from the latch bolt through hole to adopt an unlocked position, the second spring action being activated by release of a bias of a second compression spring.

2. The lock assembly of claim 1, wherein the first spring action is activated by release of a bias from a first compression spring housed in the latch bolt assembly.

3. The lock assembly of claim 2, wherein the bias of the first compression spring is oriented parallel to a direction that the latch bolt pin slidably inserts into the latch bolt through hole.

4. The lock assembly of claim 1, wherein the bias of the second compression spring is oriented perpendicular to a direction that the latch bolt pin slidably inserts into the latch bolt through hole.

5. The lock assembly of claim 1, wherein the latch bolt assembly further comprises a latch bolt body, the latch bolt body having a longitudinal axis defined by a first body end and a second body end, the latch bolt pin extending from the first body end of the latch bolt body and parallel to the longitudinal axis of the latch bolt body.

6. The lock assembly of claim 5, wherein the latch bolt body further comprises a compression spring housing, the compression spring housing containing a first compression spring.

7. The lock assembly of claim 6, wherein the compression spring housing includes a channel having a first channel end, a second channel end and configured to receive the first compression spring, the channel running parallel to the longitudinal axis of the latch bolt body with the first channel end position on a same end as the first body end and the second channel end position on a same end as the second body end.

8. The lock assembly of claim 7, wherein the first compression spring is capable of adopting a bias against the first channel end of the channel and capable of generating a force parallel to the longitudinal axis of the body when the bias is released,
wherein in the unlocked position, the latch bolt assembly is retracted against the bias of the first compression spring with the latch bolt pin withdrawn from the latch bolt through hole, and
wherein in the locked position, the latch bolt pin of the latch bolt assembly is inserted into the latch bolt through hole of the latching pin by the force of the first compression spring.

9. The lock assembly of claim 7, wherein the latch bolt assembly further includes a limiter slot and limiter pin, the limiter slot having a first limiter slot end and a second limiter slot end, and configured to receive the limiter pin, the limiter slot running parallel to the longitudinal axis of the channel with the first limiter slot end position on a same end as the first channel end and the second limiter slot end position on a same end as the second channel end, and the limiter pin capable of slidably traversing the limiter slot in a direction parallel to the longitudinal axis of the channel,
wherein the limiter pin limits the movement of the latch bolt assembly by a distance defined by the first and second limiter slot ends.

10. The lock assembly of claim 1, contained in a housing.

11. The lock assembly of claim 10, wherein the housing includes a latch bolt bore configured to slidably receive the latch bolt assembly.

12. The lock assembly of claim 11, wherein the latch bolt bore is contained in a jaw member of the housing.

13. A lock assembly comprising a latch bolt assembly and a housing,
the latch bolt assembly including a positive action locking mechanism comprising a latch bolt, a latch bolt compression spring, and
the housing including a positive unlocking mechanism comprising one or more compression springs,
wherein the latch bolt assembly is configured to adopt an unlocked position and a locked position,
wherein in the unlocked position, the latch bolt is retracted against a bias of the latch bolt compression spring and a bias of each of the one or more compression springs is released, and
wherein in the locked position, release of the bias of the latch bolt compression spring causes the latch bolt to insert into a latch bolt bore.

14. The lock assembly of claim 13, wherein in the locked position, each of the one or more compression springs is retracted against its respective bias.

15. The lock assembly of claim 14, wherein the latch bolt bore is configured to slidably receive the latch bolt assembly.

16. The lock assembly of claim 13, wherein retraction against the bias of the latch bolt compression spring causes the release of the bias of each of the one or more compression springs.

17. A lock assembly comprising a latch bolt assembly and a latching pin,
the latch bolt assembly including a latch bolt body and a latch bolt pin,
the latch bolt body having a longitudinal axis defined by a first body end and a second body end and including a compression spring housing and a latch bolt compression spring, the compression spring housing including a channel having a first channel end, a second channel end and configured to receive the latch bolt compression spring, the channel running parallel to the longitudinal axis of the latch bolt body with the first channel end position on a same end as the first body end and the second channel end position on same end as the second body end, the latch bolt compression spring capable of adopting a bias against the first channel end of the channel and capable generating a force parallel to the longitudinal axis the latch bolt body when the bias is released, the latch bolt pin extending from the first latch bolt body end of the latch bolt body and parallel to the longitudinal axis of the latch bolt body; and
the latching pin comprising a bolt channel and a latch bolt through hole;
wherein the latch bolt pin is configured to slidably fit within the latch bolt through hole and enable a locking mechanism,
wherein the lock assembly is configured to adopt an unlocked position and a locked position,
wherein in the unlocked position, the latch bolt assembly is retracted against the bias of the latch bolt compression spring with the latch bolt pin residing within the bolt channel of the latching pin, and
wherein in the locked position, the latch bolt pin of the latch bolt assembly is inserted into the latch bolt through hole of the latching pin by the force of the latch bolt compression spring.

18. The lock assembly of claim 17, further comprising a compression spring capable of adopting a bias against the latch bolt body and capable of generating a force perpendicular to the longitudinal axis the latch bolt body when the bias is released,
wherein in the unlocked position, the latch bolt pin of the latch bolt assembly is inserted into the bolt channel of the latching pin by the force of the compression spring, and
wherein in the locked position, the latch bolt pin of the latch bolt assembly is inserted into the latch bolt through hole of the latching pin against the bias of the compression spring.

19. The lock assembly of claim 17, wherein the latch bolt assembly further includes a limiter slot and limiter pin, the limiter slot having a first limiter slot end and a second limiter slot end and configured to receive the limiter pin, the limiter slot running parallel to the longitudinal axis of the channel with the first limiter slot end position on a same end as the first channel end and the second limiter slot end position on a same end as the second channel end, and the limiter pin capable of slidably traversing the limiter slot in a direction parallel to the longitudinal axis of the channel, wherein the limiter pin limits the movement of the latch bolt assembly by a distance defined by the first and second limiter slot ends.

20. The lock assembly of claim 17, contained in a housing.

21. The lock assembly of claim 20, wherein the housing includes a latch bolt bore configured to slidably receive the latch bolt assembly.

22. The lock assembly of claim 21, wherein the latch bolt bore is contained in a jaw member of the housing.

* * * * *